United States Patent
Yamazaki et al.

(10) Patent No.: US 11,417,687 B2
(45) Date of Patent: Aug. 16, 2022

(54) DISPLAY DEVICE

(71) Applicant: SEMICONDUCTOR ENERGY LABORATORY CO., LTD., Atsugi (JP)

(72) Inventors: Shunpei Yamazaki, Tokyo (JP); Koji Kusunoki, Kanagawa (JP); Yoshiaki Oikawa, Kanagawa (JP); Kensuke Yoshizumi, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/965,053

(22) PCT Filed: Jan. 28, 2019

(86) PCT No.: PCT/IB2019/050660
§ 371 (c)(1),
(2) Date: Jul. 27, 2020

(87) PCT Pub. No.: WO2019/155318
PCT Pub. Date: Aug. 15, 2019

(65) Prior Publication Data
US 2021/0111196 A1   Apr. 15, 2021

(30) Foreign Application Priority Data

Feb. 8, 2018 (JP) .............................. JP2018-021216
Feb. 16, 2018 (JP) .............................. JP2018-025658

(51) Int. Cl.
*H01L 27/12* (2006.01)
*G02F 1/1368* (2006.01)
(Continued)

(52) U.S. Cl.
CPC ...... *H01L 27/1225* (2013.01); *G02F 1/13685* (2021.01); *H01L 27/1207* (2013.01);
(Continued)

(58) Field of Classification Search
CPC ............. H01L 27/1225; H01L 27/1207; H01L 27/1211; H01L 27/3262; H01L 27/32;
(Continued)

(56) References Cited

U.S. PATENT DOCUMENTS 6,927,455 B2 * 8/2005 Narazaki ........... H01L 29/66348
257/341
9,865,712 B2   1/2018 Okamoto et al.
(Continued)

FOREIGN PATENT DOCUMENTS

CN    104904013 A   9/2015
JP    2013-145878 A  7/2013
(Continued)

OTHER PUBLICATIONS

International Search Report (Application No. PCT/IB2019/050660) dated May 14, 2019.
(Continued)

*Primary Examiner* — Joseph L Williams
*Assistant Examiner* — Jose M Diaz
(74) *Attorney, Agent, or Firm* — Fish & Richardson P.C.

(57) ABSTRACT

A high-definition display device is provided. A display device with low power consumption is provided. A highly reliable display device is provided. The display device includes a first transistor and a display element electrically connected to the first transistor. The first transistor includes a first oxide, a second oxide, a first conductor, a second conductor, a third conductor, a first insulator, and a second insulator. The first conductor and the second conductor are positioned over the first oxide to be apart from each other. The first insulator is positioned over the first conductor and the second conductor and includes an opening. The opening overlaps with a portion between the first conductor and the second conductor. The third conductor is positioned in the
(Continued)

opening. The second insulator is positioned between the third conductor, and the first oxide, the first conductor, the second conductor, and the first insulator. The second oxide is positioned between the second insulator, and the first oxide, the first conductor, the second conductor, and the first insulator.

26 Claims, 56 Drawing Sheets

(51) Int. Cl.
    *H01L 27/32*     (2006.01)
    *H01L 29/66*     (2006.01)
    *G02F 1/1335*     (2006.01)

(52) U.S. Cl.
    CPC ...... *H01L 27/1211* (2013.01); *H01L 27/3262* (2013.01); *H01L 29/66969* (2013.01); *G02F 1/133512* (2013.01); *H01L 27/3272* (2013.01)

(58) Field of Classification Search
    CPC .............. H01L 27/3272; H01L 27/088; H01L 27/0688; H01L 29/66969; H01L 29/869; H01L 29/78648; H01L 29/78696; H01L 29/786; H01L 51/50; G02F 1/13685; G02F 1/133512; G02F 1/1343; G02F 1/1368; G09F 9/30; G09F 9/33; H05B 33/02; H05B 33/14
    See application file for complete search history.

(56) References Cited

U.S. PATENT DOCUMENTS

| | | | |
|---|---|---|---|
| 9,947,802 B2 | 4/2018 | Kimura et al. | |
| 9,954,003 B2 | 4/2018 | Matsuda et al. | |
| 9,954,018 B2 | 4/2018 | Yamaguchi | |
| 10,002,968 B2 | 6/2018 | Yoneda | |
| 10,008,524 B2 | 6/2018 | Yamaguchi | |
| 10,074,697 B2 | 9/2018 | Yamaguchi | |
| 10,446,671 B2 | 10/2019 | Okamoto et al. | |
| 10,680,110 B2 | 6/2020 | Yoneda | |
| 2013/0153890 A1 | 6/2013 | Yoneda | |
| 2015/0349008 A1 | 12/2015 | Yamaguchi | |
| 2016/0260822 A1 | 9/2016 | Okamoto et al. | |
| 2017/0092779 A1 | 3/2017 | Kimura et al. | |
| 2017/0236842 A1 | 8/2017 | Matsuda et al. | |
| 2018/0040640 A1 | 2/2018 | Takahashi et al. | |
| 2018/0059721 A1 | 3/2018 | Akimoto | |
| 2018/0082118 A1 | 3/2018 | Kozuma et al. | |
| 2018/0180951 A1 | 6/2018 | Toyotaka | |
| 2018/0350863 A1 | 12/2018 | Yamaguchi | |
| 2019/0163433 A1 | 5/2019 | Yoshizumi et al. | |
| 2019/0378918 A1 | 12/2019 | Okamoto et al. | |
| 2020/0057330 A1 | 2/2020 | Yamazaki et al. | |
| 2020/0127064 A1 | 4/2020 | Ikeda et al. | |

FOREIGN PATENT DOCUMENTS

| | | | | |
|---|---|---|---|---|
| JP | 2014-007399 A | | 1/2014 | |
| JP | 2015073093 A | * | 4/2015 | ........ H01L 21/31116 |
| JP | 2016-157937 A | | 9/2016 | |
| JP | 2016-167584 A | | 9/2016 | |
| JP | 2017-063192 A | | 3/2017 | |
| JP | 2017-147445 A | | 8/2017 | |
| KR | 2015-0106400 A | | 9/2015 | |
| KR | 2017-0096956 A | | 8/2017 | |
| TW | 201707215 | | 2/2017 | |
| WO | WO-2014/112279 | | 7/2014 | |
| WO | WO-2016/139548 | | 9/2016 | |

OTHER PUBLICATIONS

Written Opinion (Application No. PCT/IB2019/050660) dated May 14, 2019.

\* cited by examiner

FIG. 16A
FIG. 16C
FIG. 16B
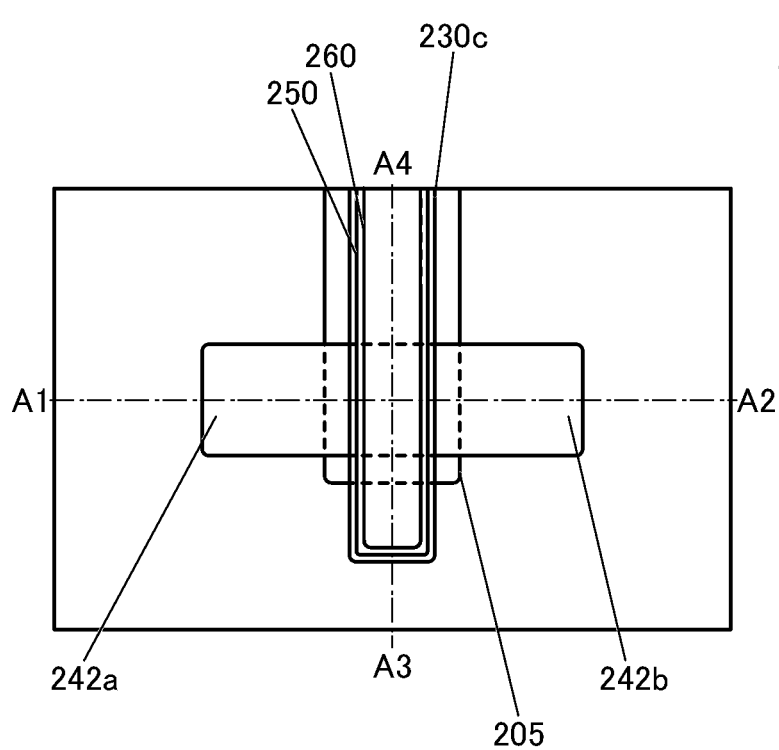
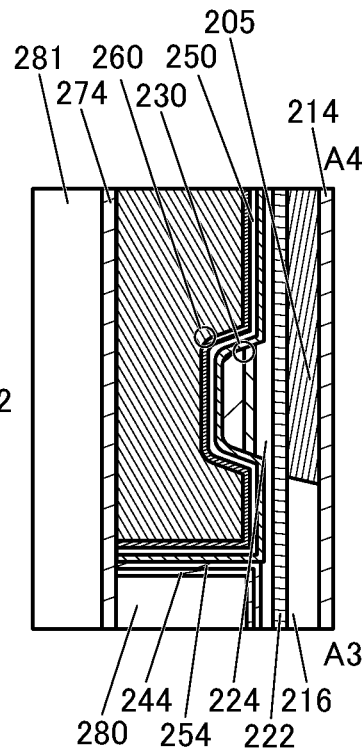
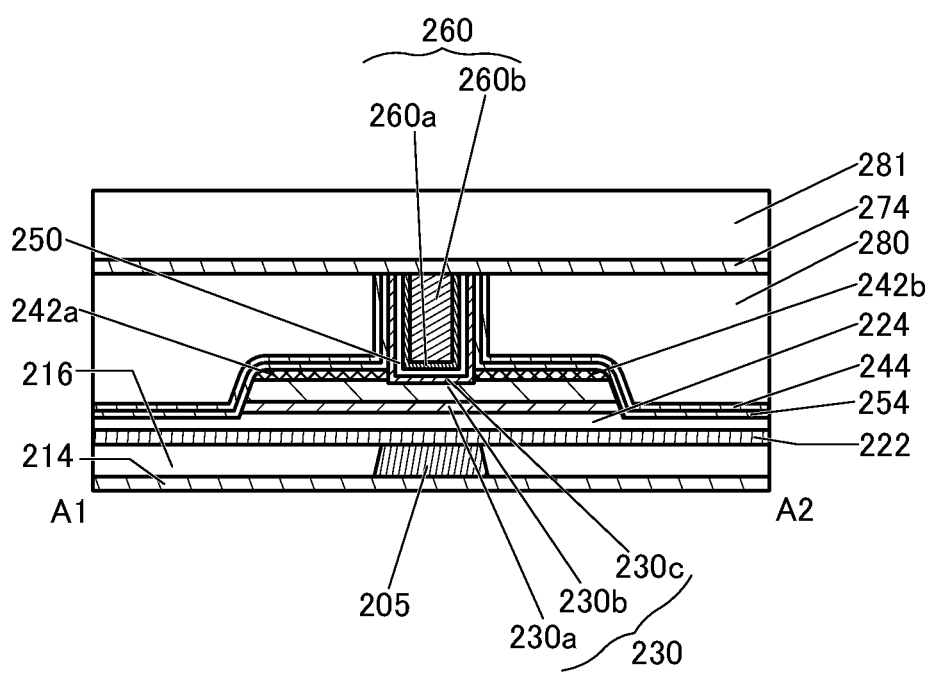

FIG. 28A
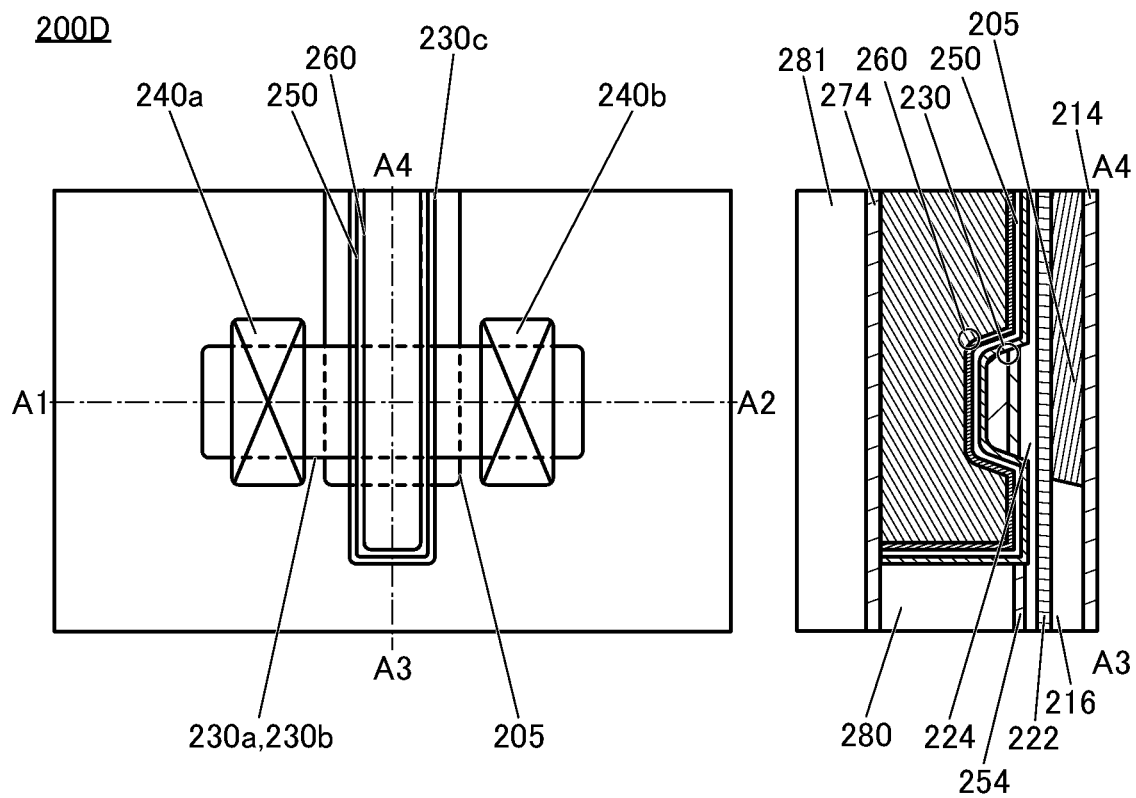
FIG. 28C
FIG. 28B
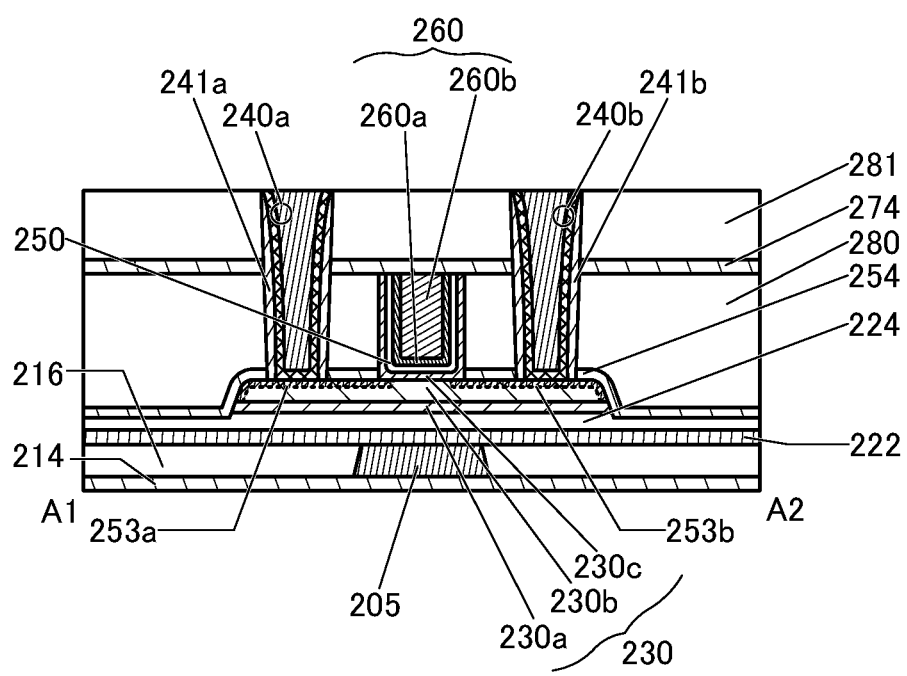

FIG. 47A
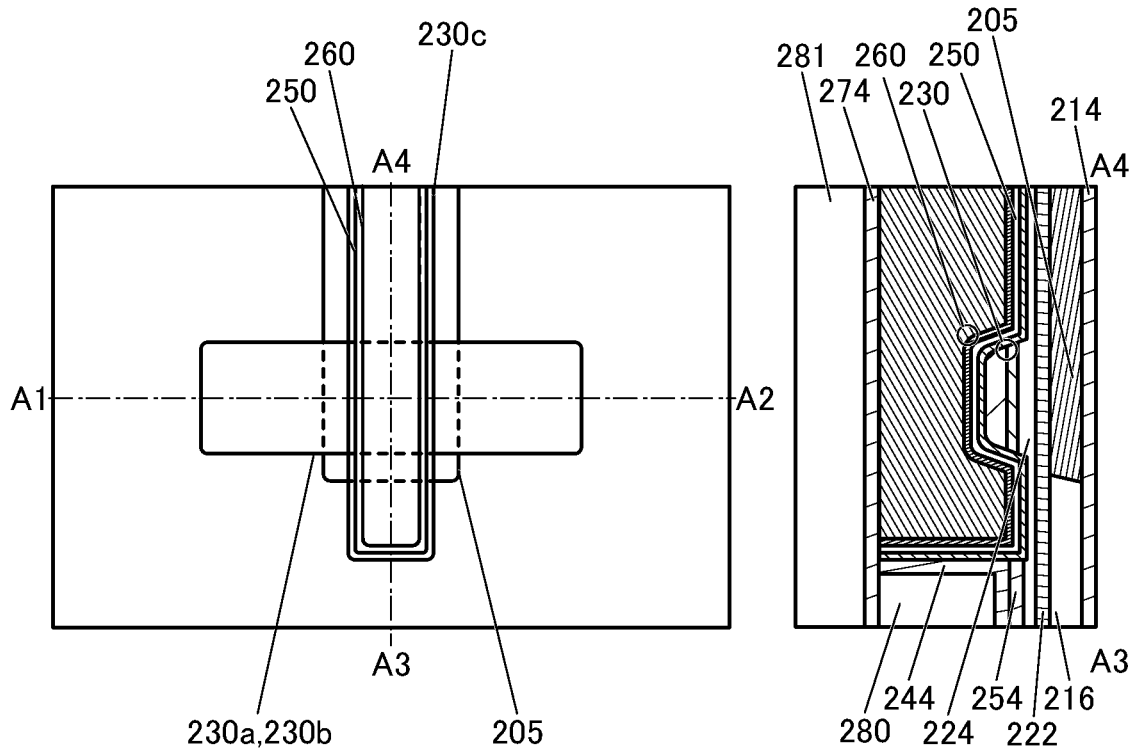
FIG. 47C
FIG. 47B
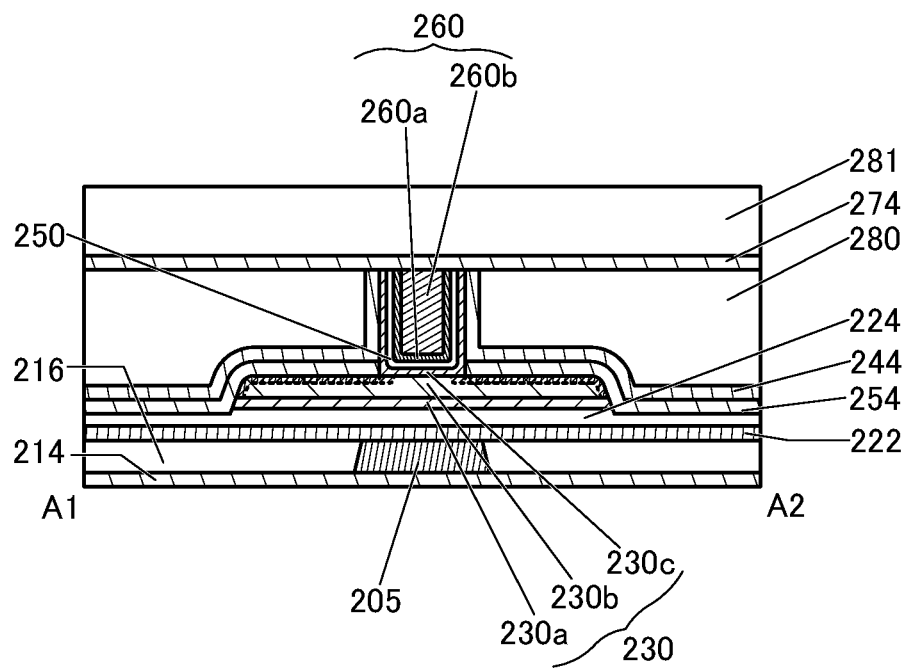

DISPLAY DEVICE

CROSS REFERENCE TO RELATED APPLICATIONS

This application is a U.S. National Phase Application under 35 U.S.C. § 371 of International Application PCT/IB2019/050660, filed on Jan. 28, 2019, which is incorporated by reference and claims the benefit of foreign priority applications filed in Japan on Feb. 8, 2018, as Application No. 2018-021216 and on Feb. 16, 2018, as Application No. 2018-025658.

TECHNICAL FIELD

One embodiment of the present invention relates to a display device and a manufacturing method thereof. One embodiment of the present invention relates to a transistor and a manufacturing method thereof.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

As a semiconductor material that can be applied to a transistor, an oxide semiconductor using a metal oxide has been attracting attention. For example, Patent Document 1 discloses a semiconductor device that achieves increased field-effect mobility (simply referred to as mobility or µFE in some cases) by stacking a plurality of oxide semiconductor layers, containing indium and gallium in an oxide semiconductor layer serving as a channel in the plurality of oxide semiconductor layers, and making the proportion of indium higher than the proportion of gallium.

A metal oxide that can be used for a semiconductor layer can be formed by a sputtering method or the like, and thus can be used for a semiconductor layer of a transistor included in a large display device. In addition, capital investment can be reduced because part of production equipment for a transistor using polycrystalline silicon or amorphous silicon can be retrofitted and utilized. Furthermore, a transistor using a metal oxide has field-effect mobility higher than that in the case where amorphous silicon is used; therefore, a high-performance display device provided with driver circuits can be achieved.

In addition, as display devices for augmented reality (AR) or virtual reality (VR), wearable display devices and stationary display devices have been widely used. Examples of wearable display devices include a head mounted display (HMD) and an eyeglass-type display device. Examples of stationary display devices include a head-up display (HUD).

PRIOR ART DOCUMENT

Patent Document

[Patent Document 1] Japanese Published Patent Application No. 2014-7399

SUMMARY OF THE INVENTION

Problems to be Solved by the Invention

A display device whose display surface and a user are closer to each other, such as a head mounted display (HMD), easily allows the user to perceive pixels and strongly feel granularity, which might decrease the sense of immersion or realistic feeling of AR or VR. Accordingly, a display device with high-definition pixels is needed so that the user does not perceive the pixels.

In view of the above, an object of one embodiment of the present invention is to provide a high-definition display device. Another object is to provide a display device with low power consumption. Another object of one embodiment of the present invention is to provide a highly reliable display device. Another object of one embodiment of the present invention is to provide a novel display device.

Note that the description of these objects does not disturb the existence of other objects. Note that one embodiment of the present invention does not need to achieve all the objects. Note that objects other than these can be derived from the description of the specification, the drawings, the claims, and the like.

Means for Solving the Problems

One embodiment of the present invention is a display device that includes a first transistor and a display element electrically connected to the first transistor. The first transistor includes a first oxide, a second oxide, a first conductor, a second conductor, a third conductor, a first insulator, and a second insulator. The first conductor and the second conductor are positioned over the first oxide to be apart from each other. The first insulator is positioned over the first conductor and the second conductor and includes an opening. The opening overlaps with a portion between the first conductor and the second conductor. The third conductor is positioned in the opening. The second insulator is positioned between the third conductor, and the first oxide, the first conductor, the second conductor, and the first insulator. The second oxide is positioned between the second insulator, and the first oxide, the first conductor, the second conductor, and the first insulator.

Another embodiment of the present invention is a display device that includes a first transistor, a display element electrically connected to the first transistor, and a structure body. The first transistor includes a first oxide, a second oxide, a first conductor, a second conductor, a third conductor, a first insulator, and a second insulator. The first conductor and the second conductor are positioned over the first oxide to be apart from each other. The first insulator is positioned over the first conductor and the second conductor and includes an opening. The opening overlaps with a portion between the first conductor and the second conductor. The third conductor is positioned in the opening. The second insulator is positioned between the third conductor, and the first oxide, the first conductor, the second conductor, and the first insulator. The second oxide is positioned between the second insulator, and the first oxide, the first conductor, the second conductor, and the first insulator. The structure body is positioned in the same layer as a layer including the display element. The structure body includes a region overlapping with the first transistor.

Another embodiment of the present invention is a display device that includes a first transistor, a second transistor, and a display element electrically connected to the second transistor. The first transistor includes a first oxide, a second oxide, a first conductor, a second conductor, a third conductor, a first insulator, and a second insulator. The first conductor and the second conductor are positioned over the first oxide to be apart from each other. The first insulator is positioned over the first conductor and the second conductor and includes an opening. The opening overlaps with a portion between the first conductor and the second conductor. The third conductor is positioned in the opening. The second insulator is positioned between the third conductor, and the first oxide, the first conductor, the second conductor, and the first insulator. The second oxide is positioned between the second insulator, and the first oxide, the first conductor, the second conductor, and the first insulator. A layer including the first transistor is positioned between a layer including the display element and a layer included in the second transistor.

Another embodiment of the present invention is a display device that includes a first transistor, a second transistor, a display element electrically connected to the second transistor, and a light-blocking film. The first transistor includes a first oxide, a second oxide, a first conductor, a second conductor, a third conductor, a first insulator, and a second insulator. The first conductor and the second conductor are positioned over the first oxide to be apart from each other. The first insulator is positioned over the first conductor and the second conductor and includes an opening. The opening overlaps with a portion between the first conductor and the second conductor. The third conductor is positioned in the opening. The second insulator is positioned between the third conductor, and the first oxide, the first conductor, the second conductor, and the first insulator. The second oxide is positioned between the second insulator, and the first oxide, the first conductor, the second conductor, and the first insulator. A layer including the first transistor is positioned between a layer including the display element and a layer included in the second transistor. The light-blocking film is positioned above the display element. The light-blocking film, the first transistor, and the second transistor include an overlap region.

In the display device, the second transistor preferably includes silicon in a channel formation region.

In addition, in the display device, the second transistor can be an n-channel transistor.

In addition, in the display device, the second transistor can be a p-channel transistor.

The display device preferably further includes a third insulator. The third insulator is preferably positioned between the first insulator, and the first oxide, the first conductor, the second conductor, and the second oxide. The third insulator preferably has lower oxygen permeability than the first insulator.

The display device preferably further includes a third insulator. The third insulator is preferably positioned between the first insulator, and the first oxide, the first conductor, and the second conductor. The third insulator preferably has lower oxygen permeability than the first insulator. The second oxide is preferably in contact with the first insulator.

The display device preferably further includes a fourth conductor and a fifth conductor. The fourth conductor is preferably positioned between the first conductor and the first oxide. The fifth conductor is preferably positioned between the second conductor and the first oxide. Part of the first conductor is preferably in contact with a top surface of the first oxide. Part of the second conductor is preferably in contact with a top surface of the first oxide.

In the display device, a distance between the first conductor and the second conductor is preferably shorter than a length of the opening in a channel length direction.

Another embodiment of the present invention is a display device that includes a first transistor and a display element electrically connected to the first transistor. The first transistor includes a first oxide, a second oxide, a conductor, a first insulator, a second insulator, a third insulator, and a fourth insulator. The second oxide is positioned over the first oxide. The first insulator is positioned over the second oxide. The conductor is positioned over the first insulator. The second insulator is in contact with part of a top surface of the first oxide, part of a side surface of the first oxide, and part of a side surface of the second oxide. The third insulator is positioned over the second insulator. Part of the second oxide and part of the first insulator are positioned between a side surface of the conductor and a side surface of the third insulator. The fourth insulator is in contact with a top surface of the second oxide, a top surface of the first insulator, a top surface of the conductor, and a top surface of the third insulator. The first oxide includes a first region, a second region, and a third region positioned between the first region and the second region. The conductor is positioned above the third region to overlap with the third region. The second insulator is in contact with the first region and the second region. The first region and the second region have lower resistance than the third region.

Another embodiment of the present invention is a display device that includes a first transistor, a display element electrically connected to the first transistor, and a structure body. The first transistor includes a first oxide, a second oxide, a conductor, a first insulator, a second insulator, a third insulator, and a fourth insulator. The second oxide is positioned over the first oxide. The first insulator is positioned over the second oxide. The conductor is positioned over the first insulator. The second insulator is in contact with part of a top surface of the first oxide, part of a side surface of the first oxide, and part of a side surface of the second oxide. The third insulator is positioned over the second insulator. Part of the second oxide and part of the first insulator are positioned between a side surface of the conductor and a side surface of the third insulator. The fourth insulator is in contact with a top surface of the second oxide, a top surface of the first insulator, a top surface of the conductor, and a top surface of the third insulator. The first oxide includes a first region, a second region, and a third region positioned between the first region and the second region. The conductor is positioned above the third region to overlap with the third region. The second insulator is in contact with the first region and the second region. The first region and the second region have lower resistance than the third region. The structure body is positioned in the same layer as a layer including the display element. The structure body includes a region overlapping with the first transistor.

Another embodiment of the present invention is a display device that includes a first transistor, a second transistor, and a display element electrically connected to the second transistor. The first transistor includes a first oxide, a second oxide, a conductor, a first insulator, a second insulator, a third insulator, and a fourth insulator. The second oxide is positioned over the first oxide. The first insulator is positioned over the second oxide. The conductor is positioned over the first insulator. The second insulator is in contact with part of a top surface of the first oxide, part of a side surface of the first oxide, and part of a side surface of the second oxide. The third insulator is positioned over the second insulator. Part of the second oxide and part of the first insulator are positioned between a side surface of the conductor and a side surface of the third insulator. The fourth insulator is in contact with a top surface of the second oxide, a top surface of the first insulator, a top surface of the conductor, and a top surface of the third insulator. The first oxide includes a first region, a second region, and a third region positioned between the first region and the second region. The conductor is positioned above the third region to overlap with the third region. The second insulator is in contact with the first region and the second region. The first region and the second region have lower resistance than the third region. A layer including the first transistor is positioned between a layer including the display element and a layer included in the second transistor.

Another embodiment of the present invention is a display device that includes a first transistor, a second transistor, a display element electrically connected to the second transistor, and a light-blocking film. The first transistor includes a first oxide, a second oxide, a conductor, a first insulator, a second insulator, a third insulator, and a fourth insulator. The second oxide is positioned over the first oxide. The first insulator is positioned over the second oxide. The conductor is positioned over the first insulator. The second insulator is in contact with part of a top surface of the second oxide, part of a side surface of the first oxide, and part of a side surface of the second oxide. The third insulator is positioned over the second insulator. Part of the second oxide and part of the first insulator are positioned between a side surface of the conductor and a side surface of the third insulator. The fourth insulator is in contact with the top surface of the second oxide, a top surface of the first insulator, a top surface of the conductor, and a top surface of the third insulator. The first oxide includes a first region, a second region, and a third region positioned between the first region and the second region. The conductor is positioned above the third region to overlap with the third region. The second insulator is in contact with the first region and the second region. The first region and the second region have lower resistance than the third region. The light-blocking film is positioned above the display element. The light-blocking film, the first transistor, and the second transistor include an overlap region.

In the display device, the second transistor preferably includes silicon in a channel formation region.

In addition, in the display device, the second transistor can be an n-channel transistor.

In addition, in the display device, the second transistor can be a p-channel transistor.

In addition, in the display device, it is preferable that the first region and the second region each include any one or more of phosphorus and boron.

In addition, in the display device, it is preferable that the first region and the second region each contain a larger amount of hydrogen than the third region.

In addition, in the display device, the second oxide preferably overlaps with part of the first region and part of the second region.

The display device preferably further includes a fifth insulator. The fifth insulator is preferably in contact with the top surface of the first insulator and part of the side surface of the second oxide. The first oxide preferably further includes a fourth region and a fifth region. The fourth region is preferably positioned between the first region and the third region. The fifth region is preferably positioned between the second region and the third region. The fourth region and the fifth region preferably have lower resistance than the third region and have higher resistance than the first region and the second region.

In addition, in the display device, it is preferable that the fourth region and the fifth region each include any one or more of phosphorus and boron.

In addition, in the display device, it is preferable that the first region and the second region each contain a larger amount of phosphorus or boron than the fourth region and the fifth region.

In the display device, it is preferable that the first region, the second region, the fourth region, and the fifth region each contain a larger amount of hydrogen than the third region.

In addition, in the display device, it is preferable that the first region and the second region each contain a larger amount of hydrogen than the fourth region and the fifth region.

In addition, in the display device, the second oxide preferably overlaps with part of the fourth region and part of the fifth region.

In the display device, the first oxide and the second oxide preferably include In, an element M (M is Al, Ga, Y, or Sn), and Zn.

In the display device, the atomic ratio of In to the element M in the first oxide is preferably higher than the atomic ratio of In to the element M in the second oxide.

It is preferable that the display device further include a third oxide and the third oxide be positioned below the first oxide.

In the display device, the first oxide, the second oxide, and the third oxide preferably contain In, an element M (M is Al, Ga, Y, or Sn), and Zn.

In the display device, the atomic ratio of In to the element M in the first oxide is preferably higher than the atomic ratio of In to the element M in each of the second oxide and the third oxide.

In the display device, the display element can be a liquid crystal element.

In the display device, the display element can be a light-emitting element.

Effect of the Invention

According to one embodiment of the present invention, a high-definition display device can be provided. According to another embodiment of the present invention, a display device with low power consumption can be provided. According to another embodiment of the present invention, a highly reliable display device can be provided. According to another embodiment of the present invention, a novel display device can be provided.

Note that the description of the effects does not disturb the existence of other effects. Note that one embodiment of the present invention does not need to have all the effects. Note that effects other than these can be derived from the description of the specification, the drawings, the claims, and the like.

BRIEF DESCRIPTION OF THE DRAWINGS

FIG. 16 (A) A top view illustrating a method for manufacturing a transistor. (B), (C) Cross-sectional views illustrating the method for manufacturing a transistor.

FIG. 28 (A) A top view of a transistor. (B), (C) Cross-sectional views of the transistor.

FIG. 47 (A) A top view illustrating a method for manufacturing a transistor. (B), (C) Cross-sectional views illustrating the method for manufacturing a transistor.

MODE FOR CARRYING OUT THE INVENTION

Figure 1:
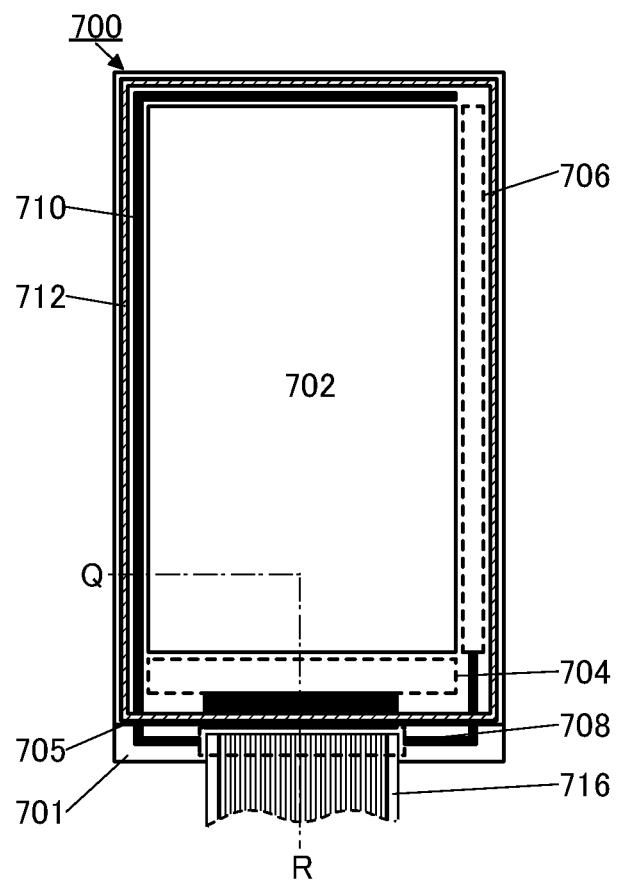
FIG. 1 A top view of a display device.

Embodiments will be described below with reference to the drawings. Note that the embodiments can be implemented with many different modes, and it will be readily understood by those skilled in the art that modes and details thereof can be changed in various ways without departing from the spirit and scope thereof. Therefore, the present invention should not be construed as being limited to the description of embodiments below.

In addition, in each drawing described in this specification, the size, the layer thickness, or the region of each component is exaggerated for clarity in some cases.

Furthermore, ordinal numbers such as "first," "second," and "third" used in this specification are used in order to avoid confusion among components and do not limit the components numerically.

In addition, in this specification, terms for describing arrangement, such as "over" and "below," are used for convenience to describe the positional relationship between components with reference to drawings. Furthermore, the positional relationship between components is changed as appropriate in accordance with a direction in which the components are described. Thus, terms for the description are not limited to terms used in the specification, and description can be made appropriately depending on the situation.

In addition, in this specification and the like, functions of a source and a drain of a transistor are sometimes interchanged with each other depending on the polarity of the transistor, the case where the direction of current is changed in circuit operation, or the like. Therefore, the terms "source" and "drain" can be used interchangeably.

In addition, in this specification and the like, "electrically connected" includes the case where connection is made through an "object having any electric action." Here, there is no particular limitation on the "object having any electric action" as long as electric signals can be transmitted and received between connected components. Examples of the "object having any electric action" include a switching element such as a transistor, a resistor, an inductor, a capacitor, and other elements having a variety of functions as well as an electrode and a wiring.

Moreover, in this specification and the like, the term "film" and the term "layer" can be interchanged with each other. For example, in some cases, the term "conductive layer" and the term "insulating layer" can be interchanged with the term "conductive film" and the term "insulating film," respectively.

In addition, unless otherwise specified, off-state current in this specification and the like refers to drain current of a transistor in an off state (also referred to as a non-conducting state or a cutoff state). Unless otherwise specified, an off state refers to, in an n-channel transistor, a state where voltage $V_{gs}$ between its gate and source is lower than threshold voltage $V_{th}$ (in a p-channel transistor, higher than $V_{th}$).

In this specification and the like, a display panel that is one embodiment of a display device has a function of displaying (outputting) an image or the like on (to) a display surface. Therefore, the display panel is one embodiment of an output device.

Furthermore, in this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Note that in this specification and the like, a touch panel that is one embodiment of the display device has a function of displaying an image or the like on a display surface and a function of a touch sensor capable of detecting the contact, press, approach, or the like of a sensing target such as a finger or a stylus with or to the display surface. Therefore, the touch panel is one embodiment of an input/output device.

A touch panel can be referred to as, for example, a display panel (or a display device) with a touch sensor or a display panel (or a display device) having a touch sensor function. A touch panel can have a structure including a display panel and a touch sensor panel. Alternatively, a touch panel can have a structure having a function of a touch sensor inside or on a surface of a display panel.

In addition, in this specification and the like, a substrate of a touch panel on which a connector and an IC are mounted is referred to as a touch panel module, a display module, or simply a touch panel or the like in some cases.

Embodiment 1

In this embodiment, a display device that is one embodiment of the present invention and a manufacturing method thereof will be described.

A display device that is one embodiment of the present invention includes a first transistor and a display element electrically connected to the first transistor. The first transistor includes a first oxide, a second oxide, a first conductor, a second conductor, a third conductor, a first insulator, and a second insulator. The first conductor and the second conductor are positioned over the first oxide to be apart from each other. The first insulator is positioned over the first conductor and the second conductor and includes an opening. The opening overlaps with a portion between the first conductor and the second conductor. The third conductor is positioned in the opening. The second insulator is positioned between the third conductor, and the first oxide, the first conductor, the second conductor, and the first insulator. The second oxide is positioned between the second insulator, and the first oxide, the first conductor, the second conductor, and the first insulator.

A display device that is another embodiment of the present invention includes a first transistor and a display element electrically connected to the first transistor. The first transistor includes a first oxide, a second oxide, a conductor, a first insulator, a second insulator, a third insulator, and a fourth insulator. The second oxide is positioned over the first oxide. The first insulator is positioned over the second oxide. The conductor is positioned over the first insulator. The second insulator is in contact with part of a top surface of the first oxide, part of a side surface of the first oxide, and part of a side surface of the second oxide. The third insulator is positioned over the second insulator. In addition, part of the second oxide and part of the first insulator are positioned between a side surface of the conductor and a side surface of the third insulator. The fourth insulator is in contact with a top surface of the second oxide, a top surface of the first insulator, a top surface of the conductor, and a top surface of the third insulator. Furthermore, the first oxide includes a first region, a second region, and a third region positioned between the first region and the second region. The conductor is positioned above the third region to overlap with the third region. The second insulator is in contact with the first region and the second region. The first region and the second region have lower resistance than the third region.

With such a structure, the area occupied by transistors in pixels can be reduced, so that an extremely high-definition image can be displayed. Thus, the display device of one embodiment of the present invention can be suitably used for a display device whose display surface and a user are closer to each other, especially a portable electronic device, a wearable electronic device (a wearable device), an e-book reader, or the like. In addition, the display device of one embodiment of the present invention can be suitably used for a virtual reality (VR) device, an augmented reality (AR) device, or the like. Alternatively, a display device with low power consumption can be provided. Alternatively, a highly reliable display device can be provided.

Structure Example 1

FIG. 1 shows a top view of a display device 700 that is one embodiment of the present invention. The display device 700 includes a first substrate 701 and a second substrate 705 that are attached to each other with a sealant 712. In addition, over the first substrate 701, a pixel portion 702, a source driver circuit portion 704, and a gate driver circuit portion 706 are provided in a region sealed with the first substrate 701, the second substrate 705, and the sealant 712. Furthermore, a plurality of display elements are provided in the pixel portion 702.

In addition, a portion of the first substrate 701 that does not overlap with the second substrate 705 is provided with an FPC terminal portion 708 to which an FPC 716 (FPC: Flexible printed circuit) is connected. The pixel portion 702, the source driver circuit portion 704, and the gate driver circuit portion 706 are supplied with a variety of signals and the like from the FPC 716 through the FPC terminal portion 708 and a signal line 710.

A plurality of gate driver circuit portions 706 may be provided. In addition, each of the gate driver circuit portion 706 and the source driver circuit portion 704 may be formed separately over a semiconductor substrate or the like and may be in the form of a packaged IC chip. The IC chip can be mounted over the first substrate 701 or on the FPC 716.

Examples of the display element provided in the pixel portion 702 include a liquid crystal element and a light-emitting element. As the liquid crystal element, a transmissive liquid crystal element, a reflective liquid crystal element, a transflective liquid crystal element, or the like can be used. In addition, examples of the light-emitting element include self-luminous elements such as an LED (Light Emitting Diode), an OLED (Organic Light Emitting Diode), a QLED (Quantum-dot LED), and a semiconductor laser. Moreover, a MEMS (Micro Electro Mechanical Systems) shutter element, an optical interference type MEMS element, or a display element using a microcapsule method, an electrophoretic method, an electrowetting method, an Electronic Liquid Powder (registered trademark) method, or the like can also be used, for example.

Figure 2:
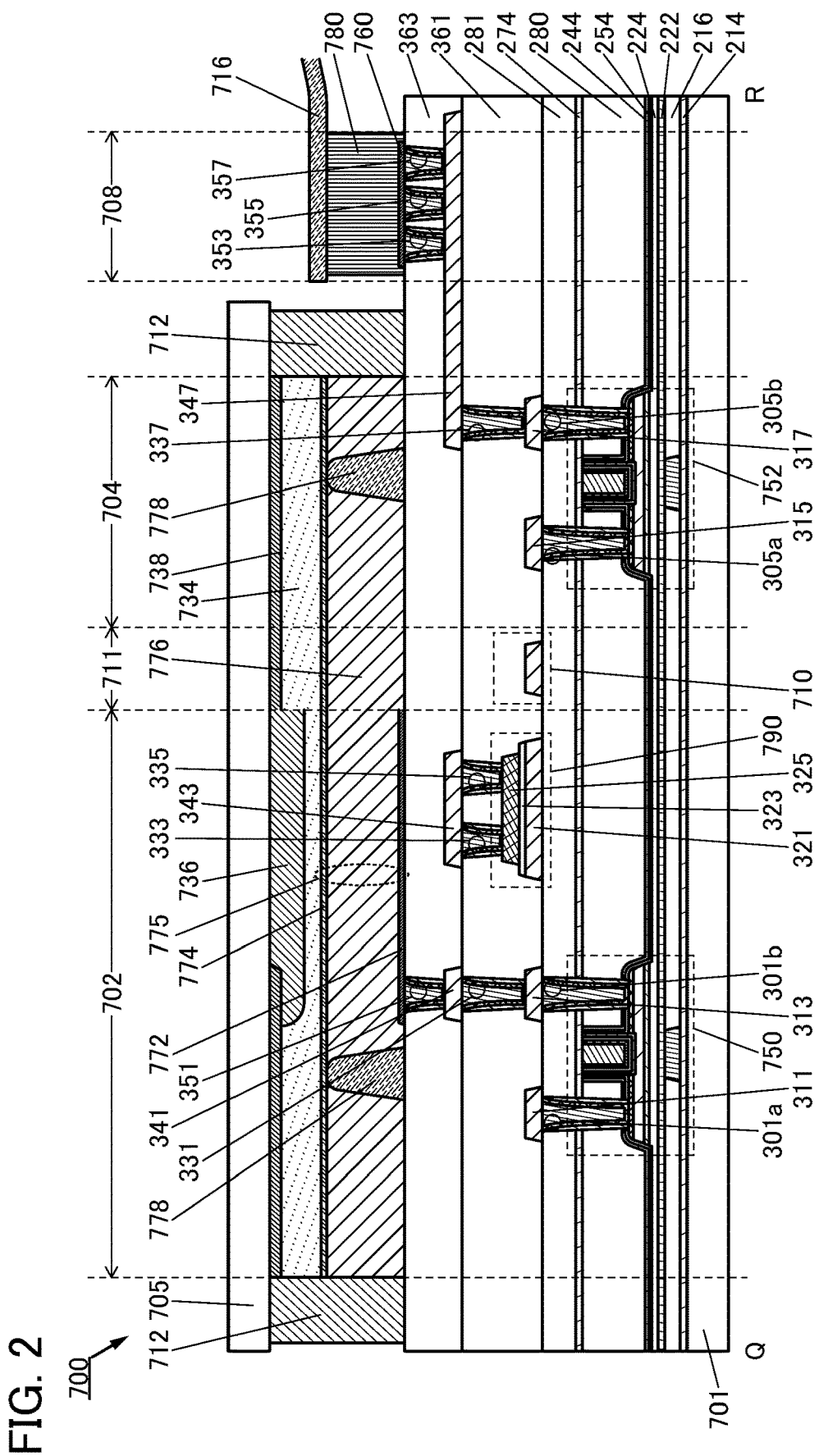
FIG. 2 A cross-sectional view of the display device.
Figure 3:
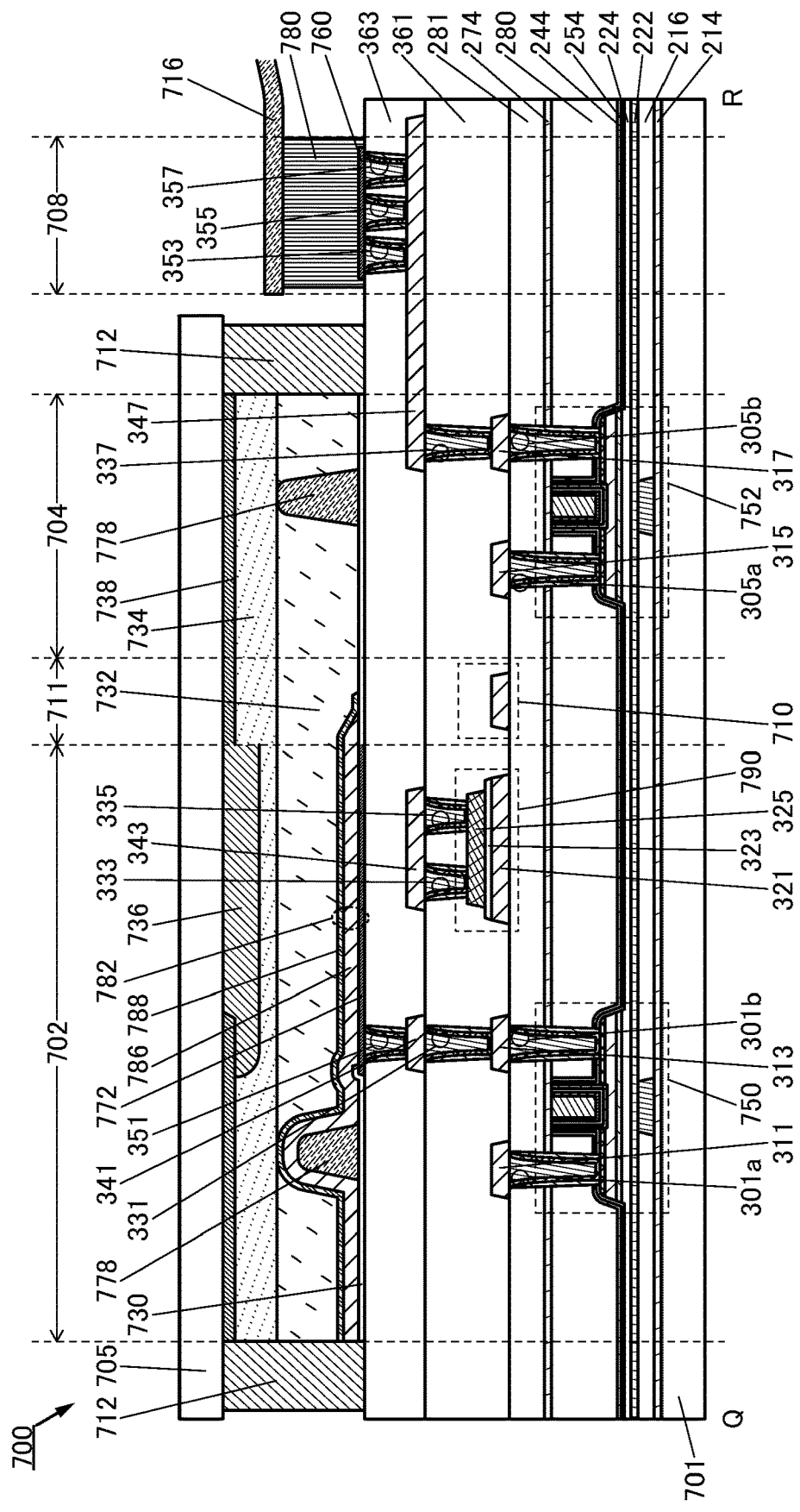
FIG. 3 A cross-sectional view of the display device.

Structures using a liquid crystal element and an EL (Electro Luminescence) element as display elements are described with reference to FIG. 2 and FIG. 3. Note that FIG. 2 and FIG. 3 are cross-sectional views taken along a dashed-dotted line Q-R in FIG. 1. FIG. 2 illustrates a structure using a liquid crystal element as a display element, and FIG. 3 illustrates a structure using a light-emitting element.

<Description of Common Portions in Display Devices>

The display device illustrated in FIG. 2 and FIG. 3 includes a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752. FIG. 2 and FIG. 3 illustrate cross sections of the transistor 750 and the transistor 752 in a channel length direction.

As illustrated in FIG. 2 and FIG. 3, an insulator 280, an insulator 274, and an insulator 281 are provided over the transistor 750. A conductor 301a, a conductor 301b, a conductor 305a, and a conductor 305b are embedded in the insulator 280, the insulator 274, and the insulator 281. The conductor 301a is electrically connected to one of a source and a drain of the transistor 750, and the conductor 301b is electrically connected to the other of the source and the drain of the transistor 750. The conductor 305a is electrically connected to one of a source and a drain of the transistor 752, and the conductor 305b is electrically connected to the other of the source and the drain of the transistor 752. Here, top surfaces of the conductor 301a, the conductor 301b, the conductor 305a, and the conductor 305b and a top surface of the insulator 281 can be substantially level with each other.

An insulator 361 is provided over the conductor 301a, the conductor 301b, the conductor 305a, the conductor 305b, and the insulator 281. A conductor 311, a conductor 313, a conductor 331, the capacitor 790, a conductor 333, a conductor 335, the signal line 710, a conductor 315, a conductor 317, and a conductor 337 are embedded in the insulator 361. The conductor 311 is electrically connected to the conductor 301a. The conductor 331 is electrically connected to the conductor 301b through the conductor 313. The conductor 311 and the conductor 313 are electrically connected to the transistor 750 and have functions of wirings. The conductor 333 and the conductor 335 are electrically connected to the capacitor 790. The conductor 315 is electrically connected to the conductor 305a. The conductor 337 is electrically connected to the conductor 305b through the conductor 317. The conductor 315 and the conductor 317 are electrically connected to the transistor 752 and have functions of wirings. Here, top surfaces of the conductor 331, the conductor 333, the conductor 335, and the conductor 337 and a top surface of the insulator 361 can be substantially level with each other.

An insulator 363 is provided over the conductor 331, the conductor 333, the conductor 335, the conductor 337, and the insulator 361. A conductor 341, a conductor 343, a conductor 347, a conductor 353, a conductor 355, and a conductor 357 are embedded in the insulator 363. The conductor 351 is electrically connected to the conductor 331 through the conductor 341. The conductor 353, the conductor 355, and the conductor 357 are electrically connected to the conductor 337 through the conductor 347. Here, top surfaces of the conductor 351, the conductor 353, the conductor 355, and the conductor 357 and a top surface of the insulator 363 can be substantially level with each other.

An insulator 214, an insulator 216, an insulator 222, an insulator 224, an insulator 254, an insulator 244, the insulator 280, the insulator 274, the insulator 281, the insulator 361, and the insulator 363 function as interlayer films and may each function as a planarization film that covers an uneven shape therebelow. For example, the top surface of the insulator 363 may be planarized by planarization treatment using a chemical mechanical polishing (CMP) method or the like to increase planarity.

A conductive layer 772 is provided over the conductor 351 and the insulator 363. The conductive layer 772 is electrically connected to the transistor 750 through the conductor 301b, the conductor 313, the conductor 331, the conductor 341, and the conductor 351. The conductive layer 772 has a function of a pixel electrode of a display element. Here, the top surface of the conductor 351 and the top surface of the insulator 363 can be substantially level with each other, and the top surface of the insulator 363 is formed to have high planarity. Thus, the conductive layer 772 formed over the conductor 351 and the insulator 363 is formed to have high planarity. Since the planarity of the conductive layer 772 is high, light emitted from the display element can be efficiently extracted, so that the display device can have high luminance. Furthermore, the display device can have low power consumption.

A connection electrode 760 is provided over the conductor 353, the conductor 355, the conductor 357, and the insulator 363. The connection electrode 760 is electrically connected to the transistor 752 through the conductor 353, the conductor 355, the conductor 357, and the like. Note that although FIG. 2 and FIG. 3 each illustrate three conductors of the conductor 353, the conductor 355, and the conductor 357 as conductors that function as plugs between the connection electrode 760 and the conductor 353, one embodiment of the present invention is not limited thereto. The number of conductors functioning as plugs may be one or may be two. Alternatively, the number of conductors functioning as plugs may be four or more. Providing a plurality of conductors functioning as plugs can reduce contact resistance.

The FPC terminal portion 708 includes the connection electrode 760, an anisotropic conductive film 780, and the FPC 716. The connection electrode 760 is electrically connected to a terminal of the FPC 716 through the anisotropic conductive film 780.

In each of the transistors used in this embodiment, a metal oxide functioning as an oxide semiconductor (hereinafter also referred to as an oxide semiconductor) can be used in a channel formation region. The transistors each include an oxide semiconductor film that is highly purified and in which formation of oxygen vacancies is suppressed. The transistors can each have low off-state current. Accordingly, the holding time of an electrical signal such as an image signal can be made longer, and an interval between writings can also be set longer in a power on state. Therefore, the frequency of refresh operations can be reduced, resulting in an effect of reducing power consumption.

In addition, the transistors used in this embodiment can each have comparatively high field-effect mobility and thus is capable of high-speed operation. For example, with the use of such transistors capable of high-speed operation for a display device, a switching transistor in a pixel portion and a driver transistor used in a driver circuit portion can be formed over the same substrate. That is, a structure can be employed in which a driver circuit formed using a silicon wafer or the like is not used, which enables a reduction in the number of components of the display device. Moreover, the use of the transistors capable of high-speed operation also in the pixel portion can provide a high-quality image.

Details of the transistor 750 and the transistor 752 are described later.

Note that as the transistor 750 included in the pixel portion 702 and the transistor 752 included in the source driver circuit portion 704, transistors having different structures may be used. For example, a structure may be employed in which a top-gate transistor is applied to either one of the transistors and a bottom-gate transistor is applied to the other. Note that the gate driver circuit portion 706 is also similar to the source driver circuit portion 704.

As illustrated in FIG. 2 and FIG. 3, the capacitor 790 includes a lower electrode 321 and an upper electrode 325. In addition, an insulator 323 is provided between the lower electrode 321 and the upper electrode 325. That is, the capacitor 790 has a stacked-layer structure in which the insulator 323 functioning as a dielectric film is interposed between a pair of electrodes. Note that although examples in which the capacitor 790 is provided over an insulator 381 are illustrated in FIG. 2 and FIG. 3, one embodiment of the present invention is not limited thereto. The capacitor 790 may be provided over an insulator other than the insulator 381.

The insulator 361 is provided over the capacitor 790. The conductor 333 and the conductor 335 are embedded in the insulator 361. The conductor 333 and the conductor 335 are electrically connected to the capacitor 790. Here, the top surfaces of the conductor 333 and the conductor 335 and the top surface of the insulator 361 can be substantially level with each other.

The insulator 363 is provided over the conductor 333, the conductor 335, and the insulator 361. The conductor 343 is embedded in the insulator 363. The conductor 343 is electrically connected to the capacitor 790 through the conductor 333 and the conductor 335 and has a function of a wiring. In addition, the insulator 363 is provided over the conductor 343. Note that although FIG. 2 and FIG. 3 each illustrate two conductors of the conductor 333 and the conductor 335 as conductors that function as plugs, one embodiment of the present invention is not limited thereto. The number of conductors functioning as plugs may be one or may be three or more. Providing a plurality of conductors functioning as plugs can reduce contact resistance.

An example of a method for manufacturing the capacitor 790 is described. First, a conductive film to be the lower electrode 321, an insulating film to be the insulator 323, and a conductive film to be the upper electrode 325 are formed over the insulator 381. Next, the upper electrode 325 is formed. Then, the insulator 323 and the lower electrode 321 are formed, so that the capacitor 790 can be manufactured. Alternatively, the upper electrode 325 may be formed, the insulator 323 may be formed, and then the lower electrode 321 may be formed. Alternatively, the upper electrode 325 and the insulator 323 may be formed, and then the lower electrode 321 may be formed.

A low-resistance material such as a material containing a copper element is preferably used for the signal line 710 because signal delay or the like due to wiring resistance can be reduced and display on a large screen is possible.

Note that FIG. 2 and FIG. 3 illustrate examples in which the conductor 301a, the conductor 301b, the conductor 305a, and the conductor 305b are formed in the same layer and include the same kind of material. FIG. 2 and FIG. 3 also illustrate examples in which the conductor 311, the conductor 313, the lower electrode 321, the signal line 710, the conductor 315, and the conductor 317 are formed in the same layer and include the same kind of material. FIG. 2 and FIG. 3 also illustrate examples in which the conductor 331, the conductor 333, the conductor 335, and the conductor 337 are formed in the same layer and include the same kind of material. FIG. 2 and FIG. 3 also illustrate examples in which the conductor 341, the conductor 343, and the conductor 347 are formed in the same layer and include the same kind of material. FIG. 2 and FIG. 3 also illustrate examples in which the conductor 351, the conductor 353, the conductor 355, and the conductor 357 are formed in the same layer and include the same kind of material. FIG. 2 and FIG. 3 also illustrate examples in which the conductive layer 772 and the connection electrode 760 are formed in the same layer and include the same kind of material. With such a structure, processes can be simplified. Note that these components may be formed in different layers. Furthermore, these components may include different kinds of materials.

As each of the first substrate 701 and the second substrate 705, an insulator substrate, a semiconductor substrate, or a conductor substrate is used, for example. Examples of the insulator substrate include a glass substrate, a quartz substrate, a sapphire substrate, a stabilized zirconia substrate (an yttria-stabilized zirconia substrate or the like), and a resin substrate. In addition, examples of the semiconductor substrate include a semiconductor substrate of silicon, germanium, or the like and a compound semiconductor substrate containing silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

As each of the first substrate 701 and the second substrate 705, a flexible substrate such as a plastic substrate can be used, for example. In the case where a flexible substrate is used as the first substrate 701, an insulating layer having a barrier property against water or hydrogen is preferably provided between the first substrate 701 and the transistor 750 and the like.

A structure body 778 is provided between the first substrate 701 and the second substrate 705. The structure body 778 is a columnar spacer and is provided to control the distance (the cell gap) between the first substrate 701 and the second substrate 705. Note that a spherical spacer may be used as the structure body 778. As illustrated in FIG. 2, the structure body 778 is preferably positioned in the same layer as a layer including a liquid crystal element 775. In addition, as illustrated in FIG. 3, the structure body 778 is preferably positioned above a light-emitting element 782.

It is preferable that the transistor 750 and the transistor 752 each have a region overlapping with the structure body 778, as illustrated in FIG. 2 and FIG. 3. When the transistor 750 and the like have a region overlapping with the structure body 778, it is possible to inhibit unnecessary pressure from being applied to the transistor in the case where pressure is applied to the display device, so that the display device can have high mechanical strength. In addition, inhibiting unnecessary pressure from being applied to the transistor can suppress changes in the electrical characteristics of the transistor, so that the display device can have high reliability.

On a second substrate 705 side, a light-blocking film 738, a coloring film 736, and an insulating film 734 that is in contact with these films are provided. The light-blocking film 738 has a function of blocking light emitted from adjacent regions. Alternatively, the light-blocking film 738 has a function of preventing external light from reaching the transistor 750 or the like. As illustrated in FIG. 2, the light-blocking film 738 is preferably positioned above the liquid crystal element 775. In addition, as illustrated in FIG. 3, the light-blocking film 738 is preferably positioned above the light-emitting element 782.

<Structure Example of Display Device Using Liquid Crystal Element>

The display device 700 illustrated in FIG. 2 includes the liquid crystal element 775. The liquid crystal element 775 includes the conductive layer 772, a conductive layer 774, and a liquid crystal layer 776 provided therebetween. The conductive layer 774 is provided on the second substrate 705 side and has a function of a common electrode. In addition, the conductive layer 772 is electrically connected to a source electrode or a drain electrode of the transistor 750. The conductive layer 772 is formed over the insulator 363 and functions as a pixel electrode.

For the conductive layer 772, a material having a visible-light-transmitting property or a material having a visible-light-reflective property can be used. An oxide material containing indium, zinc, tin, or the like is preferably used as a material having a light-transmitting property, for example. A material containing aluminum, silver, or the like is preferably used as a material having a reflective property, for example.

When a material having a reflective property is used for the conductive layer 772, the display device 700 is a reflective liquid crystal display device. On the other hand, when a material having a light-transmitting property is used for the conductive layer 772, the display device 700 is a transmissive liquid crystal display device. In the case of a reflective liquid crystal display device, a polarizing plate is provided on a viewer side. On the other hand, in the case of a transmissive liquid crystal display device, a pair of polarizing plates are provided such that a liquid crystal element is sandwiched therebetween.

In addition, although not illustrated in FIG. 2, an alignment film in contact with the liquid crystal layer 776 may be provided. Furthermore, an optical member (an optical substrate) such as a polarizing member, a retardation member, or an anti-reflection member and a light source such as a backlight or a side light can be provided as appropriate.

For the liquid crystal layer 776, thermotropic liquid crystal, low-molecular liquid crystal, high-molecular liquid crystal, polymer dispersed liquid crystal (PDLC), polymer network liquid crystal (PNLC), ferroelectric liquid crystal, anti-ferroelectric liquid crystal, or the like can be used. In addition, in the case of employing a horizontal electric field mode, liquid crystal exhibiting a blue phase for which an alignment film is not used may be used.

In addition, as the mode of the liquid crystal element, a TN (Twisted Nematic) mode, a VA (Vertical Alignment) mode, an IPS (In-Plane-Switching) mode, an FFS (Fringe Field Switching) mode, an ASM (Axially Symmetric aligned Micro-cell) mode, an OCB (Optical Compensated Birefringence) mode, an ECB (Electrically Controlled Birefringence) mode, a guest-host mode, or the like can be employed.

In addition, scattering liquid crystal employing polymer dispersed liquid crystal, polymer network liquid crystal, or the like can also be used for the liquid crystal layer 776. In that case, a structure where monochrome display is performed without providing the coloring film 736 may be employed, or a structure where color display is performed using the coloring film 736 may be employed.

In addition, as a method for driving the liquid crystal element, a time-division display method (also referred to as a field-sequential driving method) by which color display is performed by a successive additive color mixing method may be employed. In that case, a structure without the coloring film 736 can be employed. In the case where a time-division display method is used, there are advantages such as an improvement in the aperture ratio of pixels and an increase in definition because it is not necessary to provide subpixels that emit light with respective colors of, for example, R (red), G (green), and B (blue).

<Display Device Using Light-Emitting Element>

The display device 700 illustrated in FIG. 3 includes the light-emitting element 782. The light-emitting element 782 includes the conductive layer 772, an EL layer 786, and a conductive film 788. The EL layer 786 contains an organic compound or an inorganic compound such as a quantum dot.

Examples of materials that can be used for an organic compound include a fluorescent material and a phosphorescent material. In addition, examples of materials that can be used for a quantum dot include a colloidal quantum dot material, an alloyed quantum dot material, a core-shell quantum dot material, and a core quantum dot material.

In the display device 700 illustrated in FIG. 3, an insulating film 730 covering part of the conductive layer 772 is provided over the insulator 363. Here, the light-emitting element 782 is a top-emission light-emitting element including the light-transmitting conductive film 788. Note that the light-emitting element 782 may have a bottom-emission structure in which light is emitted to a conductive layer 772 side or a dual-emission structure in which light is emitted to both the conductive layer 772 and the conductive film 788.

In addition, the coloring film 736 is provided in a position overlapping with the light-emitting element 782, and the light-blocking film 738 is provided in a position overlapping with the insulating film 730, in the lead wiring portion 711, and in the source driver circuit portion 704. Furthermore, the coloring film 736 and the light-blocking film 738 are covered with the insulating film 734. Moreover, a space between the light-emitting element 782 and the insulating film 734 is filled with a sealing film 732. Note that a structure in which the coloring film 736 is not provided may also be employed in the case where the EL layer 786 is formed into an island shape per pixel or a stripe shape per pixel column, i.e., formed by separate coloring.

<Structure Example of Display Device Provided with Input Device>

In addition, an input device may be provided in the display device 700 illustrated in FIG. 2 and FIG. 3. Examples of the input device include a touch sensor.

For example, a variety of types such as a capacitive type, a resistive type, a surface acoustic wave type, an infrared type, an optical type, and a pressure-sensitive type can be used for the sensor. Alternatively, a combination of two or more of these types may be employed.

Note that examples of the structure of a touch panel include what is called an in-cell touch panel in which an input device is formed inside a pair of substrates; what is called an on-cell touch panel in which an input device is formed over the display device 700; and what is called an out-cell touch panel that is attached to the display device 700 to be used.

Structure Example 2

Figure 4:
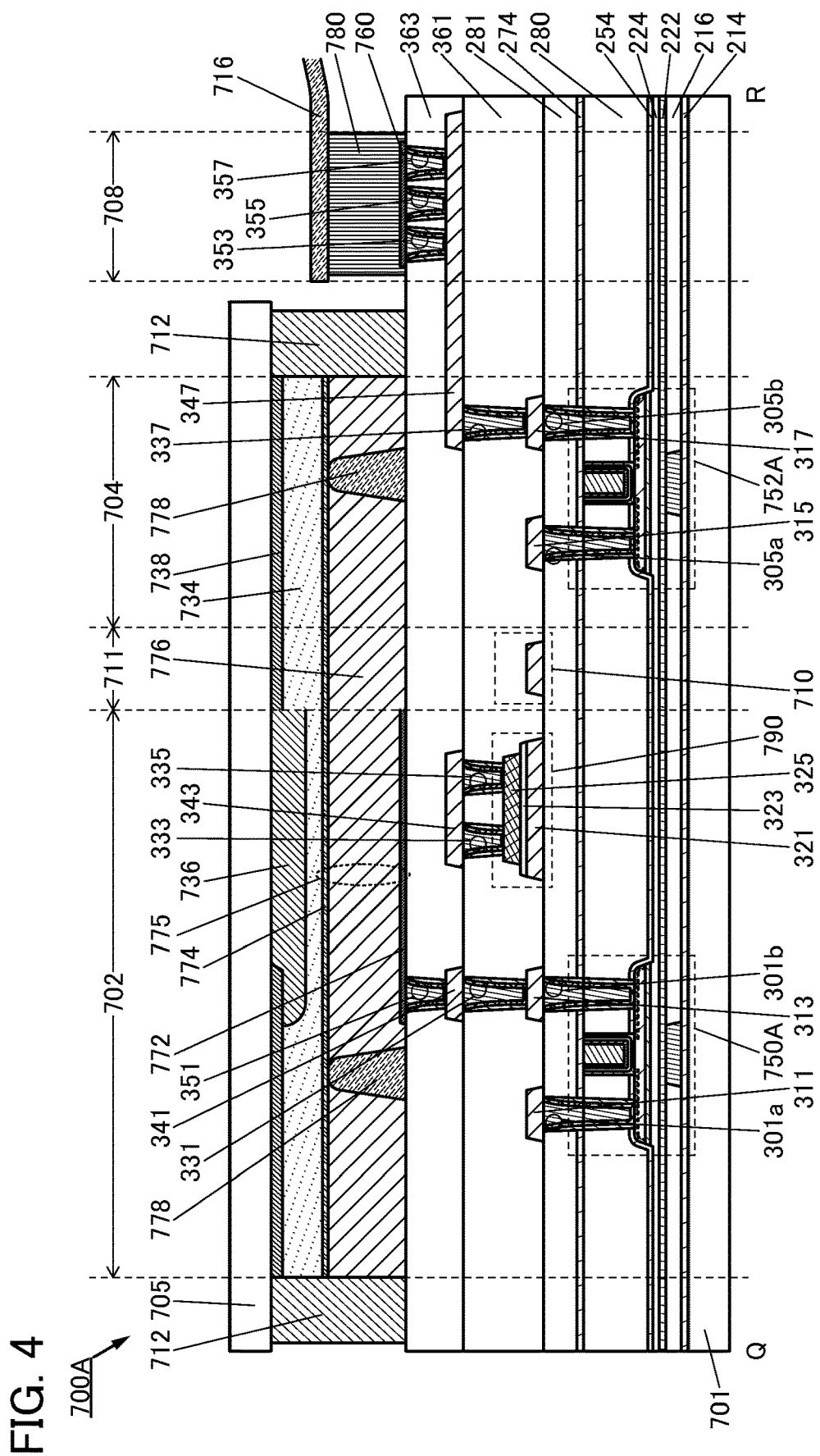
FIG. 4 A cross-sectional view of a display device.
Figure 5:
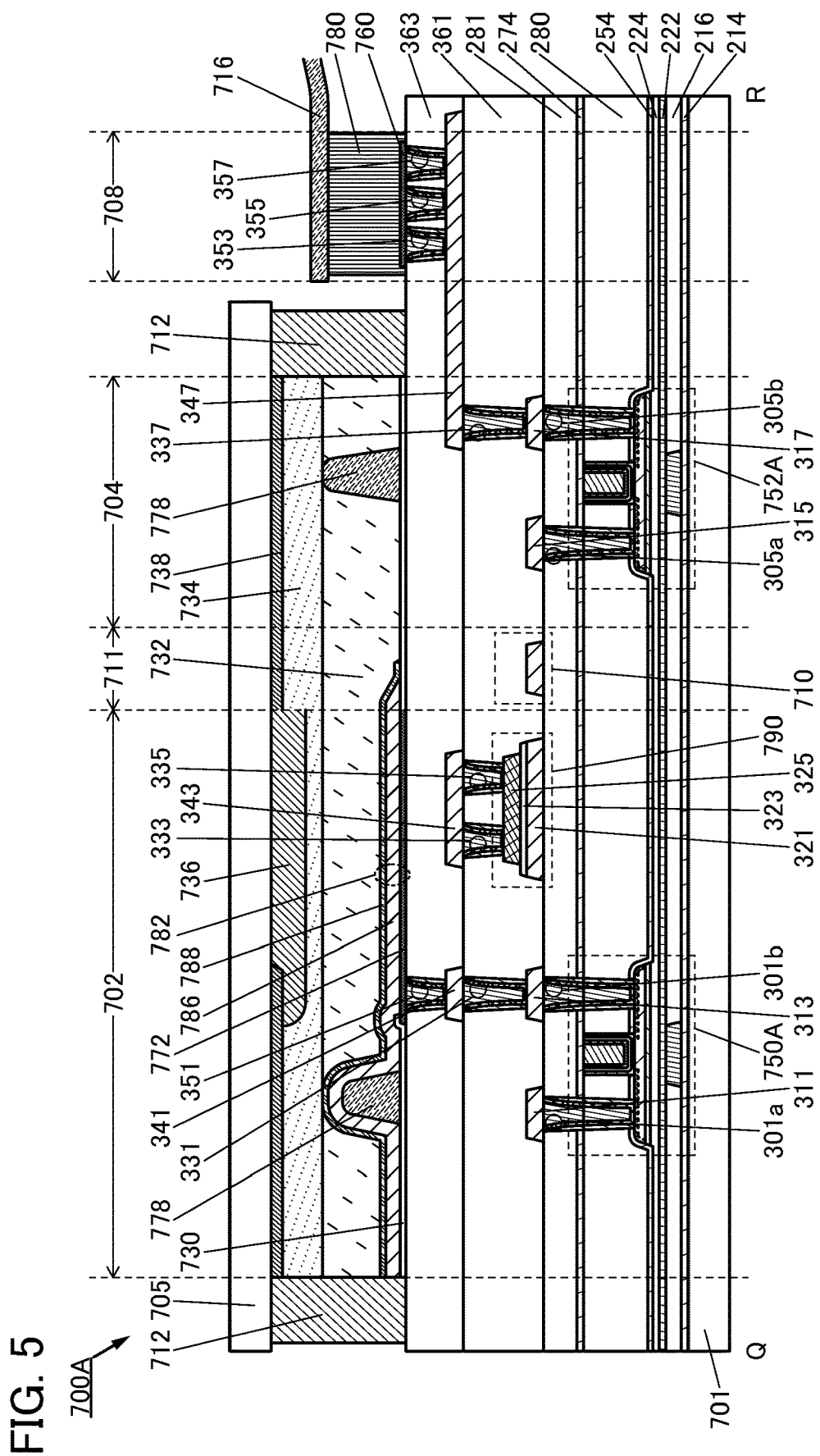
FIG. 5 A cross-sectional view of the display device.

Structures different from those of the display device 700 illustrated in FIG. 2 and FIG. 3 are described with reference to FIG. 4 and FIG. 5. Note that FIG. 4 and FIG. 5 are cross-sectional views taken along the dashed-dotted line Q-R in FIG. 1. FIG. 4 illustrates a structure using a liquid crystal element as a display element, and FIG. 5 illustrates a structure using a light-emitting element.

A display device 700A illustrated in FIG. 4 and FIG. 5 differs from the display device 700 illustrated in FIG. 2 and FIG. 3 in the following respects. The display device 700A includes a transistor 750A instead of the transistor 750 and includes a transistor 754A instead of the transistor 754. The transistor 750 and the transistor 754 differ from the transistor 750A and the transistor 754A in transistor structures. The details of the transistors are described later.

At least part of the structure examples, the drawings corresponding thereto, and the like illustrated in this embodiment can be implemented in combination with the other structure examples, the other drawings, and the like as appropriate.

At least part of this embodiment can be implemented in combination with the other embodiments described in this specification as appropriate.

Embodiment 2

Examples of structures different from those of the display device described in the above embodiment will be described. In the following description, the description of portions overlapping with those in the above embodiment are omitted in some cases. Furthermore, in drawings that are referred to later, the same hatching pattern is applied to portions having functions similar to those in the above embodiment, and the portions are not denoted by reference numerals in some cases.

Figure 6:
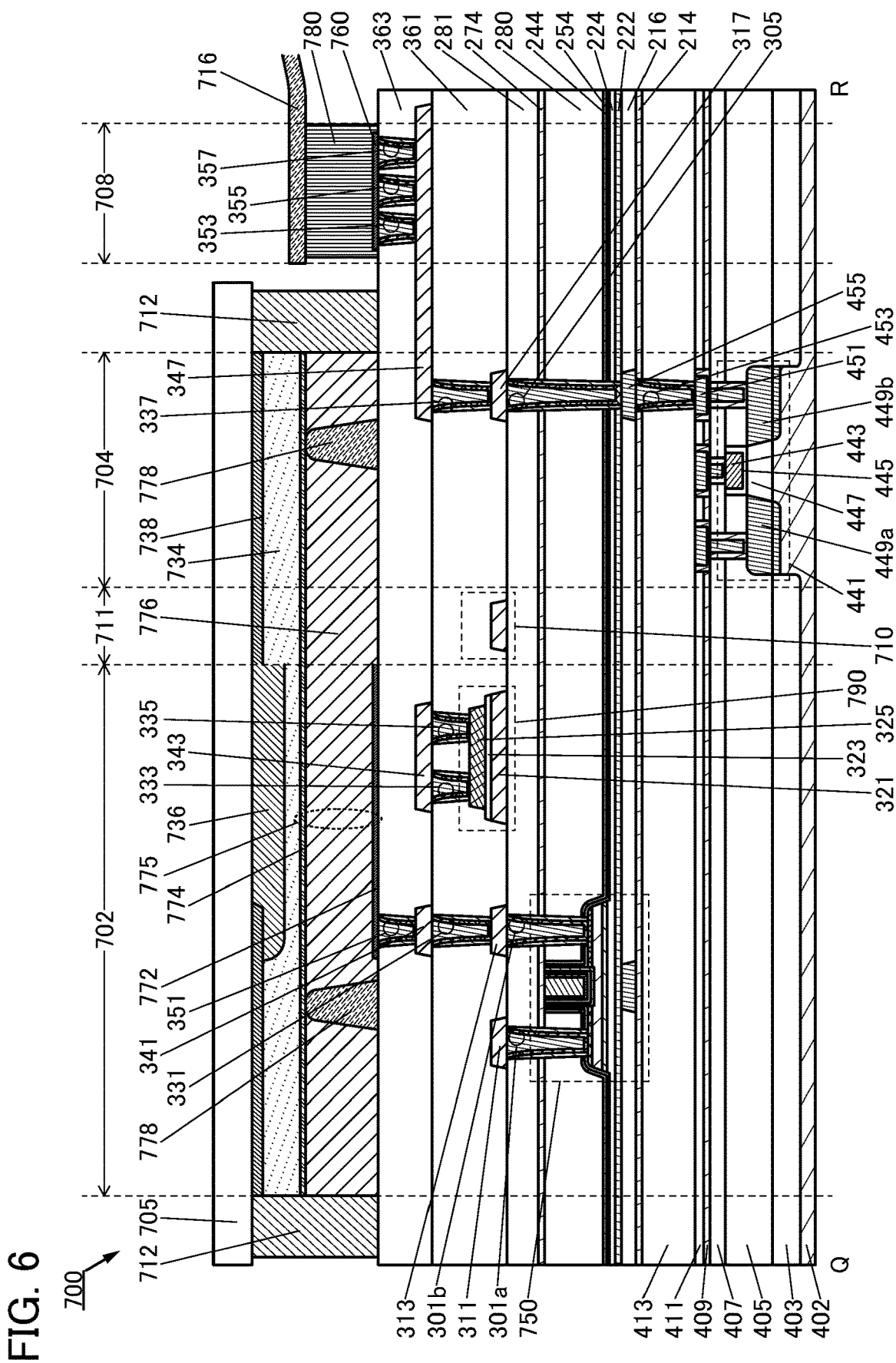
FIG. 6 A cross-sectional view of the display device.
Figure 7:
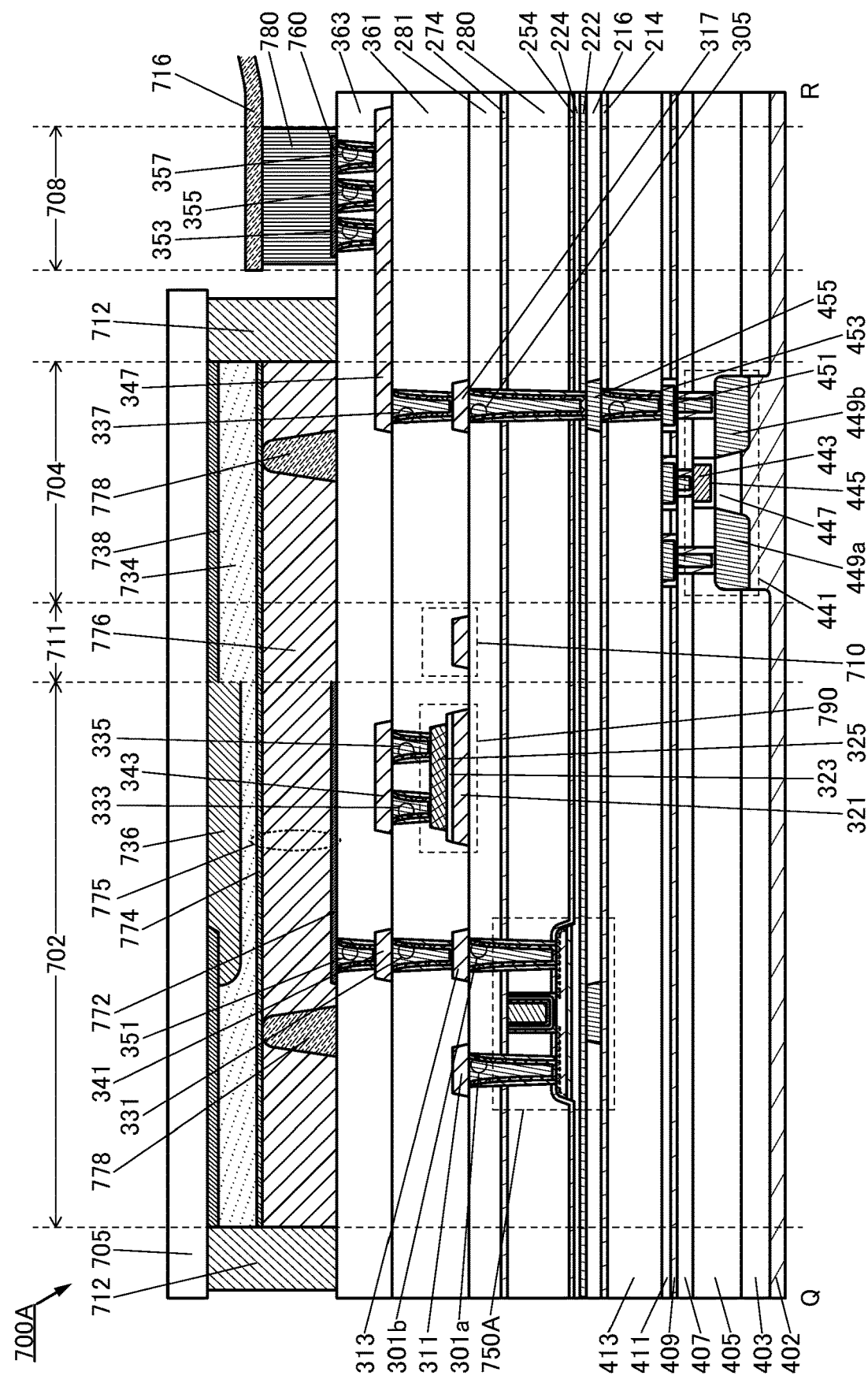
FIG. 7 A cross-sectional view of the display device.

Structures each using a liquid crystal element as a display element are described with reference to FIG. 6 and FIG. 7. Structures each using a light-emitting element as a display element are described with reference to FIG. 8 and FIG. 9. Note that FIG. 6 to FIG. 9 are cross-sectional views taken along the dashed-dotted line Q-R in FIG. 1.

Modification Example 1

Structures each using a liquid crystal element as a display element are described with reference to FIG. 6 and FIG. 7. In the display device 700 illustrated in FIG. 6, the pixel portion 702 includes the transistor 750 and the capacitor 790. The source driver circuit portion 704 includes a transistor 441. The display device 700 illustrated in FIG. 6 differs from the display device illustrated in FIG. 2 in that a transistor included in the pixel portion 702 and a transistor included in the source driver circuit portion 704 are formed in different layers. FIG. 6 illustrates a cross section of the transistor 750 and the transistor 441 in a channel length direction. The above description can be referred to for the transistor 750 and the capacitor 790; thus, the detailed description is omitted.

The transistor 441 is provided on a substrate 402 and includes a conductor 443 functioning as a gate electrode, an insulator 445 functioning as a gate insulator, a semiconductor region 447 formed of part of the substrate 402, and a low-resistance region 449a and a low-resistance region 449b functioning as a source region and a drain region. The transistor 441 is either a p-channel transistor or an n-channel transistor. Note that FIG. 6 illustrates the case where a single crystal semiconductor substrate (for example, a single crystal silicon substrate) is used as the substrate 402. When a source driver circuit is required to operate at high speed, a single crystal semiconductor substrate is preferably used as the substrate 402. The transistor 441 is electrically isolated from other transistors (not illustrated) by an element isolation layer 403. For the formation of the element isolation layer 403, a LOCOS (Local Oxidation of Silicon) method, an STI (Shallow Trench Isolation) method, or the like can be used.

Here, in the transistor 441 illustrated in FIG. 6, the semiconductor region 447 (part of the substrate 402) in which a channel is formed has a convex shape. In addition, the conductor 443 is provided to cover a side surface and a top surface of the semiconductor region 447 with the insulator 445 therebetween. Note that a material adjusting a work function may be used for the conductor 443. Such a transistor 441 is also referred to as a FIN-type transistor because it utilizes a convex portion of a semiconductor substrate. Note that an insulator functioning as a mask for forming the convex portion may be included in contact with an upper portion of the convex portion. Furthermore, although the case where the convex portion is formed by processing part of the semiconductor substrate is described here, a semiconductor film having a convex shape may be formed by processing an SOI substrate.

Note that the transistor 441 illustrated in FIG. 6 is an example and the structure is not limited thereto; a transistor appropriate for a circuit configuration or a driving method is used. For example, the transistor 441 may be a planar transistor. Alternatively, the transistor 441 may be a transistor including a thin film semiconductor layer. When a transistor including a thin film semiconductor layer is used, the transistor can be formed easily even over a large-area substrate such as a large-sized glass substrate. In addition, for the thin film semiconductor layer, polycrystalline silicon, amorphous silicon, microcrystalline silicon, single crystal silicon, an organic semiconductor such as pentacene, an oxide semiconductor, or the like can be used, for example.

An insulator 405, an insulator 407, an insulator 409, and an insulator 411 are provided over the substrate 402, as illustrated in FIG. 6. A conductor 451 is embedded in the insulator 405, the insulator 407, the insulator 409, and the insulator 411. The conductor 451 is electrically connected to one of a source and a drain of the transistor 441. Here, a top surface of the conductor 451 and a top surface of the insulator 411 can be substantially level with each other.

An insulator 413 and the insulator 214 are provided over the conductor 451 and the insulator 411. A conductor 453 is embedded in the insulator 413 and the insulator 214. The conductor 453 is electrically connected to the conductor 451. Here, a top surface of the conductor 453 and a top surface of the insulator 214 can be substantially level with each other.

The insulator 216 is provided over the conductor 453 and the insulator 214. A conductor 455 is embedded in the insulator 216. The conductor 455 is electrically connected to the conductor 453. Here, a top surface of the conductor 455 and a top surface of the insulator 216 can be substantially level with each other.

The insulator 222, the insulator 224, the insulator 254, the insulator 244, the insulator 280, the insulator 274, and the insulator 281 are provided over the conductor 453 and the insulator 216. A conductor 305 is embedded in the insulator 222, the insulator 224, the insulator 254, the insulator 244, the insulator 280, the insulator 274, and the insulator 281. The conductor 305 is electrically connected to the conductor 455. Here, a top surface of the conductor 305 and the top surface of the insulator 281 can be substantially level with each other.

The insulator 361 is provided over the conductor 305 and the insulator 281. The conductor 317 and the conductor 337 are embedded in the insulator 361. The conductor 337 is electrically connected to the conductor 305 through the conductor 317. Here, a top surface of the conductor 337 and the top surface of the insulator 361 can be substantially level with each other.

The insulator 405, the insulator 407, the insulator 409, the insulator 411, and the insulator 413 function as interlayer films and may each function as a planarization film that covers an uneven shape therebelow. For example, the top surface of the insulator 411 may be planarized by planarization treatment using a chemical mechanical polishing (CMP) method or the like to improve planarity. An insulator that can be used as the insulator 216 or the like can be used as each of the insulator 405, the insulator 407, the insulator 409, the insulator 411, and the insulator 413.

Note that FIG. 6 illustrates an example in which the conductor 301a, the conductor 301b, and the conductor 305 are formed in the same layer and include the same kind of material. With such a structure, processes can be simplified. Note that the conductor 301a, the conductor 301b, and the conductor 305 may be formed in different layers. In addition, the conductor 301a, the conductor 301b, and the conductor 305 may include different kinds of materials.

It is preferable that the transistor 750 and the transistor 441 each have a region overlapping with the light-blocking film 738, as illustrated in FIG. 6. When the transistor 750 and the like have a region overlapping with the light-blocking film 738, it is possible to inhibit external light from reaching the transistor 750 and the like. Inhibiting light from reaching the transistor can suppress changes in the electrical characteristics of the transistor, so that the display device can have high reliability.

A structure different from the structure of the display device 700 illustrated in FIG. 6 is described with reference to FIG. 7.

The display device 700A illustrated in FIG. 7 differs from the display device 700 illustrated in FIG. 6 in the following respects. The display device 700A includes the transistor 750A instead of the transistor 750. The transistor 750 differs from the transistor 750A in a transistor structure. The details of the transistors are described later.

Modification Example 2

Figure 8:
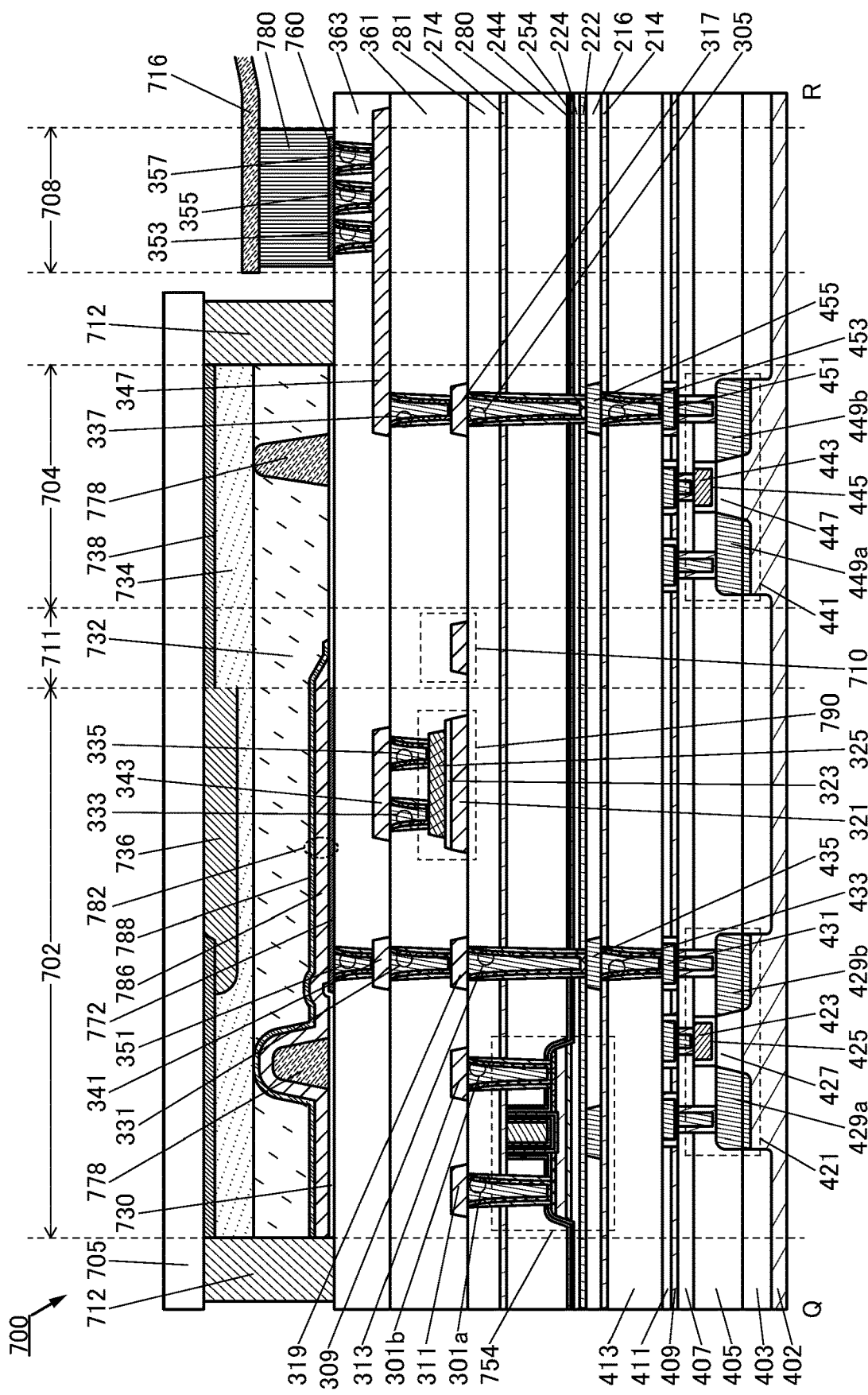
FIG. 8 A cross-sectional view of the display device.
Figure 9:
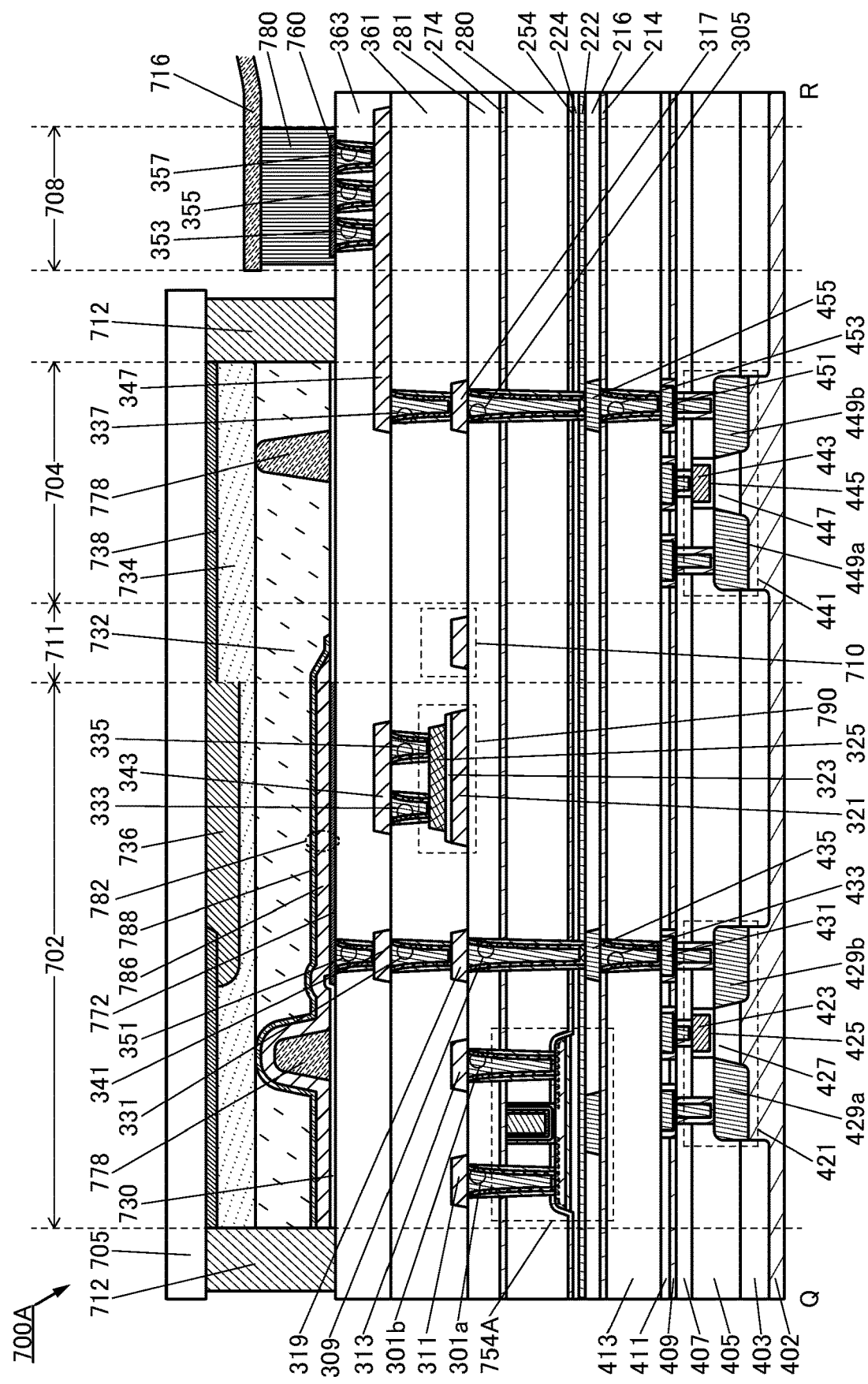
FIG. 9 A cross-sectional view of the display device.

The structures each using a light-emitting element as a display element are described with reference to FIG. 8 and FIG. 9. In a display device illustrated in FIG. 8, the pixel portion 702 includes a transistor 421, the transistor 754, and the capacitor 790. The source driver circuit portion 704 includes the transistor 441. The display device illustrated in FIG. 8 differs from the display device illustrated in FIG. 3 in that a transistor included in the pixel portion 702 and a transistor included in the source driver circuit portion 704 are formed in different layers. FIG. 8 illustrates a cross section of the transistor 421, the transistor 754, and the transistor 441 in a channel length direction. The above description can be referred to for the transistor 441, the transistor 754, and the capacitor 790; thus, the detailed description is omitted.

The transistor 421 is provided on the substrate 402 and includes a conductor 423 functioning as a gate electrode, an insulator 425 functioning as a gate insulator, a semiconductor region 427 formed of part of the substrate 402, and a low-resistance region 429a and a low-resistance region 429b functioning as a source region and a drain region. The transistor 441 is either a p-channel transistor or an n-channel transistor.

Although, here, FIG. 8 illustrates an example of a FIN-type transistor as the transistor 441, one embodiment of the present invention is not limited thereto. The transistor 441 illustrated in FIG. 8 is an example and the structure is not limited thereto; a transistor appropriate for a circuit configuration or a driving method is used. For example, the transistor 441 may be a planar transistor. Alternatively, the transistor 441 may be a transistor including a thin film semiconductor layer.

The insulator 405, the insulator 407, the insulator 409, and the insulator 411 are provided over the substrate 402, as illustrated in FIG. 8. A conductor 431 is embedded in the insulator 405, the insulator 407, the insulator 409, and the insulator 411. The conductor 431 is electrically connected to one of a source and a drain of the transistor 421. Here, a top surface of the conductor 431 and the top surface of the insulator 411 can be substantially level with each other.

The insulator 413 and the insulator 214 are provided over the conductor 451 and the insulator 411. A conductor 433 is embedded in the insulator 413 and the insulator 214. The conductor 433 is electrically connected to the conductor 431. Here, a top surface of the conductor 433 and the top surface of the insulator 214 can be substantially level with each other.

The insulator 216 is provided over the conductor 433 and the insulator 214. A conductor 435 is embedded in the insulator 216. The conductor 435 is electrically connected to the conductor 433. Here, a top surface of the conductor 435 and the top surface of the insulator 216 can be substantially level with each other.

The insulator 222, the insulator 224, the insulator 254, the insulator 244, the insulator 280, the insulator 274, and the insulator 281 are provided over the conductor 433 and the insulator 216. A conductor 309 is embedded in the insulator 222, the insulator 224, the insulator 254, the insulator 244, the insulator 280, the insulator 274, and the insulator 281. The conductor 309 is electrically connected to the conductor 455. Here, a top surface of the conductor 309 and the top surface of the insulator 281 can be substantially level with each other.

The insulator 361 is provided over the conductor 309 and the insulator 281. A conductor 319 and the conductor 331 are embedded in the insulator 361. The conductor 331 is electrically connected to the conductor 313 through the conductor 319. Here, the top surface of the conductor 331 and the top surface of the insulator 361 can be substantially level with each other.

FIG. 8 illustrates an example in which the conductor 431 and the conductor 451 are formed in the same layer and include the same kind of material. FIG. 8 also illustrates an example in which the conductor 433 and the conductor 453 are formed in the same layer and include the same kind of material. FIG. 8 also illustrates an example in which the conductor 435 and the conductor 455 are formed in the same layer and include the same kind of material. FIG. 8 also illustrates an example in which the conductor 301a, the conductor 301b, the conductor 313, and the conductor 305 are formed in the same layer and include the same kind of material. FIG. 8 also illustrates an example in which the conductor 311, the conductor 313, the conductor 319, the lower electrode 321, the signal line 710, and the conductor 317 are formed in the same layer and include the same kind of material. With such a structure, processes can be simplified. Note that these components may be formed in different layers. Furthermore, these components may include different kinds of materials.

As illustrated in FIG. 8, the transistor 754 and the transistor 421 have an overlap region. When the transistor 754 and the transistor 421 have an overlap region, the area occupied by the transistors in a pixel is reduced, so that the pixel can be made small. In addition, a high-definition display device can be provided.

It is preferable that the transistor 754, the transistor 421, and the transistor 441 each have a region overlapping with the light-blocking film 738, as illustrated in FIG. 8. When the transistor 754 and the like have a region overlapping with the light-blocking film 738, it is possible to inhibit external light from reaching the transistor 754 and the like. Inhibiting light from reaching the transistor can suppress changes in the electrical characteristics of the transistor, so that the display device can have high reliability.

A structure different from the structure of the display device 700 illustrated in FIG. 8 is described with reference to FIG. 9.

The display device 700A illustrated in FIG. 9 differs from the display device 700 illustrated in FIG. 8 in the following respects. The display device 700A includes the transistor 754A instead of the transistor 754. The transistor 754 differs from the transistor 754A in a transistor structure. The details of the transistors are described later.

At least part of the structure examples, the drawings corresponding thereto, and the like illustrated in this embodiment can be implemented in combination with the other structure examples, the other drawings, and the like as appropriate.

At least part of this embodiment can be implemented in combination with the other embodiments described in this specification as appropriate.

Embodiment 3

In this embodiment, transistors that can be used in a display device according to one embodiment of the present invention and manufacturing methods thereof will be described.

<Structure Example of Transistor>

Figure 10A:
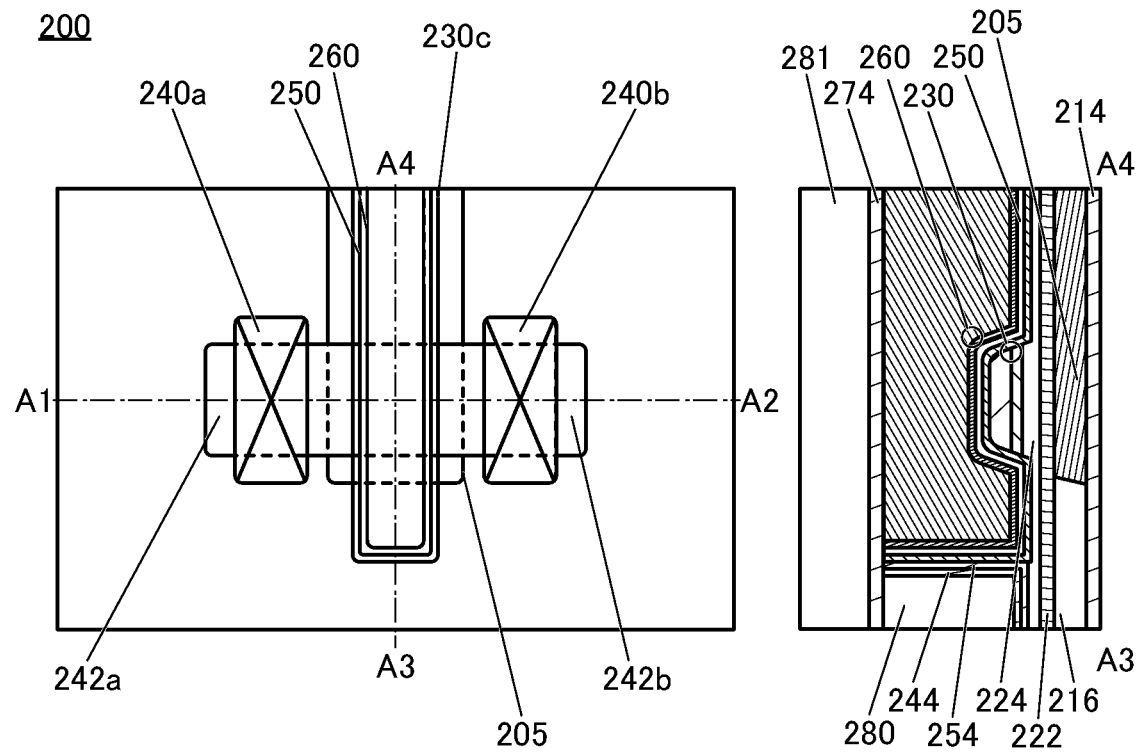
FIG. 10 (A) A top view of a transistor. (B), (C) Cross-sectional views of the transistor.
Figure 10C:
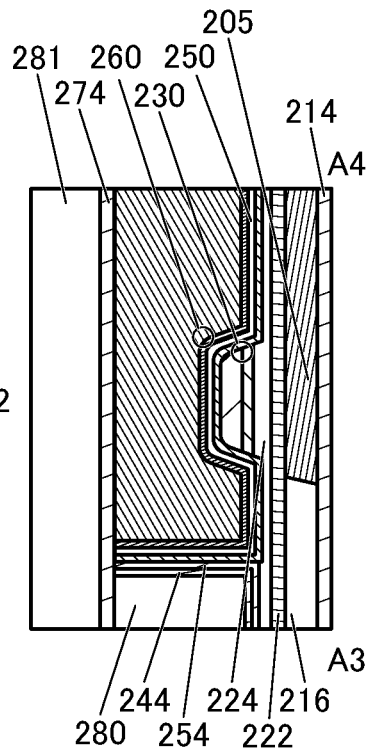
Figure 10B:
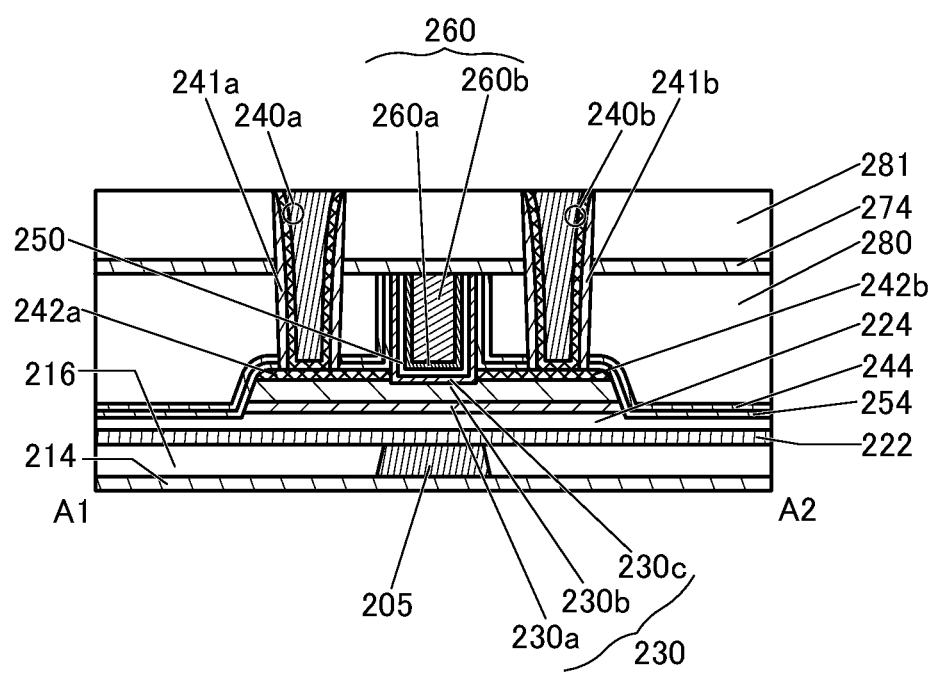

FIG. 10(A), FIG. 10(B), and FIG. 10(C) are a top view and cross-sectional views of a transistor 200 that can be used in a display device according to one embodiment of the present invention and a periphery of the transistor 200. The transistor 200 can be applied to transistors included in the pixel portion 702, the source driver circuit portion 704, and the gate driver circuit portion 706.

FIG. 10(A) is a top view of the transistor 200. In addition, FIG. 10(B) and FIG. 10(C) are cross-sectional views of the transistor 200. Here, FIG. 10(B) is a cross-sectional view of a portion indicated by a dashed-dotted line A1-A2 in FIG. 10(A), and is a cross-sectional view in the channel length direction of the transistor 200. Furthermore, FIG. 10(C) is a cross-sectional view of a portion indicated by a dashed-dotted line A3-A4 in FIG. 10(A), and is a cross-sectional view in the channel width direction of the transistor 200. Note that for clarity of the drawing, some components in the top view in FIG. 10(A) are omitted.

In the examples of the display device 700 illustrated in FIG. 2, FIG. 3, FIG. 6, and FIG. 8, the transistor 200 illustrated in FIG. 10(A), FIG. 10(B), and FIG. 10(C) is applied to the transistor 750, the transistor 752, and the transistor 754.

[Transistor 200]

As illustrated in FIG. 10, the transistor 200 includes an oxide 230a provided over a substrate (not illustrated); an oxide 230b provided over the oxide 230a; a conductor 242a and a conductor 242b positioned over the oxide 230b to be apart from each other; the insulator 280 that is provided over the conductor 242a and the conductor 242b and is provided with an opening formed to overlap with a portion between the conductor 242a and the conductor 242b; a conductor 260 provided in the opening; an insulator 250 provided between the conductor 260, and the oxide 230b, the conductor 242a, the conductor 242b, and the insulator 280; and an oxide 230c provided between the insulator 250, and the oxide 230b, the conductor 242a, the conductor 242b, and the insulator 280.

Here, as illustrated in FIG. 10(B) and FIG. 10(C), a top surface of the conductor 260 is preferably substantially aligned with top surfaces of the insulator 250, the insulator 254, insulator 244, the oxide 230c, and the insulator 280. Note that in the following description, the oxide 230a, the oxide 230b, and the oxide 230c might be collectively referred to as an oxide 230. In addition, the conductor 242a and the conductor 242b might be collectively referred to as a conductor 242.

In the transistor 200 illustrated in FIG. 10, side surfaces of the conductor 242a and the conductor 242b on the conductor 260 side have substantially perpendicular shapes. Note that the transistor 200 illustrated in FIG. 10 is not limited thereto, and an angle formed between the side surfaces and bottom surfaces of the conductor 242a and the conductor 242b may be greater than or equal to 10° and less than or equal to 80°, preferably greater than or equal to 30° and less than or equal to 60°. Alternatively, side surfaces of the conductor 242a and the conductor 242b that face each other may have a plurality of surfaces.

In addition, as illustrated in FIG. 10, the insulator 244 and the insulator 254 are preferably provided between the insulator 280, and the insulator 224, the oxide 230a, the oxide 230b, the conductor 242a, the conductor 242b, and the oxide 230c. Here, as illustrated in FIG. 10(B) and FIG. 10(C), the insulator 254 is preferably in contact with a side surface of the oxide 230c, a top surface and a side surface of the conductor 242a, a top surface and a side surface of the conductor 242b, side surfaces of the oxide 230a and the oxide 230b, and a top surface of the insulator 224. The insulator 254 is further preferably in contact with a side surface of an insulator 241 (an insulator 241a and an insulator 241b). The insulator 244 is preferably provided in contact with a top surface of the insulator 254.

Note that although a structure of the transistor 200 in which three layers of the oxide 230a, the oxide 230b, and the oxide 230c are stacked in a region where a channel is formed (hereinafter also referred to as a channel formation region) and its vicinity is illustrated, the present invention is not limited thereto. For example, a two-layer structure of the oxide 230b and the oxide 230c or a stacked-layer structure of four or more layers may be employed. Furthermore, in the transistor 200, the conductor 260 is shown to have a stacked-layer structure of two layers; however, the present invention is not limited thereto. For example, the conductor 260 may have a single-layer structure or a stacked-layer structure of three or more layers. Alternatively, each of the oxide 230a, the oxide 230b, and the oxide 230c may have a stacked-layer structure of two or more layers.

For example, when the oxide 230c has a stacked-layer structure including a first oxide and a second oxide over the first oxide, it is preferable that the first oxide have a composition similar to that of the oxide 230b and the second oxide have a composition similar to that of the oxide 230a.

Here, the conductor 260 functions as a gate electrode of the transistor, and the conductor 242a and the conductor 242b each function as a source electrode or a drain electrode. As described above, the conductor 260 is formed to be embedded in the opening of the insulator 280 and a region between the conductor 242a and the conductor 242b. Here, the positions of the conductor 260, the conductor 242a, and the conductor 242b with respect to the opening of the insulator 280 are selected in a self-aligned manner. That is, in the transistor 200, the gate electrode can be provided between the source electrode and the drain electrode in a self-aligned manner. Therefore, the conductor 260 can be formed without an alignment margin, resulting in a reduction in the area occupied by the transistor 200. Accordingly, a high-definition display device can be provided. In addition, a display device with a narrow frame can be provided.

In addition, as illustrated in FIG. 10, the conductor 260 preferably includes a conductor 260a provided in the insulator 250 and a conductor 260b provided to be embedded in the conductor 260a.

In addition, it is preferable that the transistor 200 include an insulator 214 provided over the substrate (not illustrated); the insulator 216 provided over the insulator 214; a conductor 205 provided to be embedded in the insulator 216; the insulator 222 provided over the insulator 216 and the conductor 205; and the insulator 224 provided over the insulator 222. The oxide 230a is preferably provided over the insulator 224.

In addition, the insulator 274 and the insulator 281 functioning as interlayer films are preferably provided over the transistor 200. Here, the insulator 274 is preferably provided in contact with the top surfaces of the conductor 260, the insulator 250, the insulator 254, the insulator 244, the oxide 230c, and the insulator 280.

It is preferable that the insulator 222, the insulator 254, the insulator 244, and the insulator 274 have a function of inhibiting diffusion of hydrogen (e.g., at least one of a hydrogen atom, a hydrogen molecule, and the like). For example, the insulator 222, the insulator 254, the insulator 244, and the insulator 274 preferably have lower hydrogen permeability than the insulator 224, the insulator 250, and the insulator 280. In addition, it is preferable that the insulator 222, the insulator 254, the insulator 244, and the insulator 274 have a function of inhibiting diffusion of oxygen (e.g., at least one of an oxygen atom, an oxygen molecule, and the like). For example, the insulator 222, the insulator 254, the insulator 244, and the insulator 274 preferably have lower oxygen permeability than the insulator 224, the insulator 250, and the insulator 280.

Here, the insulator 224, the oxide 230, and the insulator 250 are apart from the insulator 280 and the insulator 281 with the insulator 254, the insulator 244, and the insulator 274. Thus, the mixing of impurities such as hydrogen contained in the insulator 280 and the insulator 281 and excess oxygen into the insulator 224, the oxide 230a, the oxide 230b, and the insulator 250 can be inhibited.

In addition, a conductor 240 (a conductor 240a and a conductor 240b) that is electrically connected to the transistor 200 and functions as a plug is preferably provided. Note that the insulator 241 (the insulator 241a and the insulator 241b) is provided in contact with a side surface of the conductor 240 functioning as a plug. In other words, the insulator 241 is provided in contact with an inner wall of an opening in the insulator 254, the insulator 244, the insulator 280, the insulator 274, and the insulator 281. Alternatively, a structure may be employed in which a first conductor of the conductor 240 is provided in contact with a side surface of the insulator 241 and a second conductor of the conductor 240 is provided on the inner side of the first conductor. Here, a top surface of the conductor 240 and the top surface of the insulator 281 can be substantially level with each other. Note that although the transistor 200 having a structure in which the first conductor of the conductor 240 and the second conductor of the conductor 240 are stacked is illustrated, the present invention is not limited thereto. For example, the conductor 240 may be provided as a single layer or to have a stacked-layer structure of three or more layers. When a structure body has a stacked-layer structure, layers might be distinguished by ordinal numbers corresponding to the formation order.

In addition, in the transistor 200, as the oxide 230 (the oxide 230a, the oxide 230b, and the oxide 230c) that includes the channel formation region, a metal oxide functioning as an oxide semiconductor (hereinafter also referred to as an oxide semiconductor) is preferably used. For example, it is preferable to use a metal oxide having a bandgap more than or equal to 2 eV, preferably more than or equal to 2.5 eV as the metal oxide to be the channel formation region of the oxide 230. The transistor 200 using an oxide semiconductor having a large bandgap in the channel formation region exhibits extremely low leakage current in a non-conduction state (off-state current); thus, a display device with low power consumption can be provided.

For example, as the oxide 230, a metal oxide such as an In-M-Zn oxide (the element M is one kind or a plurality of kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used for the element M. Furthermore, indium oxide, zinc oxide, an In—Ga oxide, an In—Zn oxide, a Ga—Zn oxide, or gallium oxide may be used as the oxide 230.

In addition, as illustrated in FIG. 10(B), the oxide 230b in a region that does not overlap with the conductor 242 sometimes has smaller thickness than the oxide 230b in a region overlapping with the conductor 242. The thin region in the oxide 230b is formed when part of a top surface of the oxide 230b is removed at the time of forming the conductor 242a and the conductor 242b. When a conductive film to be the conductor 242 is deposited, a low-resistance region is sometimes formed on the top surface of the oxide 230b in the vicinity of an interface with the conductive film. Removal of the low-resistance region positioned between the conductor 242a and the conductor 242b on the top surface of the oxide 230b in the above manner can prevent formation of the channel in the region.

According to one embodiment of the present invention, a display device that includes small-sized transistors and has high definition can be provided. Alternatively, a display device that includes a transistor with high on-state current and has high luminance can be provided. Alternatively, a display device that includes a transistor operating at high speed and operates at high speed can be provided. Alternatively, a highly reliable display device that includes a transistor having stable electrical characteristics can be provided. Alternatively, a display device that includes a transistor with low off-state current and has low power consumption can be provided.

The structure of the transistor 200 that can be used in the display device according to one embodiment of the present invention is described in detail.

The conductor 205 is provided to overlap with the oxide 230 and the conductor 260. Furthermore, the conductor 205 is preferably provided to be embedded in the insulator 216. Here, a top surface of the conductor 205 preferably has favorable planarity. For example, the average surface roughness (Ra) of the top surface of the conductor 205 is less than or equal to 1 nm, preferably less than or equal to 0.5 nm, further preferably less than or equal to 0.3 nm. This allows the improvement in favorable planarity of the insulator 224 formed over the conductor 205 and the increase in crystallinity of the oxide 230a, the oxide 230b, and the oxide 230c.

Here, the conductor 260 sometimes functions as a first gate (also referred to as top gate) electrode. Alternatively, the conductor 205 sometimes functions as a second gate (also referred to as bottom gate) electrode. In that case, $V_th$ of the transistor 200 can be controlled by changing a potential applied to the conductor 205 independently of a potential applied to the conductor 260. In particular, $V_th$ of the transistor 200 can be higher than 0 V and the off-state current can be reduced by applying a negative potential to the conductor 205. Thus, drain current when a potential applied to the conductor 260 is 0 V can be lower in the case where a negative potential is applied to the conductor 205 than in the case where the negative potential is not applied to the conductor 205.

In addition, the conductor 205 is preferably provided larger than the channel formation region of the oxide 230. As illustrated in FIG. 10(C), it is particularly preferable that the conductor 205 also extend to a region outside an end portion of the oxide 230 that intersects with the channel width direction. That is, the conductor 205 and the conductor 260 preferably overlap with each other with the insulators therebetween on an outer side of a side surface of the oxide 230 in the channel width direction.

When the above-described structure is included, the channel formation region of the oxide 230 can be electrically surrounded by the electric field of the conductor 260 functioning as the first gate electrode and the electric field of the conductor 205 functioning as the second gate electrode.

Furthermore, as illustrated in FIG. 10(C), the conductor 205 is extended to function as a wiring as well. However, without limitation to this structure, a structure where a conductor functioning as a wiring is provided below the conductor 205 may be employed. In addition, the conductor 205 is not necessarily provided in each transistor. For example, the conductor 205 may be shared by a plurality of transistors.

Moreover, a conductive material containing tungsten, copper, or aluminum as its main component is preferably used for the conductor 205. Note that the conductor 205 is illustrated as a single layer but may have a stacked-layer structure, for example, stacked layers of the above conductive material, and titanium or titanium nitride.

In addition, a conductor having a function of inhibiting diffusion of impurities such as a hydrogen atom, a hydrogen molecule, a water molecule, a nitrogen atom, a nitrogen molecule, a nitrogen oxide molecule ($N_2O$, $NO$, $NO_2$, or the like), and a copper atom (a conductor through which the above impurities are less likely to pass) may be used below the conductor 205. Alternatively, it is preferable to use a conductor having a function of inhibiting diffusion of oxygen (e.g., at least one of an oxygen atom, an oxygen molecule, and the like) (a conductor through which oxygen is less likely to pass). Note that in this specification, a function of inhibiting diffusion of impurities or oxygen means a function of inhibiting diffusion of any one or all of the above impurities and oxygen.

When a conductor having a function of inhibiting oxygen diffusion is used below the conductor 205, the conductivity of the conductor 205 can be inhibited from being lowered because of oxidation. As the conductor having a function of inhibiting oxygen diffusion, for example, tantalum, tantalum nitride, ruthenium, ruthenium oxide, or the like is preferably used. Accordingly, a first conductor of the conductor 205 is a single layer or stacked layers of the above conductive materials.

The insulator 214 preferably functions as a barrier insulating film that inhibits the mixing of impurities such as water or hydrogen into the transistor 200 from the substrate side. Accordingly, for the insulator 214, it is preferable to use an insulating material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom (an insulating material through which the above impurities are less likely to pass). Alternatively, it is preferable to use an insulating material having a function of inhibiting diffusion of oxygen (e.g., at least one of an oxygen atom, an oxygen molecule, and the like) (an insulating material through which oxygen is less likely to pass).

For example, aluminum oxide, silicon nitride, or the like is preferably used for the insulator 214. Accordingly, impurities such as water or hydrogen can be inhibited from being diffused into the transistor 200 side from the substrate side through the insulator 214. Alternatively, oxygen contained in the insulator 224 and the like can be inhibited from being diffused into the substrate side through the insulator 214.

In addition, the permittivity of the insulator 216, the insulator 280, and the insulator 281 each functioning as an interlayer film is preferably lower than that of the insulator 214. When a material with low permittivity is used for an interlayer film, parasitic capacitance generated between wirings can be reduced. For each of the insulator 216, the insulator 280, and the insulator 281, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate, for example.

Furthermore, the insulator 216 may have a stacked-layer structure. For example, the insulator 216 may have a structure in which an insulator similar to the insulator 214 is provided at least in a portion that is in contact with a side surface of the conductor 205. With this structure, oxidation of the conductor 205 due to oxygen contained in the insulator 216 can be inhibited. Alternatively, owing to the conductor 205, absorption of oxygen contained in the insulator 216 can be inhibited.

The insulator 222 and the insulator 224 each have a function of a gate insulator.

Here, it is preferable that oxygen be released from the insulator 224 in contact with the oxide 230 by heating. In this specification, oxygen that is released by heating is referred to as excess oxygen in some cases. For example, for the insulator 224, silicon oxide, silicon oxynitride, or the like is used as appropriate. When an insulator containing oxygen is provided in contact with the oxide 230, oxygen vacancies in the oxide 230 can be reduced and the reliability of the transistor 200 can be improved.

As the insulator 224, specifically, an oxide material from which part of oxygen is released by heating is preferably used. An oxide that releases oxygen by heating is an oxide film in which the amount of released oxygen converted into oxygen atoms is greater than or equal to $1.0 \times 10^{18}$ atoms/$cm^3$, preferably greater than or equal to $1.0 \times 10^{19}$ atoms/$cm^3$, further preferably greater than or equal to $2.0 \times 10^{19}$ atoms/$cm^3$ or greater than or equal to $3.0 \times 10^{20}$ atoms/$cm^3$ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 400° C.

In addition, as illustrated in FIG. 10(C), the insulator 224 in a region overlapping with neither the insulator 254 nor the oxide 230b sometimes has smaller thickness than the insulator 224 in the other regions. In the insulator 224, the region overlapping with neither the insulator 254 nor the oxide 230b preferably has thickness with which released oxygen can be adequately diffused.

Like the insulator 214 and the like, the insulator 222 preferably functions as a barrier insulating film that inhibits the mixing of impurities such as water or hydrogen into the transistor 200 from the substrate side. For example, the insulator 222 preferably has lower hydrogen permeability than the insulator 224. When the insulator 224, the oxide 230, the insulator 250, and the like are surrounded by the insulator 222, the insulator 254, the insulator 244, and the insulator 274, impurities such as water or hydrogen can be inhibited from entering the transistor 200 from the outside.

In addition, it is preferable that the insulator 222 have a function of inhibiting diffusion of oxygen (e.g., at least one of an oxygen atom, an oxygen molecule, and the like) (through which oxygen is less likely to pass). For example, the insulator 222 preferably has lower oxygen permeability than the insulator 224. When the insulator 222 has a function of inhibiting diffusion of oxygen or impurities, oxygen contained in the oxide 230 can be inhibited from being diffused into the substrate side, which is preferable. Furthermore, the conductor 205 can be inhibited from reacting with oxygen contained in the insulator 224 or the oxide 230.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. In the case where the insulator 222 is formed using such a material, the insulator 222 functions as a layer that inhibits release of oxygen from the oxide 230 and the mixing of impurities such as hydrogen from the periphery of the transistor 200 into the oxide 230.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

Alternatively, for example, a single layer or stacked layers of an insulator containing aluminum oxide, hafnium oxide, tantalum oxide, zirconium oxide, lead zirconate titanate (PZT), strontium titanate ($SrTiO_3$), $(Ba,Sr)TiO_3$ (BST), or the like may be used for the insulator 222. As miniaturization and high integration of the transistor progress, a problem such as leakage current may arise because of a thinner gate insulator. When a high-k material is used for an insulator functioning as the gate insulator, a gate potential during operation of the transistor can be reduced while the physical thickness of the gate insulator is maintained.

Note that the insulator 222 and the insulator 224 may each have a stacked-layer structure of two or more layers. In that case, the stacked-layer structure is not limited to a stacked-layer structure formed of the same materials and may be a stacked-layer structure formed of different materials. For example, a structure where an insulator similar to the insulator 224 is provided below the insulator 222 may be employed.

The oxide 230 includes the oxide 230a, the oxide 230b over the oxide 230a, and the oxide 230c over the oxide 230b. Including the oxide 230a below the oxide 230b makes it possible to inhibit diffusion of impurities into the oxide 230b from the components formed below the oxide 230a. Moreover, including the oxide 230c over the oxide 230b makes it possible to inhibit diffusion of impurities into the oxide 230b from the components formed above the oxide 230c.

Note that the oxide 230 preferably has a stacked-layer structure of oxides that differ in the atomic ratio of metal atoms. Specifically, the atomic ratio of the element M to the constituent elements in the metal oxide used as the oxide 230a is preferably higher than the atomic ratio of the element M to the constituent elements in the metal oxide used as the oxide 230b. In addition, the atomic ratio of the element M to In in the metal oxide used as the oxide 230a is preferably higher than the atomic ratio of the element M to In in the metal oxide used as the oxide 230b. Furthermore, the atomic ratio of In to the element M in the metal oxide used as the oxide 230b is preferably higher than the atomic ratio of In to the element M in the metal oxide used as the oxide 230a. Moreover, a metal oxide that can be used as the oxide 230a or the oxide 230b can be used as the oxide 230c.

The oxide 230a, the oxide 230b, and the oxide 230c preferably have crystallinity, and in particular, a CAAC-OS is preferably used. An oxide having crystallinity, such as a CAAC-OS, has a dense structure with small amounts of impurities and defects (oxygen vacancies or the like) and high crystallinity. This can inhibit oxygen extraction from the oxide 230b by the source electrode or the drain electrode. This can reduce oxygen extraction from the oxide 230b even when heat treatment is performed; thus, the transistor 200 is stable with respect to high temperatures in a manufacturing process (what is called thermal budget).

In addition, the energy of the conduction band minimum of each of the oxide 230a and the oxide 230c is preferably higher than the energy of the conduction band minimum of the oxide 230b. In other words, the electron affinity of each of the oxide 230a and the oxide 230c is preferably smaller than the electron affinity of the oxide 230b. In that case, a metal oxide that can be used for the oxide 230a is preferably used for the oxide 230c. Specifically, the atomic ratio of the element M to the constituent elements in the metal oxide used as the oxide 230c is preferably higher than the atomic ratio of the element M to the constituent elements in the metal oxide used as the oxide 230b. In addition, the atomic ratio of the element M to In in the metal oxide used as the oxide 230c is preferably higher than the atomic ratio of the element M to In in the metal oxide used as the oxide 230b. Furthermore, the atomic ratio of In to the element M in the metal oxide used as the oxide 230b is preferably higher than the atomic ratio of In to the element M in the metal oxide used as the oxide 230c.

Here, the energy level of the conduction band minimum gradually changes at junction portions of the oxide 230a, the oxide 230b, and the oxide 230c. In other words, the energy level of the conduction band minimum at the junction portions of the oxide 230a, the oxide 230b, and the oxide 230c continuously changes or is continuously connected. To change the energy level gradually, the densities of defect states in mixed layers formed at an interface between the oxide 230a and the oxide 230b and an interface between the oxide 230b and the oxide 230c are preferably made low.

Specifically, when the oxide 230a and the oxide 230b or the oxide 230b and the oxide 230c contain a common element (as a main component) in addition to oxygen, a mixed layer with a low density of defect states can be formed. For example, in the case where the oxide 230b is an In—Ga—Zn oxide, an In—Ga—Zn oxide, a Ga—Zn oxide, gallium oxide, or the like may be used for the oxide 230a and the oxide 230c. Alternatively, the oxide 230c may have a stacked-layer structure. For example, it is possible to use a stacked-layer structure of an In—Ga—Zn oxide and a Ga—Zn oxide over the In—Ga—Zn oxide, or a stacked-layer structure of an In—Ga—Zn oxide and gallium oxide over the In—Ga—Zn oxide. In other words, a stacked-layer structure of an In—Ga—Zn oxide and an oxide that does not contain In may be used as the oxide 230c.

Specifically, as the oxide 230a, a metal oxide having In:Ga:Zn=1:3:4 [atomic ratio] or 1:1:0.5 [atomic ratio] is used. In addition, as the oxide 230b, a metal oxide having In:Ga:Zn=4:2:3 [atomic ratio] or 3:1:2 [atomic ratio] is used. Furthermore, as the oxide 230c, a metal oxide having In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used. Furthermore, specific examples of the oxide 230c having a stacked-layer structure include a stacked-layer structure of In:Ga:Zn=4:2:3 [atomic ratio] and Ga:Zn=2:1 [atomic ratio], a stacked-layer structure of In:Ga:Zn=4:2:3 [atomic ratio] and Ga:Zn=2:5 [atomic ratio], and a stacked-layer structure of In:Ga:Zn=4:2:3 [atomic ratio] and gallium oxide.

At this time, the oxide 230b serves as a main carrier path. When the oxide 230a and the oxide 230c have the above structures, the densities of defect states at the interface between the oxide 230a and the oxide 230b and the interface between the oxide 230b and the oxide 230c can be made low. Thus, the influence of interface scattering on carrier conduction is small, and the transistor 200 can have high on-state current and high frequency characteristics. Note that in the case where the oxide 230c has a stacked-layer structure, not only an effect of lowering the density of defect state at the interface between the oxide 230b and the oxide 230c but also an effect of inhibiting diffusion of the constituent elements contained in the oxide 230c into an insulator 250 side can be expected. More specifically, the oxide 230c has a stacked-layer structure and an oxide that does not contain In is positioned as an upper layer in the stacked-layer structure, so that In that can be diffused into the insulator 250 side can be inhibited. Since the insulator 250 functions as a gate insulator, the transistor exhibits poor characteristics when In diffuses into the insulator 250. Thus, when the oxide 230c has a stacked-layer structure, a highly reliable display device can be provided.

A metal oxide functioning as an oxide semiconductor is preferably used as the oxide 230. For example, it is preferable to use a metal oxide having a bandgap of more than or equal to 2 eV, preferably more than or equal to 2.5 eV as the metal oxide to be the channel formation region of the oxide 230. With the use of a metal oxide having such a wide bandgap, the off-state current of the transistor can be reduced. With the use of such a transistor, a display device with low power consumption can be provided.

The conductor 242 (the conductor 242a and the conductor 242b) functioning as the source electrode and the drain electrode are provided over the oxide 230b. For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

When the conductor 242 is provided to be in contact with the oxide 230, the oxygen concentration of the oxide 230 in the vicinity of the conductor 242 sometimes decreases. In addition, a metal compound layer that contains the metal contained in the conductor 242 and the component of the oxide 230 is sometimes formed in the oxide 230 in the vicinity of the conductor 242. In such cases, the carrier density of a region in the oxide 230 in the vicinity of the conductor 242 increases, and the region becomes a low-resistance region.

Here, the region between the conductor 242a and the conductor 242b is formed to overlap with the opening of the insulator 280. Accordingly, the conductor 260 can be provided between the conductor 242a and the conductor 242b in a self-aligned manner.

The insulator 250 functions as a gate insulator. The insulator 250 is preferably provided in contact with the top surface of the oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because of their thermal stability.

As in the insulator 224, the concentration of impurities such as water or hydrogen in the insulator 250 is preferably lowered. The thickness of the insulator 250 is preferably greater than or equal to 1 nm and less than or equal to 20 nm.

Furthermore, a metal oxide may be provided between the insulator 250 and the conductor 260. The metal oxide preferably inhibits oxygen diffusion from the insulator 250 to the conductor 260. Accordingly, oxidation of the conductor 260 due to oxygen from the insulator 250 can be inhibited.

In addition, the metal oxide has a function of part of the gate insulator in some cases. Therefore, when silicon oxide, silicon oxynitride, or the like is used for the insulator 250, a metal oxide that is a high-k material with high relative permittivity is preferably used for the metal oxide. When the gate insulator has a stacked-layer structure of the insulator 250 and the metal oxide, the stacked-layer structure can be thermally stable and have high relative permittivity. Thus, a gate potential that is applied during operation of the transistor can be reduced while the physical thickness of the gate insulator is maintained. Furthermore, the equivalent oxide thickness (EOT) of the insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used. It is particularly preferable to use an insulator containing an oxide of one or both of aluminum and hafnium, such as aluminum oxide, hafnium oxide, or an oxide containing aluminum and hafnium (hafnium aluminate).

Although FIG. 10 illustrates the conductor 260 as a conductor having a two-layer structure, the conductor 260 may have a single-layer structure or a stacked-layer structure of three or more layers.

For the conductor 260a, it is preferable to use the above conductor having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like).

In addition, when the conductor 260a has a function of inhibiting oxygen diffusion, the conductivity of the conductor 260b can be inhibited from being lowered because of oxidation due to oxygen contained in the insulator 250. As a conductive material having a function of inhibiting oxygen diffusion, for example, tantalum, tantalum nitride, ruthenium, ruthenium oxide, or the like is preferably used.

In addition, a conductive material containing tungsten, copper, or aluminum as its main component is preferably used for the conductor 260b. Furthermore, the conductor 260 also functions as a wiring, and thus a conductor having high conductivity is preferably used as the conductor 260. For example, a conductive material containing tungsten, copper, or aluminum as its main component can be used. Moreover, the conductor 260b may have a stacked-layer structure; for example, a stacked-layer structure of the above conductive material and titanium or titanium nitride.

In addition, as illustrated in FIG. 10(A) and FIG. 10(C), the oxide 230 is provided such that the side surface of the oxide 230 is covered with the conductor 260 in the region of the oxide 230b that does not overlap with the conductor 242, that is, the channel formation region of the oxide 230. Accordingly, the electric field of the conductor 260 functioning as the first gate electrode is likely to act on the side surface of the oxide 230. Thus, the on-state current of the transistor 200 can be increased and the frequency characteristics of the transistor 200 can be improved.

Like the insulator 214 and the like, the insulator 254 preferably functions as a barrier insulating film that inhibits the mixing of impurities such as water or hydrogen into the transistor 200 from the insulator 280 side. For example, the insulator 254 preferably has lower hydrogen permeability than the insulator 224. Furthermore, as illustrated in FIG. 10(B) and FIG. 10(C), the insulator 254 is preferably in contact with the side surface of the oxide 230c, the top surface and side surface of the conductor 242a, the top surface and side surface of the conductor 242b, the side surface of the oxide 230a, the side surface of the oxide 230b, and the top surface of the insulator 224. Such a structure can inhibit entry of hydrogen contained in the insulator 280 into the oxide 230 through the top surfaces or side surfaces of the conductor 242a, the conductor 242b, the oxide 230a, the oxide 230b, and the insulator 224.

It is also preferable that the insulator 254 have a function of inhibiting diffusion of oxygen (e.g., at least one of an oxygen atom, an oxygen molecule, and the like) (through which oxygen is less likely to pass). For example, the insulator 254 preferably has lower oxygen permeability than the insulator 280 or the insulator 224.

The insulator 254 is preferably deposited by a sputtering method. When the insulator 254 is deposited by a sputtering method in an oxygen-containing atmosphere, oxygen can be added to the vicinity of a region of the insulator 224 that is in contact with the insulator 254. Accordingly, oxygen can be supplied from the region to the oxide 230 through the insulator 224. Here, with the insulator 254 having a function of inhibiting upward oxygen diffusion, oxygen can be prevented from diffusing from the oxide 230 into the insulator 280. Moreover, with the insulator 222 having a function of inhibiting downward oxygen diffusion, oxygen can be prevented from diffusing from the oxide 230 into the substrate side. In this manner, oxygen is supplied to the channel formation region of the oxide 230. Accordingly, oxygen vacancies in the oxide 230 can be reduced, so that the transistor can be inhibited from becoming normally on.

An insulator containing an oxide of one or both of aluminum and hafnium is preferably deposited as the insulator 254, for example. Note that as the insulator containing an oxide of one or both of aluminum and hafnium, aluminum oxide, hafnium oxide, an oxide containing aluminum and hafnium (hafnium aluminate), or the like is preferably used.

Like the insulator 214 and the like, the insulator 244 preferably functions as a barrier insulating film that inhibits the mixing of impurities such as water or hydrogen into the transistor 200 from the insulator 280 side. For example, the insulator 244 preferably has lower hydrogen permeability than the insulator 224. In addition, the insulator 244 is preferably provided to be in contact with the insulator 254, as illustrated in FIG. 10(B) and FIG. 10(C). Such a structure can inhibit entry of hydrogen contained in the insulator 280 into the oxide 230 from the side surfaces of the conductor 260, the oxide 230c, and the insulator 250.

As described above, by covering the insulator 224, the insulator 250, and the oxide 230 with the insulator 254 and the insulator 244 that have barrier properties against hydrogen, the insulator 280 is apart from the insulator 224, the oxide 230, and the insulator 250 with the insulator 254 or the insulator 244. This can inhibit entry of impurities such as hydrogen from the outside of the transistor 200, resulting in favorable electrical characteristics and high reliability of the transistor 200.

In addition, for example, it is preferable that the insulator 244 have a function of inhibiting diffusion of oxygen (e.g., at least one of an oxygen atom, an oxygen molecule, and the like) (through which oxygen is less likely to pass). For example, the insulator 244 preferably has lower oxygen permeability than the insulator 224. When the insulator 244 has a function of inhibiting oxygen diffusion, the conductor 260 can be inhibited from reacting with oxygen contained in the insulator 280.

An insulator containing aluminum nitride is used as the insulator 244, for example. It is preferable to use a nitride insulator that satisfies the composition formula $AlN_x$ (x is a real number greater than 0 and less than or equal to 2, preferably x is a real number greater than 0.5 and less than or equal to 1.5) as the insulator 244. Accordingly, a film having an excellent insulating property and high thermal conductivity can be obtained, and thus dissipation of heat generated in driving the transistor 200 can be increased. Alternatively, aluminum titanium nitride, titanium nitride, or the like can be used for the insulator 244. In that case, deposition by a sputtering method is preferable because deposition can be performed without using a highly-oxidizing gas such as oxygen or ozone as a deposition gas. Alternatively, silicon nitride, silicon nitride oxide, or the like can be used.

In addition, an insulator containing an oxide of one or both of aluminum and hafnium is preferably deposited as the insulator 244, for example. Note that as the insulator containing an oxide of one or both of aluminum and hafnium, aluminum oxide, hafnium oxide, an oxide containing aluminum and hafnium (hafnium aluminate), or the like is preferably used. In that case, the insulator 244 is preferably deposited by an ALD (Atomic Layer Deposition) method. An ALD method is a deposition method that provides good coverage, and thus can prevent formation of disconnection or the like due to unevenness of the insulator 244.

The insulator 280 is provided over the insulator 224, the oxide 230, and the conductor 242 with the insulator 244 and the insulator 254 therebetween. For example, for the insulator 280, silicon oxide, silicon oxynitride, silicon nitride oxide, silicon oxide to which fluorine is added, silicon oxide to which carbon is added, silicon oxide to which carbon and nitrogen are added, porous silicon oxide, or the like is preferably included. In particular, silicon oxide and silicon oxynitride are preferable because of their thermal stability. Materials such as silicon oxide, silicon oxynitride, and porous silicon oxide, in each of which a region containing oxygen released by heating can be easily formed, are particularly preferable.

The concentration of impurities such as water or hydrogen in the insulator 280 is preferably lowered. In addition, the top surface of the insulator 280 may be planarized.

Like the insulator 214 and the like, the insulator 274 preferably functions as a barrier insulating film that inhibits the mixing of impurities such as water or hydrogen into the insulator 280 from the above. An insulator that can be used as the insulator 214, the insulator 254, or the like is used as the insulator 274, for example.

In addition, the insulator 281 functioning as an interlayer film is preferably provided over the insulator 274. As in the insulator 224 and the like, the concentration of impurities such as water or hydrogen in the insulator 281 is preferably lowered.

In addition, the conductor 240a and the conductor 240b are provided in openings formed in the insulator 281, the insulator 274, the insulator 280, and the insulator 244. The conductor 240a and the conductor 240b are provided to face each other with the conductor 260 therebetween. Note that the level of top surfaces of the conductor 240a and the conductor 240b may be on the same plane as the top surface of the insulator 281.

Note that the insulator 241a is provided in contact with the inner wall of the opening in the insulator 281, the insulator 274, the insulator 280, the insulator 244, and the insulator 254, and a first conductor of the conductor 240a is formed in contact with a side surface of the insulator 241a. The conductor 242a is located on at least part of the bottom portion of the opening, and thus the conductor 240a is in contact with the conductor 242a. Similarly, the insulator 241b is provided in contact with the inner wall of the opening in the insulator 281, the insulator 274, the insulator 280, the insulator 244, and the insulator 254, and a first conductor of the conductor 240b is formed in contact with a side surface of the insulator 241b. The conductor 242b is located on at least part of the bottom portion of the opening, and thus the conductor 240b is in contact with the conductor 242b.

For the conductor 240a and the conductor 240b, a conductive material containing tungsten, copper, or aluminum as its main component is preferably used. In addition, the conductor 240a and the conductor 240b may have a stacked-layer structure.

In addition, in the case where the conductor 240 has a stacked-layer structure, the conductor having a function of inhibiting diffusion of impurities such as water or hydrogen is preferably used as a conductor in contact with the oxide 230a, the oxide 230b, the conductor 242, the insulator 244, the insulator 254, the insulator 280, the insulator 274, and the insulator 281. For example, tantalum, tantalum nitride, titanium, titanium nitride, ruthenium, ruthenium oxide, or the like is preferably used. Alternatively, the conductive material having a function of inhibiting diffusion of impurities such as water or hydrogen may be used as a single layer or stacked layers. The use of the conductive material can prevent oxygen added to the insulator 280 from being absorbed by the conductor 240a and the conductor 240b. Moreover, the mixing of impurities such as water or hydrogen into the oxide 230 through the conductor 240a and the conductor 240b from a layer above the insulator 281 can be inhibited.

Insulators that can be used as the insulator 244 and the like are used as the insulator 241a and the insulator 241b, for example. Since the insulator 241a and the insulator 241b are provided in contact with the insulator 254 and the insulator 244, the mixing of impurities such as water or hydrogen into the oxide 230 through the conductor 240a and the conductor 240b from the insulator 280 or the like can be inhibited. In addition, oxygen contained in the insulator 280 can be prevented from being absorbed by the conductor 240a and the conductor 240b.

For formation of the insulator 241a and the insulator 241b, an ALD method or a CVD (Chemical Vapor Deposition) method can be used.

In addition, although not illustrated, a conductor functioning as a wiring may be provided in contact with the top surface of the conductor 240a and the top surface of the conductor 240b. For the conductor functioning as a wiring, a conductive material containing tungsten, copper, or aluminum as its main component is preferably used. Furthermore, the conductor may have a stacked-layer structure; for example, stacked layers of the above conductive material, and titanium or titanium nitride. The conductor may be formed to be embedded in an opening provided in an insulator.

In addition, although not illustrated, an insulator having resistivity higher than or equal to $1.0 \times 10^{13}$ Ωcm and lower than or equal to $1.0 \times 10^{15}$ Ωcm, preferably higher than or equal to $5.0 \times 10^{13}$ Ωcm and lower than or equal to $5.0 \times 10^{14}$ Ωcm is preferably provided to cover the conductor. It is preferable that an insulator having resistivity in the above range be provided over the conductor, in which case the insulator can disperse electric charge accumulated in the transistor 200 or between wirings of the conductor or the like and can inhibit poor characteristics and electrostatic breakdown of the transistor and an electronic device including the transistor due to the electric charge, while maintaining the insulating property.

<Transistor Constituent Material>

Constituent materials that can be used for the transistor are described.

<<Insulator>>

Examples of an insulator include an oxide, a nitride, an oxynitride, a nitride oxide, a metal oxide, a metal oxynitride, and a metal nitride oxide, each of which has an insulating property.

As miniaturization and high integration of the transistor progress, for example, a problem such as leakage current may arise because of a thinner gate insulator. When a high-k material is used for the insulator functioning as the gate insulator, voltage during operation of the transistor can be reduced while the physical thickness of the gate insulator is maintained. In contrast, when a material with low relative permittivity is used for the insulator functioning as an interlayer film, parasitic capacitance generated between wirings can be reduced. Thus, a material is preferably selected depending on the function of an insulator.

In addition, examples of an insulator with high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

In addition, examples of an insulator with low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

In addition, when a transistor using an oxide semiconductor is surrounded by an insulator (the insulator 214, the insulator 222, the insulator 254, the insulator 244, the insulator 274, or the like) having a function of inhibiting the passage of oxygen and impurities such as hydrogen, the electrical characteristics of the transistor can be stable. For the insulator having a function of inhibiting the passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, for the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; or a metal nitride such as aluminum nitride, aluminum titanium nitride, titanium nitride, silicon nitride oxide, or silicon nitride can be used.

In addition, the insulator functioning as the gate insulator is preferably an insulator including a region containing oxygen released by heating. For example, when a structure is employed in which silicon oxide or silicon oxynitride including a region containing oxygen released by heating is in contact with the oxide 230, oxygen vacancies included in the oxide 230 can be compensated for.

<<Conductor>>

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a semiconductor having high electric conductivity, typified by polycrystalline silicon containing an impurity element such as phosphorus, or silicide such as nickel silicide may be used.

In addition, a stack of a plurality of conductive layers formed using the above materials may be used. For example, a stacked-layer structure in which a material containing the above metal element and a conductive material containing oxygen are combined may be used. Alternatively, a stacked-layer structure in which a material containing the above metal element and a conductive material containing nitrogen are combined may be used. Alternatively, a stacked-layer structure in which a material containing the above metal element, a conductive material containing oxygen, and a conductive material containing nitrogen are combined may be used.

Note that when an oxide is used for the channel formation region of the transistor, a stacked-layer structure in which a material containing the above metal element and a conductive material containing oxygen are combined is preferably used for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where the channel is formed. Alternatively, a conductive material containing the above metal element and nitrogen may be used. For example, a conductive material containing nitrogen, such as titanium nitride or tantalum nitride, may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Alternatively, indium gallium zinc oxide containing nitrogen may be used. With the use of such a material, hydrogen contained in the metal oxide where the channel is formed can be trapped in some cases. Alternatively, hydrogen entering from an external insulator or the like can be trapped in some cases.

<<Metal Oxide>>

As the oxide 230, a metal oxide functioning as an oxide semiconductor (hereinafter also referred to as an oxide semiconductor) is preferably used. A metal oxide that can be applied to the oxide 230 according to the present invention is described below.

The oxide semiconductor preferably contains at least indium or zinc. In particular, indium and zinc are preferably contained. In addition to them, aluminum, gallium, yttrium, tin, or the like is preferably contained. Furthermore, one kind or a plurality of kinds selected from boron, silicon, titanium, iron, nickel, germanium, zirconium, molybdenum, lanthanum, cerium, neodymium, hafnium, tantalum, tungsten, magnesium, and the like may be contained.

Here, the case where the oxide semiconductor is an In-M-Zn oxide that contains indium, the element M, and zinc is considered. Note that the element M is aluminum, gallium, yttrium, tin, or the like. Other elements that can be applied to the element M include boron, silicon, titanium, iron, nickel, germanium, zirconium, molybdenum, lanthanum, cerium, neodymium, hafnium, tantalum, tungsten, magnesium, and the like. Note that a plurality of above elements may be combined as the element M in some cases.

Note that in this specification and the like, a metal oxide containing nitrogen is also referred to as a metal oxide in some cases. In addition, a metal oxide containing nitrogen may be referred to as a metal oxynitride.

<Composition of Metal Oxide>

The composition of a CAC (Cloud-Aligned Composite)-OS that can be used for a transistor disclosed in one embodiment of the present invention is described below.

Note that the terms "CAAC (c-axis aligned crystal)" and "CAC (Cloud-Aligned Composite)" might appear in this specification and the like. Note that CAAC refers to an example of a crystal structure, and CAC refers to an example of a function or a material composition.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

Furthermore, the CAC-OS or the CAC-metal oxide includes conductive regions and insulating regions. The conductive regions have the above conducting function, and the insulating regions have the above insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow through the component having a narrow gap. Furthermore, the component having a narrow gap complements the component having a wide gap, and carriers also flow through the component having a wide gap in conjunction with the component having a narrow gap. Therefore, in the case where the CAC-OS or the CAC-metal oxide is used for the channel formation region of the transistor, high current drive capability in an on state of the transistor, that is, high on-state current and high field-effect mobility can be obtained.

In other words, the CAC-OS or the CAC-metal oxide can also be referred to as a matrix composite or a metal matrix composite.

[Structure of Metal Oxide]

Oxide semiconductors are classified into a single crystal oxide semiconductor and a non-single crystal oxide semiconductor. Examples of a non-single crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of lattice arrangement changes between a region with regular lattice arrangement and another region with regular lattice arrangement in a region where the plurality of nanocrystals are connected.

The nanocrystal is basically a hexagon but is not always a regular hexagon and is a non-regular hexagon in some cases. Furthermore, pentagonal lattice arrangement, heptagonal lattice arrangement, and the like are included in the distortion in some cases. Note that a clear crystal grain boundary (also referred to as grain boundary) cannot be observed even in the vicinity of distortion in the CAAC-OS. That is, formation of a crystal grain boundary is inhibited by the distortion of lattice arrangement. This is probably because the CAAC-OS can tolerate distortion owing to the low density of oxygen atom arrangement in the a-b plane direction, a change in interatomic bond distance by replacement of a metal element, and the like.

Furthermore, the CAAC-OS tends to have a layered crystal structure (also referred to as a layered structure) in which a layer containing indium and oxygen (hereinafter referred to as an In layer) and a layer containing the element M, zinc, and oxygen (hereinafter referred to as an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is an oxide semiconductor with high crystallinity. Meanwhile, in the CAAC-OS, it can be said that a reduction in electron mobility due to the crystal grain boundary is less likely to occur because a clear crystal grain boundary cannot be observed. Furthermore, the mixing of impurities, formation of defects, or the like might decrease the crystallinity of the oxide semiconductor; thus, it can also be said that the CAAC-OS is an oxide semiconductor having small amounts of impurities and defects (oxygen vacancies or the like). Thus, an oxide semiconductor including a CAAC-OS is physically stable. Therefore, the oxide semiconductor including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

The a-like OS is an oxide semiconductor that has a structure between those of the nc-OS and the amorphous oxide semiconductor. The a-like OS includes a void or a low-density region. That is, the a-like OS has lower crystallinity than the nc-OS and the CAAC-OS.

An oxide semiconductor has various structures with different properties. Two or more kinds of the amorphous oxide semiconductor, the polycrystalline oxide semiconductor, the a-like OS, the nc-OS, and the CAAC-OS may be included in an oxide semiconductor of one embodiment of the present invention.

[Transistor Including Oxide Semiconductor]

Next, the case where the above oxide semiconductor is used for a transistor is described.

Note that when the above oxide semiconductor is used for a transistor, a transistor with high field-effect mobility can be achieved. In addition, a transistor with high reliability can be achieved.

In addition, an oxide semiconductor with a low carrier density is preferably used for a transistor. In the case where the carrier density of an oxide semiconductor film is lowered, the impurity concentration in the oxide semiconductor film is lowered to decrease the density of defect states. In this specification and the like, a state with a low impurity concentration and a low density of defect states is referred to as a highly purified intrinsic or substantially highly purified intrinsic state. For example, the carrier density of the oxide semiconductor is set lower than $8\times10^{11}/cm^3$, preferably lower than $1\times10^{11}/cm^3$, further preferably lower than $1\times10^{10}/cm^3$, and greater than or equal to $1\times10^{-9}/cm^3$.

In addition, a highly purified intrinsic or substantially highly purified intrinsic oxide semiconductor film has a low density of defect states and thus has a low density of trap states in some cases.

Furthermore, electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Thus, in order to stabilize electrical characteristics of the transistor, reducing the impurity concentration in the oxide semiconductor is effective. Furthermore, in order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

[Impurity]

Here, the influence of each impurity in the oxide semiconductor is described.

When silicon or carbon, which is one of the Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/$cm^3$, preferably lower than or equal to $2\times10^{17}$ atoms/$cm^3$.

Furthermore, when the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Accordingly, it is preferable to reduce the concentration of an alkali metal or an alkaline earth metal in the oxide semiconductor. Specifically, the concentration of an alkali metal or an alkaline earth metal in the oxide semiconductor that is obtained by SIMS is set lower than or equal to $1\times10^{18}$ atoms/$cm^3$, preferably lower than or equal to $2\times10^{16}$ atoms/$cm^3$.

Furthermore, when the oxide semiconductor contains nitrogen, the oxide semiconductor easily becomes n-type by generation of electrons serving as carriers and an increase of carrier density. As a result, a transistor using an oxide semiconductor containing nitrogen as a semiconductor is likely to have normally-on characteristics. For this reason, nitrogen in the oxide semiconductor is preferably reduced as much as possible; the nitrogen concentration in the oxide semiconductor that is obtained by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

In addition, hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor that is obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

[Effect of Vacuum Baking]

Here, a weak Zn—O bond included in a metal oxide is described, and an example of a method for reducing the number of oxygen atoms and zinc atoms that form the bond is described.

In a transistor using a metal oxide, an oxygen vacancy is given as an example of a defect that leads to poor electrical characteristics of the transistor. For example, the threshold voltage of a transistor using a metal oxide including oxygen vacancies in the film tends to shift in the negative direction, and thus the transistor is likely to have normally-on characteristics. This is because a donor caused by oxygen vacancies in the metal oxide is generated and the carrier concentration is increased. The transistor having normally-on characteristics causes various problems where malfunction is likely to occur at the time of operation and power consumption is increased at the time of non-operation, for example.

Furthermore, heat treatment in a step of forming a connection wiring for manufacturing a module causes problems such as degradation of the electrical characteristics of the transistor, such as variations in threshold voltage and an increase in parasitic resistance, and increased variations in electrical characteristics due to the degradation of the electrical characteristics. Since such problems lead directly to a decrease in manufacturing yield, it is important to consider countermeasures. Moreover, the electrical characteristics degrade through a stress test, which can evaluate changes in transistor characteristics due to long-term use (changes over time) in a short time. The degradation of the electrical characteristics is presumably caused by formation of oxygen vacancies in the metal oxide due to high-temperature treatment performed in the manufacturing process or electrical stress applied during the stress test.

In the metal oxide, there is an oxygen atom that has a weak bond to a metal atom and is likely to form an oxygen vacancy. In particular, in the case where the metal oxide is an In—Ga—Zn oxide, a zinc atom and an oxygen atom are likely to form a weak bond (also referred to as a weak Zn—O bond). Here, the weak Zn—O bond means a bond generated between a zinc atom and an oxygen atom, which is weak enough to be broken by high-temperature treatment performed in the manufacturing process or electrical stress applied during the stress test. When a weak Zn—O bond exists in the metal oxide, the bond is broken by heat treatment or current stress, so that an oxygen vacancy is formed. The formation of an oxygen vacancy decreases the stability of the transistor, such as resistance to the heat treatment and resistance to the stress test.

In the case where a plurality of oxygen atoms are bonded to one zinc atom, a bond between the zinc atom and the oxygen atom (a Zn—O bond) is sometimes weak. A zinc atom is bonded to an oxygen atom more weakly than a gallium atom is. Accordingly, as the number of oxygen atoms bonded to one zinc atom becomes larger, the zinc atom is likely to form an oxygen vacancy. That is, a bond generated between a zinc atom and an oxygen atom is probably weaker than a bond between an oxygen atom and another metal.

In addition, it is probable that a weak Zn—O bond is likely to be formed when impurities exist in the metal oxide. Examples of impurities in the metal oxide include a water molecule and hydrogen. When a water molecule or hydrogen exists in the metal oxide, a hydrogen atom is sometimes bonded to an oxygen atom forming the metal oxide (which is also referred to as an OH bond). In the case where the In—Ga—Zn oxide is single crystal, an oxygen atom forming the metal oxide is bonded to four metal atoms forming the metal oxide. However, an oxygen atom bonded to a hydrogen atom is bonded to two or three metal atoms in some cases. When the number of metal atoms bonded to an oxygen atom decreases, the oxygen atom is likely to form an oxygen vacancy. Note that when a zinc atom is bonded to an oxygen atom that forms an OH bond, the bond between the oxygen atom and the zinc atom is probably weak.

In addition, a weak Zn—O bond is sometimes formed in distortion in a region where a plurality of nanocrystals are connected. Although the shape of nanocrystals is basically a hexagon, they have pentagonal lattice arrangement, heptagonal lattice arrangement, or the like in the distortion. A weak Zn—O bond is formed in the distortion presumably because the bond distances between atoms are not uniform in the distortion.

In addition, it is probable that a weak Zn—O bond is likely to be formed when the crystallinity of the metal oxide is low. When the crystallinity of the metal oxide is high, a zinc atom forming the metal oxide is bonded to four or five oxygen atoms. However, when the crystallinity of the metal oxide becomes lower, the number of oxygen atoms bonded to a zinc atom tends to decrease. When the number of oxygen atoms bonded to a zinc atom decreases, the zinc atom is likely to form a vacancy. That is, a bond generated between a zinc atom and an oxygen atom is presumably weaker than a bond generated in single crystal.

Reducing the number of oxygen atoms and zinc atoms that form the weak Zn—O bonds inhibits formation of oxygen vacancies due to heat treatment or current stress and can improve the stability of the transistor. Note that in the case where only the number of oxygen atoms that form the weak Zn—O bonds is reduced and the number of zinc atoms that form the weak Zn—O bonds is not reduced, a weak Zn—O bond is sometimes formed again when an oxygen atom is supplied to the vicinity of the zinc atoms. Therefore, it is preferable to reduce the number of zinc atoms and oxygen atoms that form the weak Zn—O bonds.

As a method for reducing the number of oxygen atoms and zinc atoms that form the weak Zn—O bonds, a method in which vacuum baking is performed after a metal oxide is deposited can be given. Vacuum baking is heat treatment performed in a vacuum atmosphere. A vacuum atmosphere is kept by evacuation with a turbomolecular pump or the like. Note that pressure in a treatment chamber is lower than or equal to $1 \times 10^{-2}$ Pa, preferably lower than or equal to $1 \times 10^{-3}$ Pa. In addition, substrate temperature in the heat treatment is higher than or equal to 300° C., preferably higher than or equal to 400° C.

Performing the vacuum baking can reduce the number of oxygen atoms and zinc atoms that form the weak Zn—O bonds. Furthermore, since the metal oxide is heated by the vacuum baking, atoms included in the metal oxide are rearranged after the number of oxygen atoms and zinc atoms that form the weak Zn—O bonds is reduced, so that the number of oxygen atoms each bonded to four metal atoms is increased. Consequently, the number of oxygen atoms and zinc atoms that form the weak Zn—O bonds can be reduced, and a weak Zn—O bond can be inhibited from being formed again.

In addition, when impurities exist in the metal oxide, performing the vacuum baking can release water molecules or hydrogen in the metal oxide and reduce the number of OH bonds. When the number of OH bonds in the metal oxide decreases, the proportion of the oxygen atoms each bonded to four metal atoms increases. Furthermore, the atoms forming the metal oxide are rearranged when water molecules or hydrogen is released, so that the number of oxygen atoms each bonded to four metal atoms increases. Thus, a weak Zn—O bond can be inhibited from being formed again.

As described above, when vacuum baking is performed after the metal oxide is deposited, the number of oxygen atoms and zinc atoms that form weak Zn—O bonds can be reduced. Thus, the stability of the transistor can be improved through the step. Furthermore, an improvement in stability of the transistor increases the degree of freedom in selecting materials and formation methods.

<Method 1 for Manufacturing Transistor>

Next, a method for manufacturing the transistor 200 that can be used in the display device according to one embodiment of the present invention is described with reference to FIG. 11 to FIG. 16. In addition, (A) in each of FIG. 11 to FIG. 16 is a top view. Furthermore, (B) in each drawing is a cross-sectional view corresponding to a portion indicated by a dashed-dotted line A1-A2 in (A), and is also a cross-sectional view of the transistor 200 in the channel length direction. Moreover, (C) in each drawing is a cross-sectional view corresponding to a portion indicated by a dashed-dotted line A3-A4 in (A), and is also a cross-sectional view of the transistor 200 in the channel width direction. Note that for clarity of the drawing, some components are not illustrated in the top view of (A) in each drawing.

First, a substrate (not illustrated) is prepared, and the insulator 214 is deposited over the substrate. The insulator 214 can be deposited by a sputtering method, a chemical vapor deposition (CVD) method, a molecular beam epitaxy (MBE) method, a pulsed laser deposition (PLD) method, an ALD method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas to be used.

By a plasma enhanced CVD method, a high-quality film can be obtained at comparatively low temperature. Furthermore, a thermal CVD method is a deposition method that does not use plasma and thus enables less plasma damage to an object to be processed. For example, a wiring, an electrode, an element (a transistor, a capacitor, or the like), or the like included in a display device might be charged up by receiving electric charge from plasma. In that case, accumulated electric charge might break the wiring, the electrode, the element, or the like included in the display device. In contrast, such plasma damage does not occur in the case of a thermal CVD method that does not use plasma, and thus the yield of the display device can be increased. In addition, the thermal CVD method does not cause plasma damage during deposition, so that a film with few defects can be obtained.

In addition, in an ALD method, one atomic layer can be deposited at a time using self-regulating characteristics of atoms. Thus, the ALD method has advantages such as deposition of an extremely thin film, deposition on a component with a high aspect ratio, deposition of a film with a small number of defects such as pinholes, deposition with good coverage, and low-temperature deposition. Furthermore, the ALD method includes a plasma enhanced ALD (PEALD) method that is a deposition method using plasma. The use of plasma is sometimes preferable because deposition at lower temperature is possible. Note that a precursor used in the ALD method sometimes contains impurities such as carbon. Thus, in some cases, a film provided by the ALD method contains impurities such as carbon in a larger amount than a film provided by another deposition method. Note that impurities can be quantified by X-ray photoelectron spectroscopy (XPS).

Unlike a deposition method in which particles released from a target or the like are deposited, a CVD method and an ALD method are deposition methods in which a film is formed by reaction at a surface of an object to be processed. Thus, the CVD method and the ALD method are deposition methods that are less likely to be influenced by the shape of the object to be processed and thus enable good step coverage. In particular, the ALD method enables good step coverage and high thickness uniformity and thus is suitable for covering a surface of an opening portion with a high aspect ratio, for example. Note that the ALD method has a comparatively low deposition rate; thus, it is sometimes preferable to use the ALD method in combination with another deposition method with a high deposition rate, such as the CVD method.

The CVD method and the ALD method can control the composition of a film to be obtained depending on the flow rate ratio of source gases. For example, the CVD method and the ALD method enable deposition of a film with a given composition depending on the flow rate ratio of source gases. For another example, the CVD method and the ALD method enable deposition of a film whose composition is continuously changed, by changing the flow rate ratio of source gases during the deposition. In the case of depositing a film while changing the flow rate ratio of source gases, as compared with the case of depositing a film with the use of a plurality of deposition chambers, time taken for the deposition can be shortened because time taken for transfer and pressure adjustment is not required. Thus, the productivity of the transistor can be increased in some cases.

In this embodiment, for the insulator 214, aluminum oxide is deposited by a sputtering method. In addition, the insulator 214 may have a multilayer structure. For example, a structure may be employed in which aluminum oxide is deposited by a sputtering method and aluminum oxide is deposited over aluminum oxide by an ALD method. Alternatively, a structure may be employed in which aluminum oxide is deposited by an ALD method and aluminum oxide is deposited over aluminum oxide by a sputtering method.

Then, a conductive film to be the conductor 205 is deposited over the insulator 214. The conductive film to be the conductor 205 can be deposited by a sputtering method, a CVD method, an MBE method, a PLD method, an ALD method, or the like. In addition, the conductive film to be the conductor 205 can be a multilayer film. In this embodiment, tungsten is deposited for the conductive film to be the conductor 205.

Next, the conductive film to be the conductor 205 is processed by a lithography method, so that the conductor 205 is formed.

Note that in the lithography method, first, a resist is exposed to light through a mask. Next, a region exposed to light is removed or left using a developer, so that a resist mask is formed. Then, etching treatment through the resist mask is performed, so that a conductor, a semiconductor, an insulator, or the like can be processed into a desired shape. The resist mask is formed by, for example, exposure of the resist to light such as KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that a mask is unnecessary in the case of using an electron beam or an ion beam. Note that for removal of the resist mask, dry etching treatment such as ashing can be performed, wet etching treatment can be performed, wet etching treatment can be performed after dry etching treatment, or dry etching treatment can be performed after wet etching treatment.

In addition, a hard mask formed of an insulator or a conductor may be used instead of the resist mask. In the case where a hard mask is used, a hard mask with a desired shape can be formed by forming an insulating film or a conductive film to be a hard mask material over the conductive film to be the conductor 205, forming a resist mask thereover, and then etching the hard mask material. The etching of the conductive film to be the conductor 205 may be performed after removal of the resist mask or with the resist mask remaining. In the latter case, the resist mask sometimes disappears during the etching. The hard mask may be removed by etching after the etching of the conductive film to be the conductor 205. Meanwhile, the hard mask is not necessarily removed when the hard mask material does not affect a post-process or can be utilized in the post-process.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency power is applied to one of the parallel plate electrodes. Alternatively, a structure may be employed in which different high-frequency powers are applied to one of the parallel plate electrodes. Alternatively, a structure may be employed in which high-frequency powers with the same frequency are applied to the parallel plate electrodes. Alternatively, a structure may be employed in which high-frequency powers with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

Next, an insulating film to be the insulator 216 is deposited over the insulator 214 and the conductor 205. The insulating film to be the insulator 216 is formed to be in contact with the top surface and side surface of the conductor 205. The insulating film to be the insulator 216 can be deposited by a sputtering method, a CVD method, an MBE method, a PLD method, an ALD method, or the like. In this embodiment, for the insulating film to be the insulator 216, silicon oxide is deposited by a CVD method.

Here, the thickness of the insulating film to be the insulator 216 is preferably greater than or equal to the thickness of the conductor 205. For example, when the thickness of the conductor 205 is 1, the thickness of the insulating film to be the insulator 216 is greater than or equal to 1 and less than or equal to 3. In this embodiment, the thickness of the conductor 205 is 150 nm, and the thickness of the insulating film to be the insulator 216 is 350 nm.

Next, CMP treatment is performed on the insulating film to be the insulator 216, so that part of the insulating film to be the insulator 216 is removed and a surface of the conductor 205 is exposed. Thus, the insulator 216 and the conductor 205 that have flat top surfaces can be formed (see FIG. 11). The improvement in planarity of the top surfaces of the insulator 216 and the conductor 205 results in improved crystallinity of the CAAC-OS that forms the oxide 230$b$ and the oxide 230$c$.

Note that the method for manufacturing the insulator 216 and the conductor 205 is not limited to the above. For example, the insulating film to be the insulator 216 may be deposited over the insulator 214, an opening may be provided in the insulating film, and the conductor 205 may be formed to be embedded in the opening.

Next, the insulator 222 is deposited over the insulator 216 and the conductor 205. An insulator containing an oxide of one or both of aluminum and hafnium is preferably deposited as the insulator 222. Note that as the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, hydrogen and water contained in components provided around the transistor 200 are inhibited from being diffused into the transistor 200 through the insulator 222, and generation of oxygen vacancies in the oxide 230 can be inhibited.

The insulator 222 can be deposited by a sputtering method, a CVD method, an MBE method, a PLD method, an ALD method, or the like.

Next, an insulating film to be the insulator 224 is deposited over the insulator 222. The insulating film to be the insulator 224 can be deposited by a sputtering method, a CVD method, an MBE method, a PLD method, an ALD method, or the like.

Next, heat treatment is preferably performed. The heat treatment is performed at higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen or inert gas atmosphere, or an atmosphere containing an oxidizing gas at higher than or equal to 10 ppm, higher than or equal to 1%, or higher than or equal to 10%. Alternatively, the heat treatment may be performed under reduced pressure. Alternatively, the heat treatment may be performed by performing heat treatment in a nitrogen or inert gas atmosphere and then performing heat treatment in an atmosphere containing an oxidizing gas at higher than or equal to 10 ppm, higher than or equal to 1%, or higher than or equal to 10% to compensate for released oxygen.

In this embodiment, as the heat treatment, treatment is performed at 400° C. in a nitrogen atmosphere for 1 hour after deposition of the insulator 224. By the heat treatment, impurities such as water and hydrogen contained in the insulator 224 can be removed, for example. The heat treatment can also be performed after the deposition of the insulator 222, for example.

Here, in order to form an excess-oxygen region in the insulator 224, plasma treatment containing oxygen may be performed under reduced pressure. For the plasma treatment containing oxygen, an apparatus including a power source for generating high-density plasma using microwaves is preferably used, for example. Alternatively, a power source for applying an RF (Radio Frequency) to a substrate side may be included. The use of high-density plasma enables high-density oxygen radicals to be produced, and RF application to the substrate side allows the oxygen radicals produced by the high-density plasma to be efficiently introduced into the insulator 224. Alternatively, after plasma treatment containing an inert gas is performed with this apparatus, plasma treatment containing oxygen may be performed to compensate for released oxygen. Note that impurities such as water and hydrogen contained in the insulator 224 can be removed by selecting the conditions for the plasma treatment as appropriate. In that case, the heat treatment does not need to be performed.

Figure 11A:
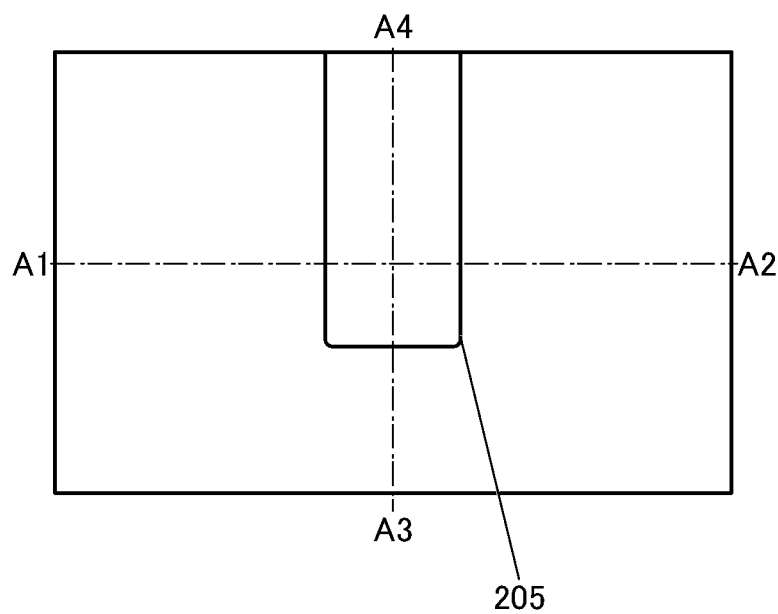
FIG. 11 (A) A top view illustrating a method for manufacturing a transistor. (B), (C) Cross-sectional views illustrating the method for manufacturing a transistor.
Figure 11C:
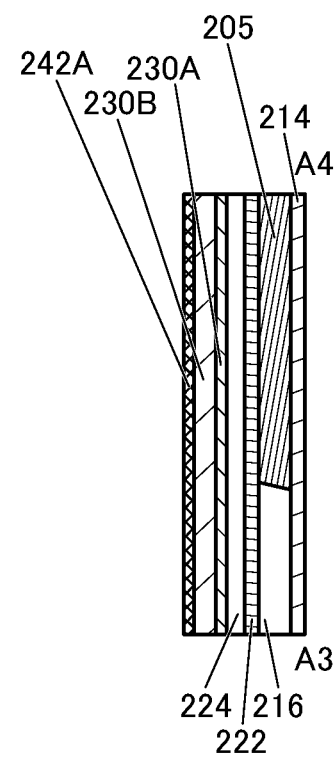
Figure 11B:
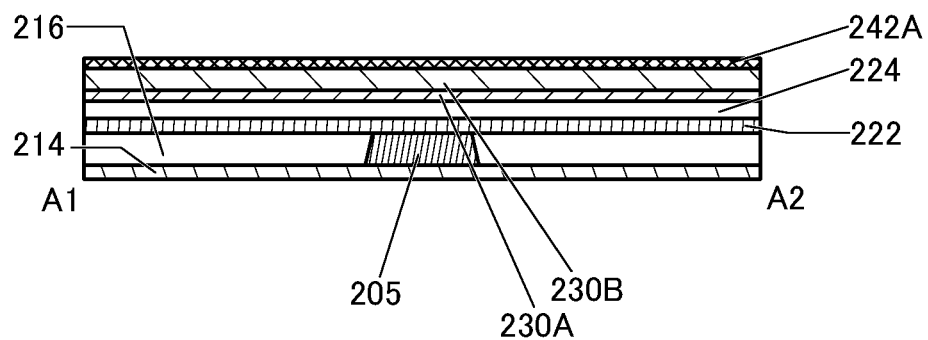
Figure 12A:
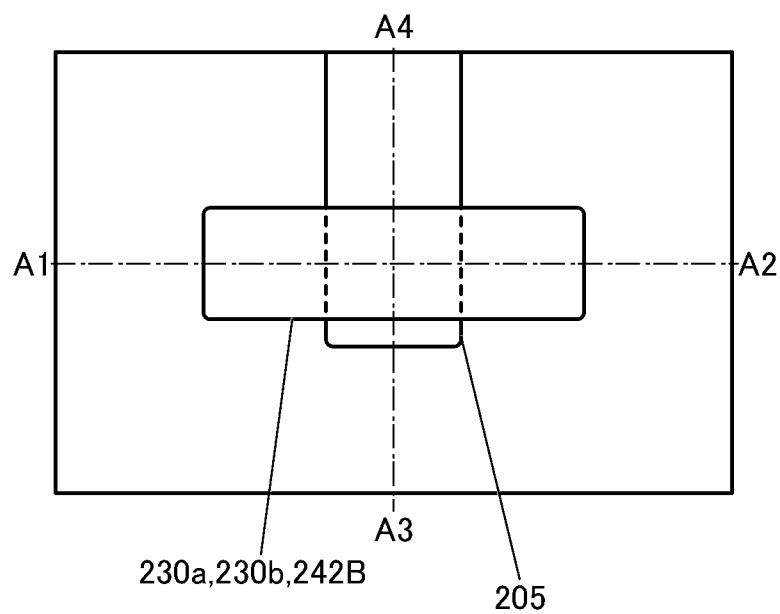
FIG. 12 (A) A top view illustrating a method for manufacturing a transistor. (B), (C) Cross-sectional views illustrating the method for manufacturing a transistor.
Figure 12C:
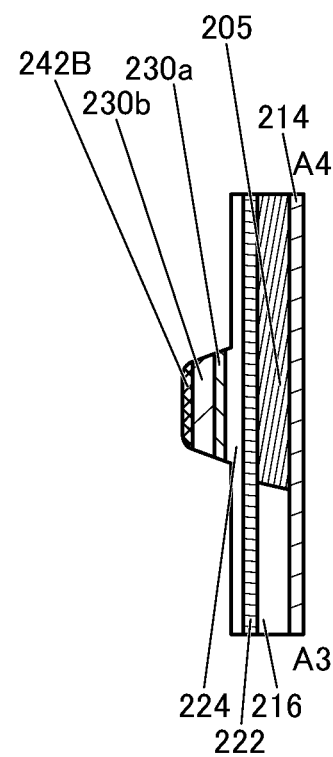
Figure 12B:
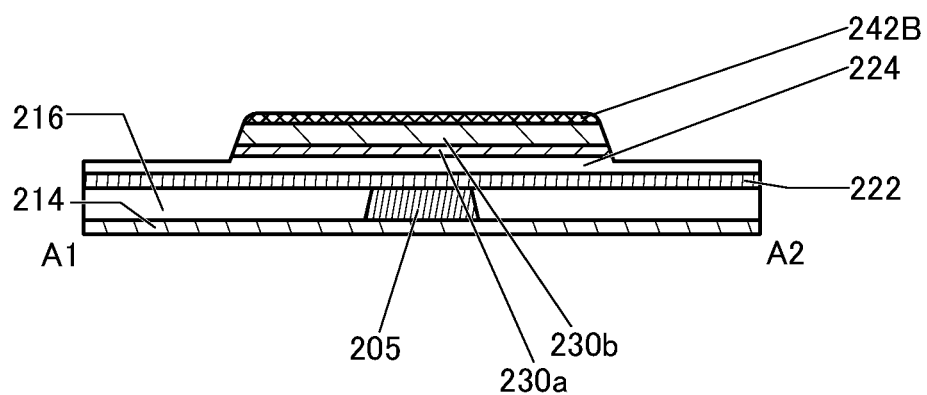

Next, an oxide film 230A to be the oxide 230a, an oxide film 230B to be the oxide 230b, and a conductive film 242A to be the conductor 242 are deposited in this order over the insulator 224 (see FIG. 11). Note that the oxide films are preferably deposited successively without being exposed to an atmospheric environment. By the deposition without exposure to the air, impurities or moisture from the atmospheric environment can be prevented from being attached onto the oxide film 230A and the oxide film 230B, so that the vicinity of an interface between the oxide film 230A and the oxide film 230B can be kept clean.

The oxide film 230A, the oxide film 230B, and the conductive film 242A can be deposited by a sputtering method, a CVD method, an MBE method, a PLD method, an ALD method, or the like.

In the case where the oxide film 230A and the oxide film 230B are deposited by a sputtering method, for example, oxygen or a mixed gas of oxygen and a rare gas is used as a sputtering gas. Increasing the proportion of oxygen contained in the sputtering gas can increase the amount of excess oxygen in the deposited oxide films. In addition, in the case where the oxide films are deposited by a sputtering method, the In-M-Zn oxide target or the like can be used. Furthermore, a direct current (DC) power source or an alternating current (AC) power source such as a radio frequency (RF) power source is connected to a target, and required power can be applied depending on the electric conductivity of the target.

In particular, part of oxygen contained in the sputtering gas is supplied to the insulator 224 during the deposition of the oxide film 230A in some cases. Therefore, the proportion of oxygen contained in the sputtering gas for the oxide film 230A is higher than or equal to 70%, preferably higher than or equal to 80%, further preferably 100%.

In addition, in the case where the oxide film 230B is formed by a sputtering method, when the proportion of oxygen contained in the sputtering gas for deposition is higher than or equal to 1% and lower than or equal to 30%, preferably higher than or equal to 5% and lower than or equal to 20% during the deposition, an oxygen-deficient oxide semiconductor is formed. In a transistor in which an oxygen-deficient oxide semiconductor is used for its channel formation region, comparatively high field-effect mobility can be obtained. Furthermore, when deposition is performed while the substrate is heated, the crystallinity of the oxide film can be improved. Note that one embodiment of the present invention is not limited thereto. In the case where the oxide film 230B to be the oxide 230b is formed by a sputtering method and the proportion of oxygen contained in the sputtering gas for deposition is higher than 30% and lower than or equal to 100%, preferably higher than or equal to 70% and lower than or equal to 100%, an oxygen-excess oxide semiconductor is formed. In a transistor using an oxygen-excess oxide semiconductor for its channel formation region, comparatively high reliability can be obtained.

In this embodiment, the oxide film 230A is deposited by a sputtering method using a target with In:Ga:Zn=1:1:0.5 [atomic ratio] (2:2:1 [atomic ratio]) or 1:3:4 [atomic ratio]. In addition, the oxide film 230B is deposited by a sputtering method using a target with In:Ga:Zn=4:2:4.1 [atomic ratio]. Note that each of the oxide films is formed to have characteristics required for the oxide 230 by selecting the deposition condition and the atomic ratio as appropriate.

In addition, it is preferable that the sputtering gas be highly purified in the deposition of the oxide film 230A and the oxide film 230B. For example, as an oxygen gas or a rare gas used as the sputtering gas, a gas that is highly purified to have a dew point of lower than or equal to −60° C., preferably lower than or equal to −100° C. is used. When the highly purified sputtering gas is used for the deposition, entry of moisture or the like into the oxide 230 can be prevented as much as possible.

Furthermore, in the case where the oxide film 230A and the oxide film 230B are deposited by a sputtering method, moisture in a deposition chamber of a sputtering apparatus is preferably removed as much as possible. For example, with an adsorption vacuum evacuation pump such as a cryopump, the deposition chamber is preferably evacuated to be a high vacuum (to a degree of approximately $5\times10^{-7}$ Pa to $1\times10^{-4}$ Pa). In particular, the partial pressure of gas molecules corresponding to $H_2O$ (gas molecules corresponding to m/z=18) in the deposition chamber during the standby of the sputtering apparatus is preferably lower than or equal to $1\times10^{-4}$ Pa, further preferably lower than or equal to $5\times10^{-5}$ Pa.

Here, the insulator 222, the insulator 224, the oxide film 230A, and the oxide film 230B are preferably deposited without exposure to the air. For example, a multi-chamber deposition apparatus is used.

Next, heat treatment may be performed. For the heat treatment, the conditions for the above heat treatment can be used. Through the heat treatment, impurities such as water and hydrogen in the oxide film 230A and the oxide film 230B can be removed, for example. In this embodiment, treatment is performed at 400° C. in a nitrogen atmosphere for 1 hour, and treatment is successively performed at 400° C. in an oxygen atmosphere for 1 hour.

Next, the oxide film 230A, the oxide film 230B, and the conductive film 242A are processed into island shapes, so that the oxide 230a, the oxide 230b, and a conductor layer 242B are formed. Note that in this step, the thickness of the insulator 224 in a region that does not overlap with the oxide 230a is reduced in some cases (see FIG. 12).

Here, the oxide 230a, the oxide 230b, and the conductor layer 242B are formed to at least partly overlap with the conductor 205. In addition, a structure may be employed in which an angle formed between the oxide 230a, the oxide 230b, and the conductor layer 242B and a top surface of the insulator 222 is an acute angle. In that case, the angle formed between the side surfaces of the oxide 230a and the oxide 230b and the top surface of the insulator 222 is preferably greater than or equal to 60° and less than 70°. With such a shape, coverage with the insulator 254 and the like can be improved in a later step, so that defects such as voids can be reduced. Alternatively, side surfaces of the oxide 230a, the oxide 230b, and the conductor layer 242B may be substantially perpendicular to the top surface of the insulator 222. When the side surfaces of the oxide 230a, the oxide 230b, and the conductor layer 242B are substantially perpendicular to the top surface of the insulator 222, the plurality of transistors 200 can be provided in a smaller area at a higher density.

In addition, a curved surface is provided between the side surface of the conductor layer 242B and a top surface of the conductor layer 242B. That is, an end portion of the side surface and an end portion of the top surface are preferably curved (such shapes are hereinafter also referred to as rounded shapes). The radius of curvature of the curved surface at an end portion of the conductor layer 242B is greater than or equal to 3 nm and less than or equal to 10 nm, preferably greater than or equal to 5 nm and less than or equal to 6 nm, for example. When the end portion is not angular, coverage with films in a later deposition process is improved.

Note that the oxide film 230A, the oxide film 230B, and the conductive film 242A are processed by a lithography method. In addition, a dry etching method or a wet etching method can be used for the processing. Processing by a dry etching method is suitable for microfabrication.

In addition, in some cases, the treatment such as dry etching causes attachment or diffusion of impurities due to an etching gas or the like to a surface or an inside of the oxide 230a, the oxide 230b, or the like. Examples of the impurities include fluorine and chlorine.

In order to remove the impurities and the like, cleaning is performed. Examples of a cleaning method include wet cleaning using a cleaning solution or the like, plasma treatment using plasma, and cleaning by heat treatment, and these cleanings may be performed in appropriate combination.

As the wet cleaning, cleaning treatment may be performed using an aqueous solution obtained by diluting an oxalic acid, a phosphoric acid, a hydrofluoric acid, or the like with carbonated water or pure water. Alternatively, ultrasonic cleaning using pure water or carbonated water may be performed. In this embodiment, the ultrasonic cleaning using pure water or carbonated water is performed.

Then, heat treatment may be performed. For the conditions of the heat treatment, the conditions for the above heat treatment can be used.

Next, a dummy gate film to be a dummy gate layer 262A is deposited over the insulator 224, the oxide 230a, the oxide 230b, and the conductor layer 242B.

The dummy gate film to be the dummy gate layer 262A is processed to be used as a dummy gate. The dummy gate is an interim gate electrode. That is, the dummy gate film to be the dummy gate layer 262A is processed to form an interim gate electrode, the dummy gate is removed in a later step, and a gate electrode is formed using a conductive film or the like instead. Thus, a film that is easily processed minutely and easily removed is preferably used as the dummy gate film to be the dummy gate layer 262A.

The dummy gate film to be the dummy gate layer 262A can be deposited by a sputtering method, a CVD method, an MBE method, a PLD method, an ALD method, or the like. An insulator, a semiconductor, or a conductor can be used, for example. Specifically, silicon such as polysilicon, microcrystalline silicon, or amorphous silicon, or a metal film of aluminum, titanium, tungsten, or the like is used, for example. Alternatively, a film containing carbon, SOG (Spin On Glass), a resin film, or the like may be formed by a coating method. Examples include a photoresist, polyester, polyolefin, polyamide (nylon, aramid, or the like), polyimide, polycarbonate, and acrylic. When the film containing carbon, SOG, or the resin film is formed by a coating method, a surface of the dummy gate film can be made flat. When the surface of the dummy gate film is made flat in this manner, the dummy gate film can be easily processed minutely and easily removed.

In addition, the dummy gate film to be the dummy gate layer 262A can be a multilayer film using different kinds of films. For example, the dummy gate film to be the dummy gate layer 262A can have a two-layer structure in which a conductive film and a resin film over the conductive film are formed. When the dummy gate film has such a structure, the conductive film functions as a stopper film for CMP treatment in a later CMP process in some cases, for example. Alternatively, the end point of the CMP treatment can be detected in some cases, so that processing variations can be reduced in some cases.

Figure 13A:
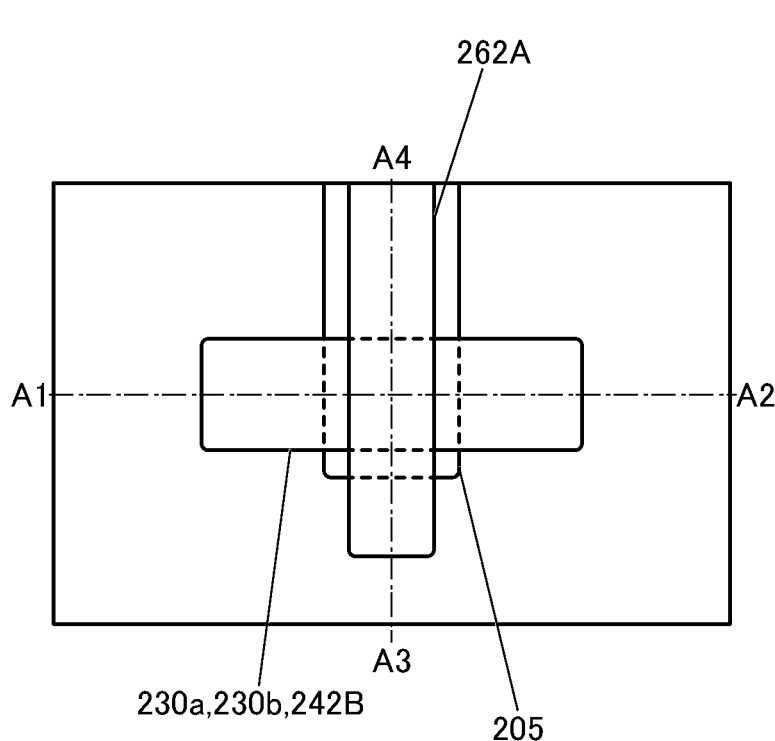
FIG. 13 (A) A top view illustrating a method for manufacturing a transistor. (B), (C) Cross-sectional views illustrating the method for manufacturing a transistor.
Figure 13C:
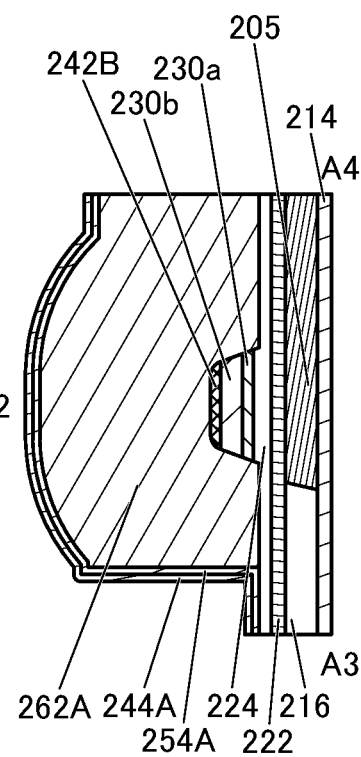
Figure 13B:
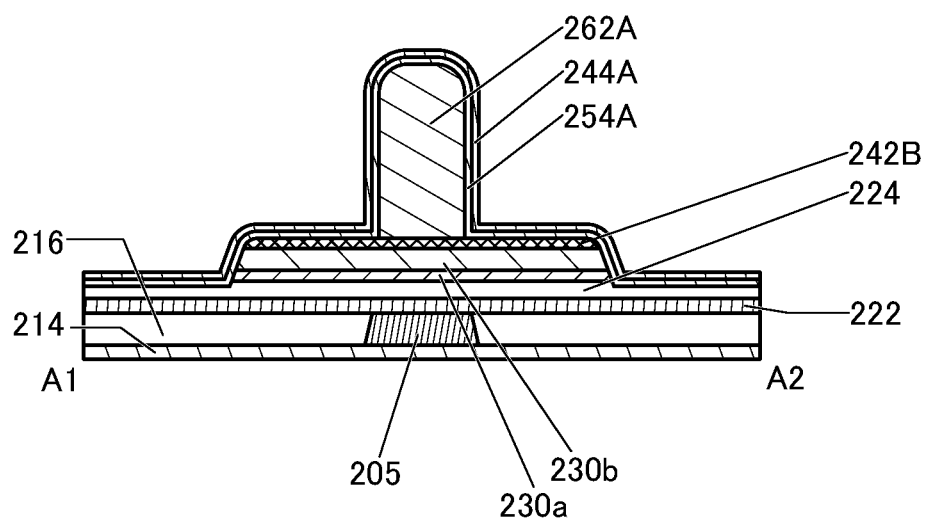

Then, the dummy gate film to be the dummy gate layer 262A is etched by a lithography method, so that the dummy gate layer 262A is formed (see FIG. 13). The dummy gate layer 262A is formed to at least partly overlap with the conductor 205 and oxide 230.

Next, an insulating film 254A is deposited to cover the oxide 230a, the oxide 230b, the conductor layer 242B, and the dummy gate layer 262A. Then, an insulating film 244A may be deposited over the insulating film 254A (see FIG. 13). The insulating film 254A and the insulating film 244A can be deposited by a sputtering method, a CVD method, an MBE method, a PLD method, an ALD method, or the like.

As the insulating film 254A, an insulating film having a function of inhibiting diffusion of oxygen and impurities such as hydrogen is preferably used. For example, an aluminum oxide film is preferably deposited by a sputtering method. When an aluminum oxide film is deposited by a sputtering method using an oxygen-containing gas, oxygen can be injected into the insulator 224. That is, the insulator 224 can contain excess oxygen.

As the insulating film 244A, an insulating film having a function of inhibiting diffusion of oxygen and impurities such as hydrogen is preferably used. For example, an aluminum oxide film is preferably deposited by an ALD method. With the use of the ALD method that provides good coverage, it is possible to form the insulating film 244A having a uniform thickness even in a step portion formed by the dummy gate layer 262A and the like. In addition, with the use of the ALD method, a dense thin film can be deposited. A dense thin film having good coverage can be deposited in this manner; thus, even when defects such as voids or pinholes are generated in the insulating film 254A, for example, they can be covered with the insulating film 244A.

Alternatively, aluminum nitride, silicon nitride, silicon nitride oxide, or the like may be deposited for the insulating film 244A. For example, in the case where an aluminum nitride film is deposited as the insulating film 244A by reactive sputtering using an aluminum target, the flow rate of a nitrogen gas to the total flow rate of a deposition gas is preferably higher than or equal to 30% and lower than or equal to 100%, further preferably higher than or equal to 40% and lower than or equal to 100%, still further preferably higher than or equal to 50% and lower than or equal to 100%.

Alternatively, aluminum oxide may be deposited for the insulating film 244A while the substrate is heated at a high temperature. The substrate heating temperature during the deposition of the insulating film 244A is higher than or equal to 200° C., preferably higher than or equal to 250° C., further preferably higher than or equal to 350° C. In that case, the deposition of aluminum oxide for the insulating film 254A by an ALD method can prevent the dummy gate layer 262A from being deformed when the insulating film 244A is deposited at the above temperature.

Alternatively, fluorine may be added after deposition of either one or both of the insulating film 244A and the insulating film 254A. Fluorine can be added to either one or both of the insulating film 244A and the insulating film 254A in such a manner that plasma treatment is performed in an atmosphere containing a fluorine-based gas (e.g., $CF_4$ or the like) or doping of a gas containing fluorine is performed. When fluorine is added to either one or both of the insulating film 244A and the insulating film 254A, hydrogen contained in the film is expected to be terminated or be subjected to gettering by fluorine.

Accordingly, it is possible to prevent outward diffusion of excess oxygen contained in the insulator 224 and entry of impurities such as water and hydrogen into the insulator 224 from the outside. Note that the deposition of the insulating film 244A can be omitted.

Next, an insulating film to be the insulator 280 is deposited over the insulating film 244A. The insulating film to be the insulator 280 can be deposited by a sputtering method, a CVD method, an MBE method, a PLD method, an ALD method, or the like.

Figure 14A:
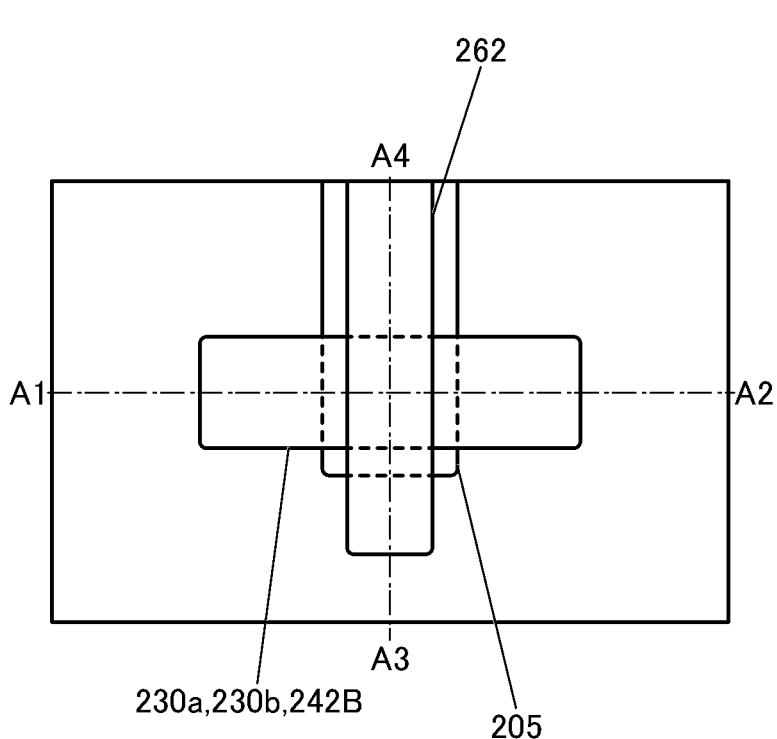
FIG. 14 (A) A top view illustrating a method for manufacturing a transistor. (B), (C) Cross-sectional views illustrating the method for manufacturing a transistor.
Figure 14C:
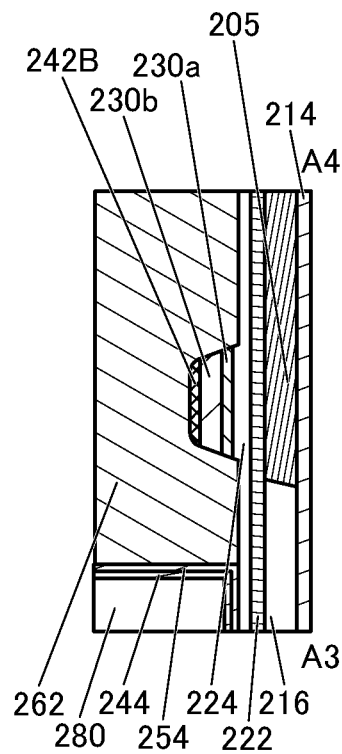

Next, the insulating film to be the insulator 280, the dummy gate layer 262A, the insulating film 254A, and the insulating film 244A are partly removed until part of the dummy gate layer 262A is exposed, so that the insulator 280, a dummy gate 262, the insulator 254, and the insulator 244 are formed (see FIG. 14). CMP treatment is preferably employed for forming the insulator 280, the dummy gate 262, the insulator 254, and the insulator 244.

Figure 14B:
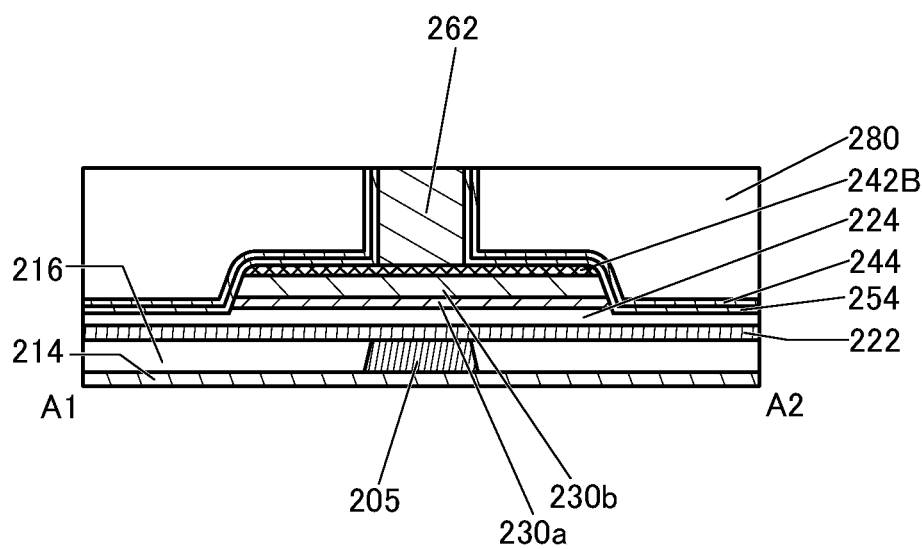

In addition, as described above, when the dummy gate layer 262A has a two-layer structure in which a conductive film and a resin film over the conductive film are formed, for example, in a CMP process, the conductive film functions as a stopper film for CMP treatment in some cases. Alternatively, the end point of the CMP treatment can be detected with the conductive film in some cases, so that variations in the height of the dummy gate 262 can be reduced in some cases. As illustrated in FIG. 14(B), a top surface of the dummy gate 262 is substantially aligned with the top surfaces of the insulator 254, the insulator 244, and the insulator 280.

Figure 15A:
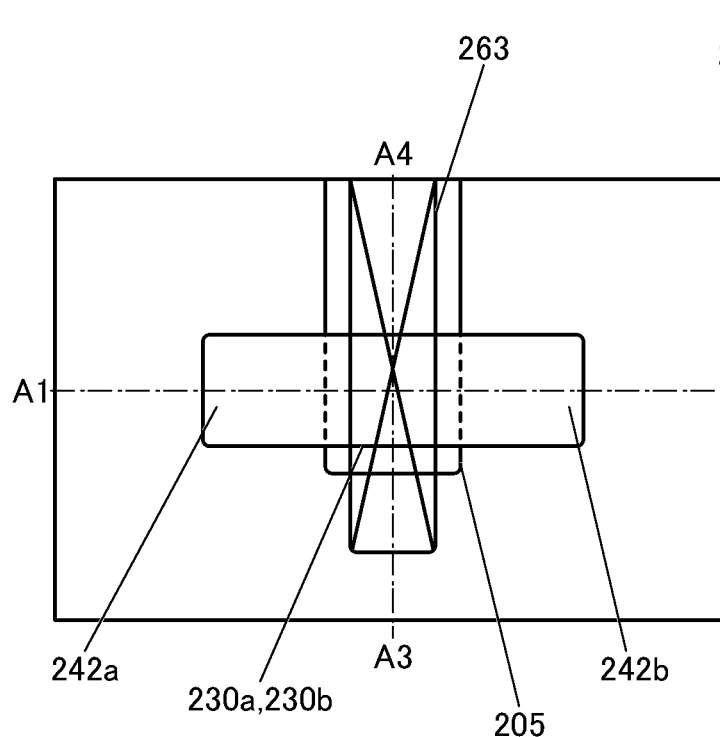
FIG. 15 (A) A top view illustrating a method for manufacturing a transistor. (B), (C) Cross-sectional views illustrating the method for manufacturing a transistor.
Figure 15C:
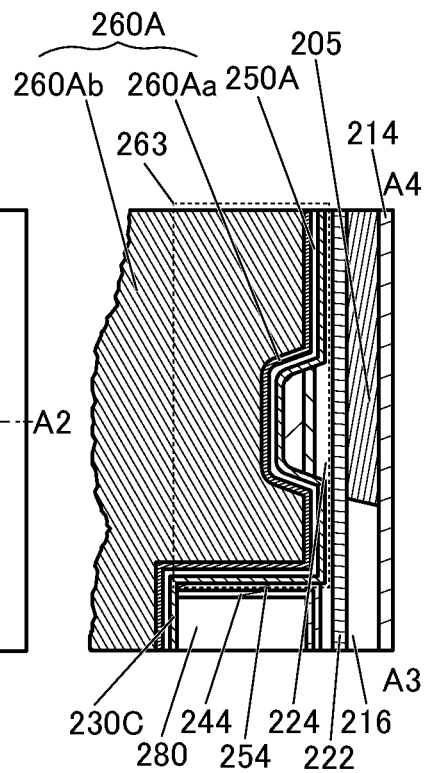
Figure 15B:
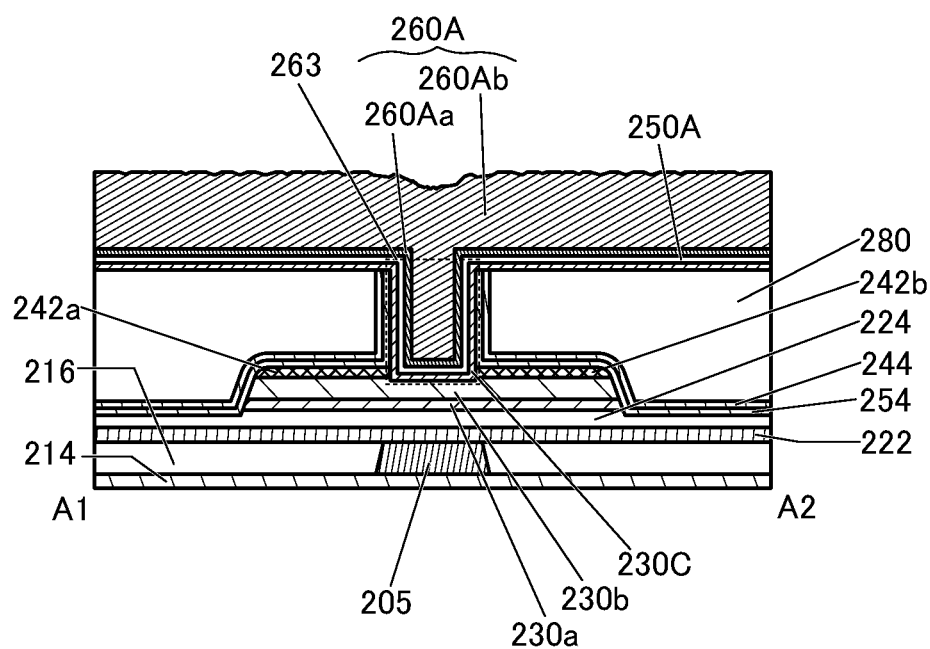

Next, the dummy gate 262 is removed to form an opening 263 (see FIG. 15). The dummy gate 262 can be removed by wet etching, dry etching, ashing, or the like. Alternatively, a plurality of above treatments may be performed in appropriate combination. For example, wet etching treatment may be performed after ashing treatment. By removing the dummy gate 262, part of a surface of the conductor layer 242B is exposed through the opening 263.

Next, by removal of a portion of the conductor layer 242B that is exposed through the opening 263, a surface of the oxide 230b is partly exposed, and thus the conductor 242a and the conductor 242b can be formed. The removal can be performed by wet etching or dry etching.

In this embodiment, dry etching is used. Dry etching is preferably used because microfabrication is possible. Here, part of the top surface of the oxide 230b that is exposed between the conductor 242a and the conductor 242b is removed in some cases.

At this time, the conductor 242a and the conductor 242b are formed using the insulator 280, the insulator 244, and the insulator 254 as masks. Thus, the opening 263 formed in the insulator 280, the insulator 244, and the insulator 254 overlaps with the region between the conductor 242a and the conductor 242b. In this manner, the conductor 260 can be formed between the conductor 242a and the conductor 242b in a self-aligned manner in a later step.

Next, heat treatment is preferably performed before deposition of an oxide film 230C. The heat treatment is performed at higher than or equal to 100° C. and lower than or equal to 400° C., and is performed at 200° C., for example. Alternatively, the heat treatment is preferably performed at the same temperature as the deposition temperature of the oxide film 230C. Here, the deposition temperature is not limited to substrate temperature during the deposition, and includes the set temperature of the deposition apparatus. For example, in the case where the oxide film 230C is deposited at 300° C., the heat treatment is preferably performed at 300° C. The heat treatment is preferably performed under reduced pressure, and for example, may be performed in a vacuum atmosphere. A vacuum atmosphere is kept by evacuation with a turbomolecular pump or the like. Pressure in a vacuum atmosphere of the treatment chamber is lower than or equal to $1\times10^{-2}$ Pa, preferably lower than or equal to $1\times10^{-3}$ Pa.

Next, the oxide film 230C is deposited to fill the opening 263.

In addition, the oxide film 230C is preferably deposited successively without being exposed to the air after the heat treatment. For example, it is preferable that the heat treatment and the deposition treatment be successively performed in different chambers by using a multi-chamber type deposition apparatus. The treatment can remove impurities such as moisture, hydrogen, or carbon adsorbed onto the surfaces or the like of the oxide 230a and the oxide 230b, and can reduce the moisture concentration and hydrogen concentration in the oxide 230a and the oxide 230b. An impurity that is removed by the heat treatment includes an impurity having a bond of hydrogen and carbon, an impurity having a bond of hydrogen and oxygen, and the like. Furthermore, it is possible to prevent reentry of impurities such as hydrogen into the oxide 230 by performing heat treatment and deposition successively without exposure to the air. In addition, similar heat treatment may also be performed before the deposition of an insulating film 250A to be described later.

The oxide film 230C can be deposited by a sputtering method, a CVD method, an MBE method, a PLD method, an ALD method, or the like. An oxide film to be the oxide film 230C is deposited by a deposition method similar to that for the oxide film 230A or the oxide film 230B depending on characteristics required for the oxide film 230C. An In—Ga—Zn oxide or an oxide that does not contain In can be used for the oxide film 230C. As the oxide that does not contain In, a Ga—Zn oxide, gallium oxide, or the like can be used. Alternatively, as the oxide film 230C, a stacked-layer structure of an In—Ga—Zn oxide and an oxide that does not contain In may be used. The oxide film 230C can be deposited by a sputtering method using a target with In:Ga:Zn=1:3:4 [atomic ratio] or 4:2:4.1 [atomic ratio], Ga:Zn=2:1 [atomic ratio], or Ga:Zn=2:5 [atomic ratio].

Alternatively, the oxide film 230C may have a stacked-layer structure of a first oxide film and a second oxide film over the first oxide film. The first oxide film may be formed using a target similar to the target used for forming the oxide film 230B, and the second oxide film may be formed using a target similar to the target used for forming the oxide film 230A.

The oxide film 230C is preferably deposited while the substrate is heated. In that case, the substrate temperature is set to higher than or equal to 300° C., so that oxygen vacancies in the oxide film 230B and the oxide film 230C can be reduced. In addition, for example, the oxide film 230C may be deposited at the same temperature as the deposition temperature of an insulating film 250A to be described later. Furthermore, when the oxide film 230C is deposited while the substrate is heated, the crystallinity of the oxide film 230C and the oxide 230b can be improved.

In particular, in the deposition of the oxide film 230C, part of oxygen contained in the sputtering gas is supplied to the oxide 230a and the oxide 230b, in some cases. Therefore, the proportion of oxygen contained in the sputtering gas for the oxide film 230C is higher than or equal to 70%, preferably higher than or equal to 80%, further preferably 100%. In addition, when the oxide film is deposited while the substrate is heated, the crystallinity of the oxide film can be improved.

Next, heat treatment is preferably performed before deposition of the insulating film 250A. The heat treatment is performed at higher than or equal to 100° C. and lower than or equal to 400° C., and is performed at 200° C., for example. Alternatively, the heat treatment is preferably performed at the same temperature as the deposition temperature of the insulating film 250A. Here, the deposition temperature is not limited to substrate temperature during the deposition, and includes the set temperature of the deposition apparatus. For example, in the case where the insulating film 250A is deposited at 350° C., the temperature of the heat treatment is preferably 350° C. The heat treatment is preferably performed under reduced pressure, and for example, may be performed in a vacuum atmosphere. A vacuum atmosphere is kept by evacuation with a turbomolecular pump or the like. Pressure in a vacuum atmosphere of the treatment chamber is lower than or equal to $1\times10^{-2}$ Pa, preferably lower than or equal to $1\times10^{-3}$ Pa.

Next, the insulating film 250A is deposited. The insulating film 250A can be deposited by a sputtering method, a CVD method, an MBE method, a PLD method, an ALD method, or the like. For the insulating film 250A, silicon oxynitride is preferably deposited by a CVD method. Alternatively, silicon oxide, hafnium oxide, gallium oxide, or the like is preferably deposited as the insulating film 250A by an ALD method. For example, a stacked film of silicon oxide and gallium oxide over silicon oxide may be used as the insulating film 250A. Note that the deposition temperature at the time of depositing the insulating film 250A is preferably higher than or equal to 300° C. and lower than 450° C., further preferably higher than or equal to 300° C. and lower than 400° C., particularly preferably approximately 350° C. For example, when the insulating film 250A is deposited at 350° C., an insulator having few impurities can be deposited.

Note that oxygen is excited by microwaves to generate high-density oxygen plasma, and the insulating film 250A is exposed to the oxygen plasma, so that oxygen can be introduced into the insulating film 250A.

Furthermore, heat treatment may be performed. For the heat treatment, the conditions for the above heat treatment can be used. The heat treatment can reduce the moisture concentration and hydrogen concentration in the insulating film 250A.

Next, a conductive film 260Aa and a conductive film 260Ab are deposited. The conductive film 260Aa and the conductive film 260Ab can be deposited by a sputtering method, a CVD method, an MBE method, a PLD method, an ALD method, or the like. A CVD method is preferably used, for example. In this embodiment, the conductive film 260Aa is deposited by an ALD method, and the conductive film 260Ab is deposited by a CVD method (see FIG. 15).

Then, the oxide film 230C, the insulating film 250A, the conductive film 260Aa, and the conductive film 260Ab are polished by CMP treatment until the insulator 280 is exposed, so that the oxide 230c, the insulator 250, and the conductor 260 (the conductor 260a and the conductor 260b) are formed (see FIG. 16).

Next, heat treatment may be performed. For the heat treatment, the conditions for the above heat treatment can be used. The heat treatment can reduce the moisture concentration and hydrogen concentration in the insulator 280. Alternatively, heat treatment is preferably performed before deposition of an insulating film to be the insulator 274. The heat treatment is performed at higher than or equal to 100° C. and lower than or equal to 400° C., and is performed at 200° C., for example. Alternatively, the heat treatment is preferably performed at the same temperature as the deposition temperature of the insulating film. Here, the deposition temperature is not limited to substrate temperature during the deposition, and includes the set temperature of the deposition apparatus. For example, in the case where the insulating film is deposited at 250° C., the temperature of the heat treatment is preferably 250° C. The heat treatment is preferably performed under reduced pressure, and for example, may be performed in a vacuum atmosphere. A vacuum atmosphere is kept by evacuation with a turbomolecular pump or the like. Pressure in a vacuum atmosphere of the treatment chamber is lower than or equal to $1\times10^{-2}$ Pa, preferably lower than or equal to $1\times10^{-3}$ Pa.

Next, an insulating film to be the insulator 274 is formed over the insulator 280 (see FIG. 16). The insulating film to be the insulator 274 can be deposited by a sputtering method, a CVD method, an MBE method, a PLD method, an ALD method, or the like. An aluminum oxide film is preferably deposited as the insulating film to be the insulator 274 by a sputtering method, for example. When an aluminum oxide film is deposited by a sputtering method, hydrogen contained in the insulator 280 can be inhibited from being diffused into the oxide 230 in some cases.

Next, heat treatment may be performed. For the heat treatment, the conditions for the above heat treatment can be used. The heat treatment can reduce the moisture concentration and hydrogen concentration in the insulator 280.

Next, an insulating film to be the insulator 281 may be deposited over the insulator 274. The insulating film to be the insulator 281 can be deposited by a sputtering method, a CVD method, an MBE method, a PLD method, an ALD method, or the like (see FIG. 16).

Then, openings reaching the conductor 242a and the conductor 242b are formed in the insulator 254, the insulator 244, the insulator 280, the insulator 274, and the insulator 281. The openings are formed by a lithography method.

Next, an insulating film to be the insulator 241 is deposited, and the insulating film is subjected to anisotropic etching to form the insulator 241. The insulating film can be deposited by a sputtering method, a CVD method, an MBE method, a PLD method, an ALD method, or the like. An insulating film having a function of inhibiting the passage of oxygen is preferably used as the insulating film to be the insulator 241. For example, an aluminum oxide film is preferably deposited by an ALD method. Alternatively, a silicon nitride film may be deposited by an ALD method or a CVD method. In the case where a silicon nitride film is deposited by an ALD method, a precursor containing silicon and halogen or a precursor of aminosilanes can be used. As the precursor containing silicon and halogen, $SiCl_4$, $SiH_2Cl_2$, $Si_2Cl_6$, $Si_3Cl_8$, or the like can be used. In addition, as the precursor of aminosilanes, monovalent, divalent, or trivalent aminosilanes can be used. Furthermore, as a nitriding gas, ammonia or hydrazine can be used. In addition, for the anisotropic etching, a dry etching method or the like is employed, for example. When sidewall portions of the openings have such structures, the passage of oxygen from the outside can be inhibited and oxidation of the conductor 240a and the conductor 240b to be formed next can be prevented. Furthermore, impurities such as water and hydrogen can be prevented from being diffused from the conductor 240a and the conductor 240b to the outside.

Next, a conductive film to be the conductor 240a and the conductor 240b is deposited. The conductive film to be the conductor 240a and the conductor 240b desirably has a stacked-layer structure that includes a conductor having a function of inhibiting diffusion of impurities such as water and hydrogen. For example, stacked layers of tantalum nitride, titanium nitride, or the like and tungsten, molybdenum, copper, or the like can be employed. A conductive film to be the conductor 240 can be deposited by a sputtering method, a CVD method, an MBE method, a PLD method, an ALD method, or the like.

Next, CMP treatment is performed to remove part of the conductive film to be the conductor 240a and the conductor 240b, so that the insulator 281 is exposed. As a result, the conductive film remains only in the openings, so that the conductor 240a and the conductor 240b having flat top surfaces can be formed (see FIG. 10). Note that the insulator 281 is partly removed by the CMP treatment in some cases.

Through the above process, the transistor 200 illustrated in FIG. 10 can be manufactured. As illustrated in FIG. 11 to FIG. 16, with the use of the method for manufacturing the transistor in this embodiment, the transistor 200 can be manufactured.

According to one embodiment of the present invention, a display device that includes small-sized transistors and has high definition can be provided. Alternatively, a display device that includes a transistor with high on-state current and has high luminance can be provided. Alternatively, a display device that includes a transistor operating at high speed and operates at high speed can be provided. Alternatively, a highly reliable display device that includes a transistor having stable electrical characteristics can be provided. Alternatively, a display device that includes a transistor with low off-state current and has low power consumption can be provided.

The structure, method, and the like described above in this embodiment can be used in appropriate combination with structures, methods, and the like described in the other embodiments.

Examples of a transistor and a method for manufacturing a transistor that are different from those described above will be described. Note that in each transistor described below, components having the same functions as the components contained in the transistor shown in <Structure example of transistor> (see FIG. 10) are denoted by the same reference numerals. Note that as the materials of the components in each transistor, materials described in detail in <Structure example of transistor> can be used.

<Modification Example 1-1 of Transistor>

Figure 17A:
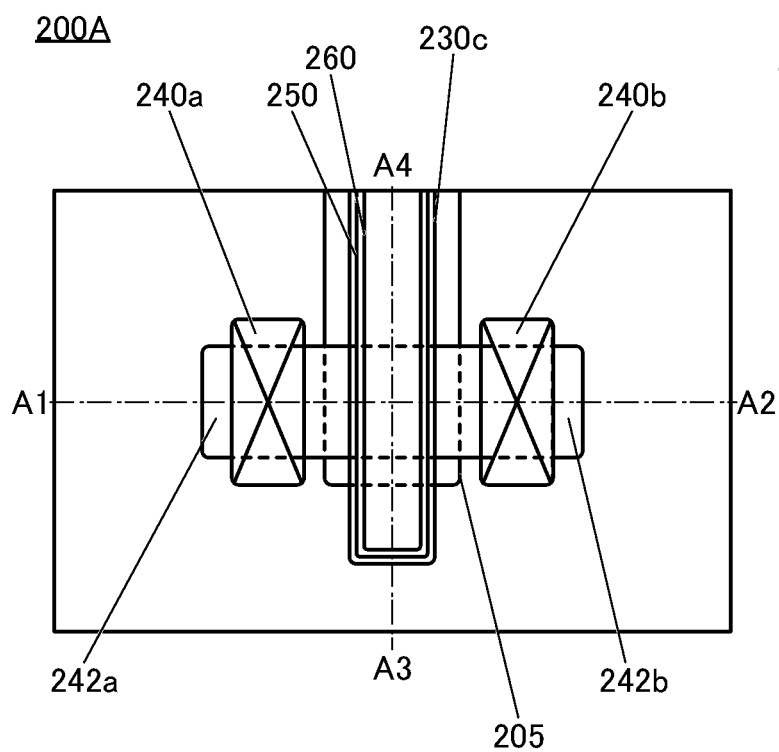
FIG. 17 (A) A top view of a transistor. (B), (C) Cross-sectional views of the transistor.
Figure 17C:
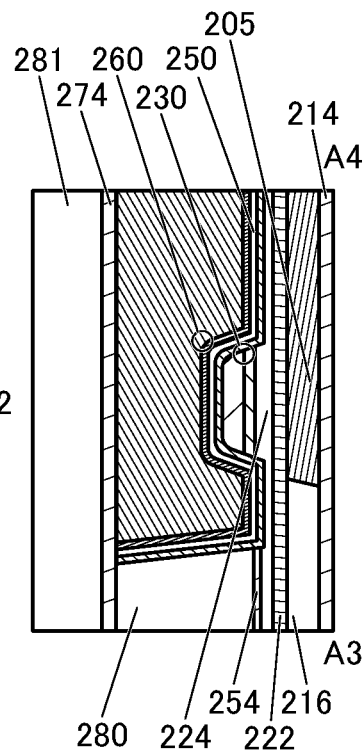
Figure 17B:
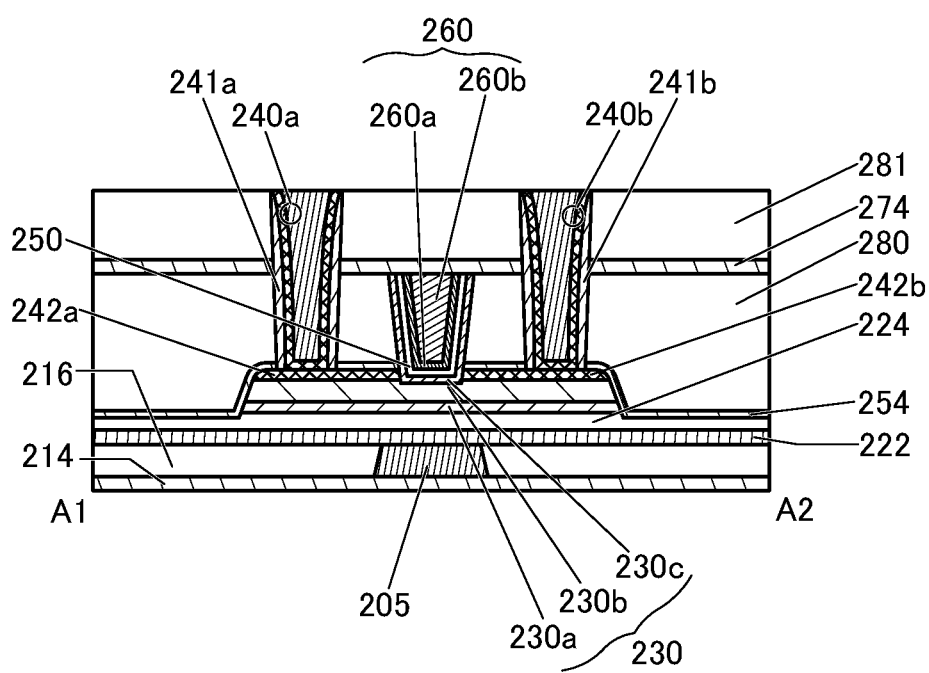
Figure 18A:
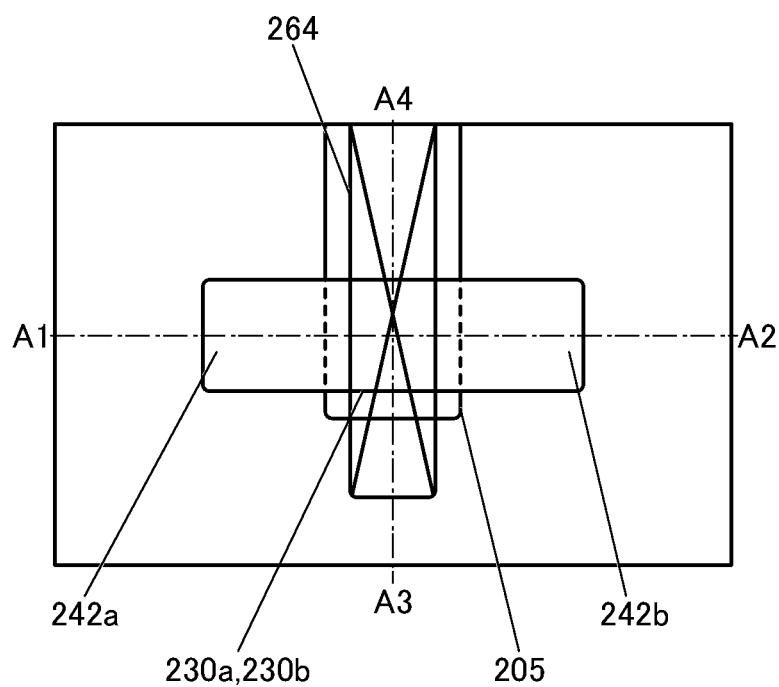
FIG. 18 (A) A top view illustrating a method for manufacturing a transistor. (B), (C) Cross-sectional views illustrating the method for manufacturing a transistor.
Figure 18C:
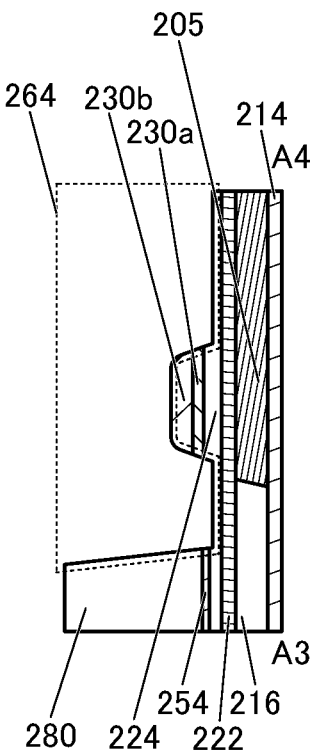
Figure 18B:
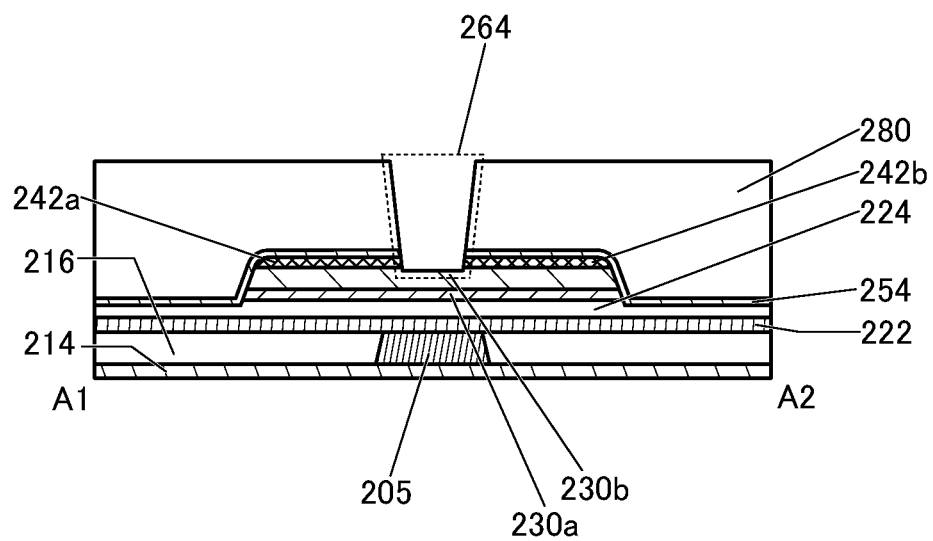

FIG. 17(A), FIG. 17(B), and FIG. 17(C) are a top view and cross-sectional views of a transistor 200A that can be used in a display device according to one embodiment of the present invention and a periphery of the transistor 200A. The transistor 200A can be applied to transistors included in the pixel portion 702, the source driver circuit portion 704, and the gate driver circuit portion 706. In addition, a method for manufacturing the transistor 200A is illustrated in FIG. 18. In addition, (A) in each of FIG. 17 and FIG. 18 is a top view. Furthermore, (B) in each drawing is a cross-sectional view corresponding to a portion indicated by a dashed-dotted line A1-A2 in FIG. 17(A), and is also a cross-sectional view of the transistor 200A in the channel length direction. Moreover, (C) in each drawing is a cross-sectional view corresponding to a portion indicated by a dashed-dotted line A3-A4 in FIG. 17(A), and is also a cross-sectional view of the transistor 200A in the channel width direction. For clarity of the drawing, some components are not illustrated in the top view of (A) in each drawing.

The transistor 200 illustrated in FIG. 17 differs from the transistor 200 illustrated in FIG. 10 in that the insulator 244 is not included and the insulator 254 is provided between the insulator 280 and the insulator 224, the oxide 230a, the oxide 230b, the conductor 242a, and the conductor 242b. That is, the transistor 200A illustrated in FIG. 17 has a structure in which the side surface of the oxide 230c is in contact with the insulator 280.

In addition, in the transistor 200A illustrated in FIG. 17, the side surfaces of the conductor 242a and the conductor 242b on the conductor 260 side have tapered shapes. Here, the angle formed between the side surfaces and bottom surfaces of the conductor 242a and the conductor 242b is greater than or equal to 10° and less than or equal to 80°, preferably greater than or equal to 30° and less than or equal to 60°. Thus, the contribution of the electric field of the conductor 260 can be increased also in regions of the oxide 230 that are in the vicinity of the conductor 242a and the conductor 242b, and the on-state current and frequency characteristics of the transistor 200A can be improved. Note that the transistor 200A illustrated in FIG. 17 is not limited to this, and the side surfaces of the conductor 242a and the conductor 242b may be substantially perpendicular to the bottom surfaces. Alternatively, the side surfaces of the conductor 242a and the conductor 242b that face each other may have a plurality of surfaces.

The transistor 200A illustrated in FIG. 17 is preferable because the transistor 200A can be manufactured without forming the dummy gate 262 and thus the manufacturing process of the transistor can be simplified.

The method for manufacturing the transistor 200A illustrated in FIG. 17 up to the formation of the oxide 230a, the oxide 230b, and the conductor layer 242B is similar to the method for manufacturing the transistor 200 illustrated in FIG. 10. Therefore, the method for manufacturing the transistor 200 in FIG. 11 and FIG. 12 can be referred to.

Next, an insulating film to be the insulator 254 is deposited over the insulator 224, the oxide 230a, the oxide 230b, and the conductor layer 242B.

Next, the insulating film to be the insulator 280 is deposited over the insulating film to be the insulator 254. The insulating film to be the insulator 280 can be deposited by a sputtering method, a CVD method, an MBE method, a PLD method, an ALD method, or the like. Next, the insulating film to be the insulator 280 is subjected to CMP treatment, so that the insulator 280 having a flat top surface is formed.

Next, part of the insulator 280, part of the insulating film to be the insulator 254, and part of the conductor layer 242B are removed to form an opening 264 reaching the oxide 230b (see FIG. 18). The opening is preferably formed to overlap with the oxide 230a, the oxide 230b, and the conductor 205. The conductor 242a, the conductor 242b, and the insulator 254 are formed by forming the opening 264. Here, the part of the top surface of the oxide 230b that is exposed between the conductor 242a and the conductor 242b is removed in some cases.

Although a wet etching method may be employed for the formation of the opening 264, a dry etching method is preferably employed because microfabrication is possible. In addition, the opening 264 is preferably formed with a hard mask formed over the insulator 280. As the hard mask, a conductor may be used or an insulator may be used.

In addition, the part of the insulator 280, the part of the insulating film to be the insulator 254, and the part of the conductor may be processed under different conditions. For example, the part of the insulator 280 may be processed by a dry etching method, the part of the insulating film to be the insulator 254 may be processed by a wet etching method, and the part of the conductor layer 242B may be processed by a dry etching method.

The following steps in the method for manufacturing the transistor 200A illustrated in FIG. 17 are similar to those in the method for manufacturing the transistor 200 illustrated in FIG. 10. Therefore, the method for manufacturing the transistor 200 in FIG. 15 and FIG. 16 can be referred to.

<Modification Example 1-2 of Transistor>

Figure 19A:
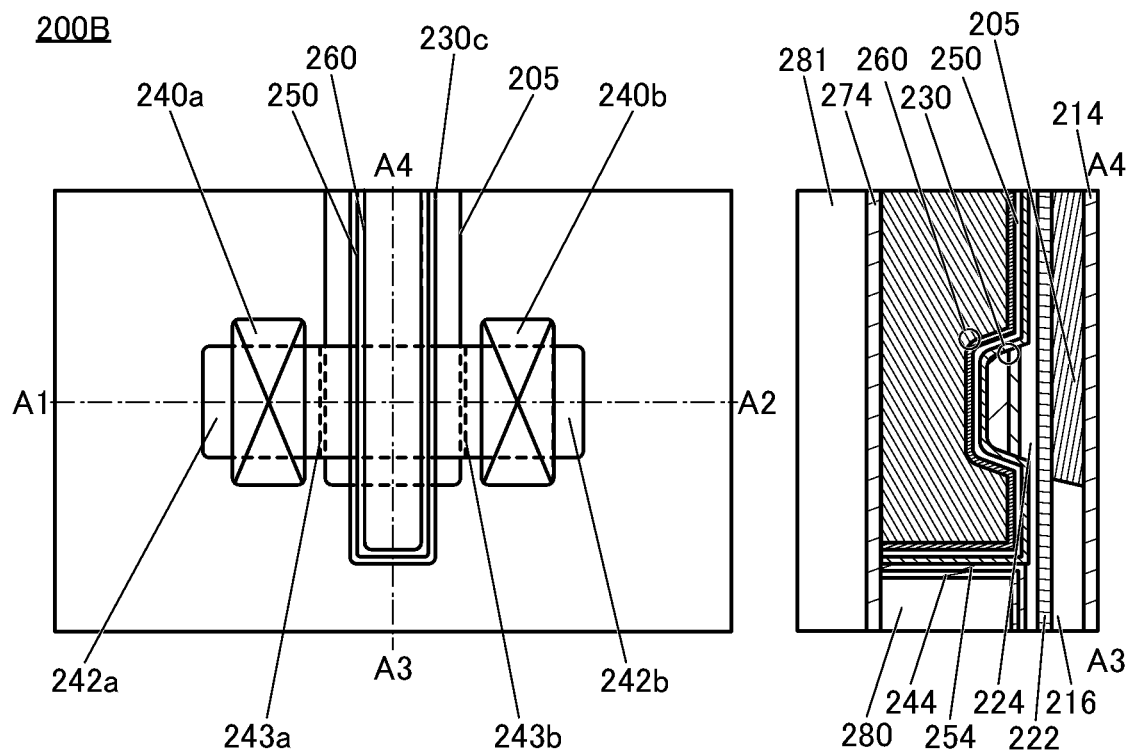
FIG. 19 (A) A top view of a transistor. (B), (C) Cross-sectional views of the transistor.
Figure 19C:
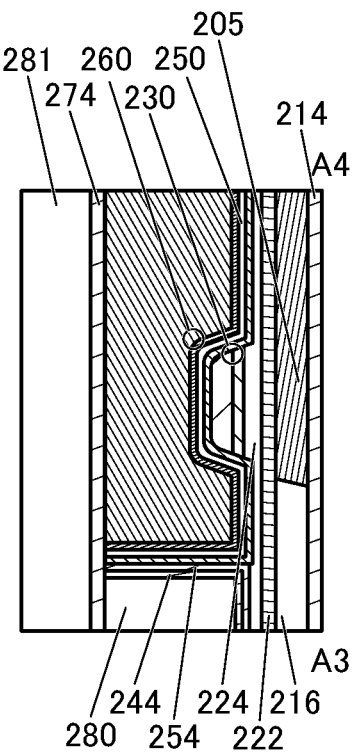
Figure 19B:
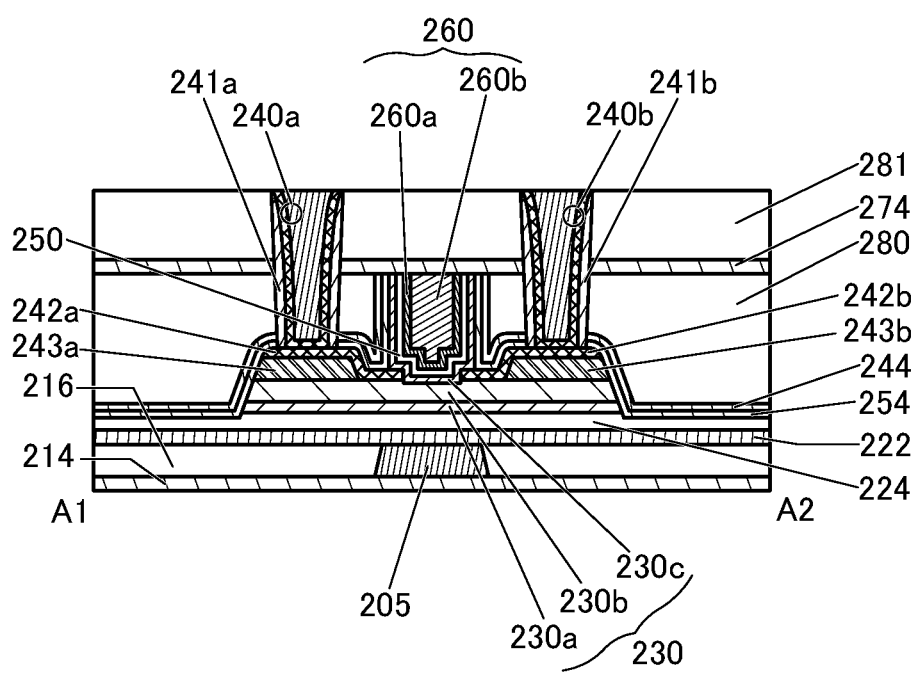

FIG. 19(A), FIG. 19(B), and FIG. 19(C) are a top view and cross-sectional views of a transistor 200B that can be used in a display device according to one embodiment of the present invention and a periphery of the transistor 200B. The transistor 200B can be applied to transistors included in the pixel portion 702, the source driver circuit portion 704, and the gate driver circuit portion 706. In addition, a method for manufacturing the transistor 200B is illustrated in FIG. 20 to FIG. 24. In addition, (A) in each of FIG. 19 to FIG. 24 is a top view. Furthermore, (B) in each drawing is a cross-sectional view corresponding to a portion indicated by a dashed-dotted line A1-A2 in FIG. 19(A), and is also a cross-sectional view of the transistor 200B in the channel length direction. Moreover, (C) in each drawing is a cross-sectional view corresponding to a portion indicated by a dashed-dotted line A3-A4 in FIG. 19(A), and is also a cross-sectional view of the transistor 200B in the channel width direction. For clarity of the drawing, some components are not illustrated in the top view of (A) in each drawing.

The transistor 200B illustrated in FIG. 19 differs from the transistor 200 illustrated in FIG. 10 in that a conductor 243a is provided between the conductor 242a and the oxide 230b and a conductor 243b is provided between the conductor 242b and the oxide 230b. Here, the conductor 242a (the conductor 242b) is provided in contact with a top surface and a side surface on the conductor 260 side of the conductor 243a (the conductor 243b) and the top surface of the oxide 230b. Here, as the conductor 243, a conductor that can be used as the conductor 242 is used. Furthermore, the thickness of the conductor 243 is preferably larger than at least that of the conductor 242.

In addition, the transistor 200B illustrated in FIG. 19 differs from the transistor 200 illustrated in FIG. 10 in that the distance between the conductor 242a and the conductor 242b is shorter than the length of the opening 263 formed in the insulator 280, the insulator 244, and the insulator 254 in the channel length direction.

When the transistor 200B illustrated in FIG. 19 has the above structure, the contribution of the electric field of the conductor 260 can be increased also in the regions of the oxide 230 in the vicinity of the conductor 242a and the conductor 242b. Thus, the substantial channel length of the transistor 200 can be shortened, so that the on-state current and the frequency characteristics can be improved.

In addition, the conductor 243a (the conductor 243b) is preferably provided to overlap with the conductor 240a (the conductor 240b). With this structure, in etching for forming an opening in which the conductor 240a (the conductor 240b) is to be embedded, overetching of the oxide 230b can be prevented because the conductor 243a (the conductor 243b) is provided in a bottom portion of the opening.

In addition, in the transistor 200B illustrated in FIG. 19, the side surfaces of the conductor 242a and the conductor 242b on the conductor 260 side have substantially perpendicular shapes. Note that the transistor 200B illustrated in FIG. 19 is not limited thereto, and the angle formed between the side surfaces and bottom surfaces of the conductor 242a and the conductor 242b may be greater than or equal to 10° and less than or equal to 80°, preferably greater than or equal to 30° and less than or equal to 60°. Alternatively, the side surfaces of the conductor 242a and the conductor 242b that face each other may have a plurality of surfaces.

The method for manufacturing the transistor 200B illustrated in FIG. 19 up to the deposition of the oxide film 230B to be the oxide 230b is similar to the method for manufacturing the transistor illustrated in FIG. 10. Therefore, the method for manufacturing the transistor in FIG. 11 can be referred to.

Next, a conductive film to be the conductor layer 243A is deposited over the oxide film 230B. The conductive film to be the conductor layer 243A can be deposited by a sputtering method, a CVD method, an MBE method, a PLD method, an ALD method, or the like.

Figure 20A:
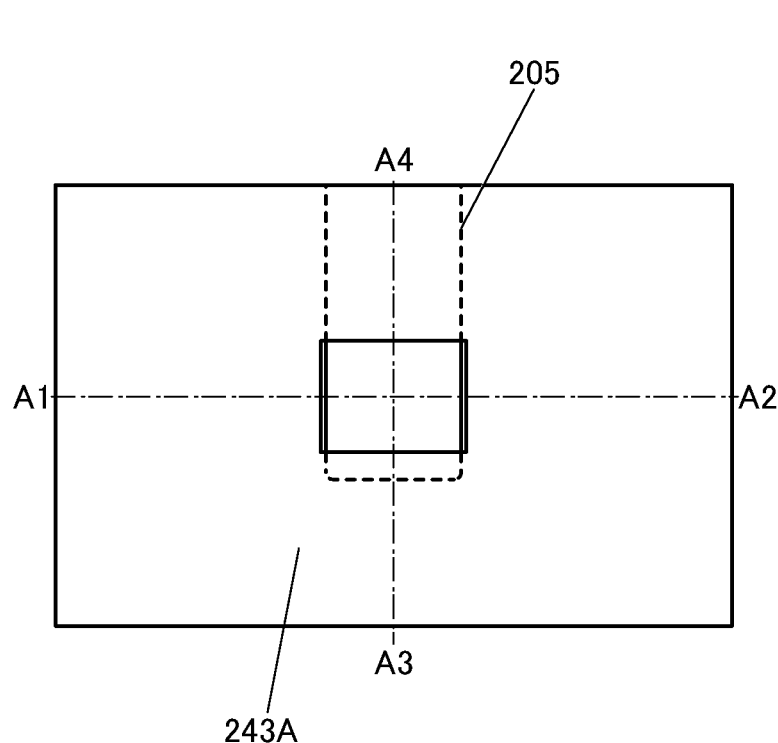
FIG. 20 (A) A top view illustrating a method for manufacturing a transistor. (B), (C) Cross-sectional views illustrating the method for manufacturing a transistor.
Figure 20C:
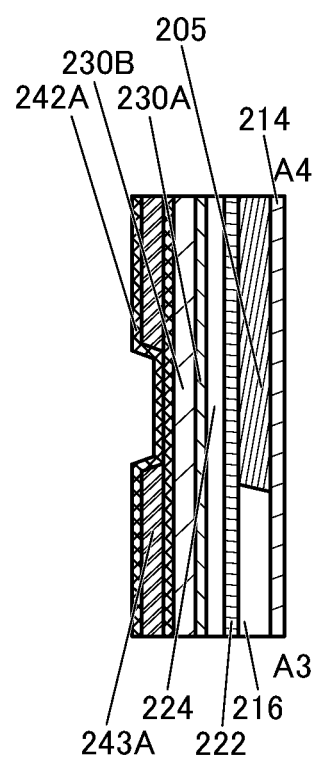
Figure 20B:
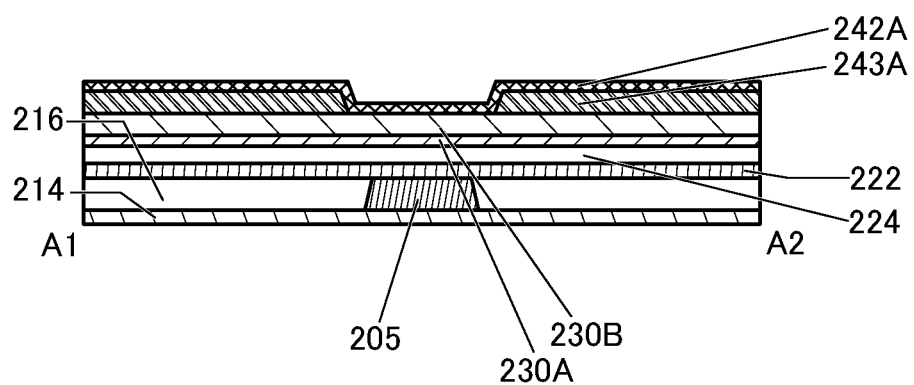
Figure 21A:
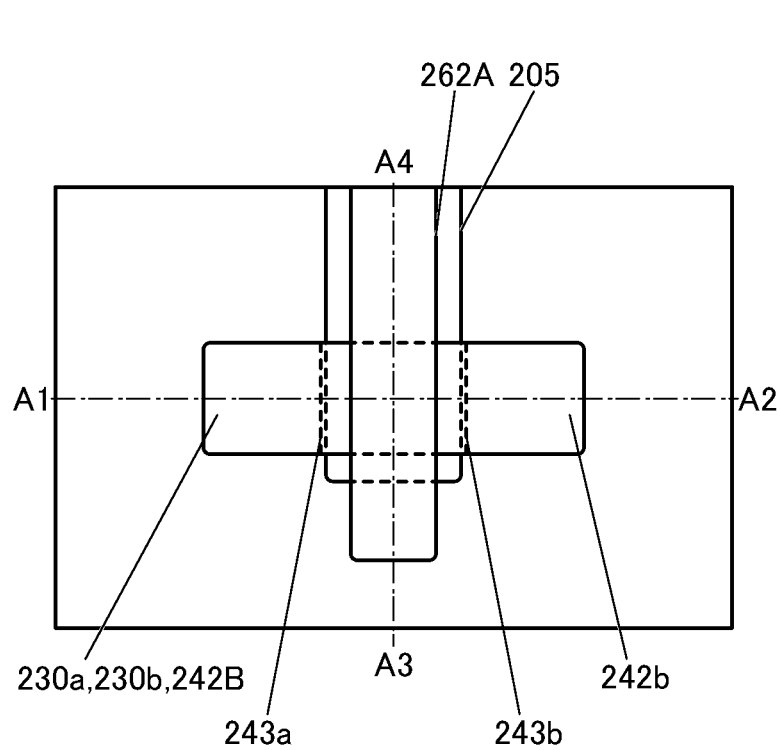
FIG. 21 (A) A top view illustrating a method for manufacturing a transistor. (B), (C) Cross-sectional views illustrating the method for manufacturing a transistor.
Figure 21C:
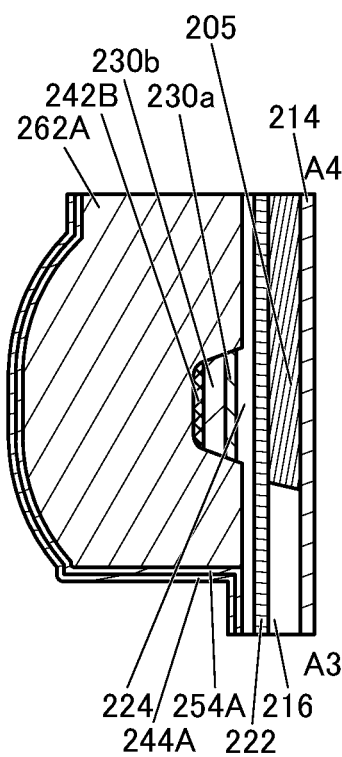
Figure 21B:
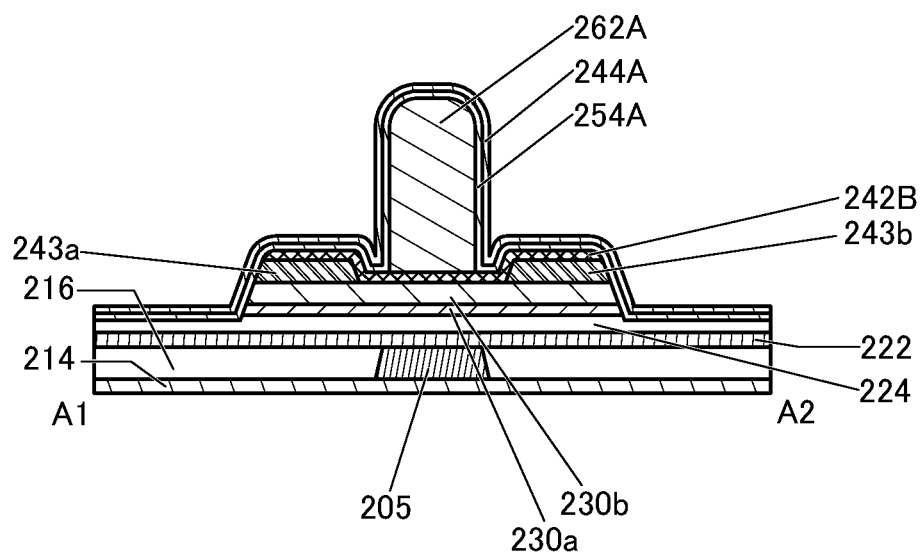

Next, part of the conductive film to be the conductor layer 243A is removed to form the conductor layer 243A (see FIG. 20). Although the conductor layer 243A has an opening in FIG. 20, this embodiment is not limited thereto. In this step, a portion of the conductive film to be the conductor layer 243A that corresponds to a region between the conductor 243a and the conductor 243b is removed. For example, the conductive film to be the conductor layer 243A may be divided into an island-shaped conductor corresponding to the conductor 243a and an island-shaped conductor corresponding to the conductor 243b.

The conductive film to be the conductor layer 243A is processed by a lithography method. In addition, a dry etching method or a wet etching method can be used for the processing. Processing by a dry etching method is suitable for microfabrication.

Next, the conductive film 242A is deposited over the oxide 230b and the conductor layer 243A. For the deposition of the conductive film 242A, the method for manufacturing the transistor in FIG. 12 can be referred to.

The following steps up to the formation of the dummy gate layer 262A and the deposition of the insulating film 254A and the insulating film 244A (see FIG. 21) are similar to those in the method for manufacturing the transistor illustrated in FIG. 10. Therefore, the method for manufacturing the transistor in FIG. 12 and FIG. 13 can be referred to.

For example, aluminum oxide may be deposited for the insulating film 244A while the substrate is heated at a high temperature. The substrate heating temperature during the deposition of the insulating film 244A is higher than or equal to 200° C., preferably higher than or equal to 250° C., further preferably higher than or equal to 350° C. In that case, the deposition of aluminum oxide for the insulating film 254A by an ALD method can prevent the dummy gate layer 262A from being deformed when the insulating film 244A is deposited at the above temperature.

Alternatively, fluorine may be added after deposition of either one or both of the insulating film 244A and the insulating film 254A. Fluorine can be added to either one or both of the insulating film 244A and the insulating film 254A in such a manner that plasma treatment is performed in an atmosphere containing a fluorine-based gas (e.g., $CF_4$ or the like) or doping of a gas containing fluorine is performed. When fluorine is added to either one or both of the insulating film 244A and the insulating film 254A, hydrogen contained in the film is expected to be terminated or be subjected to gettering by fluorine.

Next, the insulating film to be the insulator 280 is deposited over the insulating film 244A. The insulating film to be the insulator 280 can be deposited by a sputtering method, a CVD method, an MBE method, a PLD method, an ALD method, or the like.

Next, the insulating film to be the insulator 280, the dummy gate layer 262A, the insulating film 254A, and the insulating film 244A are partly removed until part of the dummy gate layer 262A is exposed, so that the insulator 280, the dummy gate 262, the insulator 254, and the insulator 244 are formed. CMP treatment is preferably employed for forming the insulator 280, the dummy gate 262, the insulator 254, and the insulator 244. The method for manufacturing the transistor in FIG. 14 can be referred to for the details.

Next, the dummy gate 262 is removed to form the opening 263 (see FIG. 15). The dummy gate 262 can be removed by wet etching, dry etching, ashing, or the like. Alternatively, a plurality of above treatments may be performed in appropriate combination. For example, wet etching treatment may be performed after ashing treatment. By removing the dummy gate 262, part of the surface of the conductor layer 242B is exposed through the opening 263.

Figure 22A:
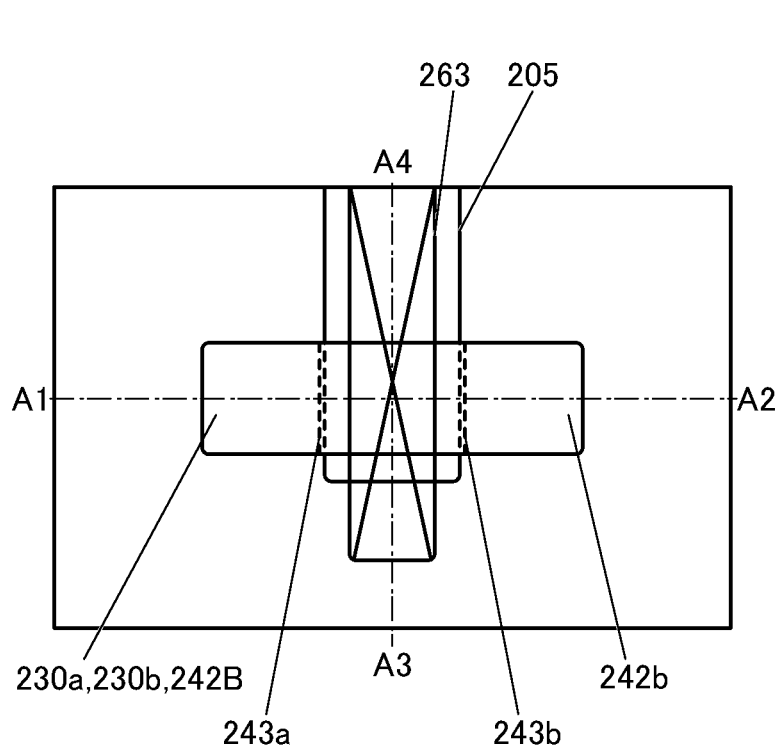
FIG. 22 (A) A top view illustrating a method for manufacturing a transistor. (B), (C) Cross-sectional views illustrating the method for manufacturing a transistor.
Figure 22C:
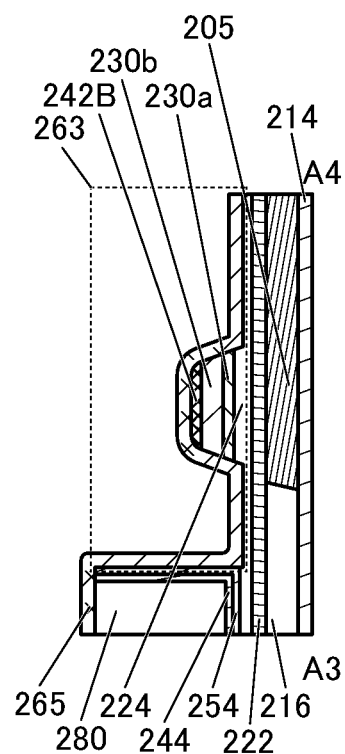
Figure 22B:
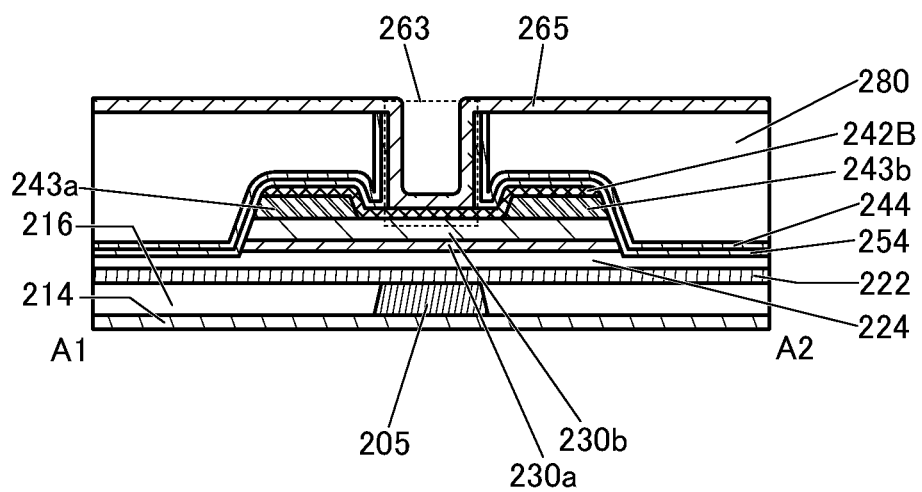
Figure 23A:
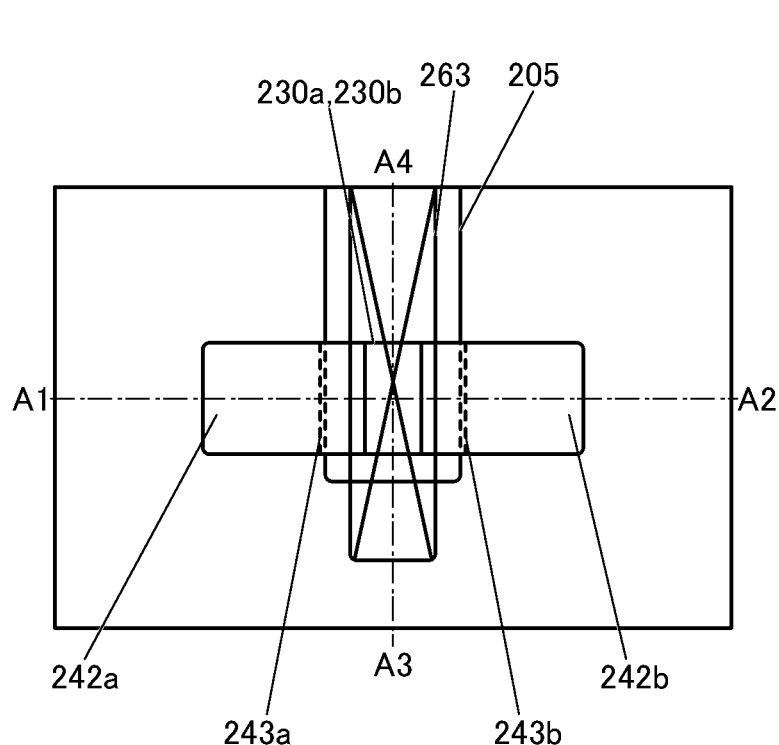
FIG. 23 (A) A top view illustrating a method for manufacturing a transistor. (B), (C) Cross-sectional views illustrating the method for manufacturing a transistor.
Figure 23C:
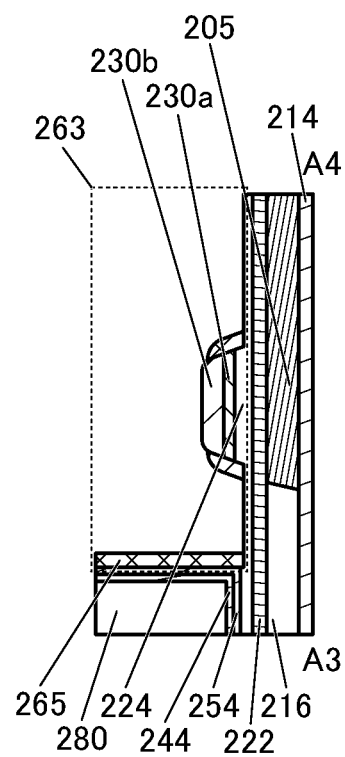
Figure 23B:
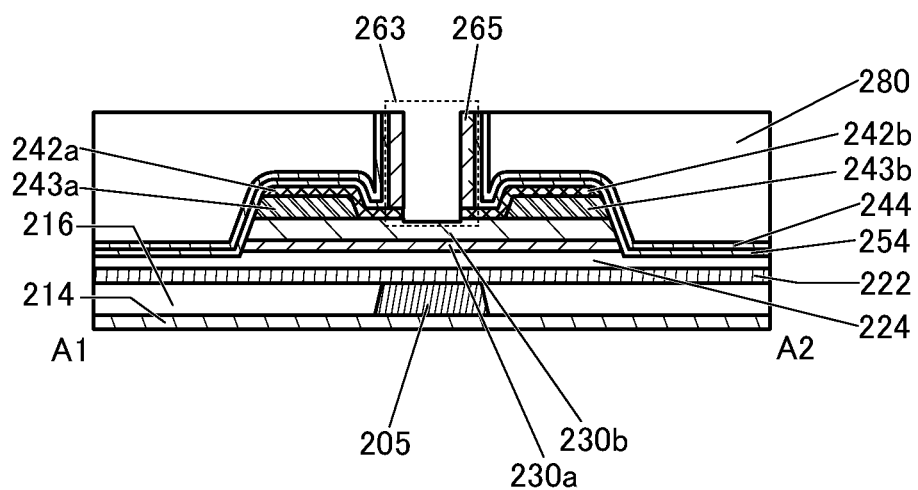

Next, a dummy film 265 is deposited over the insulator 280, the insulator 244, the insulator 254, and the conductor layer 242B (see FIG. 22). The dummy film 265 needs to be deposited on a sidewall of the opening 263; the distance between the conductor 242a and the conductor 242b, that is, the substantial channel length is determined by the thickness of the dummy film. Thus, the dummy film 265 is preferably deposited by an ALD method that provides good coverage and makes fine adjustment of the thickness comparatively easily. The thickness of the dummy film 265 is set as appropriate depending on characteristics required for the transistor 200B. For example, when the thickness of the dummy film 265 is set to 5 nm, the channel length can be substantially reduced by 10 nm. Note that it is preferable to use a film that can be easily processed minutely and easily removed as the dummy film 265 because the dummy film 265 is finally removed.

Next, the dummy film 265 is subjected to anisotropic etching so that only a portion of the dummy film 265 that is in contact with the sidewall of the opening 263 remains. In addition, the conductor 242a and the conductor 242b are formed by etching the conductor layer 242B using the remaining dummy film 265 as a mask (see FIG. 23). Note that etching of the dummy film 265 and etching of the conductor layer 242B may be performed successively. Furthermore, in some cases, the top surface of the oxide 230b that is exposed through the region between the conductor 242a and the conductor 242b is partly removed.

Here, the conductor 242a and the conductor 242b are formed using the remaining dummy film 265 as a mask. Thus, the opening 263 formed in the insulator 280, the insulator 244, and the insulator 254 overlaps with the region between the conductor 242a and the conductor 242b. In this manner, the conductor 260 can be provided between the conductor 242a and the conductor 242b in a self-aligned manner in a later step.

Figure 24A:
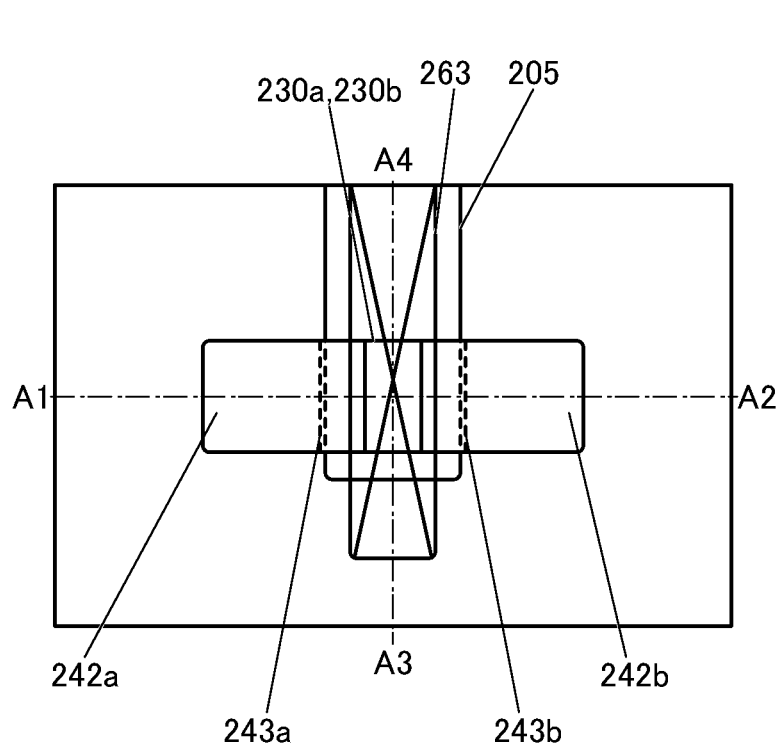
FIG. 24 (A) A top view illustrating a method for manufacturing a transistor. (B), (C) Cross-sectional views illustrating the method for manufacturing a transistor.
Figure 24C:
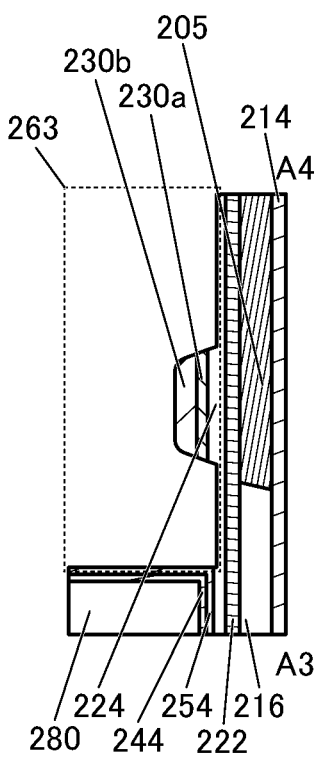
Figure 24B:
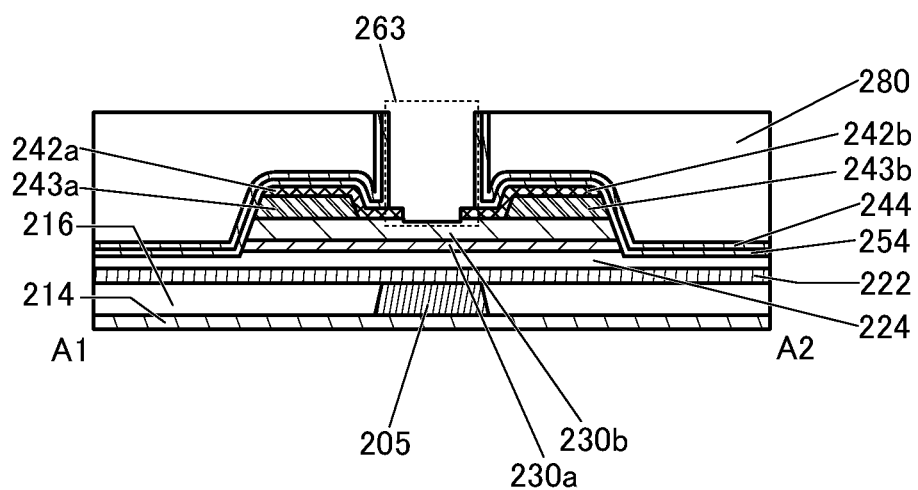

Then, the remaining dummy film 265 is selected and removed by isotropic etching (see FIG. 24). As the isotropic etching, wet etching or etching using a reactive gas is used, for example. In this manner, the distance between the conductor 242a and the conductor 242b can be shorter than the length of the opening 263 in the channel length direction.

The following steps in the method for manufacturing the transistor illustrated in FIG. 19 are similar to those in the method for manufacturing the transistor illustrated in FIG. 10. Therefore, the method for manufacturing the transistor in FIG. 15 and FIG. 16 can be referred to.

<Modification Example 1-3 of Transistor>

Figure 25A:
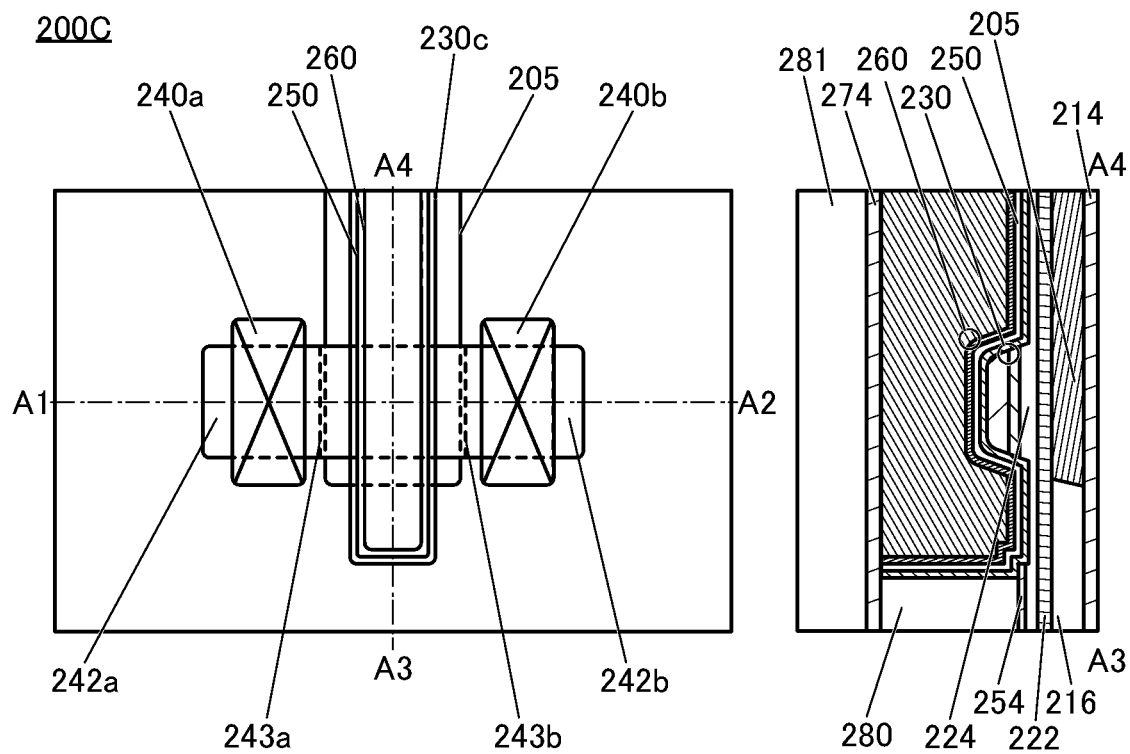
FIG. 25 (A) A top view of a transistor. (B), (C) Cross-sectional views of the transistor.
Figure 25C:
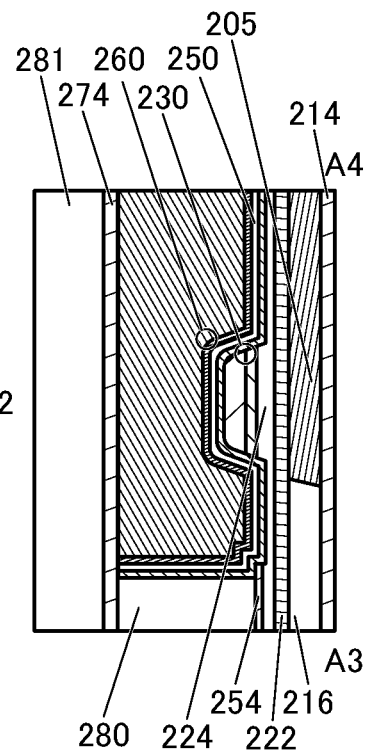
Figure 25B:
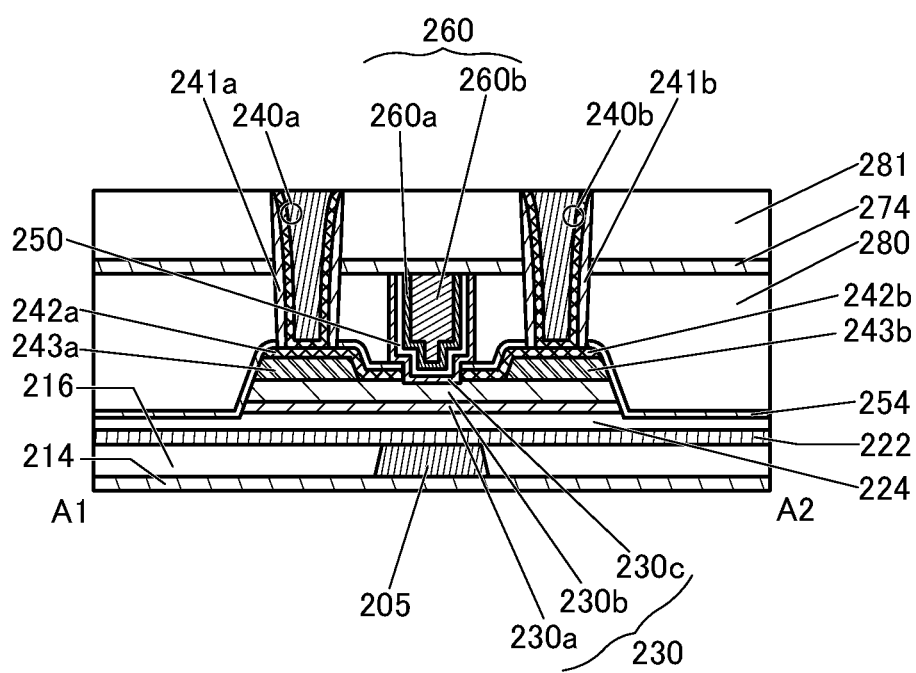
Figure 26A:
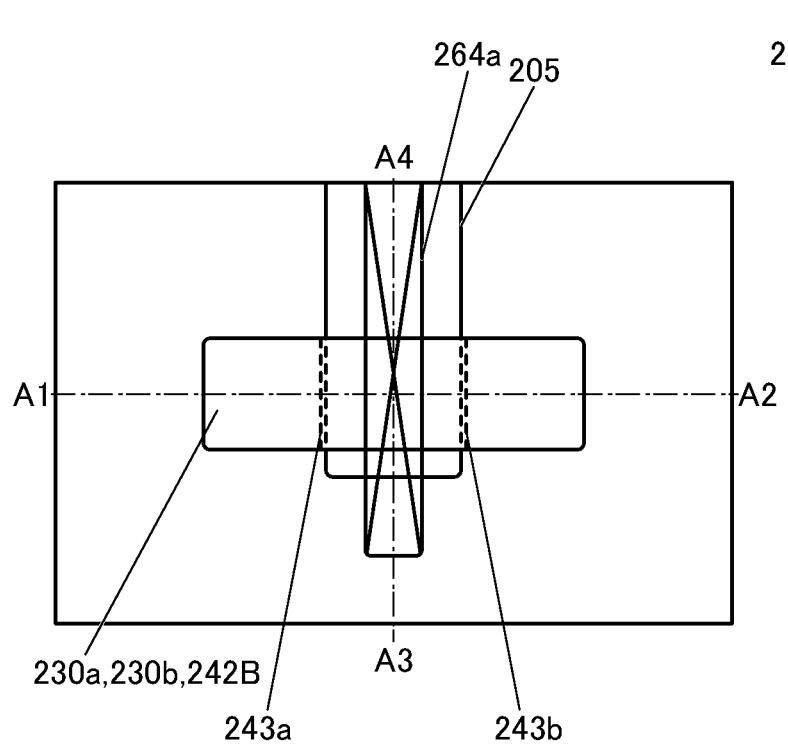
FIG. 26 (A) A top view illustrating a method for manufacturing a transistor. (B), (C) Cross-sectional views illustrating the method for manufacturing a transistor.
Figure 26C:
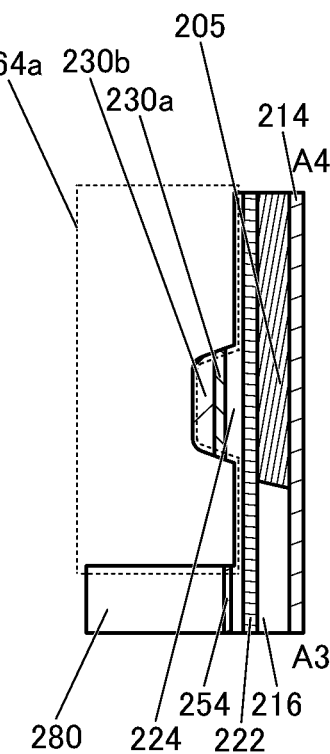
Figure 26B:
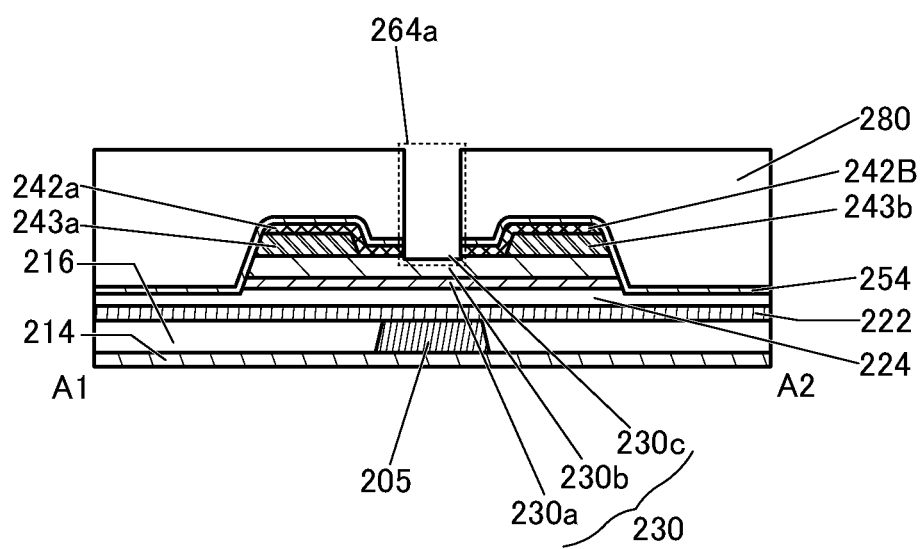
Figure 27A:
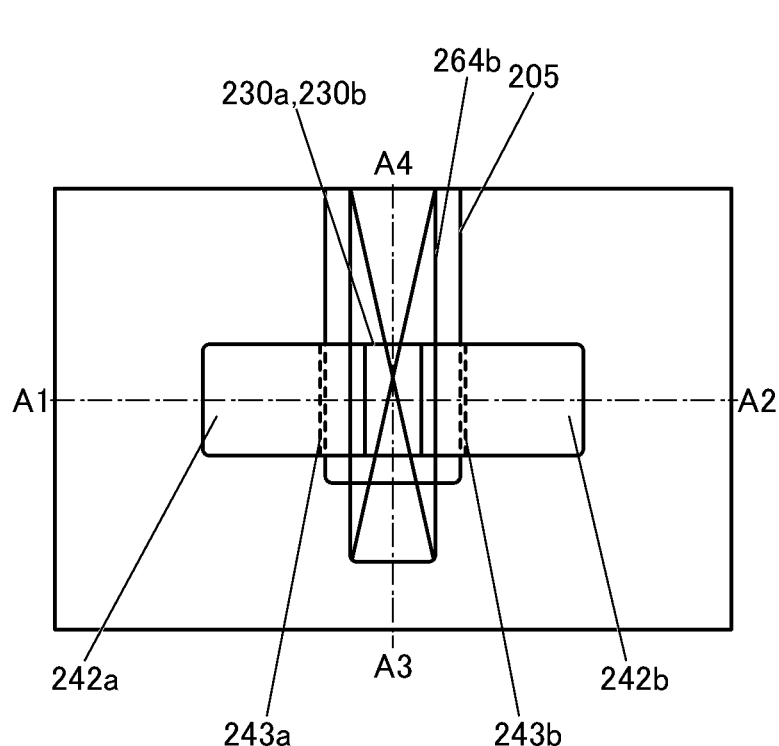
FIG. 27 (A) A top view illustrating a method for manufacturing a transistor. (B), (C) Cross-sectional views illustrating the method for manufacturing a transistor.
Figure 27C:
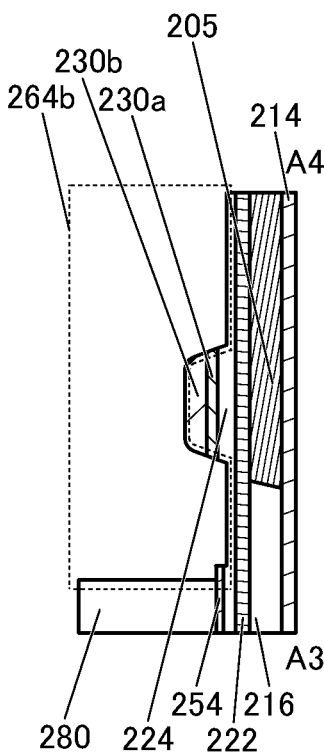
Figure 27B:
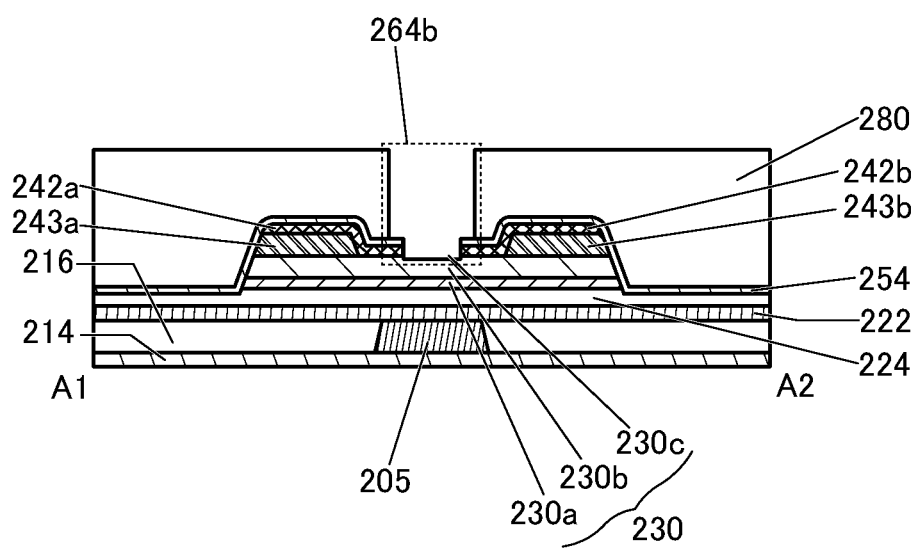

FIG. 25(A), FIG. 25(B), and FIG. 25(C) are a top view and cross-sectional views of a transistor 200C that can be used in a display device according to one embodiment of the present invention and a periphery of the transistor 200C. The transistor 200C can be applied to transistors included in the pixel portion 702, the source driver circuit portion 704, and the gate driver circuit portion 706. In addition, a method for manufacturing the transistor 200C is illustrated in FIG. 26 and FIG. 27. In addition, (A) in each of FIG. 25 to FIG. 27 is a top view. Furthermore, (B) in each drawing is a cross-sectional view corresponding to a portion indicated by a dashed-dotted line A1-A2 in FIG. 25(A), and is also a cross-sectional view of the transistor 200C in the channel length direction. Moreover, (C) in each drawing is a cross-sectional view corresponding to a portion indicated by a dashed-dotted line A3-A4 in FIG. 25(A), and is also a cross-sectional view of the transistor 200C in the channel width direction. For clarity of the drawing, some components are not illustrated in the top view of (A) in each drawing.

The transistor 200C illustrated in FIG. 25 differs from the transistor 200B illustrated in FIG. 19 in that the insulator 244 is not included and the insulator 254 is provided between the insulator 280 and the insulator 224, the oxide 230a, the oxide 230b, the conductor 242a, and the conductor 242b. That is, the transistor 200C illustrated in FIG. 25 has a structure in which the side surface of the oxide 230c is in contact with the insulator 280.

In the transistor 200C illustrated in FIG. 25, side surfaces of the conductor 242a and the conductor 242b on the conductor 260 side have substantially perpendicular shapes. Note that the transistor 200C illustrated in FIG. 25 is not limited thereto, and the angle formed between the side surfaces and bottom surfaces of the conductor 242a and the conductor 242b may be greater than or equal to 10° and less than or equal to 80°, preferably greater than or equal to 30° and less than or equal to 60°. Alternatively, the side surfaces of the conductor 242a and the conductor 242b that face each other may have a plurality of surfaces.

The transistor 200C illustrated in FIG. 25 is preferable because the transistor 200C can be manufactured without forming the dummy gate 262 and thus the manufacturing process of the transistor can be simplified.

The method for manufacturing the transistor 200C illustrated in FIG. 25 up to the formation of the oxide 230a, the oxide 230b, the conductor 242a, the conductor 242b, and the conductor layer 242B is similar to the method for manufacturing the transistor 200B illustrated in FIG. 19. Therefore, the method for manufacturing the transistor in FIG. 11, FIG. 12, and FIG. 20 can be referred to.

Next, an insulating film to be the insulator 254 is deposited over the insulator 224, the oxide 230a, the oxide 230b, the conductor 242a, the conductor 242b, and the conductor layer 242B.

Next, the insulating film to be the insulator 280 is deposited over the insulating film to be the insulator 254. The insulating film to be the insulator 280 can be deposited by a sputtering method, a CVD method, an MBE method, a PLD method, an ALD method, or the like. Next, the insulating film to be the insulator 280 is subjected to CMP treatment, so that the insulator 280 having a flat top surface is formed.

Next, part of the insulator 280, part of the insulating film to be the insulator 254, and part of the conductor layer 242B are removed to form an opening 264a reaching the oxide 230b (see FIG. 26). The opening is preferably formed to overlap with the oxide 230a, the oxide 230b, and the conductor 205. The conductor 242a, the conductor 242b, and the insulator 254 are formed by forming the opening 264. Here, the part of the top surface of the oxide 230b that is exposed between the conductor 242a and the conductor 242b is removed in some cases.

Although a wet etching method may be employed for the formation of the opening 264, a dry etching method is preferably employed because microfabrication is possible. In addition, the opening 264 is preferably formed with a hard mask formed over the insulator 280. As the hard mask, a conductor may be used or an insulator may be used.

In addition, the part of the insulator 280, the part of the insulating film to be the insulator 254, and the part of the conductor may be processed under different conditions. For example, the part of the insulator 280 may be processed by a dry etching method, the part of the insulating film to be the insulator 254 may be processed by a wet etching method, and the part of the conductor layer 242B may be processed by a dry etching method.

Next, the opening 264a in the insulator 280 is subjected to side etching to form an opening 264b (see FIG. 27). As the side etching of the insulator 280, isotropic etching such as wet etching or etching using a reactive gas is used. For example, when a side wall of the opening 264b is recessed from the opening 264a by 5 nm, the conductor 242a (the conductor 242b) can be protruded from the side wall of the opening 264b by 5 nm. In this manner, the distance between the conductor 242a and the conductor 242b can be shorter than the length of the opening 264b in the channel length direction.

The following steps in the method for manufacturing the transistor illustrated in FIG. 25 are similar to those in the method for manufacturing the transistor illustrated in FIG. 10. Therefore, the method for manufacturing the transistor in FIG. 15 and FIG. 16 can be referred to.

<Modification Example 2-1 of Transistor>

FIG. 28(A), FIG. 28(B), and FIG. 28(C) are a top view and cross-sectional views of a transistor 200D that can be used in a display device according to one embodiment of the present invention and a periphery of the transistor 200D. The transistor 200D can be applied to transistors included in the pixel portion 702, the source driver circuit portion 704, and the gate driver circuit portion 706.

Figure 29:
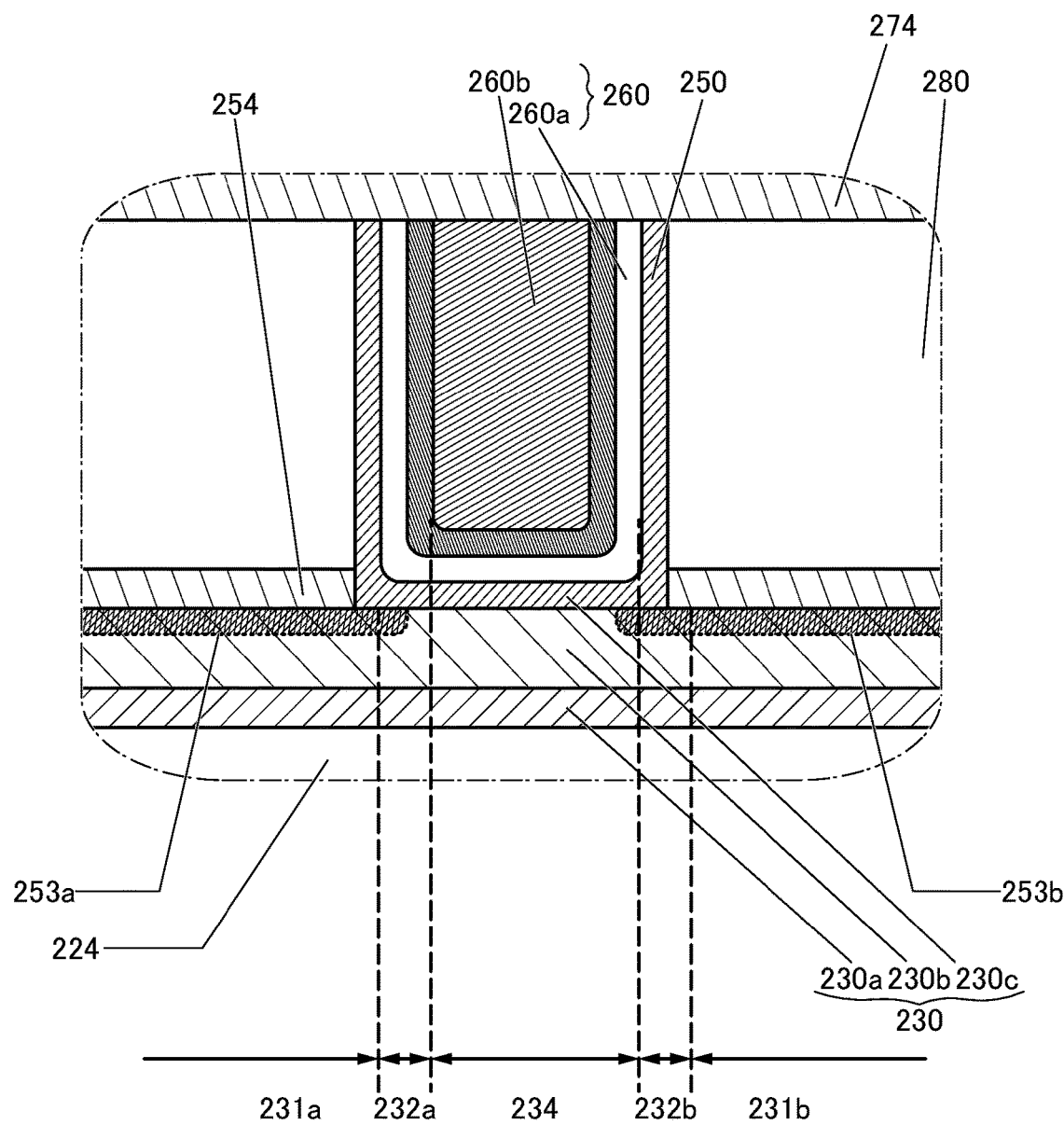
FIG. 29 A cross-sectional view of a transistor.

FIG. 28(A) is a top view of the transistor 200D. FIG. 28(B) and FIG. 28(C) are cross-sectional views of the transistor 200D. Here, FIG. 28(B) is a cross-sectional view of a portion indicated by a dashed-dotted line A1-A2 in FIG. 28(A), and is a cross-sectional view in the channel length direction of the transistor 200D. In addition, FIG. 28(C) is a cross-sectional view of a portion indicated by a dashed-dotted line A3-A4 in FIG. 28(A), and is a cross-sectional view in the channel width direction of the transistor 200D. Note that for clarity of the drawing, some components in the top view in FIG. 28(A) are omitted. Furthermore, FIG. 29 is an enlarged view of the oxide 230b in FIG. 28(B) and its vicinity.

In the examples of the display device 700A illustrated in FIG. 4, FIG. 5, FIG. 7, and FIG. 9, the transistor 200D illustrated in FIG. 28(A), FIG. 28(B), and FIG. 28(C) is applied to the transistor 750A, a transistor 752A, and the transistor 754A.

As illustrated in FIG. 28, the transistor 200D includes the oxide 230a provided over a substrate (not illustrated); the oxide 230b provided over the oxide 230a; a layer 253a and a layer 253b formed on the top surface of the oxide 230b to be apart from each other; the insulator 280 that is provided over the oxide 230b and is provided with an opening formed to overlap with a portion between the layer 253a and the layer 253b; the conductor 260 provided in the opening; the insulator 250 provided between the conductor 260, and the oxide 230b and the insulator 280; and the oxide 230c provided between the insulator 250, and the oxide 230b and the insulator 280. Here, as illustrated in FIG. 28(B) and FIG. 28(C), the top surface of the conductor 260 is preferably substantially aligned with the top surfaces of the insulator 250, the oxide 230c, and the insulator 280.

Note that in the following description, the layer 253a and the layer 253b might be collectively referred to as a layer 253.

In addition, as illustrated in FIG. 28, the insulator 254 is preferably provided between the insulator 280, and the insulator 224, the oxide 230a, and the oxide 230b. Here, as illustrated in FIG. 28(B) and FIG. 28(C), the insulator 254 is preferably in contact with a top surface and a side surface of the layer 253a, a top surface and a side surface of the layer 253b, the side surfaces of the oxide 230a and the oxide 230b, and the top surface of the insulator 224. The insulator 254 is further preferably in contact with the side surface of the insulator 241 (the insulator 241a and the insulator 241b).

Here, the conductor 260 functions as a gate electrode of the transistor, and the layer 253a and the layer 253b each function as a source region or a drain region. As described above, the conductor 260 is formed to be embedded in the opening of the insulator 280 and the insulator 254 and a region between the layer 253a and the layer 253b. Here, the positions of the conductor 260, the layer 253a, and the layer 253b with respect to the opening of the insulator 280 and the insulator 254 are selected in a self-aligned manner. That is, in the transistor 200D, the gate electrode can be provided between a source electrode and a drain electrode in a self-aligned manner. Therefore, the conductor 260 can be formed without an alignment margin, resulting in a reduction in the area occupied by the transistor 200D. Accordingly, a high-definition display device can be provided. In addition, a display device with a narrow frame can be provided.

In addition, the insulator 274 and the insulator 281 functioning as interlayer films are preferably provided over the transistor 200D. Here, the insulator 274 is preferably provided in contact with the top surfaces of the conductor 260, the insulator 250, the oxide 230c, and the insulator 280.

It is preferable that the insulator 222, the insulator 254, and the insulator 274 have a function of inhibiting diffusion of hydrogen (e.g., at least one of a hydrogen atom, a hydrogen molecule, and the like). For example, the insulator 222, the insulator 254, and the insulator 274 preferably have lower hydrogen permeability than the insulator 224, the insulator 250, and the insulator 280. In addition, it is preferable that the insulator 222, the insulator 254, and the insulator 274 have a function of inhibiting diffusion of oxygen (e.g., at least one of an oxygen atom, an oxygen molecule, and the like). For example, the insulator 222, the insulator 254, and the insulator 274 preferably have lower oxygen permeability than the insulator 224, the insulator 250, and the insulator 280.

Here, the insulator 224, the oxide 230a, the oxide 230b, and the insulator 250 are apart from the insulator 280 and the insulator 281 with the insulator 254, the oxide 230c, and the insulator 274. Thus, the mixing of impurities such as hydrogen contained in the insulator 280 and the insulator 281 and excess oxygen into the insulator 224, the oxide 230a, the oxide 230b, and the insulator 250 can be inhibited.

In addition, the conductor 240 (the conductor 240a and the conductor 240b) that is electrically connected to the transistor 200D and functions as a plug is preferably provided. Note that the insulator 241 (the insulator 241a and the insulator 241b) is provided in contact with the side surface of the conductor 240 functioning as a plug. In other words, the insulator 241 is provided in contact with an inner wall of an opening in the insulator 254, the insulator 280, the insulator 274, and the insulator 281.

In addition, in the transistor 200D, as the oxide 230 (the oxide 230a, the oxide 230b, and the oxide 230c) that includes a channel formation region, a metal oxide functioning as an oxide semiconductor (hereinafter also referred to as an oxide semiconductor) is preferably used.

Here, when an element that forms an oxygen vacancy or an element that is bonded to an oxygen vacancy is added to the oxide 230, the carrier density is increased and resistance is reduced in some cases. Typical examples of such an element include boron and phosphorus. Hydrogen, carbon, nitrogen, fluorine, sulfur, chlorine, titanium, a rare gas, or the like as well as boron and phosphorus can be used. In addition, typical examples of the rare gas include helium, neon, argon, krypton, and xenon. Furthermore, any one or more metal elements selected from metal elements such as aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum may be added to the oxide 230. Among the above elements, boron or phosphorus is preferable as the element to be added. Since an apparatus in a manufacturing line for amorphous silicon or low-temperature polysilicon can be used for the addition of boron or phosphorus, capital investment can be reduced. The concentration of the above element is measured by secondary ion mass spectrometry (SIMS) or the like.

The layer 253 is a layer that is formed by addition of the above element to the oxide 230. As illustrated in FIG. 28(B) and FIG. 29, the layer 253a and the layer 253b are formed to face each other with the conductor 260 therebetween, and the top surfaces of the layer 253a and the layer 253b are preferably in contact with the insulator 254 and the oxide 230c. In a top view, it is preferable that the side surfaces of the layer 253a and the layer 253b on the conductor 260 side be substantially aligned with the side surfaces of the conductor 260 or the layer 253a and the layer 253b partly overlap with the conductor 260. Here, it is preferable that the concentration of the above element in the layer 253 be equal to or higher than the concentration of the above element in a portion in the oxide 230 where the layer 253 is not formed. In addition, it is preferable that the amount of oxygen vacancies contained in the layer 253 be equal to or larger than the amount of oxygen vacancies in the portion of the oxide 230 where the layer 253 is not formed. Accordingly, the layer 253 has a higher carrier density and lower resistance than the portion of the oxide 230 where the layer 253 is not formed.

In the oxide 230, a region overlapping with the conductor 260 is referred to as a region 234, a region overlapping with the insulator 254 is referred to as a region 231 (a region 231a and a region 231b), and a region between the region 234 and the region 231 is referred to as a region 232 (a region 232a and a region 232b). As illustrated in FIG. 29, the region 234 is positioned between the region 231a and the region 231b, the region 232a is positioned between the region 231a and the region 234, and the region 232b is positioned between the region 231b and the region 234. Here, the region 231 is a region having a higher carrier density and lower resistance than the region 234. Moreover, the region 232 is a region having a higher carrier density and lower resistance than the region 234 and also a region having a lower carrier density and higher resistance than the region 231. Alternatively, the region 232 may have a carrier density and resistance that are equivalent to those of the region 231. Accordingly, the region 234 functions as the channel formation region of the transistor 200D, the region 231 functions as the source region or the drain region, and the region 232 functions as a junction region.

With such a structure, formation of an offset region between the channel formation region and the source region or the drain region in the oxide 230 is prevented, so that effective channel length can be inhibited from being longer than the width of the conductor 260. Accordingly, the transistor 200D can have higher on-state current and a favorable S-value.

The formation of the region 231 functioning as the source region or the drain region in the oxide 230 enables the conductor 240 functioning as a plug to be connected to the region 231 without providing a source electrode and a drain electrode that are formed using metal. When the source electrode and the drain electrode formed using metal are provided in contact with the oxide 230, the source electrode and the drain electrode formed using metal may be oxidized by high-temperature heat treatment performed in a manufacturing process of the transistor 200D or its post-process, resulting in degradation of the on-state current and the S value of the transistor 200D in some cases. However, in the transistor described in this embodiment, it is not necessary to provide the source electrode and the drain electrode formed using metal. Thus, a transistor with favorable on-state current and a favorable S value can be provided even when high-temperature heat treatment is performed in the manufacturing process of the transistor 200D or its post-process. For example, on the transistor described in this embodiment, a process at a high temperature approximately higher than or equal to 750° C. and lower than or equal to 800° C. can be performed after the transistor 200D is manufactured.

In addition, by adding an element that forms an oxygen vacancy to the layer 253 as described above and performing heat treatment, hydrogen contained in the region 234 functioning as the channel formation region can be trapped by an oxygen vacancy included in the layer 253 in some cases. Thus, the transistor 200D can have stable electrical characteristics and the reliability of the transistor 200D can be improved.

Note that although the layer 253 is formed in the vicinity of interfaces between the oxide 230b and each of the insulator 254 and the oxide 230c in the thickness direction of the oxide 230b in FIG. 29, one embodiment of the present invention is not limited thereto. For example, the layer 253 may have substantially the same thickness as the oxide 230b or may also be formed in the oxide 230a. In addition, although the layer 253 is formed in the region 231 and the region 232 in FIG. 29, one embodiment of the present invention is not limited thereto. For example, the layer 253 may be formed in only the region 231, in the region 231 and part of the region 232, or in the region 231, the region 232, and part of the region 234.

In addition, in the oxide 230, boundaries between the regions are difficult to detect clearly in some cases. The concentration of a metal element and an impurity element such as hydrogen and nitrogen that are detected in each region may be not only gradually changed between the regions, but also continuously changed (also referred to as gradation) in each region. That is, the region closer to the channel formation region has a lower concentration of a metal element and an impurity element such as hydrogen and nitrogen.

In addition, as illustrated in FIG. 28(C), the insulator 224 in a region that does not overlap with the oxide 230b preferably has smaller thickness than the insulator 224 in the other regions. With such a structure, a lower end portion of the conductor 260 can be positioned lower, and thus, the electric field of the conductor 260 functioning as the first gate electrode is easily applied to the side surface of the oxide 230. Accordingly, the on-state current of the transistor 200D can be increased. Alternatively, a structure may be employed in which the insulator 224 has an island shape to overlap with the oxide 230b and the oxide 230a.

The region between the layer 253a and the layer 253b is formed to overlap with the opening of the insulator 280. Accordingly, the conductor 260 can be provided between the layer 253a and the layer 253b in a self-aligned manner.

In addition, a metal oxide that can be used as the oxide 230 may be provided between the insulator 250 and the conductor 260a. In that case, the metal oxide functions as a gate electrode like the conductor 260. It is preferable to provide the metal oxide because oxygen can be supplied to at least one of the insulator 250 and the oxide 230. Furthermore, when a metal oxide having a function of inhibiting the passage of oxygen is used as the metal oxide, the conductor 260 can be inhibited from being oxidized by oxygen contained in the insulator 250 or the insulator 280. Alternatively, oxygen contained in the insulator 250 can be inhibited from being absorbed into the conductor 260.

In addition, as illustrated in FIG. 28(A) and FIG. 28(C), the oxide 230 is provided such that the side surface of the oxide 230 is covered with the conductor 260 in the region of the oxide 230b that does not overlap with the layer 253, that is, the channel formation region of the oxide 230. Accordingly, the electric field of the conductor 260 functioning as the first gate electrode is likely to act on the side surface of the oxide 230. Thus, the on-state current of the transistor 200D can be increased.

Like the insulator 214 and the like, the insulator 254 preferably functions as a barrier insulating film that inhibits the mixing of impurities such as water or hydrogen into the transistor 200D from the insulator 280 side. For example, the insulator 254 preferably has lower hydrogen permeability than the insulator 224. Furthermore, as illustrated in FIG. 28(B) and FIG. 28(C), the insulator 254 is preferably in contact with part of the side surface of the oxide 230c, the top surface and side surface of the layer 253a, and a top surface and a side surface of the layer 253b, that is, part of the top surface and part of the side surface of the oxide 230b, the side surface of the oxide 230a, and the top surface of the insulator 224. Such a structure can inhibit entry of hydrogen contained in the insulator 280 into the oxide 230 through the top surfaces or side surfaces of the oxide 230a, the oxide 230b, and the insulator 224.

In addition, the insulator 254 may have a stacked-layer structure. In the case where the insulator 254 has a stacked-layer structure, a second insulator may be formed by an ALD method over a first insulator formed by a sputtering method. In that case, for the first insulator and the second insulator, the same material selected from the above materials may be used or different materials selected from the above materials may be used. For example, aluminum oxide formed by a sputtering method may be used for the first insulator, and aluminum oxide formed by an ALD method may be used for the second insulator. Coverage with a film formed by an ALD method has high, and it is possible to form a film with high uniformity even in a step portion formed by a structure body such as the oxide 230. Furthermore, the film formed by an ALD method is preferable because a deposition defect in a first insulating film formed by a sputtering method can be compensated for.

As described above, by covering the insulator 224 and the oxide 230 with the insulator 254 that has a barrier property against hydrogen, the insulator 280 is apart from the insulator 224 and the oxide 230. This can inhibit entry of impurities such as hydrogen from the outside of the transistor 200D, resulting in favorable electrical characteristics and high reliability of the transistor 200D.

In addition, an insulator containing aluminum nitride is used as the insulator 254, for example. It is preferable to use a nitride insulator that satisfies the composition formula $AlN_x$ (x is a real number greater than 0 and less than or equal to 2, preferably x is a real number greater than 0.5 and less than or equal to 1.5) as the insulator 254. Accordingly, a film having an excellent insulating property and high thermal conductivity can be obtained, and thus dissipation of heat generated in driving the transistor 200D can be increased. Alternatively, aluminum titanium nitride, titanium nitride, or the like can be used for the insulator 254. In that case, deposition by a sputtering method is preferable because deposition can be performed without using a highly-oxidizing gas such as oxygen or ozone as a deposition gas. Alternatively, silicon nitride, silicon nitride oxide, or the like can be used.

Furthermore, although described later, the insulator 254 may have a function of a protective film when the layer 253a and the layer 253b are formed. In the case where an ion implantation method or an ion doping method is used for formation of the layer 253a and the layer 253b, it is preferable to provide the insulator 254 as the protective film because a surface of the oxide 230 is not directly exposed to an ion or plasma and damage to the oxide 230 at the time of the formation of the layer 253a and the layer 253b is reduced. Here, damage to the oxide 230 means formation of excess oxygen vacancies in the oxide 230, a significant decrease in the crystallinity of the oxide 230, or the like. For example, for the insulator 254, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used.

The insulator 280 is provided over the insulator 224 and the oxide 230 with the insulator 254 therebetween.

In addition, the conductor 240a and the conductor 240b are provided in openings formed in the insulator 281, the insulator 274, the insulator 280, and the insulator 254. The conductor 240a and the conductor 240b are provided to face each other with the conductor 260 therebetween. Note that the level of the top surfaces of the conductor 240a and the conductor 240b may be on the same plane as the top surface of the insulator 281.

Note that the insulator 241a is provided in contact with the inner wall of the opening in the insulator 281, the insulator 274, the insulator 280, and the insulator 254, and the first conductor of the conductor 240a is formed in contact with the side surface of the insulator 241a. The layer 253a is located on at least part of the bottom portion of the opening, and thus the conductor 240a is in contact with the layer 253a. Similarly, the insulator 241b is provided in contact with the inner wall of the opening in the insulator 281, the insulator 274, the insulator 280, and the insulator 254, and the first conductor of the conductor 240b is formed in contact with the side surface of the insulator 241b. The layer 253b is located on at least part of the bottom portion of the opening, and thus the conductor 240b is in contact with the layer 253b.

In addition, in the case where the conductor 240 has a stacked-layer structure, the conductor having a function of inhibiting diffusion of impurities such as water or hydrogen is preferably used as a conductor in contact with the oxide 230a, the oxide 230b, the insulator 254, the insulator 280, the insulator 274, and the insulator 281.

<Method 2 for Manufacturing Transistor>

Next, a method for manufacturing the transistor 200D illustrated in FIG. 28 according to one embodiment of the present invention is described with reference to FIG. 30 to FIG. 38. In addition, (A) in each of FIG. 30 to FIG. 38 is a top view. In addition, (B) in each drawing is a cross-sectional view corresponding to a portion indicated by a dashed-dotted line A1-A2 in (A), and is also a cross-sectional view of the transistor 200D in the channel length direction. Furthermore, (C) in each drawing is a cross-sectional view corresponding to a portion indicated by a dashed-dotted line A3-A4 in (A), and is also a cross-sectional view of the transistor 200D in the channel width direction. Note that for clarity of the drawing, some components are not illustrated in the top view of (A) in each drawing. Moreover, for components denoted by the same reference numerals as those of the transistor 200 described in <Method 1 for manufacturing transistor>, <Method 1 for manufacturing transistor> can be referred to.

The method for manufacturing the transistor 200D illustrated in FIG. 28 up to the formation of the insulator 224 is similar to the method for manufacturing the transistor 200 illustrated in FIG. 10. Therefore, the method for manufacturing the transistor 200 in FIG. 11 can be referred to.

Figure 30A:
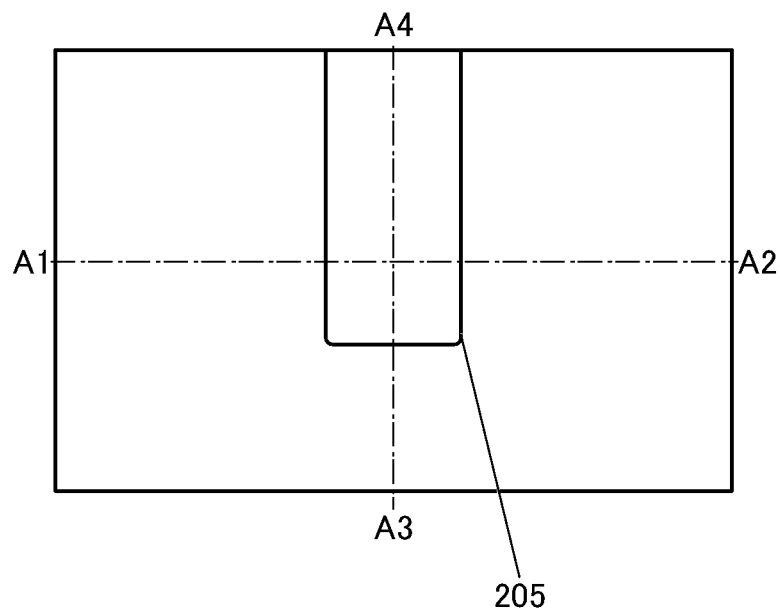
FIG. 30 (A) A top view illustrating a method for manufacturing a transistor. (B), (C) Cross-sectional views illustrating the method for manufacturing a transistor.
Figure 30C:
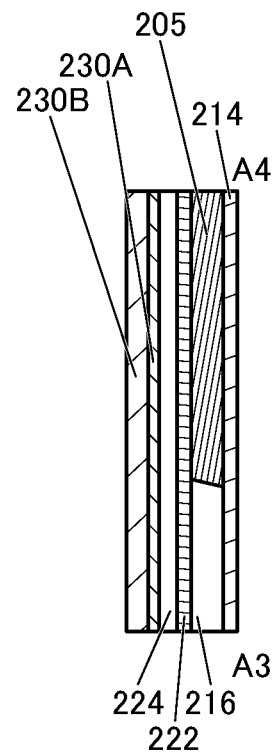
Figure 30B:
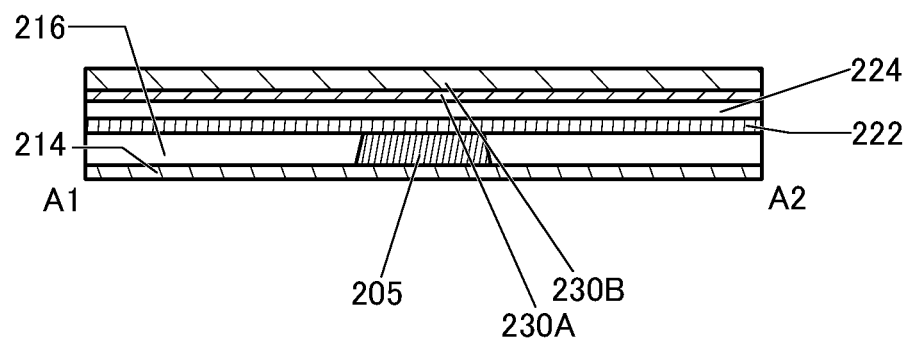
Figure 31A:
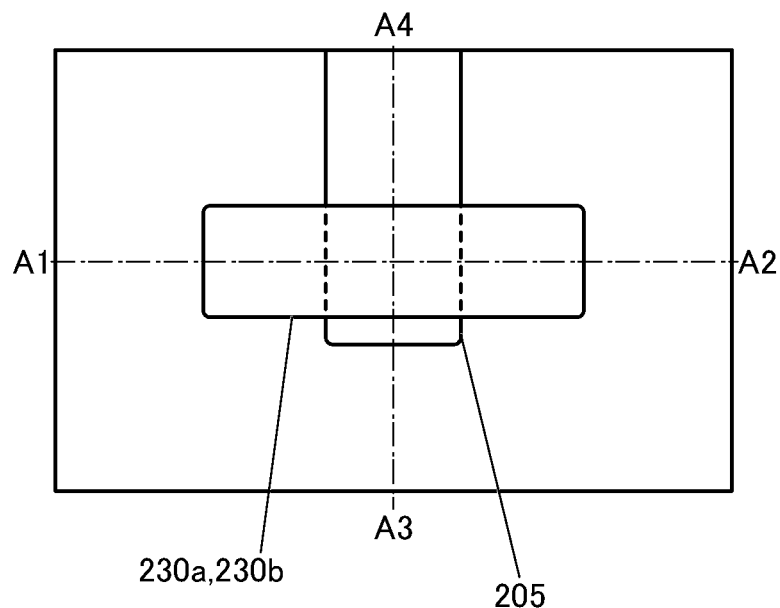
FIG. 31 (A) A top view illustrating a method for manufacturing a transistor. (B), (C) Cross-sectional views illustrating the method for manufacturing a transistor.
Figure 31C:
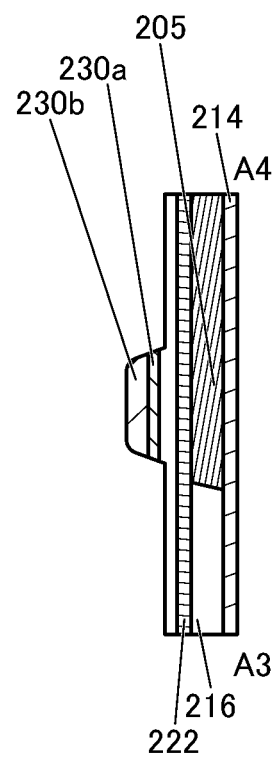
Figure 31B:
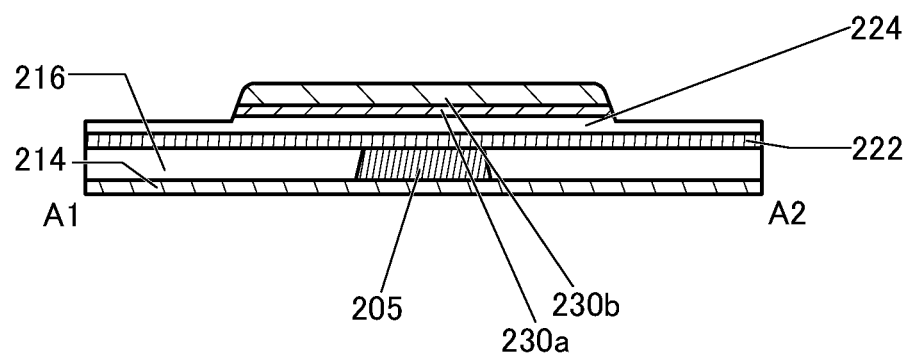

Next, the oxide film 230A to be the oxide 230a and the oxide film 230B to be the oxide 230b are deposited in this order over the insulator 224 (see FIG. 30).

Next, heat treatment may be performed. For the heat treatment, the conditions for the above heat treatment can be used.

Next, the oxide film 230A and the oxide film 230B are processed into island shapes, so that the oxide 230a and the oxide 230b are formed. Note that in this step, the thickness of the insulator 224 in the region that does not overlap with the oxide 230a is reduced in some cases (see FIG. 31).

Here, the oxide 230a and the oxide 230b are formed to at least partly overlap with the conductor 205.

In addition, a curved surface is provided between the side surface of the oxide 230b and the top surface of the oxide 230b. That is, an end portion of the side surface and an end portion of the top surface are preferably curved (such shapes are hereinafter also referred to as rounded shapes). The radius of curvature of the curved surface at an end portion of the oxide 230b is greater than or equal to 3 nm and less than or equal to 10 nm, preferably greater than or equal to 5 nm and less than or equal to 6 nm, for example. When the end portion is not angular, coverage with films in a later deposition process is improved.

In addition, in order to remove impurities and the like that have adhered or diffused by treatment such as dry etching, cleaning is performed. Examples of a cleaning method include wet cleaning using a cleaning solution or the like, plasma treatment using plasma, and cleaning by heat treatment, and these cleanings may be performed in appropriate combination.

Then, heat treatment may be performed. For the conditions of the heat treatment, the conditions for the above heat treatment can be used. Alternatively, heat treatment is preferably performed before deposition of the insulating film 254A. The heat treatment is performed at higher than or equal to 100° C. and lower than or equal to 400° C., and is performed at 200° C., for example. Alternatively, the heat treatment is preferably performed at the same temperature as the deposition temperature of the insulating film 254A. Here, the deposition temperature is not limited to substrate temperature during the deposition, and includes the set temperature of the deposition apparatus. For example, in the case where the insulating film 254A is deposited at 200° C., the heat treatment is preferably performed at 200° C. The heat treatment is preferably performed under reduced pressure, and for example, may be performed in a vacuum atmosphere. A vacuum atmosphere is kept by evacuation with a turbomolecular pump or the like. Pressure in a vacuum atmosphere of the treatment chamber is lower than or equal to $1\times10^{-2}$ Pa, preferably lower than or equal to $1\times10^{-3}$ Pa.

Figure 32A:
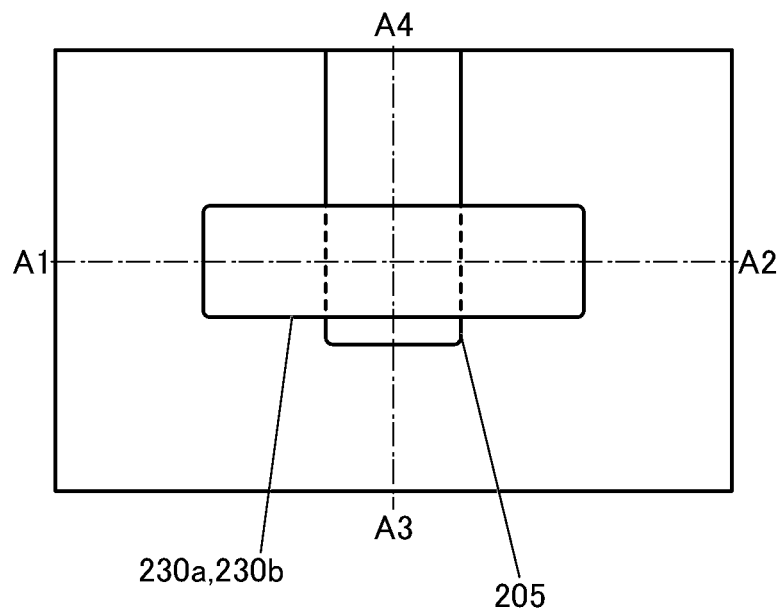
FIG. 32 (A) A top view illustrating a method for manufacturing a transistor. (B), (C) Cross-sectional views illustrating the method for manufacturing a transistor.
Figure 32C:
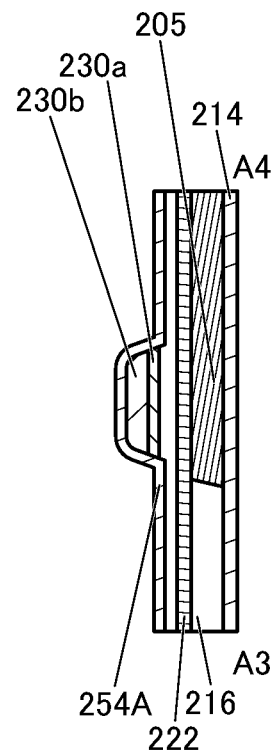
Figure 32B:
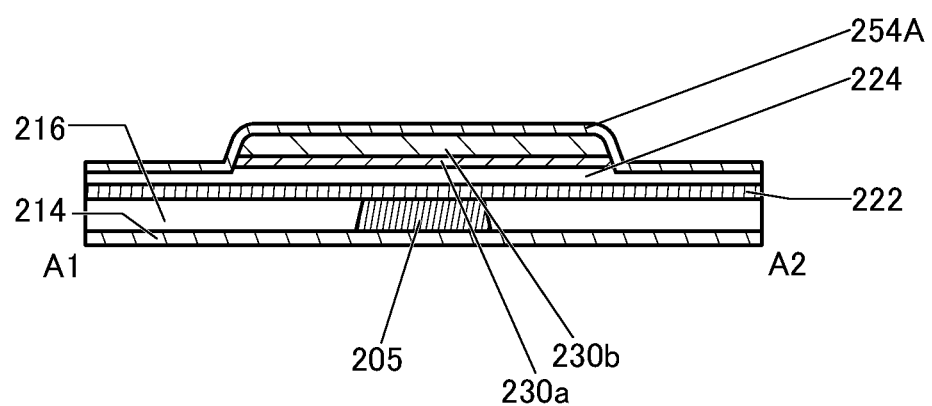

Next, the insulating film 254A to be the insulator 254 is deposited to cover the oxide 230a and the oxide 230b (see FIG. 32). The insulating film 254A can be deposited by a sputtering method, a CVD method, an MBE method, a PLD method, an ALD method, or the like.

As the insulating film 254A, an insulating film having a function of inhibiting diffusion of oxygen and impurities such as hydrogen is preferably used. For example, an aluminum oxide film is preferably deposited by a sputtering method. When an aluminum oxide film is deposited by a sputtering method using an oxygen-containing gas, oxygen can be injected into the insulator 224. That is, the insulator 224 can contain excess oxygen. Alternatively, for the insulating film 254A, hafnium oxide, an oxide containing aluminum and hafnium (hafnium aluminate), an insulator containing aluminum nitride, aluminum titanium nitride, titanium nitride, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used.

Alternatively, aluminum oxide may be deposited for the insulating film 254A while the substrate is heated at a high temperature. The substrate heating temperature during the deposition of the insulating film 254A is higher than or equal to 200° C., preferably higher than or equal to 250° C., further preferably higher than or equal to 350° C.

In addition, the insulating film 254A may have a stacked-layer structure.

Next, the dummy gate film to be the dummy gate layer 262A is deposited over the insulating film 254A.

Figure 33A:
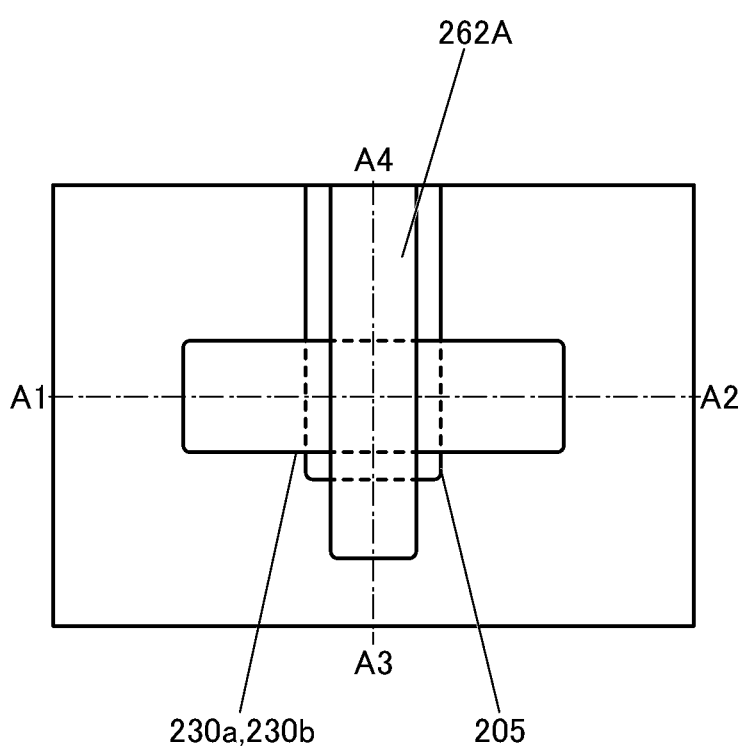
FIG. 33 (A) A top view illustrating a method for manufacturing a transistor. (B), (C) Cross-sectional views illustrating the method for manufacturing a transistor.
Figure 33C:
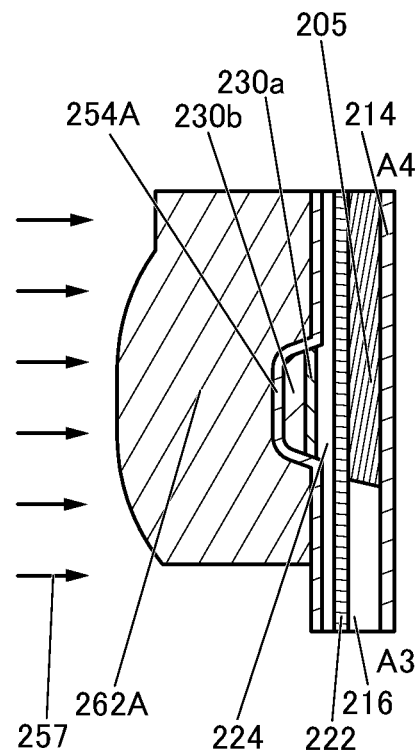
Figure 33B:
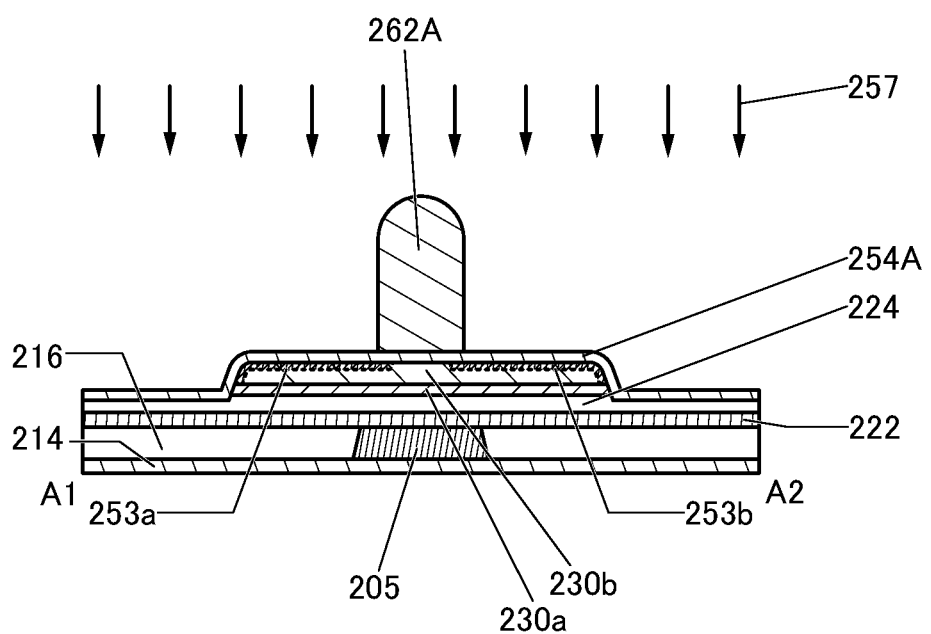

Then, the dummy gate film to be the dummy gate layer 262A is etched by a lithography method, so that the dummy gate layer 262A is formed (see FIG. 33). The dummy gate layer 262A is formed to at least partly overlap with the conductor 205 and oxide 230.

Next, a dopant 257 is added to the oxide 230b using the dummy gate layer 262A as a mask (see FIG. 33). Accordingly, the layer 253a and the layer 253b including the dopant 257 are formed in regions of the oxide 230b that do not overlap with the dummy gate layer 262A. Note that FIG. 33 shows a situation where the dopant 257 is diffused into and added to a region of the oxide 230b that overlaps with the dummy gate layer 262A. Thus, parts of the layer 253a and the layer 253b are also formed in regions overlapping with the dummy gate layer 262A. In this manner, the distance between the layer 253a and the layer 253b, i.e., the channel length, can be controlled by the length of the dummy gate layer 262A in the channel length direction.

As a method for adding the dopant 257, an ion implantation method in which an ionized source gas is subjected to mass separation and then added, an ion doping method in which an ionized source gas is added without mass separation, a plasma immersion ion implantation method, or the like can be used. In the case of performing mass separation, an ion species to be added and its concentration can be adjusted precisely. On the other hand, in the case of not performing mass separation, ions at a high concentration can be added in a short time. Alternatively, an ion doping method in which atomic or molecular clusters are generated and ionized may be used. Note that a dopant may be referred to as an ion, a donor, an acceptor, an impurity, an element, or the like.

As the dopant 257, an element that forms the oxygen vacancy, an element that is bonded to the oxygen vacancy, or the like is used. Typical examples of such an element include boron and phosphorus. Hydrogen, carbon, nitrogen, fluorine, sulfur, chlorine, titanium, a rare gas element, or the like may also be used. In addition, typical examples of the rare gas include helium, neon, argon, krypton, and xenon. Furthermore, any one or more metal elements selected from metal elements such as aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum may be added. Among the above elements, boron or phosphorus is preferable as the dopant 257. In the case where boron or phosphorus is used as the dopant 257, an apparatus in a manufacturing line for amorphous silicon or low-temperature polysilicon can be used; thus, capital investment can be reduced.

In addition, although the dopant 257 is added substantially perpendicularly to the top surface of the insulator 214 in FIG. 33, one embodiment of the present invention is not limited thereto. The dopant 257 may be added obliquely to the top surface of the insulator 214. The addition of the dopant obliquely to the top surface of the insulator 214 facilitates the formation of the layer 253a and the layer 253b in part of a region overlapping with the dummy gate layer 262A.

In addition, in the formation method in this embodiment, the dopant 257 is added to the oxide 230 through the insulating film 254A. With this formation method, the dopant 257 is also added to the insulating film 254A. In other words, both the oxide 230 and the insulating film 254A include the element contained in the dopant 257. Furthermore, in the case where the insulating film 254A contains excess oxygen, the dopant 257 can inhibit diffusion of excess oxygen into the outside in some cases.

The layer 253 is formed as described above, so that the conductor 260 to be formed in a later step can be provided between the layer 253a and the layer 253b in a self-aligned manner.

Figure 34A:
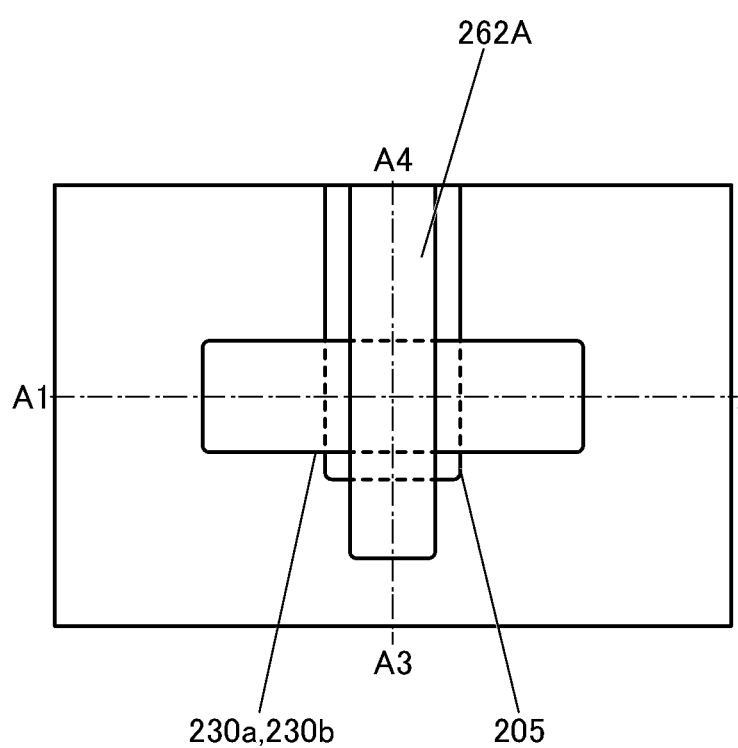
FIG. 34 (A) A top view illustrating a method for manufacturing a transistor. (B), (C) Cross-sectional views illustrating the method for manufacturing a transistor.
Figure 34C:
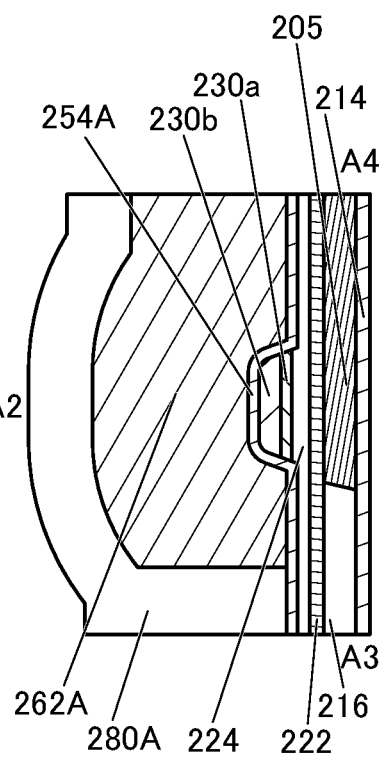
Figure 34B:
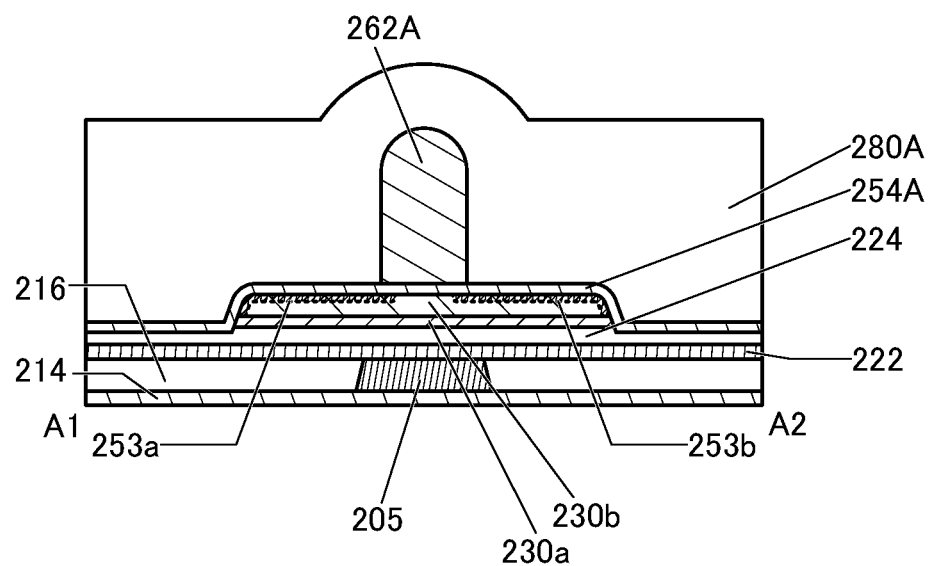

Next, an insulating film 280A is deposited over the insulating film 254A and the dummy gate layer 262A (see FIG. 34). The insulating film 280A can be deposited by a sputtering method, a CVD method, an MBE method, a PLD method, an ALD method, or the like.

Figure 35A:
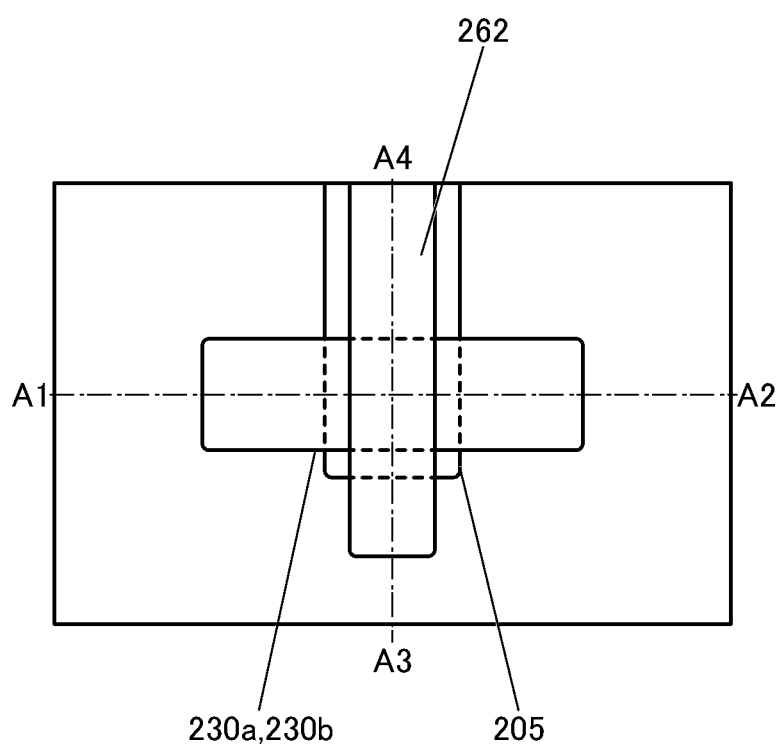
FIG. 35 (A) A top view illustrating a method for manufacturing a transistor. (B), (C) Cross-sectional views illustrating the method for manufacturing a transistor.
Figure 35C:
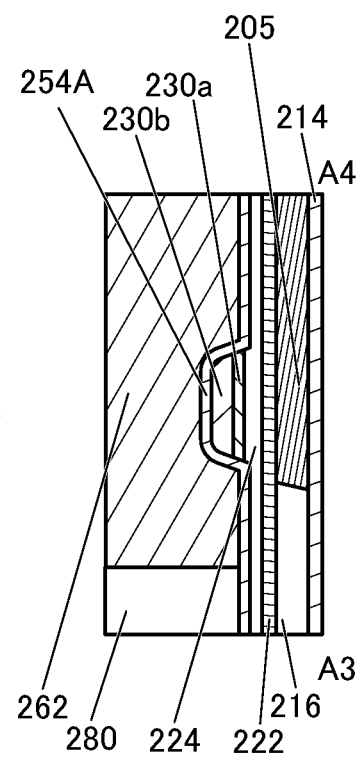

Next, the insulating film 280A and the dummy gate layer 262A are partly removed until part of the dummy gate layer 262A is exposed, so that the insulator 280 and the dummy gate 262 are formed (see FIG. 35). CMP treatment is preferably employed for forming the insulator 280 and the dummy gate 262.

Figure 35B:
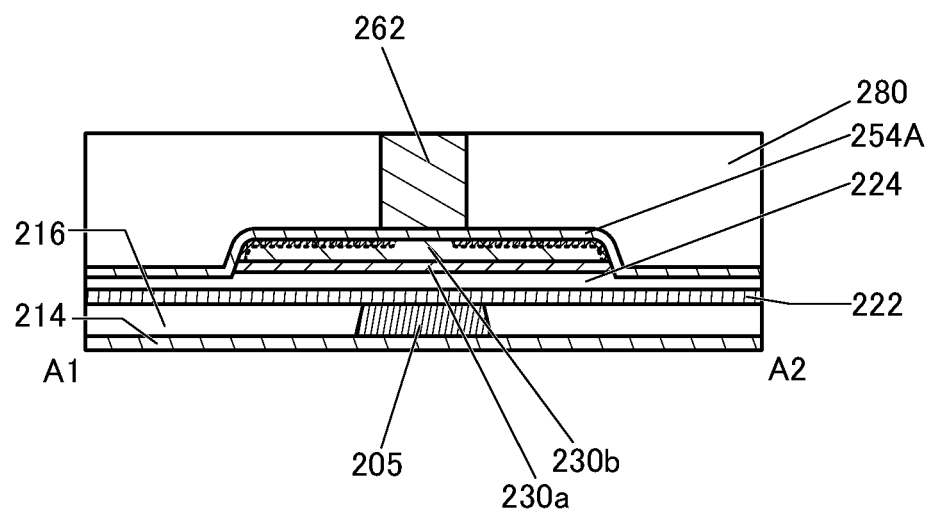

In addition, as described above, when the dummy gate layer 262A has a two-layer structure in which a conductive film and a resin film over the conductive film are formed, for example, in a CMP process, the conductive film functions as a stopper film for CMP treatment in some cases. Alternatively, the end point of the CMP treatment can be detected with the conductive film in some cases, so that variations in the height of the dummy gate 262 can be reduced in some cases. As illustrated in FIG. 35(B), the top surface of the dummy gate 262 is substantially aligned with the top surface of the insulator 280.

Figure 36A:
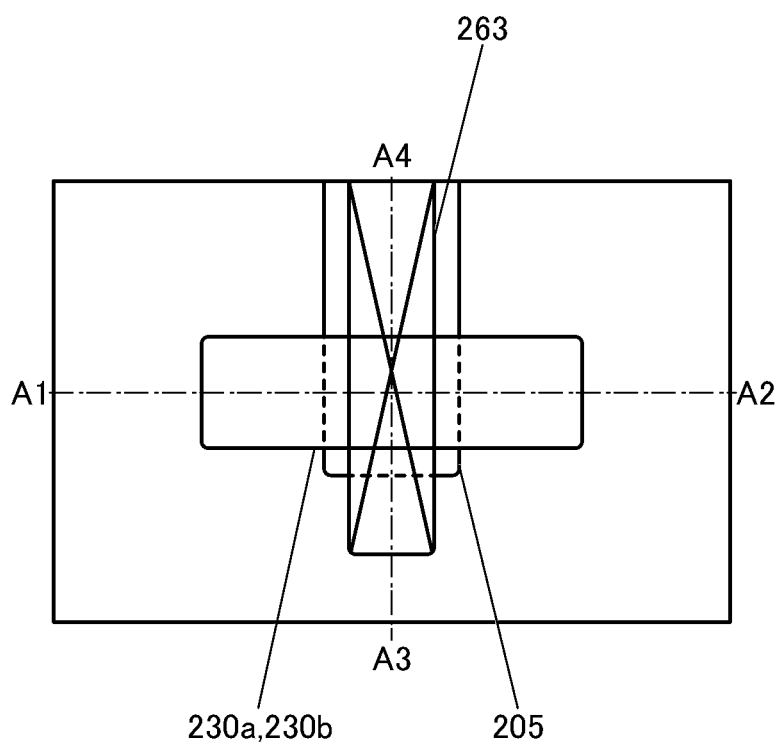
FIG. 36 (A) A top view illustrating a method for manufacturing a transistor. (B), (C) Cross-sectional views illustrating the method for manufacturing a transistor.
Figure 36C:
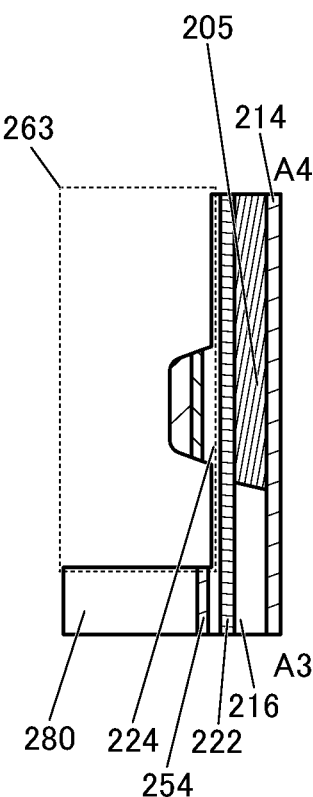
Figure 36B:
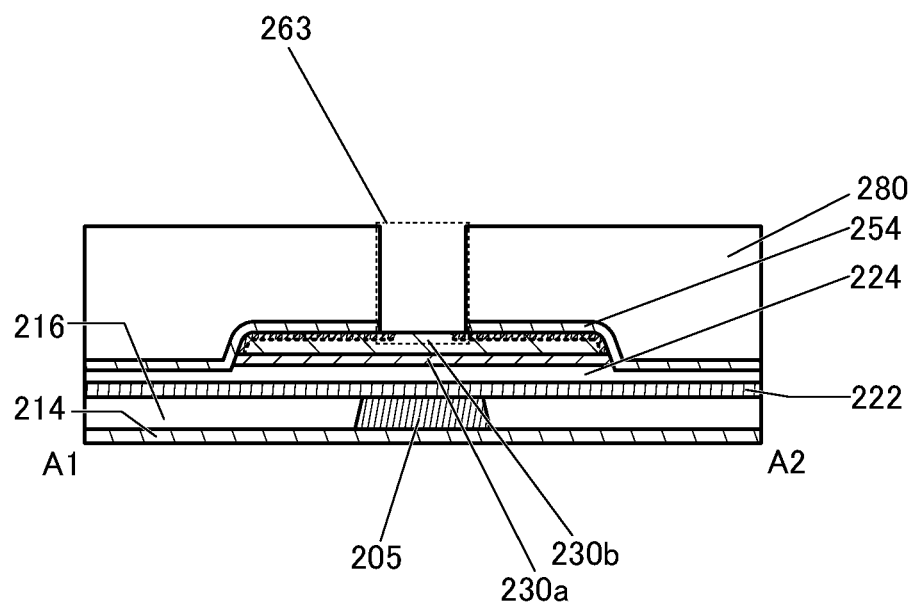

Next, the dummy gate 262 and part of the insulating film 254A overlapping with the dummy gate 262 are removed to form the opening 263 (see FIG. 36). The dummy gate 262 and the insulating film 254A can be removed by wet etching, dry etching, ashing, or the like. Alternatively, a plurality of above treatments may be performed in appropriate combination. For example, wet etching treatment may be performed after ashing treatment. By removing part of the insulating film 254A, the insulator 254 is formed. By removing the dummy gate 262 and the insulating film 254A, part of the surface of the oxide 230b is exposed through the opening 263. At this time, part of a surface of the layer 253 is exposed through the opening 263 in some cases.

Next, heat treatment is preferably performed before deposition of the oxide film 230C. The heat treatment is performed at higher than or equal to 100° C. and lower than or equal to 400° C., and is performed at 200° C., for example. Alternatively, the heat treatment is preferably performed at the same temperature as the deposition temperature of the oxide film 230C. Here, the deposition temperature is not limited to substrate temperature during the deposition, and includes the set temperature of the deposition apparatus. For example, in the case where the oxide film 230C is deposited at 300° C., the heat treatment is preferably performed at 300° C. The heat treatment is preferably performed under reduced pressure, and for example, may be performed in a vacuum atmosphere. A vacuum atmosphere is kept by evacuation with a turbomolecular pump or the like. Pressure in a vacuum atmosphere of the treatment chamber is lower than or equal to $1 \times 10^{-2}$ Pa, preferably lower than or equal to $1 \times 10^{-3}$ Pa.

Next, the oxide film 230C is deposited to fill the opening 263.

Next, heat treatment is preferably performed before deposition of the insulating film 250A. For the heat treatment, the conditions for the above heat treatment can be used.

Next, the insulating film 250A is deposited. The above description can be referred to for the deposition of the insulating film 250A; thus, a detailed description thereof is omitted.

Furthermore, heat treatment may be performed. For the heat treatment, the conditions for the above heat treatment can be used.

Figure 37A:
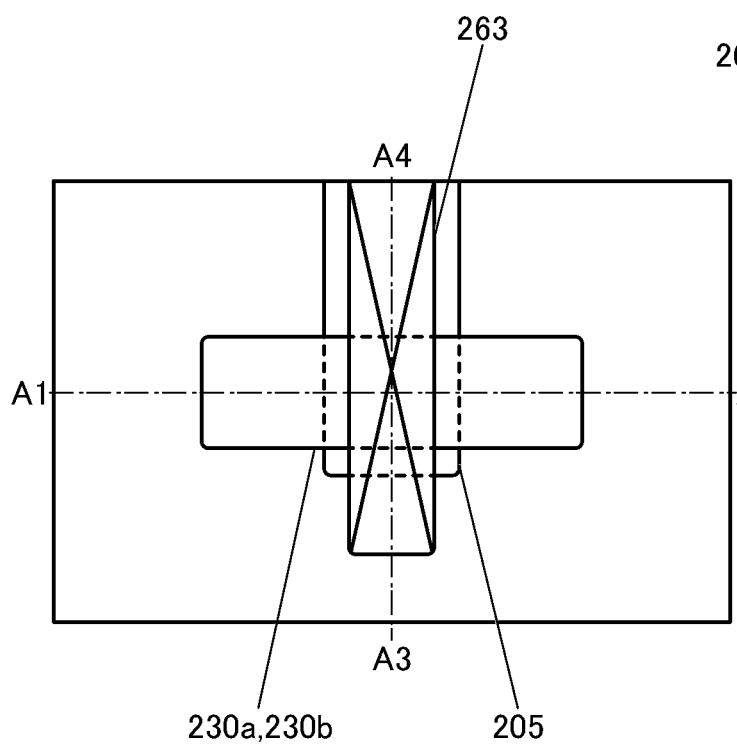
FIG. 37 (A) A top view illustrating a method for manufacturing a transistor. (B), (C) Cross-sectional views illustrating the method for manufacturing a transistor.
Figure 37C:
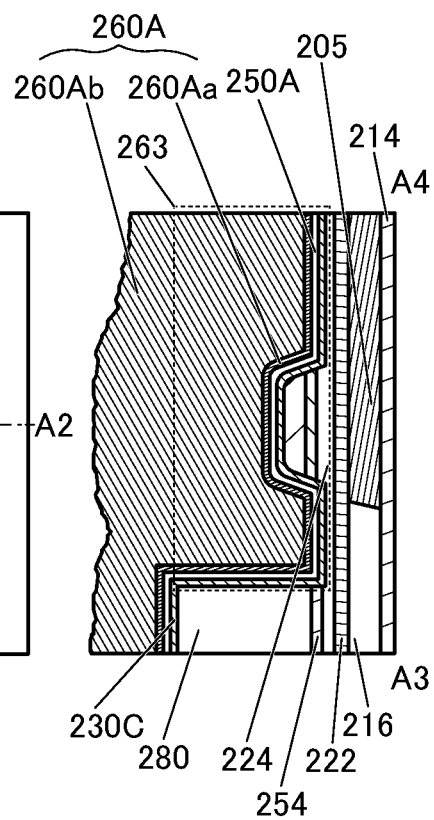
Figure 37B:
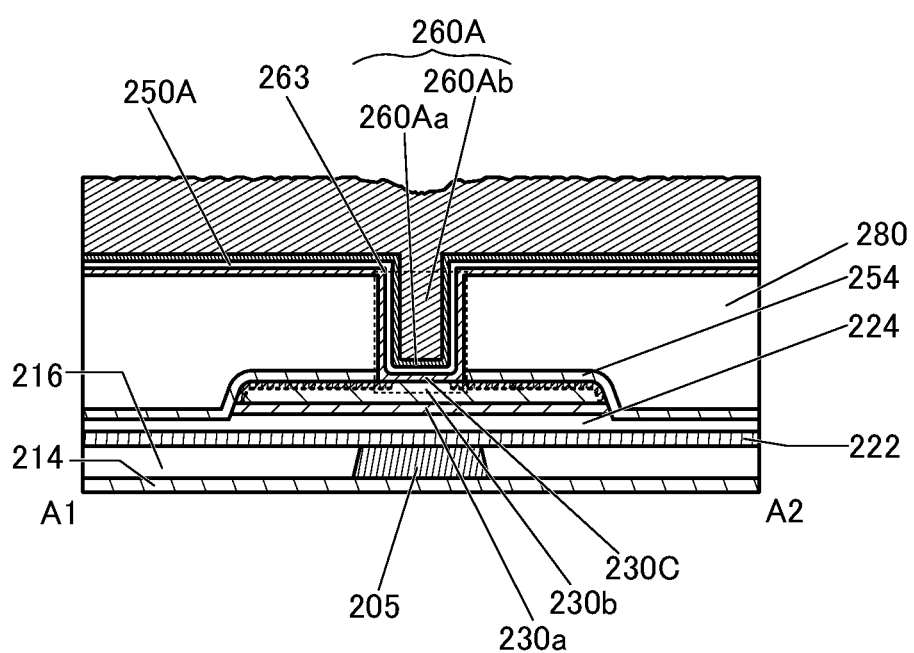

Next, the conductive film 260Aa and the conductive film 260Ab are deposited (see FIG. 37).

Figure 38A:
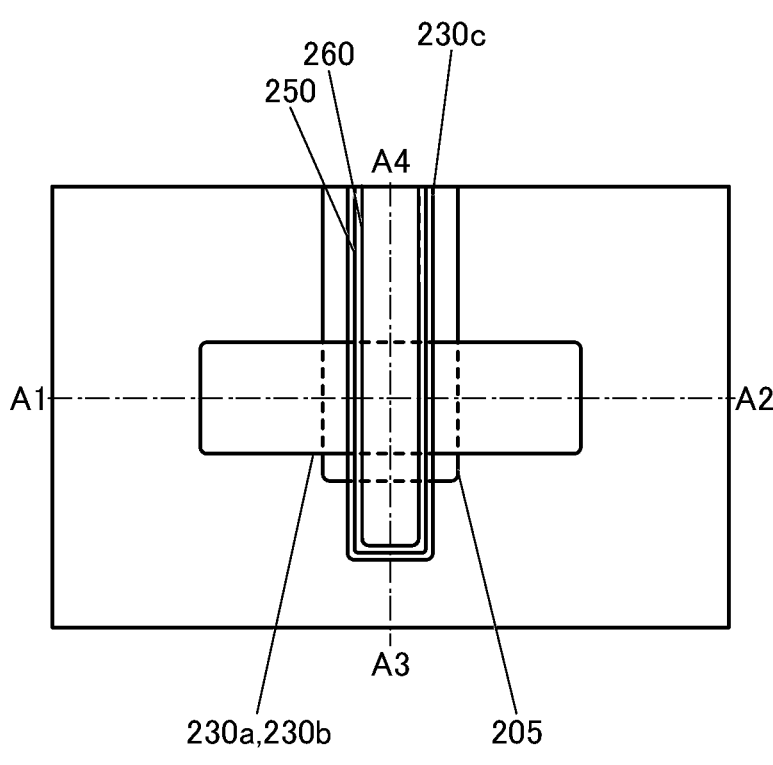
FIG. 38 (A) A top view illustrating a method for manufacturing a transistor. (B), (C) Cross-sectional views illustrating the method for manufacturing a transistor.
Figure 38C:
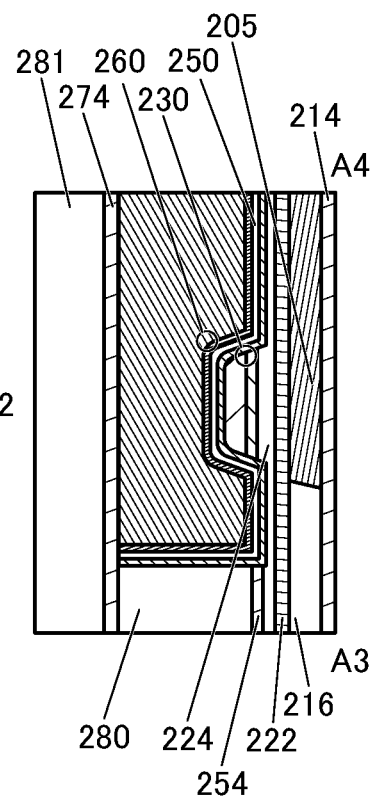
Figure 38B:
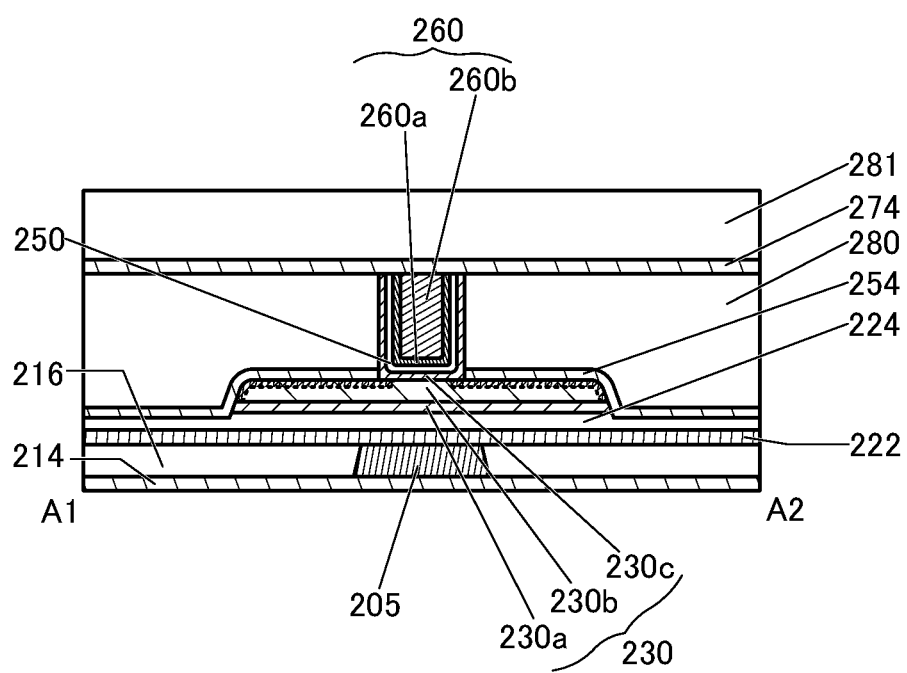

Then, the oxide film 230C, the insulating film 250A, the conductive film 260Aa, and the conductive film 260Ab are polished by CMP treatment until the insulator 280 is exposed, so that the oxide 230c, the insulator 250, and the conductor 260 (the conductor 260a and the conductor 260b) are formed (see FIG. 38).

Next, heat treatment may be performed. For the heat treatment, the conditions for the above heat treatment can be used.

Next, the insulating film to be the insulator 274 is formed over the insulator 280 (see FIG. 38). The above description can be referred to for the deposition of the insulator 274; thus, a detailed description thereof is omitted.

Next, heat treatment may be performed. For the heat treatment, the conditions for the above heat treatment can be used.

Next, an insulator to be the insulator 281 may be deposited over the insulator 274. The insulating film to be the insulator 281 can be deposited by a sputtering method, a CVD method, an MBE method, a PLD method, an ALD method, or the like (see FIG. 38).

Then, openings reaching the layer 253a and the layer 253b are formed in the insulator 254, the insulator 280, the insulator 274, and the insulator 281. The openings are formed by a lithography method.

Next, the insulating film to be the insulator 241 is deposited, and the insulating film is subjected to anisotropic etching to form the insulator 241.

Next, the conductive film to be the conductor 240a and the conductor 240b is deposited.

Next, CMP treatment is performed to remove part of the conductive film to be the conductor 240a and the conductor 240b, so that the insulator 281 is exposed. As a result, the conductive film remains only in the openings, so that the conductor 240a and the conductor 240b having flat top surfaces can be formed (see FIG. 28). Note that the insulator 281 is partly removed by the CMP treatment in some cases.

Through the above process, the transistor 200D illustrated in FIG. 28 can be manufactured.

Examples of a transistor and a method for manufacturing a transistor that are different from those described in <Modification example 2 of transistor> will be described.

<Modification Example 2-2 of Transistor>

Figure 39A:
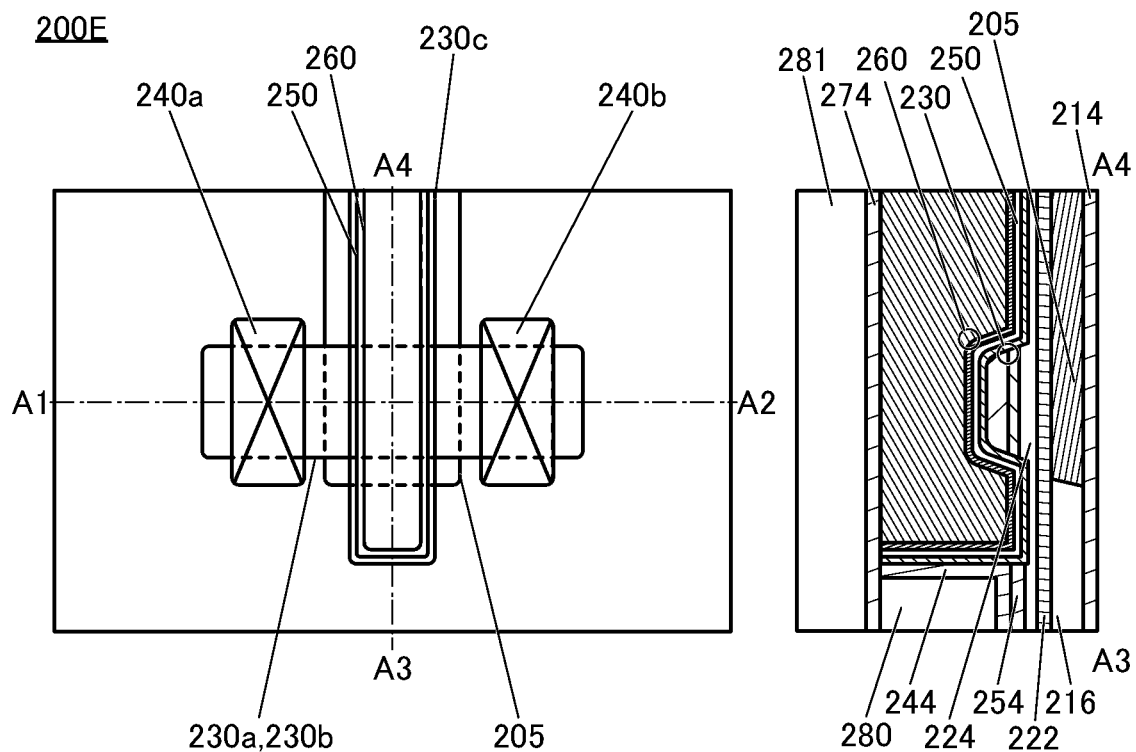
FIG. 39 (A) A top view of a transistor. (B), (C) Cross-sectional views of the transistor.
Figure 39C:
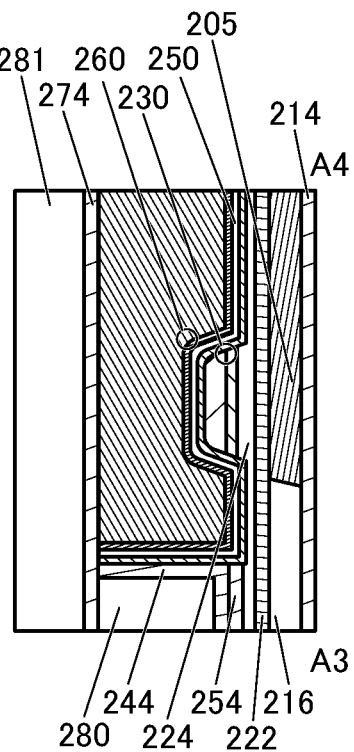
Figure 39B:
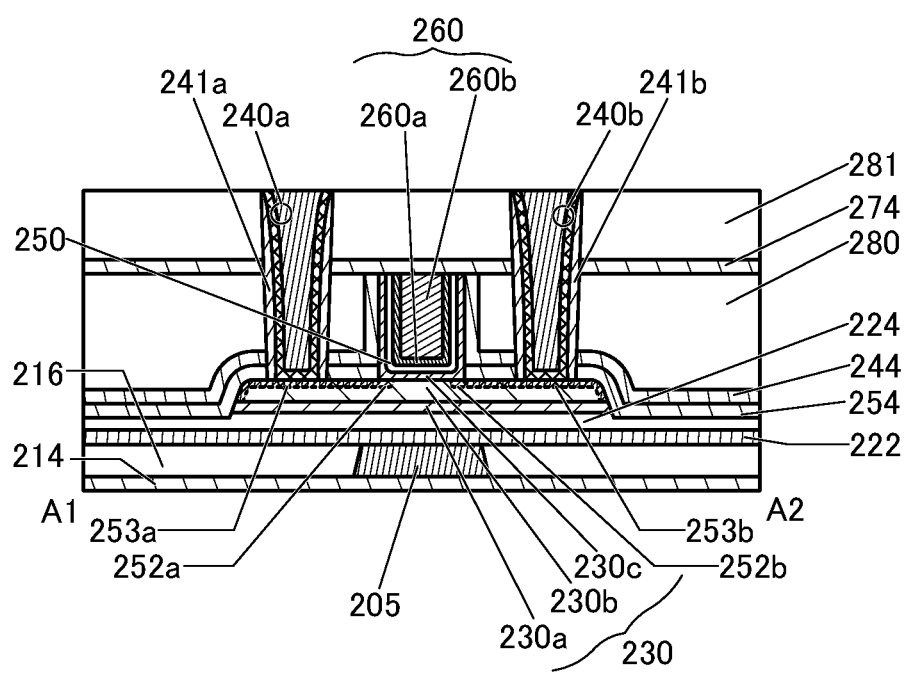
Figure 40:
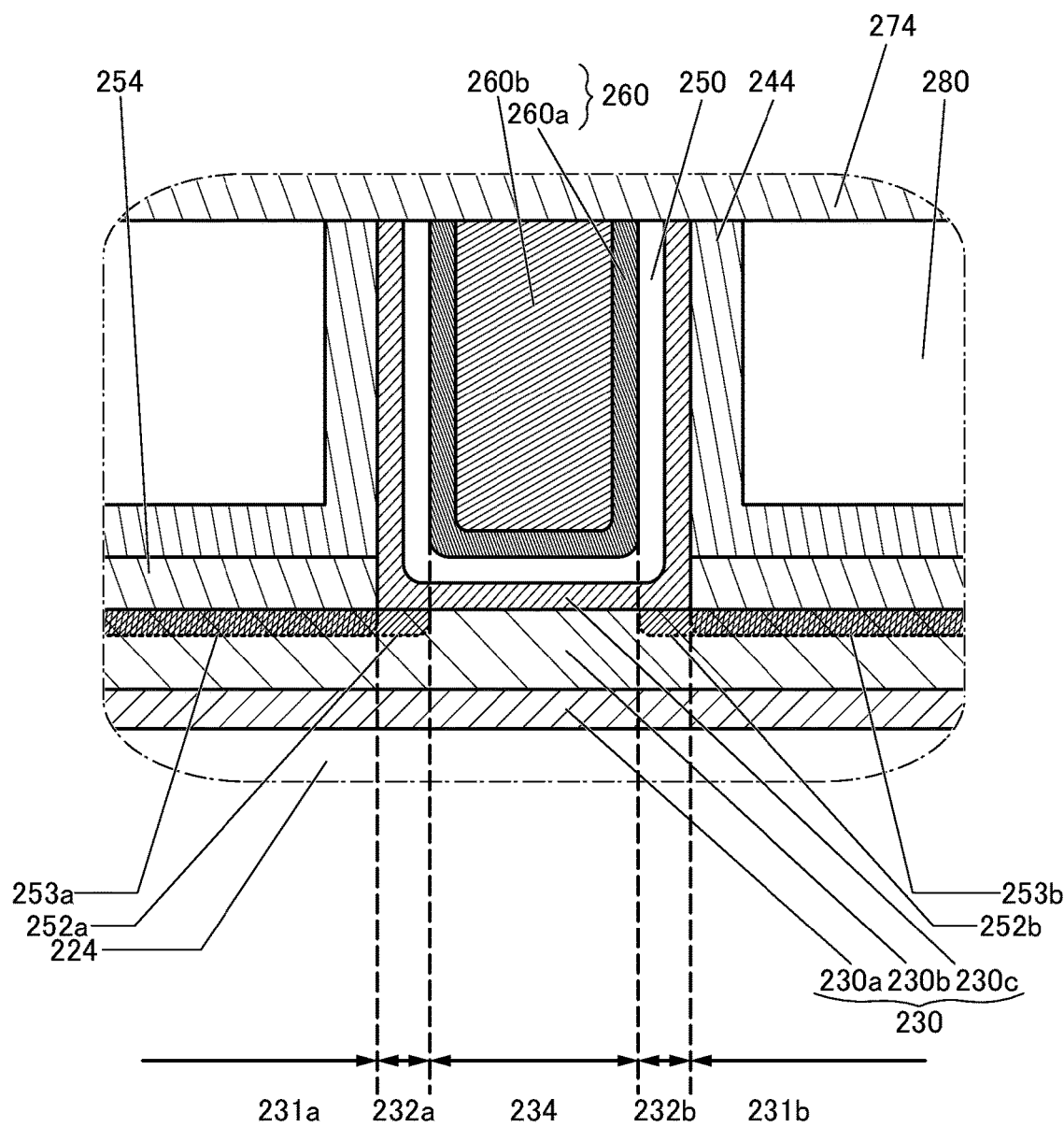
FIG. 40 A cross-sectional view of a transistor.

FIG. 39(A), FIG. 39(B), and FIG. 39(C) are a top view and cross-sectional views of a transistor 200E that can be used in a display device according to one embodiment of the present invention and a periphery of the transistor 200E. The transistor 200E can be applied to transistors included in the pixel portion 702, the source driver circuit portion 704, and the gate driver circuit portion 706. FIG. 39(A) is a top view of the transistor 200E. FIG. 39(B) is a cross-sectional view of a portion indicated by a dashed-dotted line A1-A2 in FIG. 39(A), and is a cross-sectional view in the channel length direction of the transistor 200E. In addition, FIG. 39(C) is a cross-sectional view of a portion indicated by a dashed-dotted line A3-A4 in FIG. 39(A), and is a cross-sectional view in the channel width direction of the transistor 200E. Note that for clarity of the drawing, some components in the top view in FIG. 39(A) are omitted. Furthermore, FIG. 40 is an enlarged view of the oxide 230b in FIG. 39(B) and its vicinity.

As illustrated in FIG. 39, the transistor 200E includes the oxide 230a provided over a substrate (not illustrated); the oxide 230b provided over the oxide 230a; a layer 252a and a layer 252b formed on the top surface of the oxide 230b to be apart from each other; the insulator 280 that is provided over the oxide 230b and is provided with an opening formed to overlap with a portion between the layer 252a and the layer 252b; the conductor 260 provided in the opening; the insulator 250 provided between the conductor 260, and the oxide 230b and the insulator 280; and the oxide 230c provided between the insulator 250, and the oxide 230b and the insulator 280. Here, as illustrated in FIG. 39(B) and FIG. 39(C), the top surface of the conductor 260 is preferably substantially aligned with the top surfaces of the insulator 250, the insulator 244, the oxide 230c, and the insulator 280. In addition, it is preferable that the layer 253a be formed in a region of the layer 252a that does not overlap with the oxide 230c. Furthermore, it is preferable that the layer 253b be formed in a region of the layer 252b that does not overlap with the oxide 230c. Note that the layer 252a and the layer 252b might be collectively referred to as a layer 252.

In addition, as illustrated in FIG. 39, the insulator 244 and the insulator 254 are preferably provided between the insulator 280, and the insulator 224, the oxide 230a, the oxide 230b, and the oxide 230c. Here, as illustrated in FIG. 39(B) and FIG. 39(C), the insulator 254 is preferably in contact with the side surface of the oxide 230c, a top surface and a side surface of the layer 252a, a top surface and a side surface of the layer 252b, the side surfaces of the oxide 230a and the oxide 230b, and the top surface of the insulator 224. The insulator 244 is preferably provided in contact with the top surface of the insulator 254 and the side surface of the oxide 230c. The insulator 254 is further preferably in contact with the side surface of the insulator 241 (the insulator 241a and the insulator 241b).

Here, the conductor 260 functions as a gate electrode of the transistor, and the layer 252a, the layer 253a, the layer 252b, and the layer 253b each function as a source region or a drain region. As described above, the conductor 260 is formed to be embedded in the opening of the insulator 280 and a region between the layer 252a and the layer 252b. Here, the positions of the conductor 260, the layer 252a, and the layer 252b with respect to the opening of the insulator 280 are selected in a self-aligned manner. That is, in the transistor 200E, the gate electrode can be provided between a source electrode and a drain electrode in a self-aligned manner.

In addition, the insulator 274 functioning as an interlayer film is preferably provided in contact with the top surfaces of the conductor 260, the insulator 250, the insulator 244, the oxide 230c, and the insulator 280.

It is preferable that the insulator 254 and the insulator 244 have a function of inhibiting diffusion of hydrogen (e.g., at least one of a hydrogen atom, a hydrogen molecule, and the like). For example, the insulator 254 and the insulator 244 preferably have lower hydrogen permeability than the insulator 254 and the insulator 244. In addition, it is preferable that the insulator 254 and the insulator 244 have a function of inhibiting diffusion of oxygen (e.g., at least one of an oxygen atom, an oxygen molecule, and the like). For example, the insulator 254 and the insulator 244 preferably have lower oxygen permeability than the insulator 224, the insulator 250, and the insulator 280.

Here, the insulator 224, the oxide 230, and the insulator 250 are apart from the insulator 280 and the insulator 281 with the insulator 254, the insulator 244, and the insulator 274. Thus, the mixing of impurities such as hydrogen contained in the insulator 280 and the insulator 281 and excess oxygen into the insulator 224, the oxide 230, and the insulator 250 can be inhibited.

In addition, the conductor 240 (the conductor 240a and the conductor 240b) that is electrically connected to the transistor 200E and functions as a plug is preferably provided. Note that the insulator 241 (the insulator 241a and the insulator 241b) is provided in contact with the side surface of the conductor 240. In other words, the insulator 241 is provided in contact with an inner wall of an opening in the insulator 254, the insulator 244, the insulator 280, the insulator 274, and the insulator 281.

Here, when an element that forms an oxygen vacancy or an element that is bonded to an oxygen vacancy is added to the oxide 230, the carrier density is increased and resistance is reduced in some cases. As such an element, the element described in <Method for manufacturing transistor> can be used.

The layer 252 is a layer that is formed by addition of the above element to the oxide 230. As illustrated in FIG. 39(B) and FIG. 40, the layer 252a and the layer 252b are formed to face each other with the conductor 260 therebetween, and the top surfaces of the layer 252a and the layer 252b are preferably in contact with the insulator 254 and the oxide 230c. In a top view, it is preferable that the side surfaces of the layer 252a and the layer 252b on the conductor 260 side be substantially aligned with the side surfaces of the conductor 260 or the layer 252a and the layer 252b partly overlap with the conductor 260. Here, it is preferable that the concentration of the above element in the layer 252 be equal to or higher than the concentration of the above element in a portion in the oxide 230 where neither the layer 252 nor the layer 253 is formed. In addition, it is preferable that the amount of oxygen vacancies contained in the layer 252 be equal to or larger than the amount of oxygen vacancies in the portion of the oxide 230 where neither the layer 252 nor the layer 253 is formed. Accordingly, the layer 252 has a higher carrier density and lower resistance than the portion of the oxide 230 where neither the layer 252 nor the layer 253 is formed.

The layer 253 is a layer that is formed by further addition of the above element to part of the layer 252. As illustrated in FIG. 39(B) and FIG. 40, a top surface of the layer 253 is preferably in contact with the insulator 254. Here, it is preferable that the concentration of the above element in the layer 253 be equal to or higher than the concentration of the above element in the layer 252. In addition, it is preferable that the amount of oxygen vacancies contained in the layer 253 be equal to or larger than the amount of oxygen vacancies contained in the layer 252. Accordingly, the layer 253 has a higher carrier density and lower resistance than layer 252.

In the oxide 230, the region overlapping with the conductor 260 is referred to as the region 234, a region overlapping with the layer 253 is referred to as the region 231 (the region 231a and the region 231b), and a region not overlapping with the layer 253 but overlapping with the layer 252 is referred to as the region 232 (the region 232a and the region 232b). As illustrated in FIG. 40, the region 234 is positioned between the region 231a and the region 231b, the region 232a is positioned between the region 231a and the region 234, and the region 232b is positioned between the region 231b and the region 234. Here, the region 231 is a region having a higher carrier density and lower resistance than the region 234. Moreover, the region 232 is a region having a higher carrier density and lower resistance than the region 234 and also a region having a lower carrier density and higher resistance than the region 231. Accordingly, the region 234 functions as a channel formation region of the transistor 200E, the region 231 functions as the source region or the drain region, and the region 232 functions as a junction region.

In addition, by adding an element that forms an oxygen vacancy to the layer 252 and the layer 253 as described above and performing heat treatment, hydrogen contained in the region 234 functioning as the channel formation region can be trapped by oxygen vacancies included in the layer 252 and the layer 253 in some cases. Thus, the transistor 200E can have stable electrical characteristics and the reliability of the transistor 200E can be improved.

Note that although the layer 252 is formed in the vicinity of the interface between the oxide 230b and the insulator 254 in the thickness direction of the oxide 230b in FIG. 40, one embodiment of the present invention is not limited thereto. For example, the layer 252 may have substantially the same thickness as the oxide 230b or may also be formed in the oxide 230a. In addition, although the layer 252 is formed in the region 231 and the region 232 in FIG. 40, one embodiment of the present invention is not limited thereto. For example, the layer 252 may be formed in only the region 231, in the region 231 and part of the region 232, or in the region 231, the region 232, and part of the region 234.

The region between the layer 252a and the layer 252b is formed to overlap with the opening of the insulator 280. Accordingly, the conductor 260 can be provided between the layer 252a and the layer 252b in a self-aligned manner.

The above description can be referred to for the insulator 254; thus, a detailed description thereof is omitted.

Like the insulator 214 and the like, the insulator 244 preferably functions as a barrier insulating film that inhibits the mixing of impurities such as water or hydrogen into the transistor 200E from the insulator 280 side. For example, the insulator 244 preferably has lower hydrogen permeability than the insulator 224. In addition, the insulator 244 is preferably provided to be in contact with the top surface of the insulator 254 and the side surface of the oxide 230c, as illustrated in FIG. 39(B) and FIG. 39(C). Such a structure can inhibit entry of hydrogen contained in the insulator 280 into the oxide 230 from the side surfaces of the conductor 260, the oxide 230c, and the insulator 250.

As described above, by covering the insulator 224, the insulator 250, and the oxide 230 with the insulator 254 and the insulator 244 that have barrier properties against hydrogen, the insulator 280 is apart from the insulator 224, the oxide 230, and the insulator 250. This can inhibit entry of impurities such as hydrogen from the outside of the transistor 200E, resulting in favorable electrical characteristics and high reliability of the transistor 200E.

In addition, for example, it is preferable that the insulator 244 have a function of inhibiting diffusion of oxygen (e.g., at least one of an oxygen atom, an oxygen molecule, and the like) (through which oxygen is less likely to pass). For example, the insulator 244 preferably has lower oxygen permeability than the insulator 224. When the insulator 244 has a function of inhibiting oxygen diffusion, the conductor 260 can be inhibited from reacting with oxygen contained in the insulator 280.

A material that can be used for the insulator 254 can be used for the insulator 244. An insulator containing aluminum nitride is used as the insulator 244, for example. Alternatively, aluminum titanium nitride, titanium nitride, or the like can be used for the insulator 244. Alternatively, silicon nitride, silicon nitride oxide, or the like can be used.

In addition, the insulator 244 is preferably deposited by an ALD method. An ALD method is a deposition method that provides good coverage, and thus can prevent formation of disconnection or the like due to unevenness of the insulator 254.

The insulator 280 is provided over the insulator 224 and the oxide 230 with the insulator 244 and the insulator 254 therebetween.

In addition, the conductor 240a and the conductor 240b are provided in openings formed in the insulator 281, the insulator 274, the insulator 280, and the insulator 244.

Note that the insulator 241a is provided in contact with the inner wall of the opening in the insulator 281, the insulator 274, the insulator 280, the insulator 244, and the insulator 254, and the first conductor of the conductor 240a is formed in contact with the side surface of the insulator 241a. The layer 253a is located on at least part of the bottom portion of the opening, and thus the conductor 240a is in contact with the layer 253a. Similarly, the insulator 241b is provided in contact with the inner wall of the opening in the insulator 281, the insulator 274, the insulator 280, the insulator 244, and the insulator 254, and the first conductor of the conductor 240b is formed in contact with the side surface of the insulator 241b. The layer 253b is located on at least part of the bottom portion of the opening, and thus the conductor 240b is in contact with the layer 253b.

In addition, when a transistor using an oxide semiconductor is surrounded by an insulator (the insulator 214, the insulator 222, the insulator 254, the insulator 244, the insulator 274, or the like) having a function of inhibiting the passage of oxygen and impurities such as hydrogen, the electrical characteristics of the transistor can be stable.

A method for manufacturing the transistor 200E illustrated in FIG. 39 is described with reference to FIG. 41 to FIG. 47. In addition, (A) in each of FIG. 41 to FIG. 47 is a top view. Furthermore, (B) in each drawing is a cross-sectional view corresponding to a portion indicated by a dashed-dotted line A1-A2 in (A), and is also a cross-sectional view of the transistor 200E in the channel length direction. Moreover, (C) in each drawing is a cross-sectional view corresponding to a portion indicated by a dashed-dotted line A3-A4 in (A), and is also a cross-sectional view of the transistor 200E in the channel width direction. Note that for clarity of the drawing, some components are not illustrated in the top view of (A) in each drawing. The method for manufacturing the transistor 200E illustrated in FIG. 39 up to the formation of the oxide 230a and the oxide 230b is similar to the method for manufacturing the transistor 200D illustrated in FIG. 28. Therefore, the method for manufacturing the transistor 200D in FIG. 30 and FIG. 31 can be referred to.

Next, the dummy gate film to be the dummy gate layer 262A is deposited over the insulator 224, the oxide 230a, and the oxide 230b. The above description can be referred to for the deposition of the dummy gate film to be the dummy gate layer 262A; thus, a detailed description thereof is omitted.

Figure 41A:
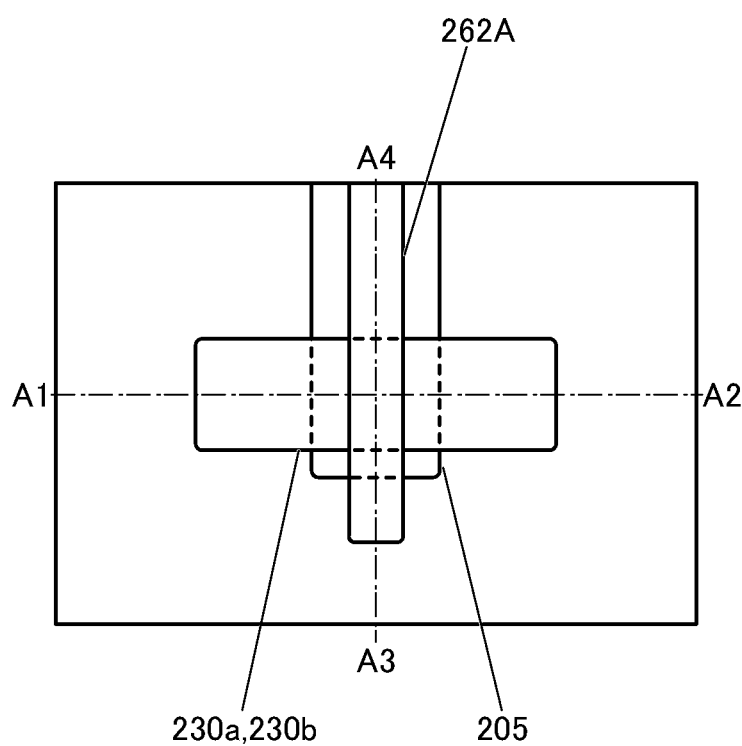
FIG. 41 (A) A top view illustrating a method for manufacturing a transistor. (B), (C) Cross-sectional views illustrating the method for manufacturing a transistor.
Figure 41C:
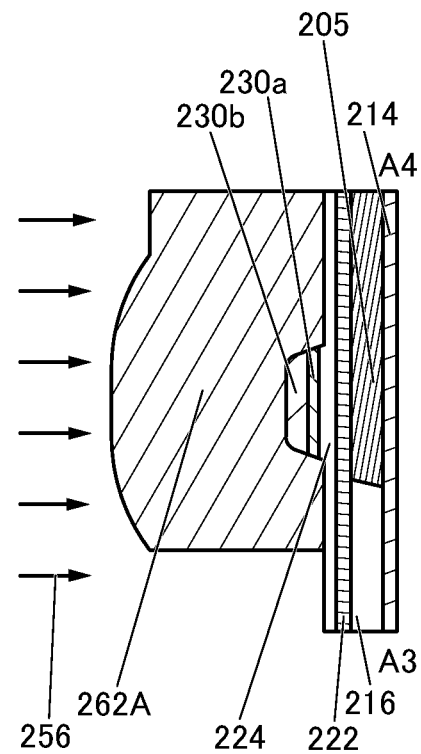
Figure 41B:
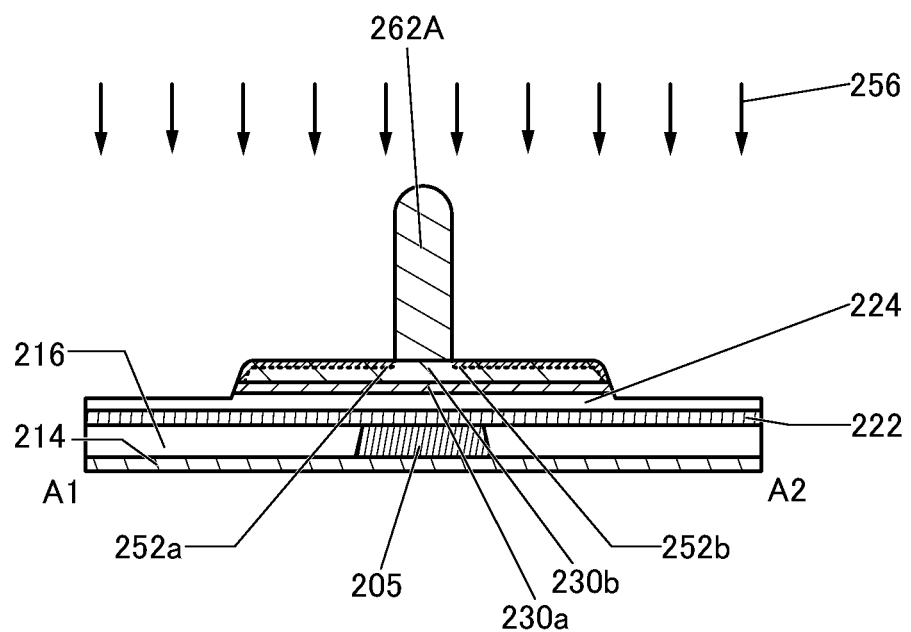

Then, the dummy gate film to be the dummy gate layer 262A is etched by a lithography method, so that the dummy gate layer 262A is formed (see FIG. 41). The dummy gate layer 262A is formed to at least partly overlap with the conductor 205 and oxide 230.

Next, a dopant 256 is added to the oxide 230b using the dummy gate layer 262A as a mask (see FIG. 41). Accordingly, the layer 252a and the layer 252b including the dopant 256 are formed in regions of the oxide 230b that do not overlap with the dummy gate layer 262A. In this manner, the distance between the layer 252a and the layer 252b, i.e., the channel length, can be controlled by the length of the dummy gate layer 262A in the channel length direction.

The description of the method for adding the dopant 257 in <Method for manufacturing transistor> can be referred to for a method for adding the dopant 256; thus, a detailed description thereof is omitted.

In addition, although the dopant 256 is added substantially perpendicularly to the top surface of the insulator 214 in FIG. 41, one embodiment of the present invention is not limited thereto. The dopant 256 may be added obliquely to the top surface of the insulator 214. By the addition of the dopant obliquely to the top surface of the insulator 214, the layer 252a and the layer 252b can be formed also in part of a region overlapping with the dummy gate layer 262A in some cases.

Figure 42A:
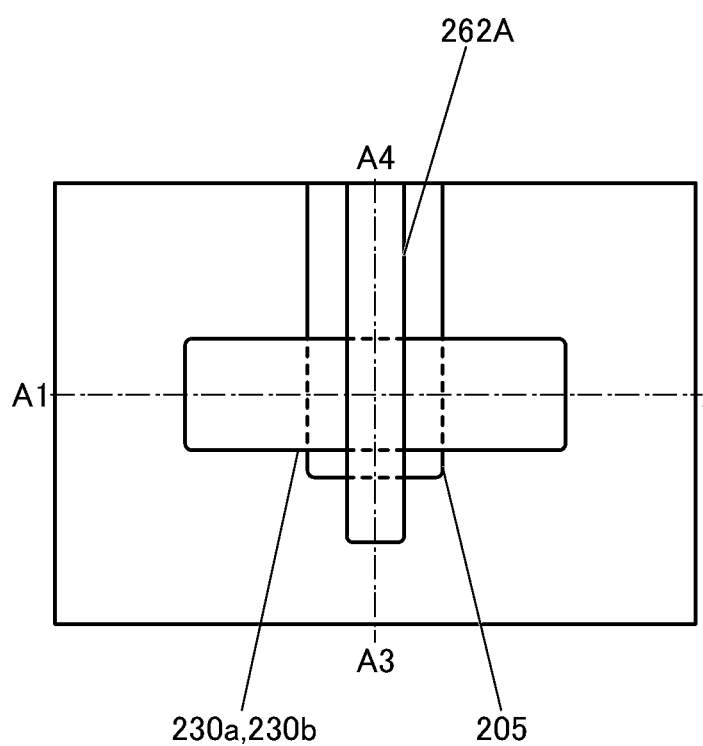
FIG. 42 (A) A top view illustrating a method for manufacturing a transistor. (B), (C) Cross-sectional views illustrating the method for manufacturing a transistor.
Figure 42C:
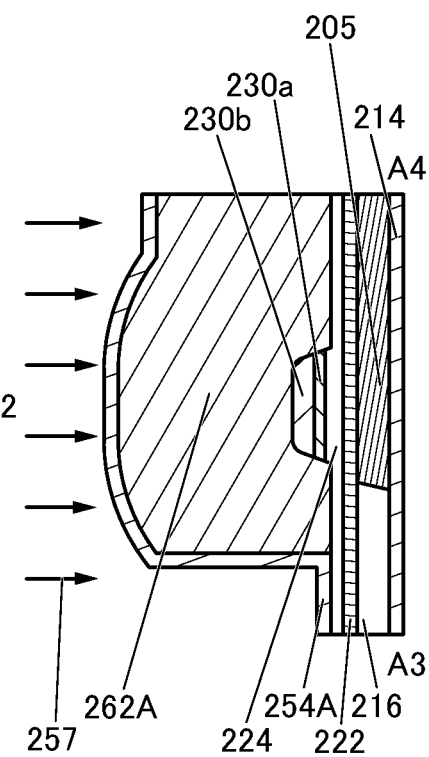
Figure 42B:
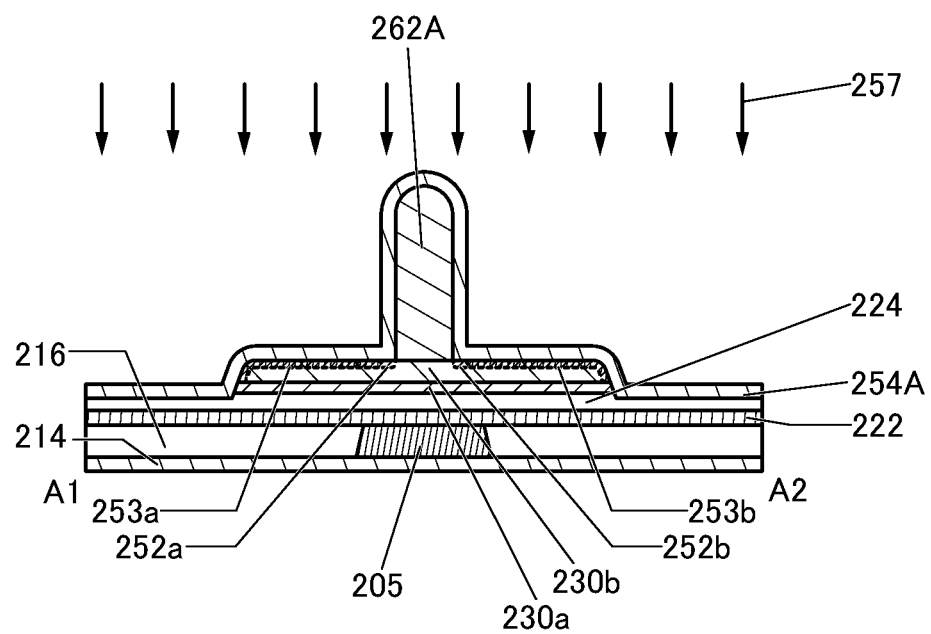

Next, the insulating film 254A is deposited to cover the oxide 230a, the oxide 230b, and the dummy gate layer 262A (see FIG. 42). The above description can be referred to for the deposition of the insulating film 254A; thus, a detailed description thereof is omitted.

Next, the dopant 257 is added to the oxide 230b using the dummy gate layer 262A and a portion of the insulating film 254A that is in contact with the dummy gate layer 262A as masks (see FIG. 42). Accordingly, the layer 253a and the layer 253b including the dopant 257 are formed in regions of the oxide 230b that do not overlap with the mask. In this manner, the thickness of the insulating film 254A can control the length of portions in the layer 252 where the layer 253 is not formed in the channel length direction (the portions correspond to the region 232a and the region 232b illustrated in FIG. 40).

A method similar to the method for adding the dopant 256 can be used as the method for adding the dopant 257. In that case, sufficient energy is preferably applied so that the dopant 257 can penetrate a portion of the insulating film 254A that is not in contact with the dummy gate layer 262A. In addition, an element that forms the oxygen vacancy, an element that is bonded to the oxygen vacancy, or the like is used as the dopant 257, like the dopant 256.

In addition, although the dopant 257 is added substantially perpendicularly to the top surface of the insulator 214 in FIG. 42, one embodiment of the present invention is not limited thereto. The dopant 257 may be added obliquely to the top surface of the insulator 214. By the addition of the dopant obliquely to the top surface of the insulator 214, the layer 253a and the layer 253b can be formed also in part of a portion of the insulating film 254A that overlaps with the dummy gate layer 262A in some cases.

In addition, in the formation method in this embodiment, the dopant 257 is added to the oxide 230 through the insulating film 254A. With this formation method, the dopant 257 is also added to the insulating film 254A. In other words, both the oxide 230 and the insulating film 254A include the element contained in the dopant 257. Furthermore, in the case where the insulating film 254A contains excess oxygen, the dopant 257 can inhibit diffusion of excess oxygen into the outside in some cases.

Note that in this embodiment, the dopant 257 is added after the insulating film 254A is deposited; however, this embodiment is not limited thereto. For example, the dopant 257 may be added after the insulating film 244A to be described later is deposited. Accordingly, the layer 253a and the layer 253b including the dopant 257 are formed in regions of the oxide 230b that overlap with none of the dummy gate layer 262A, a portion of the insulating film 254A extending in a direction perpendicular to the substrate, and a portion of the insulating film 244A extending in the direction perpendicular to the substrate.

The layer 252 and the layer 253 are formed as described above, so that the conductor 260 to be formed in a later step can be provided between the layer 252a and the layer 253a and between the layer 252b and the layer 253b in a self-aligned manner.

Figure 43A:
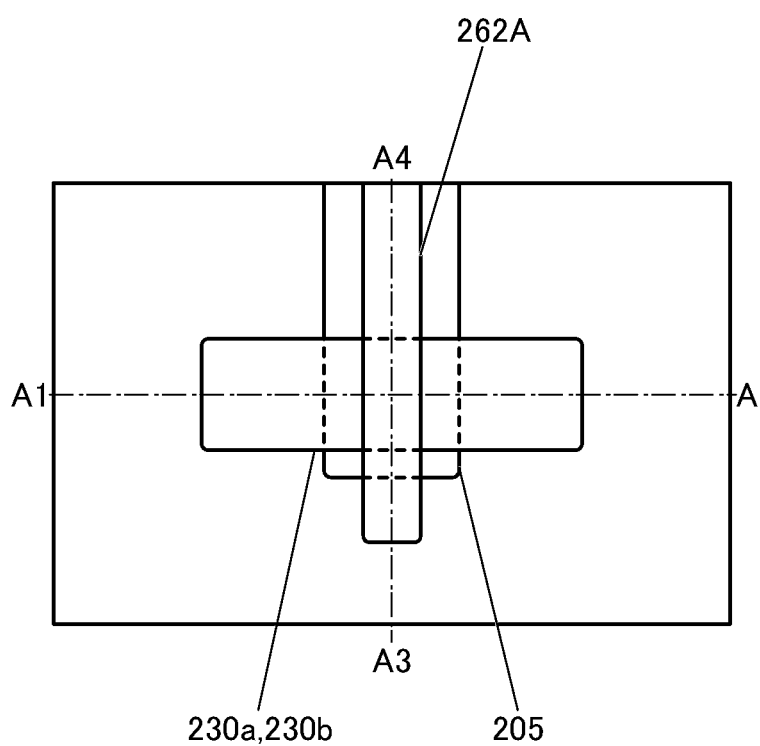
FIG. 43 (A) A top view illustrating a method for manufacturing a transistor. (B), (C) Cross-sectional views illustrating the method for manufacturing a transistor.
Figure 43C:
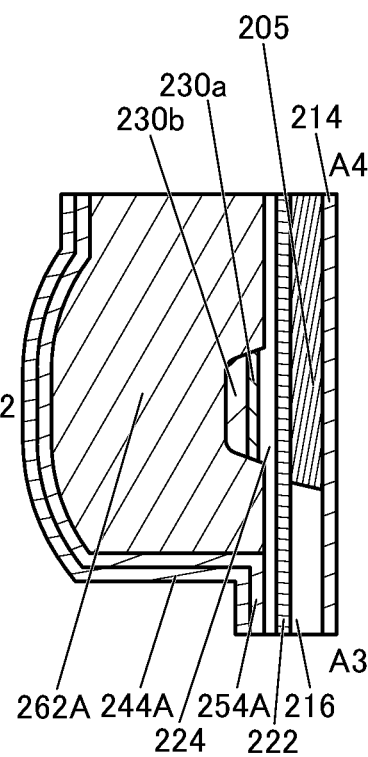
Figure 43B:
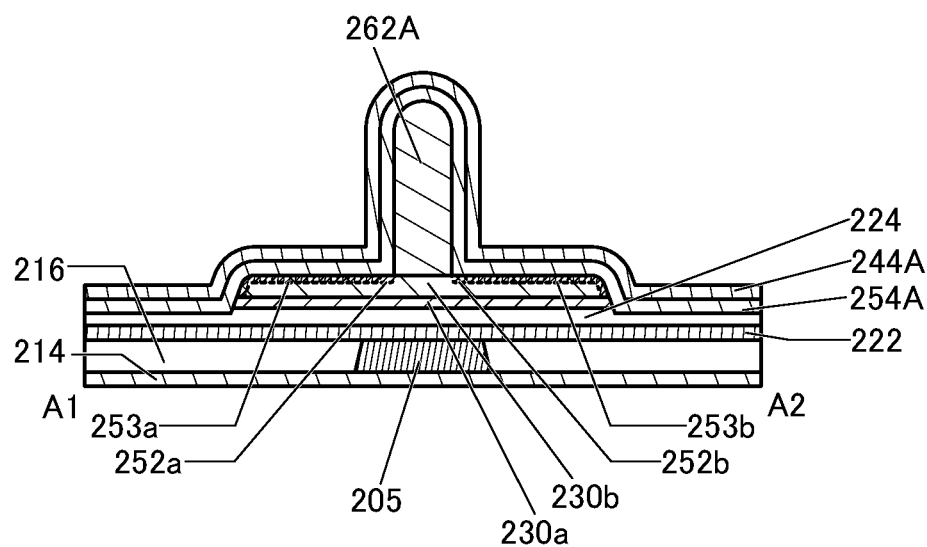

Next, the insulating film 244A is deposited over the insulating film 254A (see FIG. 43). The insulating film 244A can be deposited by a sputtering method, a CVD method, an MBE method, a PLD method, an ALD method, or the like.

As the insulating film 244A, an insulating film having a function of inhibiting diffusion of oxygen and impurities such as hydrogen is preferably used. For example, an aluminum oxide film is preferably deposited by an ALD method. With the use of the ALD method that provides good coverage, it is possible to form the insulating film 244A having a uniform thickness even in a step portion formed by the dummy gate layer 262A and the like. In addition, with the use of the ALD method, a dense thin film can be deposited. A dense thin film having good coverage can be deposited in this manner; thus, even when defects such as voids or pinholes are generated in the insulating film 254A, for example, they can be covered with the insulating film 244A.

Alternatively, aluminum nitride, silicon nitride, silicon nitride oxide, or the like may be deposited for the insulating film 244A. For example, in the case where an aluminum nitride film is deposited as the insulating film 244A by reactive sputtering using an aluminum target, the flow rate of a nitrogen gas to the total flow rate of a deposition gas is preferably higher than or equal to 30% and lower than or equal to 100%, further preferably higher than or equal to 40% and lower than or equal to 100%, still further preferably higher than or equal to 50% and lower than or equal to 100%.

Accordingly, it is possible to prevent outward diffusion of excess oxygen contained in the insulator 224 and entry of impurities such as water and hydrogen into the insulator 224 from the outside. Note that the deposition of the insulating film 244A can be omitted in some cases.

Next, the insulating film to be the insulator 280 is deposited over the insulating film 244A.

Figure 44A:
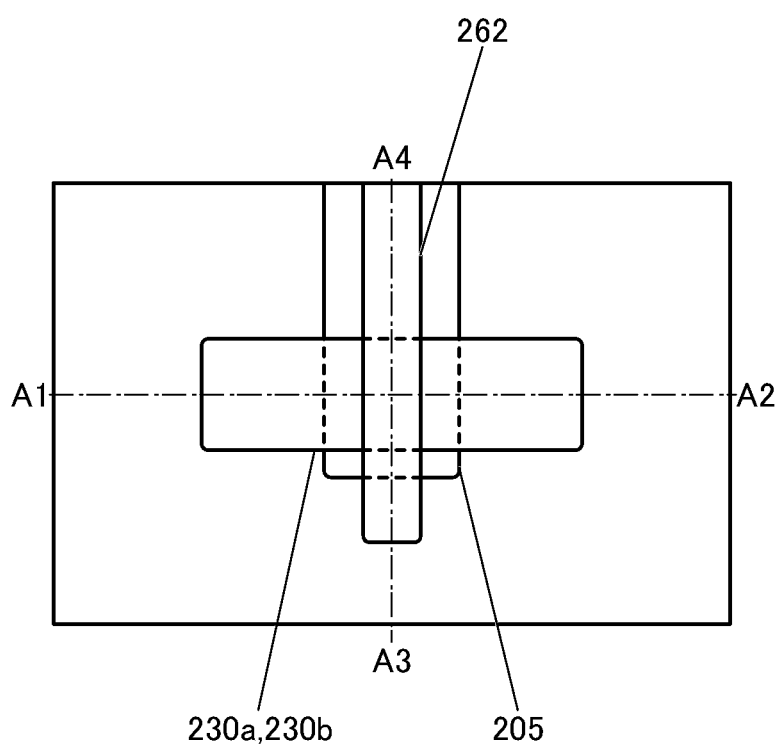
FIG. 44 (A) A top view illustrating a method for manufacturing a transistor. (B), (C) Cross-sectional views illustrating the method for manufacturing a transistor.
Figure 44C:
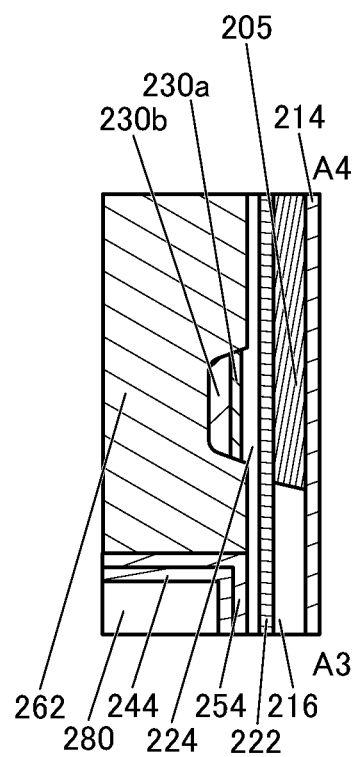

Next, the insulating film to be the insulator 280, the dummy gate layer 262A, the insulating film 254A, and the insulating film 244A are partly removed until part of the dummy gate layer 262A is exposed, so that the insulator 280, the dummy gate 262, the insulator 254, and the insulator 244 are formed (see FIG. 44). CMP treatment is preferably employed for forming the insulator 280, the dummy gate 262, an insulator 254B, and the insulator 244.

Figure 44B:
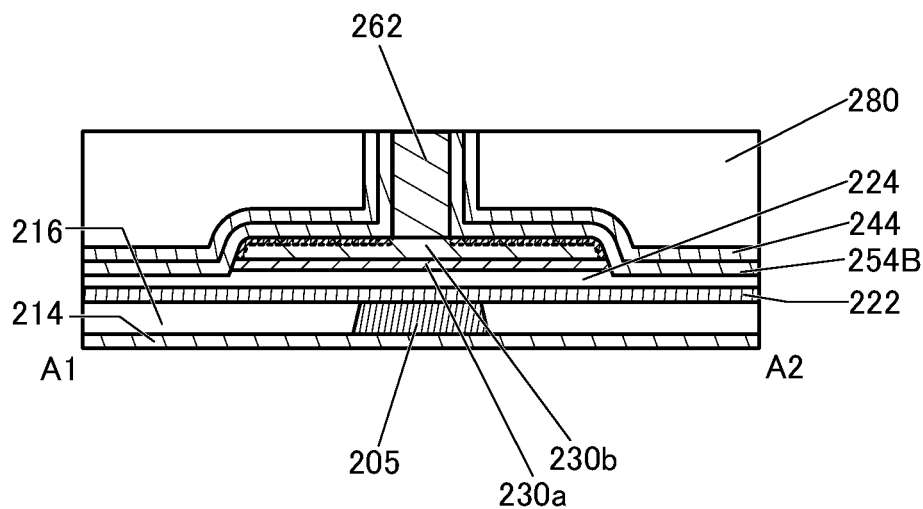

In addition, as described above, when the dummy gate layer 262A has a two-layer structure in which a conductive film and a resin film over the conductive film are formed, for example, in a CMP process, the conductive film functions as a stopper film for CMP treatment in some cases. Alternatively, the end point of the CMP treatment can be detected with the conductive film in some cases, so that variations in the height of the dummy gate 262 can be reduced in some cases. As illustrated in FIG. 44(B), the top surface of the dummy gate 262 is substantially aligned with top surfaces of the insulator 254B, the insulator 244, and the insulator 280.

Figure 45A:
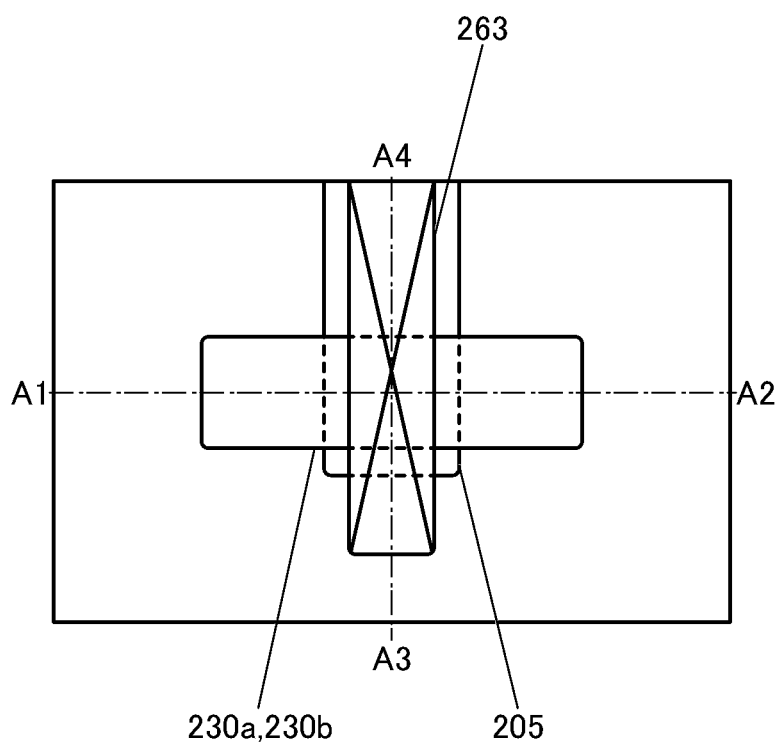
FIG. 45 (A) A top view illustrating a method for manufacturing a transistor. (B), (C) Cross-sectional views illustrating the method for manufacturing a transistor.
Figure 45C:
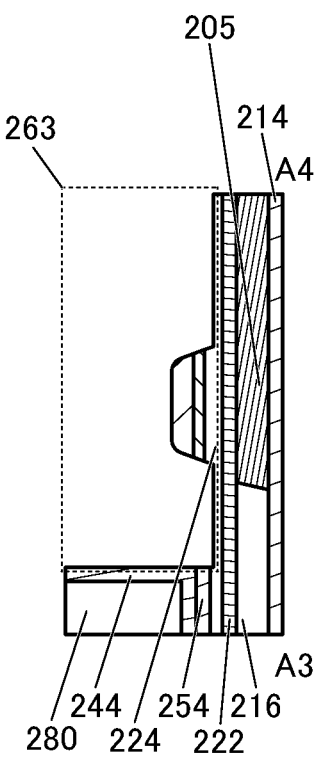
Figure 45B:
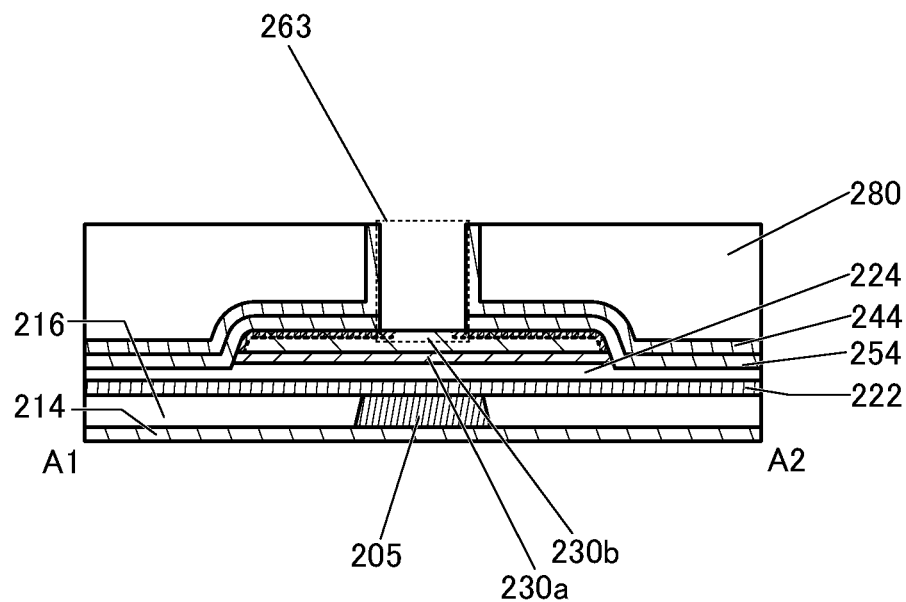

Next, the dummy gate 262 is removed to form the opening 263 (see FIG. 45). The dummy gate 262 can be removed by wet etching, dry etching, ashing, or the like. Alternatively, a plurality of above treatments may be performed in appropriate combination. For example, wet etching treatment may be performed after ashing treatment. By removing the dummy gate 262, part of the surface of the oxide 230b is exposed through the opening 263.

Next, a portion of the insulator 254B that is in contact with the dummy gate 262 is selected and removed by isotropic etching, so that the insulator 254 is formed (see FIG. 45). Here, in a top view, it is preferable that a side surface of the insulator 254 and a side surface of the insulator 244 be substantially aligned with each other so that the side surfaces correspond to side walls of the opening 263. As the isotropic etching, wet etching or etching using a reactive gas is used, for example. When part of the insulator 254B is etched, the insulator 244 preferably functions as an etching stopper. Accordingly, etching of the insulator 280 can be prevented when part of the insulator 254B is etched. When part of the insulator 254B is removed, a surface of the layer 252 is sometimes partly exposed through the opening 263.

Next, heat treatment is preferably performed before deposition of the oxide film 230C. The above description can be referred to for the heat treatment; thus, a detailed description thereof is omitted.

Next, the oxide film 230C is deposited to fill the opening 263. The above description can be referred to for the deposition of the oxide film 230C; thus, a detailed description thereof is omitted.

Next, heat treatment is preferably performed before deposition of the insulating film 250A. The above description can be referred to for the heat treatment; thus, a detailed description thereof is omitted.

Next, the insulating film 250A is deposited. The above description can be referred to for the deposition of the insulating film 250A; thus, a detailed description thereof is omitted.

Figure 46A:
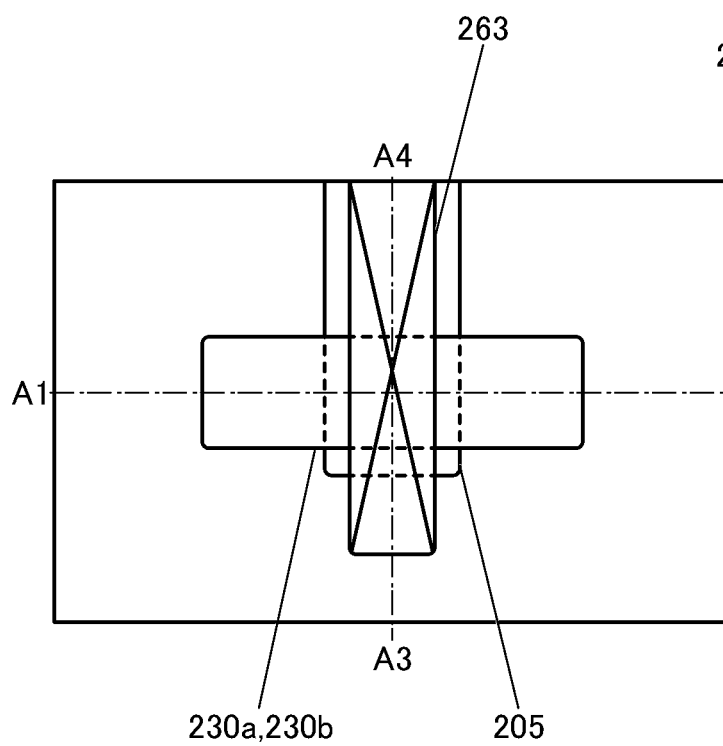
FIG. 46 (A) A top view illustrating a method for manufacturing a transistor. (B), (C) Cross-sectional views illustrating the method for manufacturing a transistor.
Figure 46C:
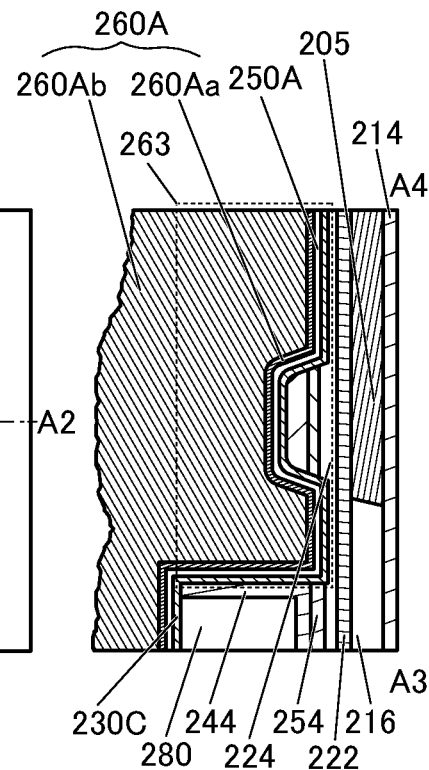
Figure 46B:
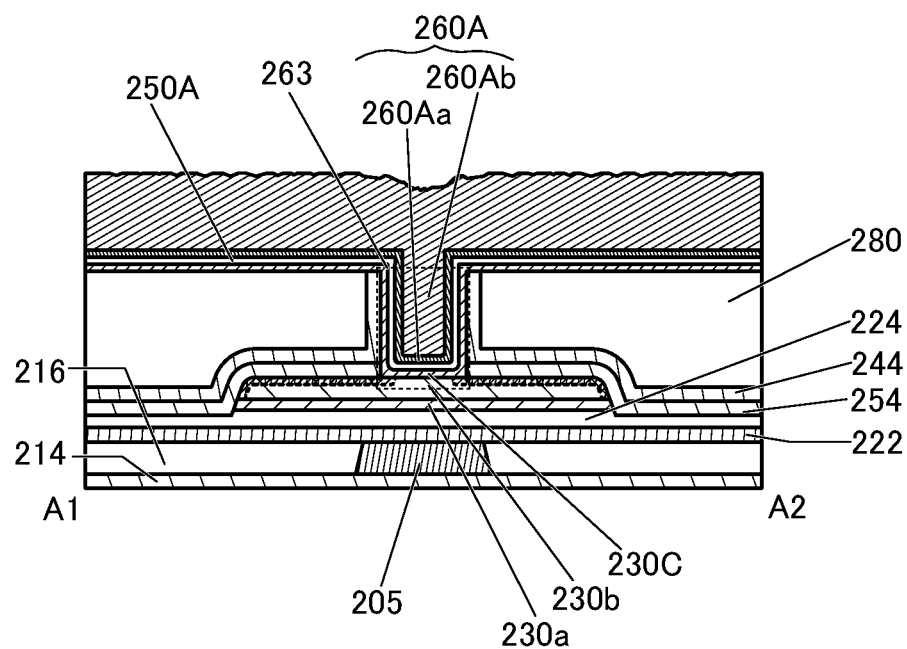

Next, the conductive film 260Aa and the conductive film 260Ab are deposited (see FIG. 46). The above description can be referred to for the deposition of the conductive film 260Aa and the conductive film 260Ab; thus, a detailed description thereof is omitted.

Then, the oxide film 230C, the insulating film 250A, the conductive film 260Aa, and the conductive film 260Ab are polished by CMP treatment until the insulator 280 is exposed, so that the oxide 230c, the insulator 250, and the conductor 260 (the conductor 260a and the conductor 260b) are formed (see FIG. 47).

Next, the insulating film to be the insulator 274 is formed over the insulator 280 (see FIG. 47). The above description can be referred to for the deposition of the insulating film to be the insulator 274; thus, a detailed description thereof is omitted.

Next, the insulator to be the insulator 281 may be deposited over the insulator 274 (see FIG. 47). The above description can be referred to for the deposition of the insulating film to be the insulator 281; thus, a detailed description thereof is omitted.

Then, openings reaching the layer 253a and the layer 253b are formed in the insulator 254, the insulator 244, the insulator 280, the insulator 274, and the insulator 281. The openings are formed by a lithography method.

Next, the insulating film to be the insulator 241 is deposited, and the insulating film is subjected to anisotropic etching to form the insulator 241. The above description can be referred to for the deposition of the insulating film to be the insulator 241 and the formation of the insulator 241; thus, a detailed description thereof is omitted.

Next, the conductive film to be the conductor 240a and the conductor 240b is deposited. The above description can be referred to for the deposition of the conductive film to be the conductor 240a and the conductor 240b; thus, a detailed description thereof is omitted.

Next, CMP treatment is performed to remove part of the conductive film to be the conductor 240a and the conductor 240b, so that the insulator 281 is exposed. As a result, the conductive film remains only in the openings, so that the conductor 240a and the conductor 240b having flat top surfaces can be formed (see FIG. 39). Note that the insulator 281 is partly removed by the CMP treatment in some cases.

Through the above process, the transistor 200E illustrated in FIG. 39 can be manufactured.

<Modification Example 2-3 of Transistor>

Figure 48A:
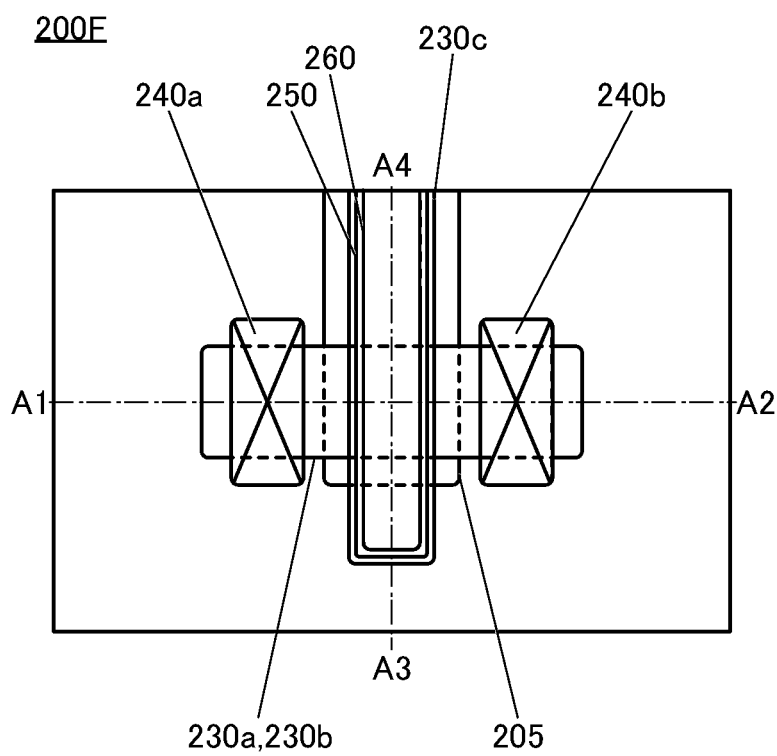
FIG. 48 (A) A top view of a transistor. (B), (C) Cross-sectional views of the transistor.
Figure 48C:
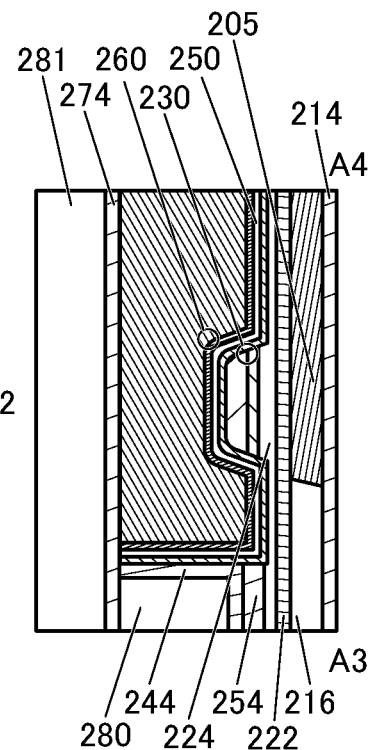
Figure 48B:
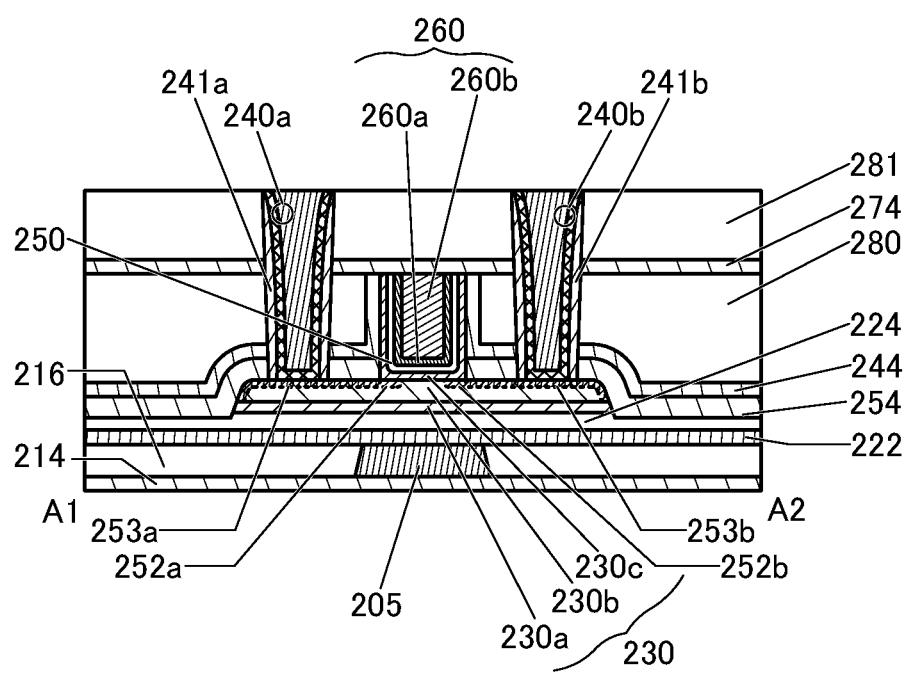

FIG. 48(A), FIG. 48(B), and FIG. 48(C) are a top view and cross-sectional views of a transistor 200F that can be used in a display device according to one embodiment of the present invention and a periphery of the transistor 200F. The transistor 200F can be applied to transistors included in the pixel portion 702, the source driver circuit portion 704, and the gate driver circuit portion 706. FIG. 48(A) is a top view of the transistor 200F. In addition, FIG. 48(B) is a cross-sectional view of a portion indicated by a dashed-dotted line A1-A2 illustrated in FIG. 48(A), and is a cross-sectional view in the channel length direction of the transistor 200F. Furthermore, FIG. 48(C) is a cross-sectional view of a portion indicated by a dashed-dotted line A3-A4 in FIG. 48(A), and is a cross-sectional view in the channel width direction of the transistor 200F. Note that for clarity of the drawing, some components in the top view in FIG. 48(A) are omitted. Furthermore, FIG. 49 is an enlarged view of the oxide 230b in FIG. 48(B) and its vicinity.

Figure 49:
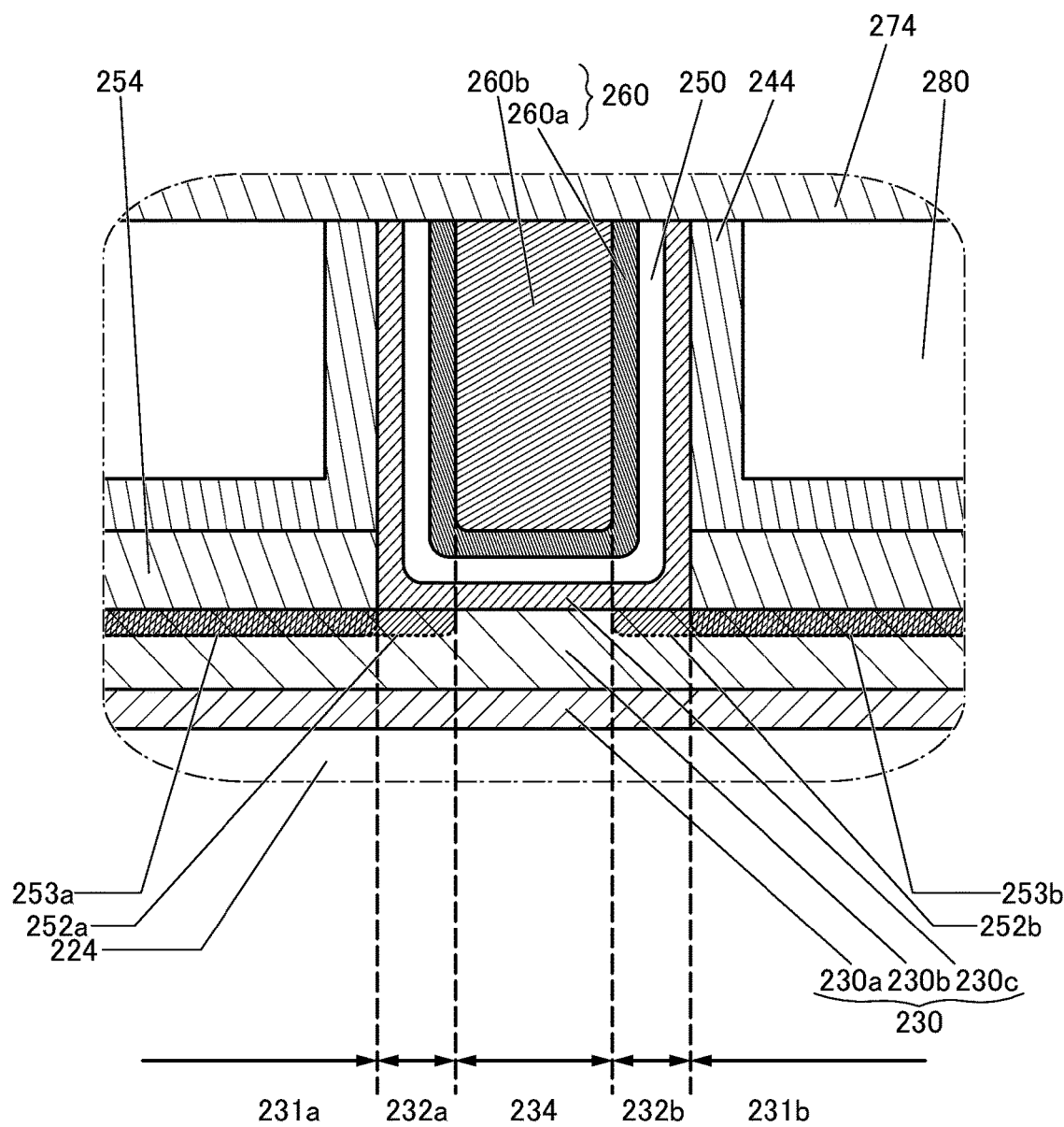
FIG. 49 A cross-sectional view of a transistor.

The transistor 200F illustrated in FIG. 48 and FIG. 49 differs from the transistor 200E illustrated in FIG. 39 in that part of the layer 252a and part of the layer 252b overlap with the conductor 260. As illustrated in FIG. 49, the part of the layer 252a and the part of the layer 252b are formed in the region 232a and the region 232b and overlap with the conductor 260. When a portion of the layer 252 that overlaps with the conductor 260 is formed, an offset region is more reliably prevented from being formed between the channel formation region and the source region or the drain region in the oxide 230, so that effective channel length can be inhibited from being longer than the width of the conductor 260. Accordingly, the transistor 200F can have higher on-state current and a favorable S-value.

As described above, the thickness of the insulating film 254A can control the length of the portions in the layer 252 where the layer 253 is not formed in the channel length direction (the portions correspond to the region 232a and the region 232b illustrated in FIG. 49). When the part of the layer 252a and the part of the layer 252b overlap with the conductor 260, the thickness of the insulating film 254A is made larger. For example, the thickness of the insulating film 254A is made larger than the sum of the thickness of the oxide film 230C and the thickness of the insulating film 250A.

The structure, composition, method, and the like described above in this embodiment can be used in appropriate combination with the structures, compositions, methods, and the like described in the other embodiments.

Embodiment 4

In this embodiment, a display device that is one embodiment of the present invention will be described.

Figure 50A:
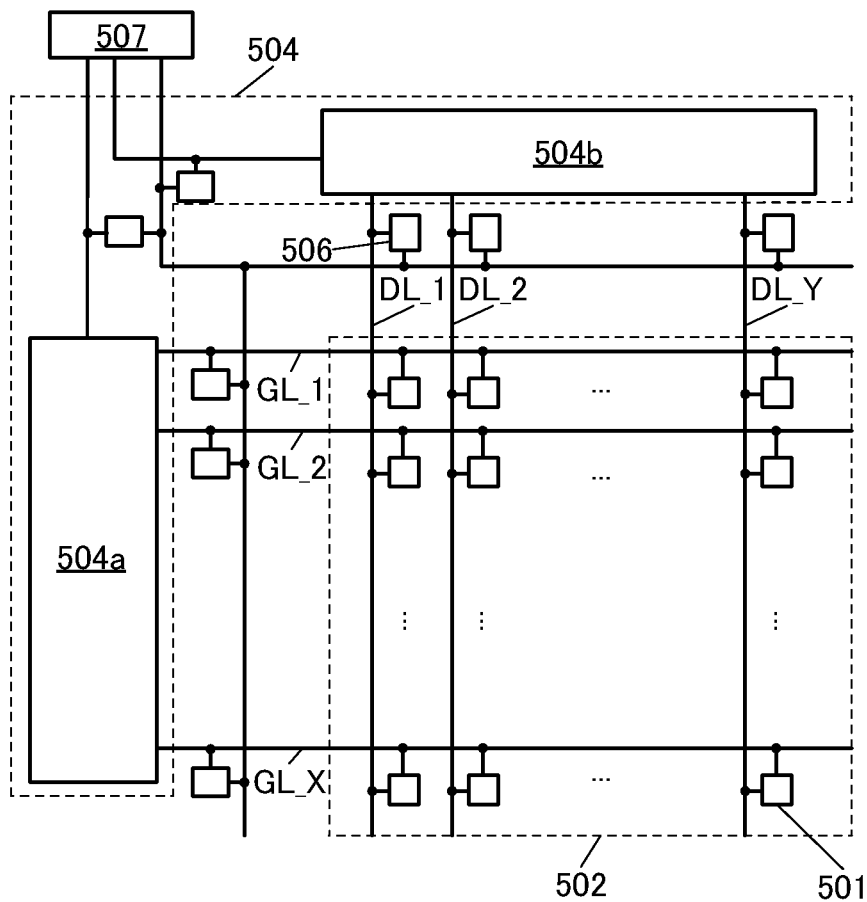
FIG. 50 (A) A block diagram of a display device. (B), (C) Circuit diagrams of display devices.

The display device illustrated in FIG. 50(A) includes a pixel portion 502, a driver circuit portion 504, protection circuits 506, and a terminal portion 507. Note that a structure in which the protection circuits 506 are not provided may be employed.

The transistors of one embodiment of the present invention can be applied to transistors included in the pixel portion 502 and the driver circuit portion 504. In addition, the transistors of one embodiment of the present invention can also be applied to the protection circuits 506.

The pixel portion 502 includes a plurality of pixel circuits 501 that drive a plurality of display elements arranged in X rows and Y columns (X and Y each independently represent a natural number of 2 or more).

The driver circuit portion 504 includes driver circuits such as a gate driver 504a that outputs a scan signal to gate lines GL_1 to GL_X and a source driver 504b that supplies a data signal to data lines DL_1 to DL_Y. The gate driver 504a includes at least a shift register. In addition, the source driver 504b is formed using a plurality of analog switches, for example. Alternatively, the source driver 504b may be formed using a shift register or the like.

The terminal portion 507 refers to a portion provided with terminals for inputting power, control signals, image signals, and the like to the display device from external circuits.

The protection circuit 506 is a circuit that makes, when a potential out of a certain range is applied to a wiring connected to the protection circuit, the wiring and another wiring be in a conduction state. The protection circuit 506 illustrated in FIG. 50(A) is connected to a variety of wirings such as scan lines GL, which are wirings between the gate driver 504a and the pixel circuits 501, and data lines DL, which are wirings between the source driver 504b and the pixel circuits 501.

In addition, the gate driver 504a and the source driver 504b may each be provided over the same substrate as the pixel portion 502, or a substrate over which a gate driver circuit or a source driver circuit is separately formed (e.g., a driver circuit board formed using a single crystal semiconductor film or a polycrystalline semiconductor film) may be mounted on the substrate by COG or TAB (Tape Automated Bonding).

Figure 50B:
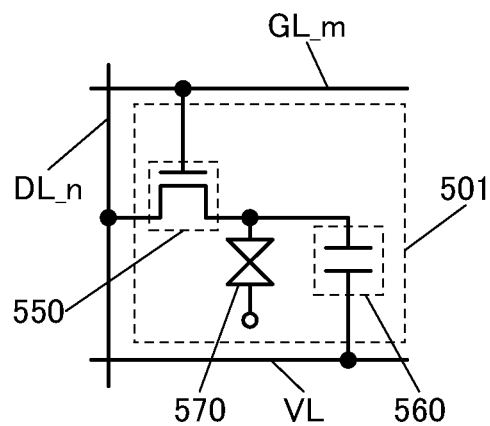
Figure 50C:
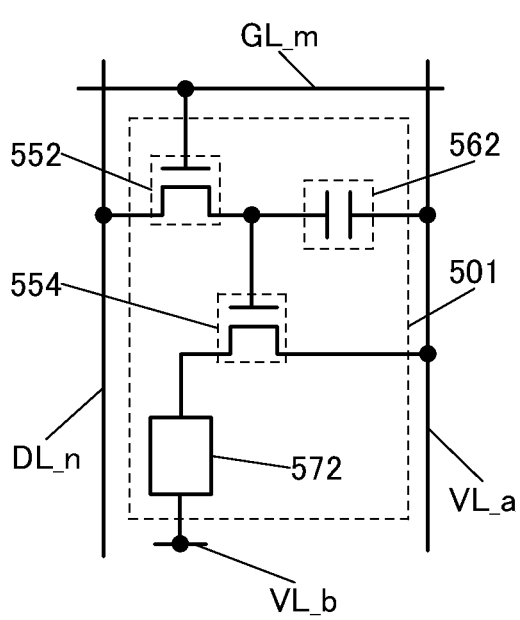

Furthermore, the plurality of pixel circuits 501 illustrated in FIG. 50(A) can have configurations illustrated in FIG. 50(B) and FIG. 50(C), for example.

The pixel circuit 501 illustrated in FIG. 50(B) includes a liquid crystal element 570, a transistor 550, and a capacitor 560. In addition, the data line DL_n, the scan line GL_m, a potential supply line VL, and the like are connected to the pixel circuit 501.

The potential of one of a pair of electrodes of the liquid crystal element 570 is set in accordance with the specifications of the pixel circuit 501 as appropriate. The alignment state of the liquid crystal element 570 is set depending on written data. Note that a common potential may be applied to one of the pair of electrodes of the liquid crystal element 570 included in each of the plurality of pixel circuits 501. Moreover, a different potential may be applied to one of the pair of electrodes of the liquid crystal element 570 included in the pixel circuit 501 in each row.

In addition, the pixel circuit 501 illustrated in FIG. 50(C) includes a transistor 552, a transistor 554, a capacitor 562, and a light-emitting element 572. Furthermore, the data line DL_n, the scan line GL_m, a potential supply line VL_a, a potential supply line VL_b, and the like are connected to the pixel circuit 501.

Note that a high power supply potential $V_{DD}$ is applied to one of the potential supply line VL_a and the potential supply line VL_b, and a low power supply potential $V_{SS}$ is applied to the other. Current flowing through the light-emitting element 572 is controlled in accordance with a potential applied to a gate of the transistor 554, so that the luminance of light emitted from the light-emitting element 572 is controlled.

Figure 51A:
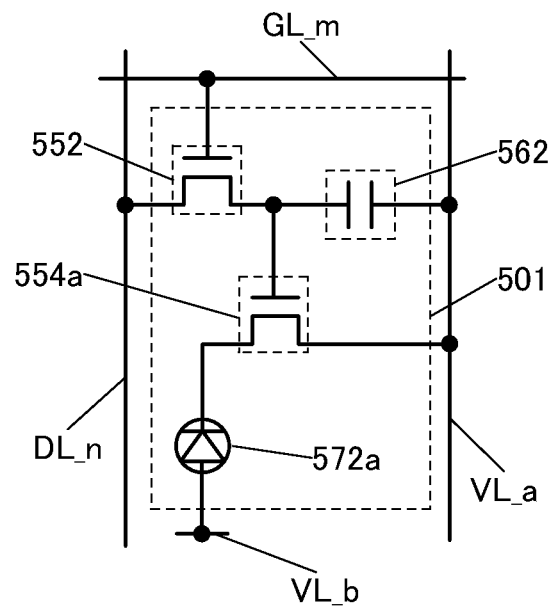
FIG. 51 (A), (B), (C) Circuit diagrams of display devices.

FIG. 51(A) illustrates an example of using an n-channel transistor as the transistor 554 in the pixel circuit 501 illustrated in FIG. 50(C). The pixel circuit 501 illustrated in FIG. 51(A) includes the transistor 552, a transistor 554a, the capacitor 562, and a light-emitting element 572a. The transistor 552 is an n-channel transistor, and the transistor 554a is an n-channel transistor. For example, the transistor including an oxide semiconductor in a channel formation region that is described in the above embodiment can be applied to the transistor 552, and a transistor including silicon in a channel formation region can be applied to the transistor 554a.

Alternatively, for example, the transistor including an oxide semiconductor in a channel formation region that is described in the above embodiment can be applied to each of the transistor 552 and the transistor 554a. With such a structure, the area occupied by the transistors in pixels can be reduced, so that an extremely high-definition image can be displayed.

In the pixel circuit 501 illustrated in FIG. 51(A), one of a source and a drain of the transistor 552 is electrically connected to the data line DL_n. The other of the source and the drain of the transistor 552 is electrically connected to one electrode of the capacitor 562 and a gate of the transistor 554a. The other electrode of the capacitor 562 is electrically connected to the potential supply line VL_a. A gate of the transistor 552 is electrically connected to the scan line GL_m. One of a source and a drain of the transistor 554a is electrically connected to the potential supply line VL_a. The other of the source and the drain of the transistor 554a is electrically connected to one electrode of the light-emitting element 572a. The other electrode of the light-emitting element 572a is electrically connected to the potential supply line VL_b. The low power supply potential $V_{SS}$ is applied to the potential supply line VL_a, and the high power supply potential $V_{DD}$ is applied to the potential supply line VL_b.

Figure 51B:
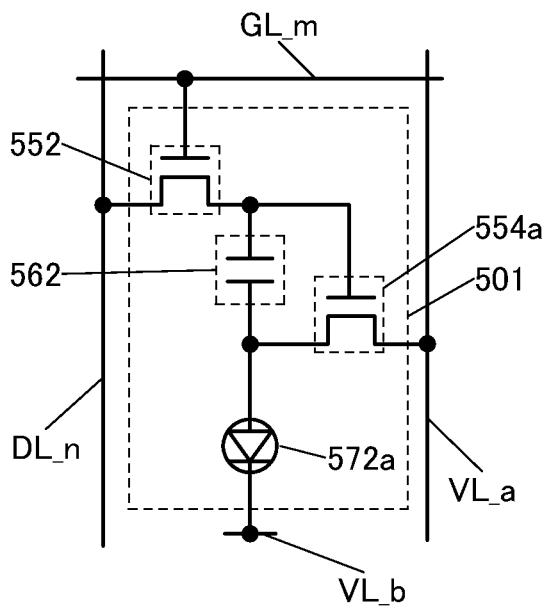

FIG. 51(B) illustrates a structure different from that of the pixel circuit 501 illustrated in FIG. 51(A). In the pixel circuit 501 illustrated in FIG. 51(B), the one of the source and the drain of the transistor 552 is electrically connected to the data line DL_n. The other of the source and the drain of the transistor 552 is electrically connected to the one electrode of the capacitor 562 and the gate of the transistor 554a. The gate of the transistor 552 is electrically connected to the scan line GL_m. The one of a source and the drain of the transistor 554a is electrically connected to the potential supply line VL_a. The other of the source and the drain of the transistor 554a is electrically connected to the other electrode of the capacitor 562 and the one electrode of the light-emitting element 572a. The other electrode of the light-emitting element 572a is electrically connected to the potential supply line VL_b. The high power supply potential $V_{DD}$ is applied to the potential supply line VL_a, and the low power supply potential $V_{SS}$ is applied to the potential supply line VL_b.

Figure 51C:
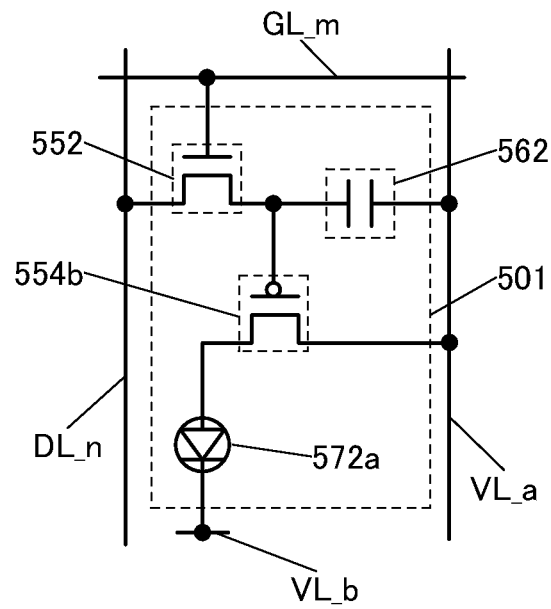

FIG. 51(C) illustrates an example of using a p-channel transistor as the transistor 554 in the pixel circuit 501 illustrated in FIG. 50(C). The pixel circuit 501 illustrated in FIG. 51(C) includes the transistor 552, a transistor 554b, the capacitor 562, and the light-emitting element 572a. The transistor 552 is an n-channel transistor, and the transistor 554b is a p-channel transistor. For example, the transistor including an oxide semiconductor in a channel formation region that is described in the above embodiment can be applied to the transistor 552, and a transistor including silicon in a channel formation region can be applied to the transistor 554b.

In the pixel circuit 501 illustrated in FIG. 51(C), the one of the source and the drain of the transistor 552 is electrically connected to the data line DL_n. The other of the source and the drain of the transistor 552 is electrically connected to the one electrode of the capacitor 562 and a gate of the transistor 554b. The other electrode of the capacitor 562 is electrically connected to the potential supply line VL_a. The gate of the transistor 552 is electrically connected to the scan line GL_m. One of a source and a drain of the transistor 554b is electrically connected to the potential supply line VL_a. The other of the source and the drain of the transistor 554a is electrically connected to one electrode of the light-emitting element 572a. The other electrode of the light-emitting element 572a is electrically connected to the potential supply line VL_b. The high power supply potential $V_{DD}$ is applied to the potential supply line VL_a, and the low power supply potential $V_{SS}$ is applied to the potential supply line VL_b.

At least part of the structure examples, the drawings corresponding thereto, and the like illustrated in this embodiment can be implemented in combination with the other structure examples, the other drawings, and the like as appropriate.

At least part of this embodiment can be implemented in combination with the other embodiments described in this specification as appropriate.

Embodiment 5

A pixel circuit including a memory for correcting gray levels displayed by pixels and a display device including the pixel circuit will be described. The transistors described in the above embodiment can be applied to transistors used in the pixel circuit described below.

<Circuit Configuration>

Figure 52A:
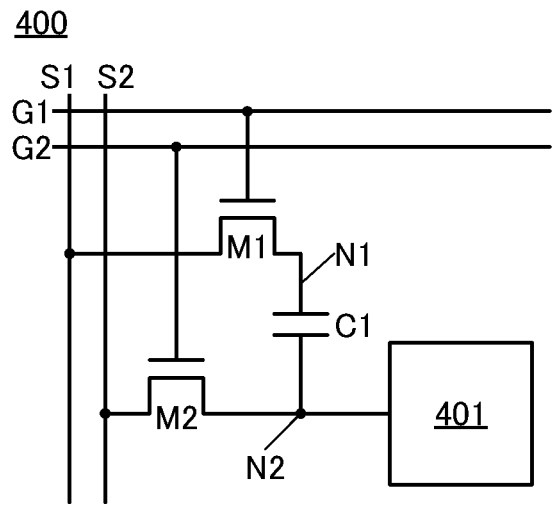
FIG. 52 (A), (C), (D) Circuit diagrams of display devices. (B) A timing chart of the display device.

FIG. 52(A) shows a circuit diagram of a pixel circuit 400. The pixel circuit 400 includes a transistor M1, a transistor M2, a capacitor C1, and a circuit 401. In addition, a wiring S1, a wiring S2, a wiring G1, and a wiring G2 are connected to the pixel circuit 400.

In the transistor M1, a gate is connected to the wiring G1, one of a source and a drain is connected to the wiring S1, and the other of the source and the drain is connected to one electrode of the capacitor C1. In the transistor M2, a gate is connected to the wiring G2, one of a source and a drain is connected to the wiring S2, and the other of the source and the drain is connected to the other electrode of the capacitor C1 and the circuit 401.

The circuit 401 a circuit including at least one display element. A variety of elements can be used as the display element, and typically, a light-emitting element such as an organic light-emitting element or an LED element, a liquid crystal element, a MEMS element, or the like can be employed.

A node connecting the transistor M1 and the capacitor C1 is denoted by N1, and a node connecting the transistor M2 and the circuit 401 is denoted by N2.

In the pixel circuit 400, the potential of the node N1 can be retained when the transistor M1 is turned off. In addition, the potential of the node N2 can be retained when the transistor M2 is turned off. Furthermore, when a predetermined potential is written to the node N1 through the transistor M1 with the transistor M2 being in an off state, the potential of the node N2 can be changed in accordance with displacement of the potential of the node N1 owing to capacitive coupling through the capacitor C1.

Here, the transistor using an oxide semiconductor, which is described in the above embodiment as an example, can be applied to either one or both the transistor M1 and the transistor M2. Accordingly, the potentials of the node N1 and the node N2 can be retained for a long time owing to an extremely low off-state current. Note that a transistor using a semiconductor such as silicon may be used in the case where the potential of each node is retained for a short time (specifically, in the case where frame frequency is higher than or equal to 30 Hz, for example).

[Driving Method Example]

Figure 52B:
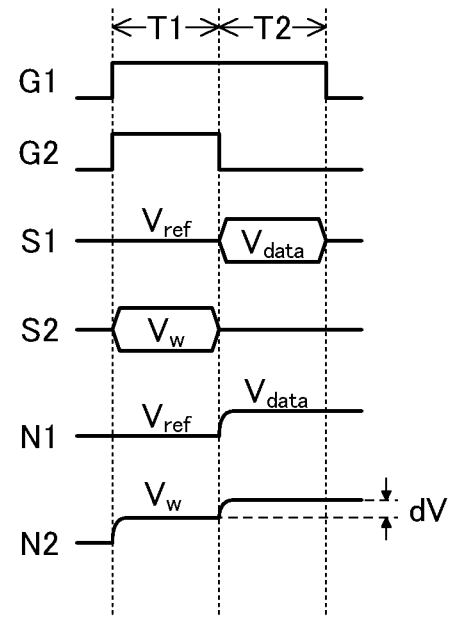

Next, an example of a method for operating the pixel circuit 400 is described with reference to FIG. 52(B). FIG. 52(B) is a timing chart according to the operation of the pixel circuit 400. Note that here, for simplification of description, the influence of a variety of resistance such as wiring resistance, parasitic capacitance of a transistor, a wiring, and the like, the threshold voltage of a transistor, and the like are not taken into consideration.

In the operation shown in FIG. 52(B), one frame period is divided into a period T1 and a period T2. The period T1 is a period in which a potential is written to the node N2, and the period T2 is a period in which a potential is written to the node N1.

[Period T1]

In the period T1, a potential for turning on the transistor is applied to both the wiring G1 and the wiring G2. In addition, a potential $V_{ref}$ that is a fixed potential is supplied to the wiring S1, and a first data potential $V_w$ is supplied to the wiring S2.

The potential $V_{ref}$ is applied from the wiring S1 to the node N1 through the transistor M1. In addition, the first data potential $V_w$ is applied to the node N2 through the transistor M2. Accordingly, a potential difference $V_w - V_{ref}$ is retained in the capacitor C1.

[Period T2]

Next, in the period T2, a potential for turning on the transistor M1 is applied to the wiring G1, and a potential for turning off the transistor M2 is applied to the wiring G2. In addition, a second data potential Vdata is supplied to the wiring S1. The wiring S2 may be supplied with a predetermined potential or may be set in a floating state.

The second data potential $V_{data}$ is applied to the node N1 through the transistor M1. At this time, capacitive coupling through the capacitor C1 changes the potential of the node N2 by a potential dV in accordance with the second data potential $V_{data}$. That is, a potential that is the sum of the first data potential $V_w$ and the potential dV is input to the circuit 401. Note that although dV is shown as having a positive value in FIG. 52(B), dV may have a negative value. In other words, the potential $V_{data}$ may be lower than the potential $V_{ref}$.

Here, the potential dV is roughly determined by the capacitance of the capacitor C1 and the capacitance of the circuit 401. When the capacitance of the capacitor C1 is sufficiently higher than the capacitance of the circuit 401, the potential dV is a potential close to the second data potential $V_{data}$.

In the pixel circuit 400, a potential to be supplied to the circuit 401 including the display element can be generated by a combination of two kinds of data signals as described above, so that gray levels can be corrected in the pixel circuit 400.

In addition, in the pixel circuit 400, it is also possible to generate a potential exceeding the maximum potential that can be supplied to the wiring S1 and the wiring S2. For example, in the case of using a light-emitting element, high-dynamic range (HDR) display or the like can be performed. Furthermore, in the case of using a liquid crystal element, overdriving or the like can be achieved.

Application Example

[Example Using Liquid Crystal Element]

Figure 52C:
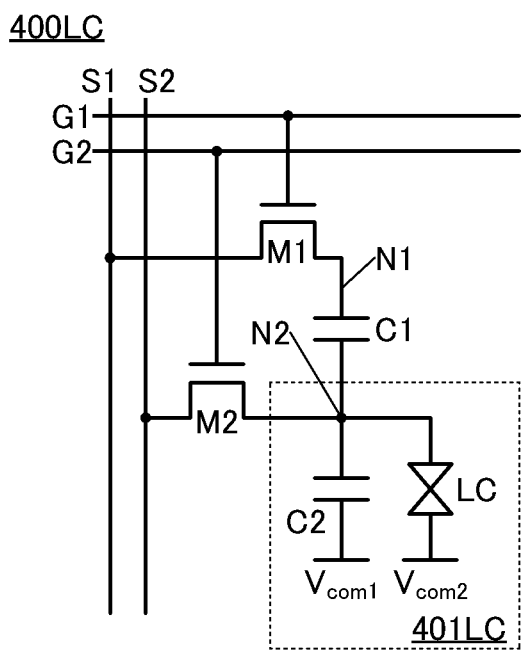

A pixel circuit 400LC illustrated in FIG. 52(C) includes a circuit 401LC. The circuit 401LC includes a liquid crystal element LC and a capacitor C2.

One electrode of the liquid crystal element LC is connected to the node N2 and one electrode of the capacitor C2, and the other electrode of the liquid crystal element LC is connected to a wiring supplied with a potential $V_{com2}$. The other electrode of the capacitor C2 is connected to a wiring supplied with a potential $V_{com1}$.

The capacitor C2 functions as a storage capacitor. Note that the capacitor C2 can be omitted when not needed.

In the pixel circuit 400LC, a high voltage can be supplied to the liquid crystal element LC; thus, high-speed display can be performed by overdriving or a liquid crystal material with a high drive voltage can be employed, for example. In addition, gray levels can also be corrected in accordance with operating temperature, the degradation state of the liquid crystal element LC, or the like by supply of a correction signal to the wiring S1 or the wiring S2.

[Example Using Light-Emitting Element]

Figure 52D:
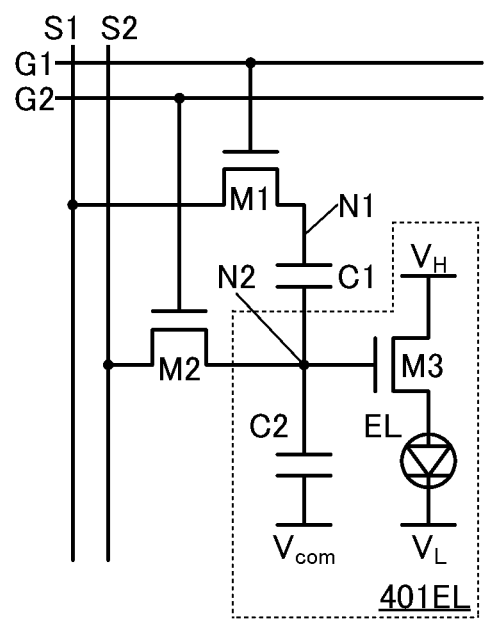

A pixel circuit 400EL illustrated in FIG. 52(D) includes a circuit 401EL. The circuit 401EL includes a light-emitting element EL, a transistor M3, and the capacitor C2.

In the transistor M3, a gate is connected to the node N2 and one electrode of the capacitor C2, one of a source and a drain is connected to a wiring supplied with a potential $V_H$, and the other of the source and the drain is connected to one electrode of the light-emitting element EL. The other electrode of the capacitor C2 is connected to a wiring supplied with a potential $V_{com}$. The other electrode of the light-emitting element EL is connected to a wiring supplied with a potential $V_L$.

The transistor M3 has a function of controlling current to be supplied to the light-emitting element EL. The capacitor C2 functions as a storage capacitor. The capacitor C2 can be omitted when not needed.

Note that although a structure is described here in which the anode side of the light-emitting element EL is connected to the transistor M3, the transistor M3 may be connected to the cathode side. In that case, the values of the potential $V_H$ and the potential $V_L$ can be changed as appropriate.

In the pixel circuit 400EL, a large amount of current can flow through the light-emitting element EL when a high potential is applied to the gate of the transistor M3, which enables HDR display or the like, for example. In addition, a variation in electrical characteristics of the transistor M3 and the light-emitting element EL can also be corrected by supply of a correction signal to the wiring S1 or the wiring S2.

Note that without limitation to the circuits illustrated in FIG. 52(C) and FIG. 52(D), a configuration to which a transistor, a capacitor, or the like is further added may be employed.

At least part of this embodiment can be implemented in combination with the other embodiments described in this specification as appropriate.

Embodiment 6

In this embodiment, light-emitting elements that can be used in a display device according to one embodiment of the present invention will be described.

<<Basic Structure of Light-Emitting Element>>

Figure 53A:
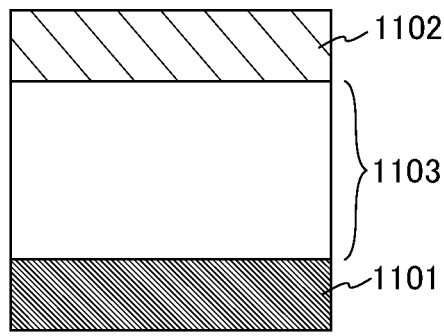
FIG. 53 (A), (B), (C), (D), (E) Diagrams each showing a structure of a light-emitting element.

FIG. 53(A) illustrates a light-emitting element including an EL layer sandwiched between a pair of electrodes. Specifically, the light-emitting element has a structure in which an EL layer 1103 is sandwiched between a first electrode 1101 and a second electrode 1102.

Figure 53B:
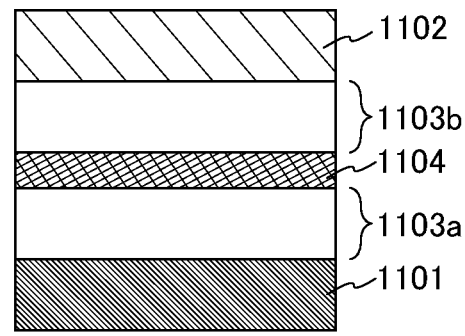

FIG. 53(B) illustrates a light-emitting element that has a stacked-layer structure (a tandem structure) in which a plurality of EL layers (two EL layers 1103*a* and 1103*b* in FIG. 53(B)) are provided between a pair of electrodes and a charge-generation layer 1104 is sandwiched between the EL layers. With such a light-emitting element having a tandem structure, a light-emitting device that can be driven at low voltage with low power consumption can be achieved.

Note that the charge-generation layer 1104 has a function of injecting electrons into one of the EL layers (1103*a* or 1103*b*) and injecting holes into the other of the EL layers (1103*b* or 1103*a*) when voltage is applied between the first electrode 1101 and the second electrode 1102. Thus, when voltage is applied in FIG. 53(B) such that the potential of the first electrode 1101 is higher than that of the second electrode 1102, the charge-generation layer 1104 injects electrons into the EL layer 1103*a* and injects holes into the EL layer 1103*b*.

In terms of light extraction efficiency, the charge-generation layer 1104 preferably has a visible light-transmitting property (specifically, the charge-generation layer 1104 has a visible light transmittance of higher than or equal to 40%). The charge-generation layer 1104 functions even when it has lower conductivity than the first electrode 1101 or the second electrode 1102.

Figure 53C:
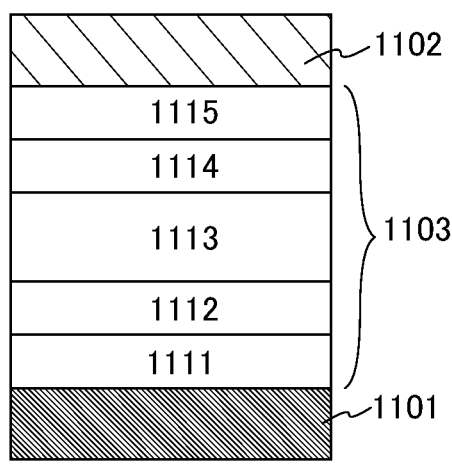

FIG. 53(C) illustrates the stacked-layer structure of the EL layer 1103. In the case where the first electrode 1101 functions as an anode in FIG. 53(C), the EL layer 1103 has a structure in which a hole-injection layer 1111, a hole-transport layer 1112, a light-emitting layer 1113, an electron-transport layer 1114, and an electron-injection layer 1115 are stacked in this order over the first electrode 1101. Even in the case where a plurality of EL layers are provided as in the tandem structure illustrated in FIG. 53(B), a structure is employed in which the layers in each EL layer are sequentially stacked from the anode side as described above. Note that when the first electrode 1101 is a cathode and the second electrode 1102 is an anode, the stacking order is reversed.

The light-emitting layer 1113 included in the EL layers (1103, 1103*a*, and 1103*b*) contains an appropriate combination of a light-emitting substance and a plurality of substances, and can have a structure where fluorescent emission or phosphorescent emission with a desired emission color can be obtained. Alternatively, the light-emitting layer 1113 may have a stacked-layer structure having different emission colors. Note that in that case, different materials may be used for the light-emitting substance and other substances used in each of the light-emitting layers that are stacked. Alternatively, a structure may be employed in which different emission colors can be obtained from the plurality of EL layers (1103*a* and 1103*b*) illustrated in FIG. 53(B). Also in that case, different materials are used for the light-emitting substance and other substances used in each of the light-emitting layers.

In addition, in the light-emitting element, a structure may be employed in which light emission obtained from the EL layers (1103, 1103*a*, and 1103*b*) is resonated between both of the electrodes so that the obtained light emission is intensified. For example, in FIG. 53(C), the light-emitting element can have a micro optical resonator (microcavity) structure when the first electrode 1101 is a reflective electrode and the second electrode 1102 is a transflective electrode, and light emission obtained from the EL layer 1103 can be intensified.

Note that when the first electrode 1101 of the light-emitting element is a reflective electrode having a stacked structure of a reflective conductive material and a light-transmitting conductive material (a transparent conductive film), optical adjustment can be performed by controlling the thickness of the transparent conductive film. Specifically, when the wavelength of light obtained from the light-emitting layer 1113 is $\lambda$, the distance between the first electrode 1101 and the second electrode 1102 is preferably adjusted to around $m\lambda/2$ (note that m is a natural number).

In addition, to amplify desired light (wavelength: $\lambda$) obtained from the light-emitting layer 1113, the optical path length from the first electrode 1101 to a region (a light-emitting region) in the light-emitting layer 1113 where the desired light is obtained and the optical path length from the second electrode 1102 to the region (the light-emitting region) in the light-emitting layer 1113 where the desired light is obtained are preferably adjusted to around $(2m'+1)\lambda/4$ (note that m' is a natural number). Note that here, the light-emitting region means a region where holes and electrons are recombined in the light-emitting layer 1113.

By such optical adjustment, the spectrum of specific monochromatic light obtained from the light-emitting layer 1113 can be narrowed and light emission with high color purity can be obtained.

Note that in the above case, the optical path length between the first electrode 1101 and the second electrode 1102 is, to be exact, the total thickness from a reflective region in the first electrode 1101 to a reflective region in the second electrode 1102. However, it is difficult to precisely determine the reflective regions in the first electrode 1101 and the second electrode 1102; thus, it is assumed that the above effect can be sufficiently obtained with given positions in the first electrode 1101 and the second electrode 1102 being supposed to be reflective regions. Furthermore, the optical path length between the first electrode 1101 and the light-emitting layer from which the desired light is obtained is, to be exact, the optical path length between the reflective region in the first electrode 1101 and the light-emitting region in the light-emitting layer from which the desired light is obtained. However, it is difficult to precisely determine the reflective region in the first electrode 1101 and the light-emitting region in the light-emitting layer from which the desired light is obtained; thus, it is assumed that the above effect can be sufficiently obtained with a given position in the first electrode 1101 being supposed to be the reflective region and a given position in the light-emitting layer from which the desired light is obtained being supposed to be the light-emitting region.

In the case where the light-emitting element illustrated in FIG. 53(C) has a microcavity structure, light (monochromatic light) with different wavelengths can be extracted even when the same EL layer is used. Thus, separate coloring for obtaining different emission colors (e.g., R, G, and B) is not necessary, and high definition can be achieved. In addition, a combination with coloring layers (color filters) is also possible. Furthermore, emission intensity of light with a specific wavelength in the front direction can be increased, so that power consumption can be reduced.

Note that at least one of the first electrode 1101 and the second electrode 1102 is a light-transmitting electrode (e.g., a transparent electrode or a transflective electrode). In the case where the light-transmitting electrode is a transparent electrode, the transparent electrode has a visible light transmittance of higher than or equal to 40%. Alternatively, in the case where the light-transmitting electrode is a transflective electrode, the transflective electrode has a visible light reflectance of higher than or equal to 20% and lower than or equal to 80%, preferably higher than or equal to 40% and lower than or equal to 70%. In addition, these electrodes preferably have a resistivity of lower than or equal to $1\times10^{-2}$ Ωcm.

In addition, when one of the first electrode 1101 and the second electrode 1102 is a reflective electrode, the reflective electrode has a visible light transmittance of higher than or equal to 40% and lower than or equal to 100%, preferably higher than or equal to 70% and lower than or equal to 100%. Furthermore, this electrode preferably has a resistivity of lower than or equal to $1\times10^{-2}$ Ωcm.

<<Specific Structure and Manufacturing Method of Light-Emitting Element>>

Next, specific structures and manufacturing methods of light-emitting elements will be described. Note that portions denoted by the same reference numeral in FIG. 53(A) to FIG. 53(D) can be described in the same way.

<First Electrode and Second Electrode>

As materials for forming the first electrode 1101 and the second electrode 1102, the following materials can be used in appropriate combination as long as the functions of the electrodes in the element structure described above can be fulfilled. For example, a metal, an alloy, an electrically conductive compound, a mixture of these, and the like can be used as appropriate.

When the light-emitting element illustrated in FIG. 53 includes the EL layer 1103 having a stacked-layer structure as in FIG. 53(C) and the first electrode 1101 is an anode, the hole-injection layer 1111 and the hole-transport layer 1112 of the EL layer 1103 are sequentially stacked over the first electrode 1101 by a vacuum evaporation method. Alternatively, when the plurality of EL layers (1103a and 1103b) each having a stacked-layer structure are stacked with the charge-generation layer 1104 therebetween as in FIG. 53(D) and the first electrode 1101 is an anode, a hole-injection layer 1111a and a hole-transport layer 1112a of the EL layer 1103a are sequentially stacked over the first electrode 1101 by a vacuum evaporation method. Furthermore, after the EL layer 1103a and the charge-generation layer 1104 are sequentially stacked, a hole-injection layer 1111b and a hole-transport layer 1112b of the EL layer 1103b are sequentially stacked over the charge-generation layer 1104 in a similar manner.

<Hole-Injection Layer and Hole-Transport Layer>

The hole-injection layers (1111, 1111a, and 1111b) are layers that inject holes from the first electrode 101 serving as an anode and the charge-generation layer (1104) to the EL layers (1103, 1103a, and 1103b) and each contain a material with a high hole-injection property.

Examples of the material with a high hole-injection property include transition metal oxides such as a molybdenum oxide and a vanadium oxide. Alternatively, it is possible to use a phthalocyanine-based compound such as phthalocyanine (abbreviation: $H_2Pc$) or copper phthalocyanine (abbreviation: CuPc), or the like. Alternatively, it is possible to use an aromatic amine compound, which is a low molecular compound, such as 4,4',4"-tris(N,N-diphenylamino)triphenylamine (abbreviation: TDATA), or the like. Alternatively, it is possible to use a high molecular compound (an oligomer, a dendrimer, a polymer, or the like) such as poly(N-vinylcarbazole) (abbreviation: PVK) or poly (4-vinyltriphenylamine) (abbreviation: PVTPA), or the like. Alternatively, it is also possible to use a high molecular compound to which acid is added, such as poly(3,4-ethylenedioxythiophene)/poly(styrenesulfonic acid) (abbreviation: PEDOT/PSS), or the like.

Alternatively, as the material with a high hole-injection property, a composite material containing a hole-transport material and an acceptor material (an electron-accepting material) can be used. In that case, the acceptor material extracts electrons from the hole-transport material, so that holes are generated in the hole-injection layers (1111, 1111a, and 1111b) and the holes are injected into the light-emitting layers (1113, 1113a, and 1113b) through the hole-transport layers (1112, 1112a, and 1112b). Note that each of the hole-injection layers (1111, 1111a, and 1111b) may be formed as a single layer formed of a composite material containing a hole-transport material and an acceptor material (an electron-accepting material), or may be formed by stacking a layer including a hole-transport material and a layer including an acceptor material (an electron-accepting material).

The hole-transport layers (1112, 1112a, and 1112b) are layers that transport the holes, which are injected from the first electrode 1101 and the charge-generation layer 1104 by the hole-injection layers (1111, 1111a, and 1111b), to the light-emitting layers (1113, 1113a, and 1113b). Note that the hole-transport layers (1112, 1112a, and 1112b) are layers each containing a hole-transport material. It is particularly preferable that the HOMO level of the hole-transport material used for the hole-transport layers (1112, 1112a, and 1112b) be the same as or close to the HOMO level of the hole-injection layers (1111, 1111a, and 1111b).

As the acceptor material used for the hole-injection layers (1111, 1111a, and 1111b), an oxide of a metal belonging to any of Groups 4 to 8 of the periodic table can be used. Specific examples include molybdenum oxide and vanadium oxide. Among these oxides, molybdenum oxide is particularly preferable because it is stable in the air, has a low hygroscopic property, and is easy to handle. Alternatively, organic acceptors such as a quinodimethane derivative and a chloranil derivative can be used. A compound in which electron-withdrawing groups are bonded to a condensed aromatic ring having a plurality of hetero atoms, such as 2,3,6,7,10,11-hexacyano-1,4,5,8,9,12-hexaazatriphenylene (abbreviation: HAT-CN), is particularly preferable because it is thermally stable. Alternatively, a [3]radialene derivative including an electron-withdrawing group (in particular, a cyano group or a halogen group such as a fluoro group) is preferable because it has a very high electron-accepting property.

The hole-transport materials used for the hole-injection layers (1111, 1111a, and 1111b) and the hole-transport layers (1112, 1112a, and 1112b) are preferably substances with a hole mobility of higher than or equal to $1 \times 10^{-6}$ cm$^2$/Vs. Note that other substances can be used as long as the substances have a hole-transport property higher than an electron-transport property.

As the hole-transport materials, materials each having a high hole-transport property, such as a π-electron rich heteroaromatic compound (e.g., a compound having a carbazole skeleton and a compound having a furan skeleton) and a compound having an aromatic amine skeleton, are preferable. Moreover, a high molecular compound such as poly(N-vinylcarbazole) (abbreviation: PVK) can also be used.

Note that the hole-transport material is not limited to the above examples and one of or a combination of various known materials can be used as the hole-transport material for the hole-injection layers (1111, 1111a, and 1111b) and the hole-transport layers (1112, 1112a, and 1112b). Note that the hole-transport layers (1112, 1112a, and 1112b) may each be formed of a plurality of layers. That is, for example, a first hole-transport layer and a second hole-transport layer may be stacked.

Figure 53D:
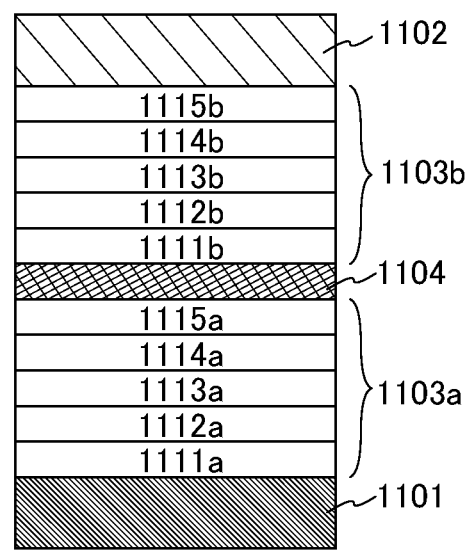
Figure 53E:
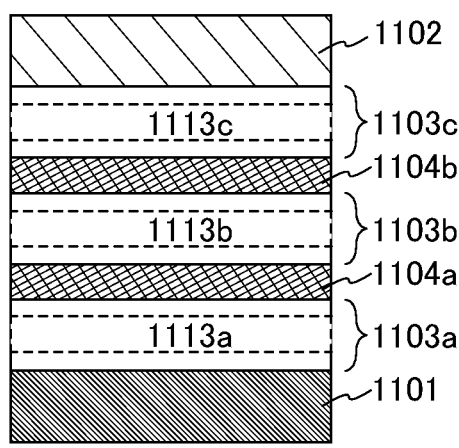

In the light-emitting element illustrated in FIG. 53(D), the light-emitting layer 1113a is formed over the hole-transport layer 1112a of the EL layer 1103a by a vacuum evaporation method. In addition, after the EL layer 1103a and the charge-generation layer 1104 are formed, the light-emitting layer 1113b is formed over the hole-transport layer 1112b of the EL layer 1103b by a vacuum evaporation method.

<Light-Emitting Layer>

The light-emitting layers (1113, 1113a, and 1113b) are layers each containing a light-emitting substance. Note that as the light-emitting substance, a substance whose emission color is blue, violet, bluish violet, green, yellowish green, yellow, orange, red, or the like is used as appropriate. Alternatively, when different light-emitting substances are used for the plurality of light-emitting layers (1113a and 1113b), a structure can be employed in which different emission colors are exhibited (for example, complementary emission colors are combined to achieve white light emission). Furthermore, a stacked-layer structure in which one light-emitting layer contains different light-emitting substances may be employed.

Alternatively, the light-emitting layers (1113, 1113a, and 1113b) may each contain one or more kinds of organic compounds (a host material and an assist material) in addition to a light-emitting substance (a guest material).

The light-emitting substance that can be used for the light-emitting layers (1113, 1113a, and 1113b) is not particularly limited, and a light-emitting substance that converts singlet excitation energy into light emission in a visible light region or a light-emitting substance that converts triplet excitation energy into light emission in a visible light region can be used. Note that examples of the light-emitting substances are given below.

As an example of the light-emitting substance that converts singlet excitation energy into light emission, a substance (a fluorescent material) that emits fluorescence can be given. Examples of the substance that emits fluorescence include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. A pyrene derivative is particularly preferable because it has a high emission quantum yield.

In addition, examples of the light-emitting substance that converts triplet excitation energy into light emission include a substance (a phosphorescent material) that emits phosphorescence and a thermally activated delayed fluorescence (TADF) material that exhibits thermally activated delayed fluorescence.

Examples of a phosphorescent material include an organometallic complex, a metal complex (a platinum complex), and a rare earth metal complex. These substances exhibit different emission colors (emission peaks) and thus, any of them is selected and used as appropriate according to need.

As examples of a phosphorescent material that emits blue or green light and whose emission spectrum has a peak wavelength at greater than or equal to 450 nm and less than or equal to 570 nm, the following substances can be given. For example, an organometallic complex having a 4H-triazole skeleton, such as tris{2-[5-(2-methylphenyl)-4-(2,6-dimethylphenyl)-4H-1,2,4-triazol-3-yl-κN$^2$]phenyl-κC}iridium(III) (abbreviation: [Ir(mpptz-dmp)$_3$]); an organometallic complex having a 1H-triazole skeleton, such as tris[3-methyl-1-(2-methylphenyl)-5-phenyl-1H-1,2,4-triazolato]iridium(III) (abbreviation: [Ir(Mptz1-mp)$_3$]); an organometallic complex having an imidazole skeleton, such as fac-tris[1-(2,6-diisopropylphenyl)-2-phenyl-1H-imidazole]iridium(III) (abbreviation: [Ir(iPrpmi)$_3$]); an organometallic complex in which a phenylpyridine derivative having an electron-withdrawing group is a ligand, such as bis[2-(4',6'-difluorophenyl)pyridinato-N,C$^{2'}$]iridium(III) tetrakis (1-pyrazolyl)borate (abbreviation: FIr6); and the like can be given.

As examples of a phosphorescent material that emits green or yellow light and whose emission spectrum has a peak wavelength at greater than or equal to 495 nm and less than or equal to 590 nm, the following substances can be given. For example, an organometallic complex having a pyrimidine skeleton, such as tris(4-methyl-6-phenylpyrimidinato)iridium(III) (abbreviation: [Ir(mppm)$_3$]); an organometallic complex having a pyrazine skeleton, such as (acetylacetonato)bis(3,5-dimethyl-2-phenylpyrazinato)iridium (III) (abbreviation: [Ir(mppr-Me)$_2$(acac)]); an organometallic complex having a pyridine skeleton, such as tris(2-phenylpyridinato-N,C$^{2'}$)iridium(III) (abbreviation: [Ir(ppy)$_3$]); an organometallic complex such as bis(2,4-diphenyl-1,3-oxazolato-N,C$^{2'}$)iridium(III) acetylacetonate (abbreviation: [Ir(dpo)$_2$(acac)]); a rare earth metal complex such as tris(acetylacetonato) (monophenanthroline)terbium(III) (abbreviation: [Tb(acac)$_3$(Phen)]); and the like can be given.

As examples of a phosphorescent material that emits yellow or red light and whose emission spectrum has a peak wavelength at greater than or equal to 570 nm and less than or equal to 750 nm, the following substances can be given. For example, an organometallic complex having a pyrimidine skeleton, such as (diisobutyrylmethanato)bis[4,6-bis(3-methylphenyOpyrimidinato]iridium(III) (abbreviation: [Ir (5mdppm)$_2$(dibm)]); an organometallic complex having a pyrazine skeleton, such as (acetylacetonato)bis(2,3,5-triphenylpyrazinato)iridium(III) (abbreviation: [Ir(tppr)$_2$(acac)]); organometallic complexes having a pyridine skeleton, such as tris(1-phenylisoquinolinato-N,C$^{2'}$)iridium(III) (abbreviation: [Ir(piq)$_3$]) and bis(1-phenylisoquinolinato-N,C$^{2'}$) iridium(III) acetylacetonate (abbreviation: [Ir(piq)$_2$(acac)]);

a platinum complex such as 2,3,7,8,12,13,17,18-octaethyl-21H,23H-porphyrin platinum(II) (abbreviation: [PtOEP]); and a rare earth metal complex such as tris(1,3-diphenyl-1,3-propanedionato) (monophenanthroline)europium(III) (abbreviation: [Eu(DBM)$_3$(Phen)]) can be given.

As the organic compounds (the host material and the assist material) used for the light-emitting layers (1113, 1113a, and 1113b), one or more kinds of substances having a larger energy gap than the light-emitting substance (the guest material) are used. Note that the hole-transport materials listed above and electron-transport materials given below can be used as the organic compounds (the host material and the assist material).

When the light-emitting substance is a fluorescent material, it is preferable to use, as the host material, an organic compound that has a high energy level in a singlet excited state and has a low energy level in a triplet excited state. For example, an anthracene derivative, a tetracene derivative, and the like are also preferred.

In the case where the light-emitting substance is a phosphorescent material, an organic compound having triplet excitation energy (an energy difference between a ground state and a triplet excited state) higher than that of the light-emitting substance is selected as the host material. For example, condensed polycyclic aromatic compounds such as an anthracene derivative, a phenanthrene derivative, a pyrene derivative, a chrysene derivative, and a dibenzo[g,p]chrysene derivative are also preferred.

In the case where a plurality of organic compounds are used for the light-emitting layers (1113, 1113a, and 1113b), compounds that form an exciplex are preferably used in combination with a phosphorescent substance. Note that such a structure makes it possible to obtain light emission utilizing ExTET (Exciplex-Triplet Energy Transfer), which is energy transfer from an exciplex to a light-emitting substance. In that case, various organic compounds can be combined as appropriate to be used; to form an exciplex efficiently, it is particularly preferable to combine a compound (a hole-transport material) that easily accepts holes and a compound (an electron-transport material) that easily accepts electrons.

The TADF material is a material that can up-convert a triplet excited state into a singlet excited state (reverse intersystem crossing) using a little thermal energy and efficiently emit light (fluorescence) from the singlet excited state. In addition, the thermally activated delayed fluorescence is efficiently obtained under the condition where the energy difference between the triplet excited level and the singlet excited level is greater than or equal to 0 eV and less than or equal to 0.2 eV, preferably greater than or equal to 0 eV and less than or equal to 0.1 eV. Furthermore, delayed fluorescence by the TADF material refers to light emission having a spectrum similar to that of normal fluorescence and an extremely long lifetime. The lifetime is $10^{-6}$ seconds or longer, preferably $10^{-3}$ seconds or longer.

Examples of the TADF material include fullerene, a derivative thereof, an acridine derivative such as proflavine, and eosin. Other examples include a metal-containing porphyrin such as a porphyrin containing magnesium (Mg), zinc (Zn), cadmium (Cd), tin (Sn), platinum (Pt), indium (In), or palladium (Pd). A heterocyclic compound having a π-electron rich heteroaromatic ring and a π-electron deficient heteroaromatic ring, such as 2-(biphenyl-4-yl)-4,6-bis (12-phenylindolo[2,3-a]carbazol-11-yl)-1,3,5-triazine (PIC-TRZ), can be used as another TADF material. Note that a substance in which a π-electron rich heteroaromatic ring is directly bonded to a π-electron deficient heteroaromatic ring is particularly preferable because both the donor property of the π-electron rich heteroaromatic ring and the acceptor property of the 7C-electron deficient heteroaromatic ring are increased and the energy difference between the singlet excited state and the triplet excited state becomes small.

Note that when a TADF material is used, the TADF material can also be used in combination with another organic compound.

With the appropriate use of the above materials, the light-emitting layers (1113, 1113a, and 1113b) can be formed. Furthermore, when the above materials are used in combination with a low molecular material or a high molecular material, the above materials can be used to form the light-emitting layers (1113, 1113a, and 1113b).

In the light-emitting element illustrated in FIG. 53(D), the electron-transport layer 1114a is formed over the light-emitting layer 1113a of the EL layer 1103a. In addition, after the EL layer 1103a and the charge-generation layer 1104 are formed, the electron-transport layer 1114b is formed over the light-emitting layer 1113b of the EL layer 1103b.

<Electron-Transport Layer>

The electron-transport layers (1114, 1114a, and 1114b) are layers that transport the electrons, which are injected from the second electrode 1102 by the electron-injection layers (1115, 1115a, and 1115b), to the light-emitting layers (1113, 1113a, and 1113b). Note that the electron-transport layers (1114, 1114a, and 1114b) are layers each containing an electron-transport material. The electron-transport materials used for the electron-transport layers (1114, 1114a, and 1114b) are preferably substances with an electron mobility of higher than or equal to $1\times10^{-6}$ cm$^2$/Vs. Note that other substances can be used as long as the substances have an electron-transport property higher than a hole-transport property.

As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound. Alternatively, a high molecular compound such as poly(2,5-pyridinediyl) (abbreviation: PPy) can be used.

In addition, each of the electron-transport layers (1114, 1114a, and 1114b) is not limited to a single layer, and may have a stacked structure of two or more layers containing the above substances.

Next, in the light-emitting element illustrated in FIG. 53(D), the electron-injection layer 1115a is formed over the electron-transport layer 1114a of the EL layer 1103a by a vacuum evaporation method. After that, the EL layer 1103a and the charge-generation layer 1104 are formed, the components up to the electron-transport layer 1114b of the EL layer 1103b are formed, and then the electron-injection layer 1115b is formed thereover by a vacuum evaporation method.

<Electron-Injection Layer>

The electron-injection layers (1115, 1115a, and 1115b) are layers each containing a substance having a high electron-injection property. For the electron-injection layers (1115, 1115a, and 1115b), an alkali metal, an alkaline earth metal, or a compound thereof, such as lithium fluoride (LiF), cesium fluoride (CsF), calcium fluoride (CaF$_2$), or lithium oxide (LiO$_x$), can be used. Alternatively, a rare earth metal compound like erbium fluoride (ErF$_3$) can be used. Alternatively, electride may be used for the electron-injection layers (1115, 1115*a*, and 1115*b*). Examples of the electride include a substance in which electrons are added at a high concentration to calcium oxide-aluminum oxide. Note that the above substances for forming the electron-transport layers (1114, 1114*a*, and 1114*b*) can also be used.

Alternatively, a composite material in which an organic compound and an electron donor (a donor) are mixed may be used for the electron-injection layers (1115, 1115*a*, and 1115*b*). Such a composite material has a high electron-injection property and a high electron-transport property because electrons are generated in the organic compound by the electron donor. In this case, the organic compound is preferably a material excellent in transporting the generated electrons; specifically, for example, the electron-transport material used for the electron-transport layers (1114, 1114*a*, and 1114*b*), such as a metal complex or a heteroaromatic compound, can be used.

As the electron donor, a substance showing an electron-donating property with respect to an organic compound may be used. Preferable examples are an alkali metal, an alkaline earth metal, and a rare earth metal. Specifically, lithium, cesium, magnesium, calcium, erbium, ytterbium, and the like can be given. Furthermore, an alkali metal oxide and an alkaline earth metal oxide are preferable, and a lithium oxide, a calcium oxide, a barium oxide, and the like can be given. Alternatively, a Lewis base such as magnesium oxide can be used. Alternatively, an organic compound such as tetrathiafulvalene (abbreviation: TTF) can be used.

Note that in the case where light obtained from the light-emitting layer 1113*b* is amplified in the light-emitting element illustrated in FIG. 53(D), the optical path length between the second electrode 1102 and the light-emitting layer 1113*b* is preferably less than one fourth of the wavelength λ of light emitted from the light-emitting layer 1113*b*. In that case, the optical path length can be adjusted by changing the thickness of the electron-transport layer 1114*b* or the electron-injection layer 1115*b*.

<Charge-Generation Layer>

In the light-emitting element illustrated in FIG. 53(D), the charge-generation layer 1104 has a function of injecting electrons into the EL layer 1103*a* and injecting holes into the EL layer 1103*b* when voltage is applied between the first electrode (the anode) 1101 and the second electrode (the cathode) 1102. Note that the charge-generation layer 1104 may have either a structure in which an electron acceptor (an acceptor) is added to a hole-transport material or a structure in which an electron donor (a donor) is added to an electron-transport material. Alternatively, both of these structures may be stacked. Note that forming the charge-generation layer 1104 with the use of the above material can suppress an increase in drive voltage caused when the EL layers are stacked.

As the electron acceptor, 7,7,8,8-tetracyano-2,3,5,6-tetrafluoroquinodimethane (abbreviation: F$_4$-TCNQ), chloranil, and the like can be given. In addition, oxides of metals that belong to Group 4 to Group 8 of the periodic table can be given.

As the electron donor, it is possible to use an alkali metal, an alkaline earth metal, a rare earth metal, metals that belong to Groups 2 and 13 of the periodic table, or an oxide or carbonate thereof. Alternatively, an organic compound such as tetrathianaphthacene may be used as the electron donor.

For manufacture of the light-emitting element in this embodiment, a vacuum process such as an evaporation method or a solution process such as a spin coating method or an ink-jet method can be used.

Note that the functional layers (the hole-injection layers (1111, 1111*a*, and 1111*b*), the hole-transport layers (1112, 1112*a*, and 1112*b*), the light-emitting layers (1113, 1113*a*, and 1113*b*), the electron-transport layers (1114, 1114*a*, and 1114*b*), and the electron-injection layers (1115, 1115*a*, and 1115*b*)) that are included in the EL layers (1103, 1103*a*, and 1103*b*) and the charge-generation layer 1104 of the light-emitting element described in this embodiment are not limited to the above materials, and other materials can be used in combination as long as the functions of the layers are fulfilled. For example, a high molecular compound (an oligomer, a dendrimer, a polymer, or the like), a middle molecular compound (a compound between a low molecular compound and a high molecular compound with a molecular weight of 400 to 4000), or an inorganic compound (a quantum dot material or the like) can be used. In addition, as the quantum dot material, a colloidal quantum dot material, an alloyed quantum dot material, a core-shell quantum dot material, a core quantum dot material, or the like can be used.

The structure described above in this embodiment can be used in appropriate combination with structures described in the other embodiments.

Embodiment 7

In this embodiment, electronic devices each including a display device that is one embodiment of the present invention will be described.

Figure 54A:
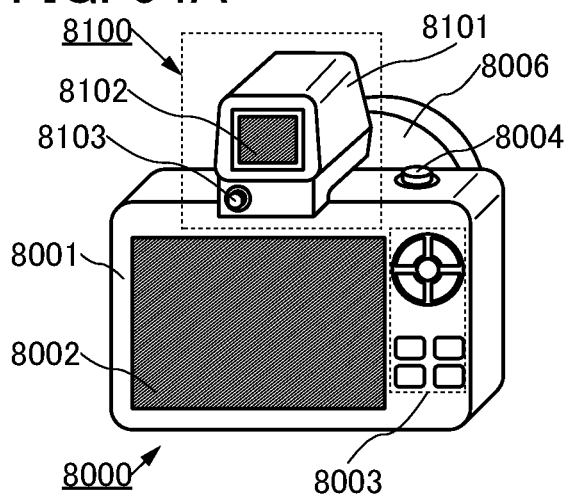
FIG. 54 (A), (B), (C), (D), (E) Perspective views illustrating examples of electronic devices.

FIG. 54(A) is an external view of a camera 8000 to which a finder 8100 is attached.

The camera 8000 includes a housing 8001, a display portion 8002, operation buttons 8003, a shutter button 8004, and the like. In addition, a detachable lens 8006 is attached to the camera 8000.

Although a structure is employed in which the lens 8006 of the camera 8000 here is detachable from the housing 8001 for replacement, the lens 8006 may be integrated with the housing 8001.

The camera 8000 can take images at the press of the shutter button 8004. In addition, the display portion 8002 has a function of a touch panel and images can also be taken at the touch of the display portion 8002.

The housing 8001 of the camera 8000 includes a mount including an electrode, so that the finder 8100, a stroboscope, or the like can be connected to the housing 8001.

The finder 8100 includes a housing 8101, a display portion 8102, a button 8103, and the like.

The housing 8101 includes a mount for engagement with the mount of the camera 8000, so that the finder 8100 can be attached to the camera 8000. In addition, the mount includes an electrode, and a video or the like received from the camera 8000 through the electrode can be displayed on the display portion 8102.

The button 8103 has a function of a power button. The display portion 8102 can be turned on and off with the button 8103.

A display device of one embodiment of the present invention can be applied to the display portion 8002 of the camera 8000 and the display portion 8102 of the finder 8100.

Note that although a structure is employed in which the camera 8000 and the finder 8100 are separate and detachable electronic devices in FIG. 54(A), a finder including a display device may be incorporated in the housing 8001 of the camera 8000.

Figure 54B:
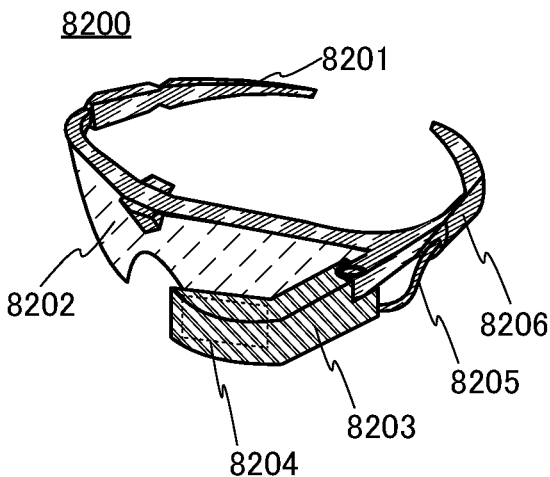

FIG. 54(B) is an external view of a head-mounted display 8200.

The head-mounted display 8200 includes a mounting portion 8201, a lens 8202, a main body 8203, a display portion 8204, a cable 8205, and the like. In addition, a battery 8206 is incorporated in the mounting portion 8201.

The cable 8205 supplies power from the battery 8206 to the main body 8203. The main body 8203 includes a wireless receiver or the like and can display received video information, such as image data, on the display portion 8204. The movement of the user's eyeball and eyelid is captured by a camera provided in the main body 8203 and then coordinates of the user's sight line are calculated using the information to utilize the user's sight line as an input means.

In addition, a plurality of electrodes may be provided in the mounting portion 8201 at a position in contact with the user. The main body 8203 may have a function of sensing current flowing through the electrodes with the movement of the user's eyeball to recognize the user's sight line. The main body 8203 may have a function of sensing current flowing through the electrodes to monitor the user's pulse. Furthermore, the mounting portion 8201 may include a variety of sensors such as a temperature sensor, a pressure sensor, and an acceleration sensor, and may have a function of displaying the user's biological information on the display portion 8204. Alternatively, the main body 8203 may sense the movement of the user's head or the like to change a video displayed on the display portion 8204 in synchronization with the movement.

A display device of one embodiment of the present invention can be applied to the display portion 8204.

Figure 54C:
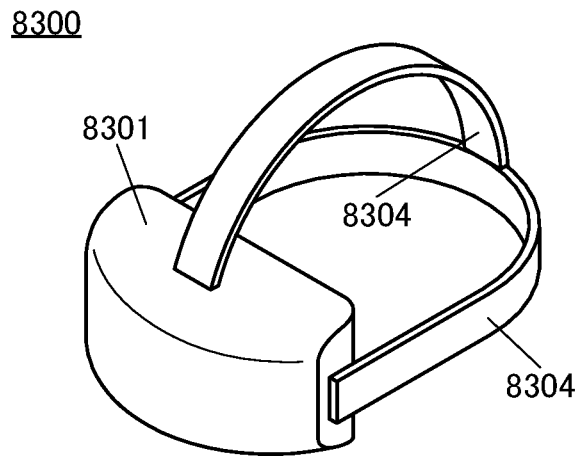
Figure 54D:
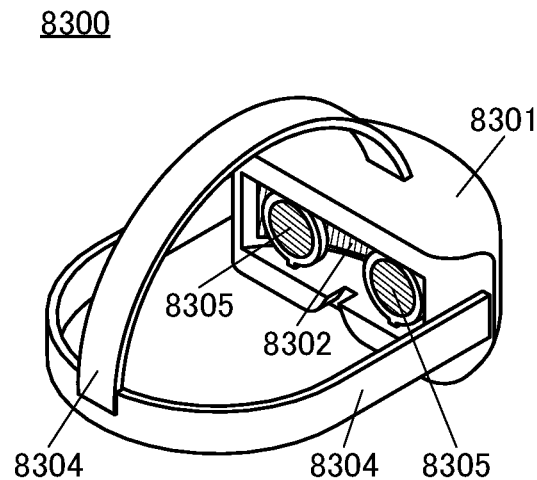
Figure 54E:
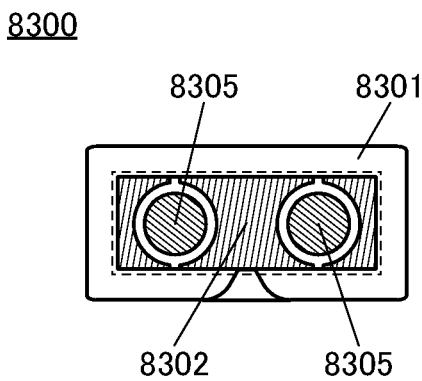

FIG. 54(C), FIG. 54(D), and FIG. 54(E) are external views of a head-mounted display 8300. The head-mounted display 8300 includes a housing 8301, a display portion 8302, a band-shaped fixing unit 8304, and a pair of lenses 8305.

The user can see display on the display portion 8302 through the lenses 8305. Note that it is suitable that the display portion 8302 be curved and placed. When the display portion 8302 is curved and placed, the user can feel a high realistic sensation. Note that although the structure in which one display portion 8302 is provided is described in this embodiment as an example, the structure is not limited thereto, and a structure where two display portions 8302 are provided may be employed, for example. In that case, when a structure where one display portion is placed for one eye of the user is employed, three-dimensional display using parallax or the like is possible.

Note that a display device of one embodiment of the present invention can be applied to the display portion 8302. The display device of one embodiment of the present invention has extremely high definition; thus, even when a video is magnified using the lenses 8305 as in FIG. 54(E), the user does not perceive pixels, and a more realistic video can be displayed.

Next, FIG. 55(A) to FIG. 55(G) illustrate examples of electronic devices that are different from the electronic devices illustrated in FIG. 54(A) to FIG. 54(E).

Electronic devices illustrated in FIG. 55(A) to FIG. 55(G) include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays), a microphone 9008, and the like.

The electronic devices illustrated in FIG. 55(A) to FIG. 55(G) have a variety of functions. Examples include a function of displaying a variety of information (a still image, a moving image, a text image, and the like) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading a program or data stored in a recording medium and displaying it on the display portion. Note that functions that can be provided for the electronic devices illustrated in FIG. 55(A) to FIG. 55(G) are not limited thereto, and the electronic devices can have a variety of functions. In addition, although not illustrated in FIG. 55(A) to FIG. 55(G), a structure may be employed in which the electronic devices each include a plurality of display portions. Alternatively, the electronic devices may each include a camera and the like and have a function of taking a still image, a function of taking a moving image, a function of storing the taken image in a recording medium (external or incorporated in the camera), a function of displaying the taken image on the display portion, or the like.

The details of the electronic devices illustrated in FIG. 55(A) to FIG. 55(G) are described below.

Figure 55A:
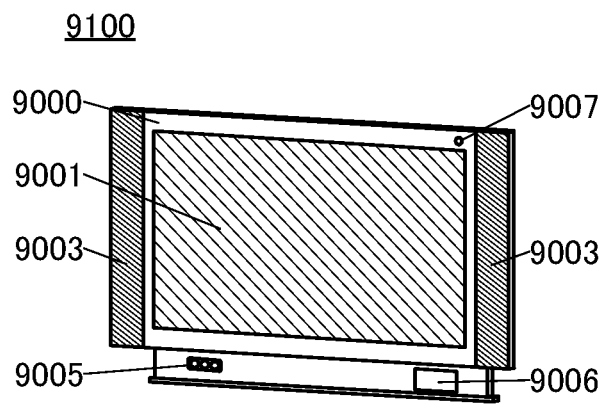
FIG. 55 (A), (B), (C), (D), (E), (F), (G) Perspective views illustrating examples of electronic devices.

FIG. 55(A) is a perspective view showing a television device 9100. The television device 9100 can include the display portion 9001 having a large screen size of, for example, 50 inches or more, or 100 inches or more.

Figure 55D:
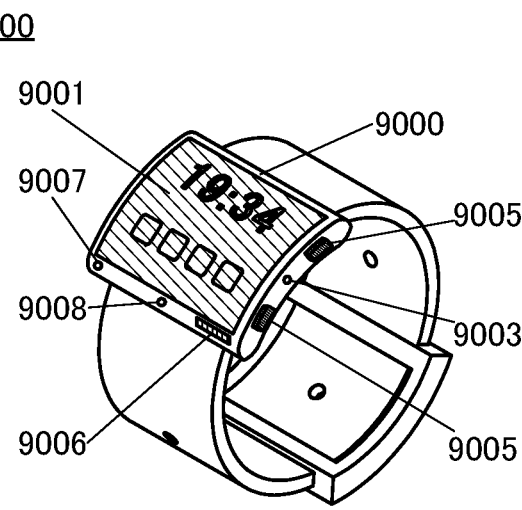
Figure 55B:
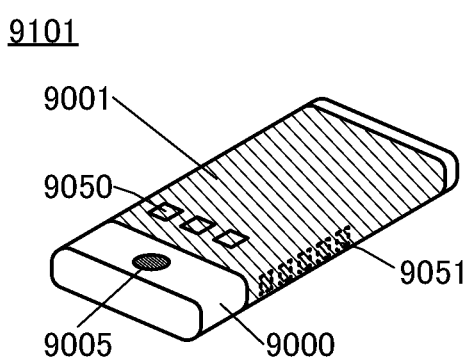

FIG. 55(B) is a perspective view showing a portable information terminal 9101. The portable information terminal 9101 has one or more functions selected from a telephone set, a notebook, an information browsing device, and the like, for example. Specifically, the portable information terminal 9101 can be used as a smartphone. Note that the speaker 9003, the connection terminal 9006, the sensor 9007, or the like may be provided in the portable information terminal 9101. In addition, the portable information terminal 9101 can display characters and image information on its plurality of surfaces. For example, three operation buttons 9050 (also referred to as operation icons, or simply as icons) can be displayed on one surface of the display portion 9001. Furthermore, information 9051 indicated by dashed rectangles can be displayed on another surface of the display portion 9001. Note that examples of the information 9051 include display indicating reception of an e-mail, an SNS (a social networking service), an incoming call, or the like; the title of an e-mail, an SNS, or the like; the sender of an e-mail, an SNS, or the like; date; time; remaining battery; and reception strength of an antenna. Alternatively, the operation buttons 9050 or the like may be displayed on the position where the information 9051 is displayed, in place of the information 9051.

Figure 55E:
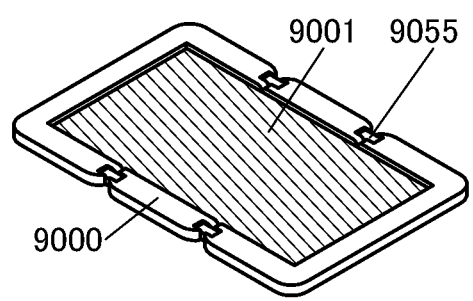
Figure 55C:
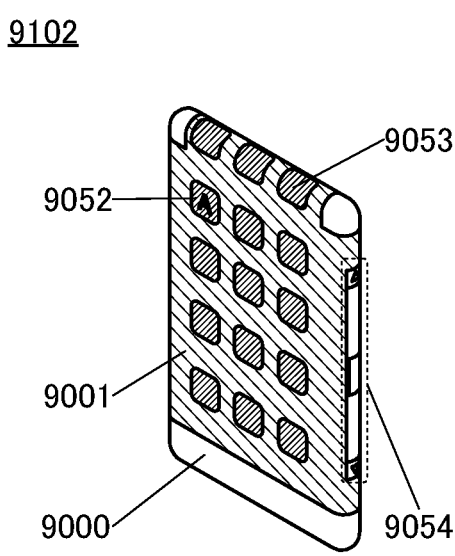

FIG. 55(C) is a perspective view showing a portable information terminal 9102. The portable information terminal 9102 has a function of displaying information on three or more surfaces of the display portion 9001. Here, an example in which information 9052, information 9053, and information 9054 are displayed on different surfaces is shown. For example, a user of the portable information terminal 9102 can see the display (here, the information 9053) with the portable information terminal 9102 put in a breast pocket of the clothes. Specifically, a caller's phone number, name, or the like of an incoming call is displayed in a position that can be seen from above the portable information terminal 9102. The user can see the display without taking out the portable information terminal 9102 from the pocket and decide whether to answer the call.

FIG. 55(D) is a perspective view showing a watch-type portable information terminal 9200. The portable information terminal 9200 is capable of executing a variety of applications such as mobile phone calls, e-mailing, reading and editing text, music reproduction, Internet communication, and computer games. In addition, the display surface of the display portion 9001 is curved and provided, and display can be performed along the curved display surface. Furthermore, the portable information terminal 9200 can perform standards-based near field communication. For example, hands-free calling can be achieved by mutual communication with a headset capable of wireless communication. Furthermore, the portable information terminal 9200 includes the connection terminal 9006, and data can be directly transmitted to and received from another information terminal via a connector. Moreover, charging through the connection terminal 9006 is also possible. Note that charging operation may be performed by wireless power feeding without using the connection terminal 9006.

Figure 55F:
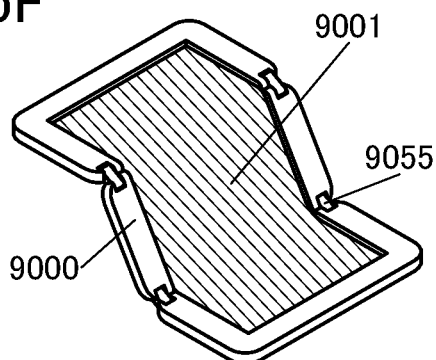
Figure 55G:
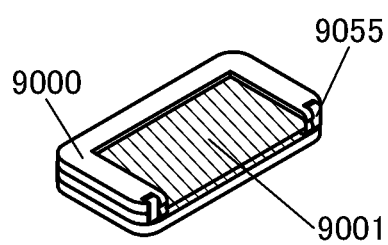

FIG. 55(E), FIG. 55(F), and FIG. 55(G) are perspective views showing a foldable portable information terminal 9201. In addition, FIG. 55(E) is a perspective view of the portable information terminal 9201 in an unfolded state, FIG. 55(F) is a perspective view of the portable information terminal 9201 that is in a state in the middle of change from one of the unfolded state and a folded state to the other, and FIG. 55(G) is a perspective view of the portable information terminal 9201 in the folded state. The portable information terminal 9201 is highly portable in the folded state and is highly browsable in the unfolded state because of a seamless large display region. The display portion 9001 of the portable information terminal 9201 is supported by three housings 9000 joined by hinges 9055. By being folded at the hinges 9055 between two housings 9000, the portable information terminal 9201 can be reversibly changed in shape from the unfolded state to the folded state. For example, the portable information terminal 9201 can be bent with a radius of curvature of greater than or equal to 1 mm and less than or equal to 150 mm.

The electronic devices described in this embodiment include the display portion for displaying some sort of information. Note that a semiconductor device of one embodiment of the present invention can also be applied to an electronic device that does not include a display portion.

At least part of the structure examples, the drawings corresponding thereto, and the like illustrated in this embodiment can be implemented in combination with the other structure examples, the other drawings, and the like as appropriate.

At least part of this embodiment can be implemented in combination with the other embodiments described in this specification as appropriate.

Embodiment 8

In this embodiment, electronic devices each including a display device that is one embodiment of the present invention will be described.

Electronic devices illustrated below each include a display device of one embodiment of the present invention in a display portion. Thus, the electronic devices achieve high resolution. In addition, the electronic devices can each achieve both high resolution and a large screen.

A display portion in an electronic device of one embodiment of the present invention can display an image with a resolution of, for example, full high definition, 4K2K, 8K4K, 16K8K, or higher. In addition, as a screen size of the display portion, a screen diagonal can be greater than or equal to 20 inches, greater than or equal to 30 inches, greater than or equal to 50 inches, greater than or equal to 60 inches, or greater than or equal to 70 inches.

Examples of electronic devices include a digital camera, a digital video camera, a digital photo frame, a cellular phone, a portable game machine, a portable information terminal, and an audio reproducing device in addition to electronic devices provided with comparatively large screens, such as a television device, a desktop or laptop personal computer, a monitor for a computer or the like, digital signage, and a large game machine like a pachinko machine.

An electronic device or a lighting device of one embodiment of the present invention can be incorporated along a curved inside wall or outside wall surface of a house or a building or a curved interior or exterior surface of a car.

The electronic device of one embodiment of the present invention may include an antenna. When a signal is received by an antenna, the electronic device can display a video, information, or the like on a display portion. In addition, when the electronic device includes an antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic device of one embodiment of the present invention can have a variety of functions. For example, the electronic device of one embodiment of the present invention can have a function of displaying a variety of information (a still image, a moving image, a text image, and the like) on the display portion, a touch panel function, a function of displaying a calendar, date, time, and the like, a function of executing a variety of software (programs), a wireless communication function, a function of reading a program or data stored in a recording medium, and the like.

Figure 56A:
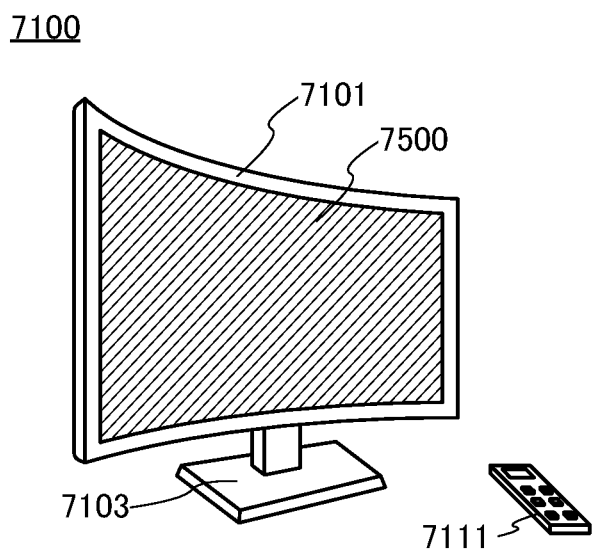
FIG. 56 (A), (B), (C), (D) Perspective views illustrating examples of electronic devices.

FIG. 56(A) illustrates an example of a television device. In a television device 7100, a display portion 7500 is incorporated in a housing 7101. Here, a structure in which the housing 7101 is supported by a stand 7103 is illustrated.

A display device of one embodiment of the present invention can be applied to the display portion 7500.

Operation of the television device 7100 illustrated in FIG. 56(A) can be performed with an operation switch provided in the housing 7101 or a separate remote control 7111. Alternatively, the display portion 7500 may include a touch sensor, and the television device 7100 can be operated by touch on the display portion 7500 with a finger or the like. The remote control 7111 may be provided with a display portion for displaying information output from the remote control 7111. With operation keys or a touch panel provided in the remote control 7111, channels and volume can be operated and videos displayed on the display portion 7500 can be operated.

Note that the television device 7100 has a structure in which a receiver, a modem, and the like are provided. A general television broadcast can be received with the receiver. In addition, when connected to a communication network with or without wires via the modem, one-way (from a transmitter to a receiver) or two-way (between a transmitter and a receiver or between receivers) information communication can also be performed.

Figure 56B:
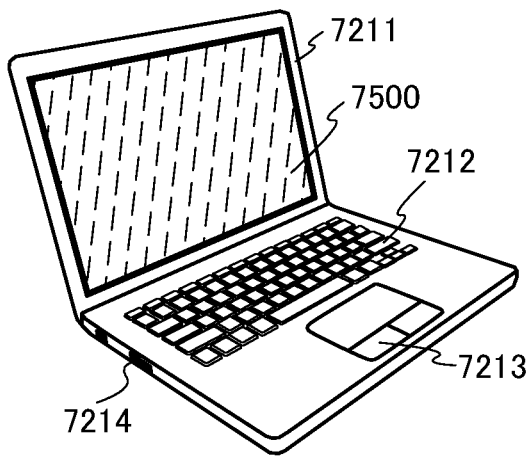

FIG. 56(B) illustrates a laptop personal computer 7200. The laptop personal computer 7200 includes a housing 7211, a keyboard 7212, a pointing device 7213, an external connection port 7214, and the like. In the housing 7211, the display portion 7500 is incorporated.

A display device of one embodiment of the present invention can be applied to the display portion 7500.

Figure 56C:
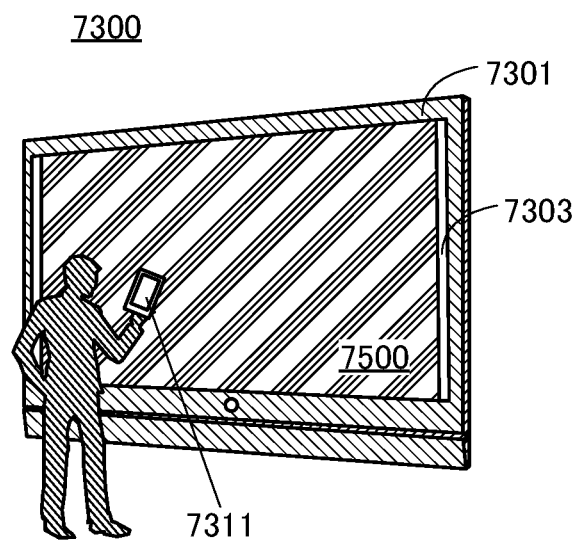
Figure 56D:
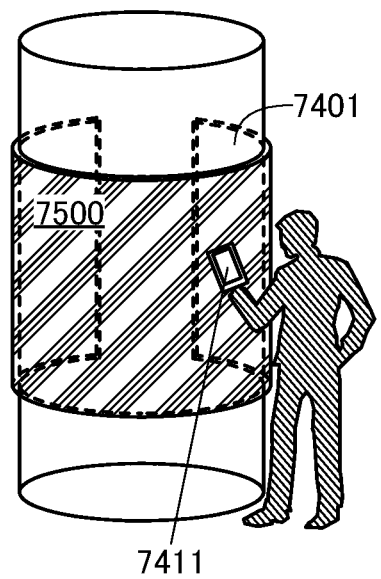

FIG. 56(C) and FIG. 56(D) illustrate examples of digital signage.

Digital signage 7300 illustrated in FIG. 56(C) includes a housing 7301, the display portion 7500, a speaker 7303, and the like. Furthermore, the digital signage can include an LED lamp, operation keys (including a power switch or an operation switch), a connection terminal, a variety of sensors, a microphone, and the like.

In addition, FIG. 56(D) is digital signage 7400 attached to a cylindrical pillar 7401. The digital signage 7400 includes the display portion 7500 provided along a curved surface of the pillar 7401.

A display device of one embodiment of the present invention can be applied to the display portion 7500 in FIG. 56(C) and FIG. 56(D).

The larger display portion 7500 can increase the amount of information that can be provided at a time. In addition, the larger display portion 7500 attracts more attention, so that the effect of advertising can be increased, for example.

It is preferable to apply a touch panel to the display portion 7500 because in addition to display of a still image or a moving image on the display portion 7500, intuitive operation by a user is possible. Moreover, for an application for providing information such as route information or traffic information, usability can be enhanced by intuitive operation.

Furthermore, as illustrated in FIG. 56(C) and FIG. 56(D), it is preferable that the digital signage 7300 or the digital signage 7400 work with an information terminal 7311 or an information terminal 7411 such as a smartphone a user has through wireless communication. For example, information of an advertisement displayed on the display portion 7500 can be displayed on a screen of the information terminal 7311 or the information terminal 7411. Moreover, by operation of the information terminal 7311 or the information terminal 7411, a displayed image on the display portion 7500 can be switched.

Furthermore, it is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

At least part of this embodiment can be implemented in combination with the other embodiments described in this specification as appropriate.

REFERENCE NUMERALS

214, 216, 222, 224, 244, 254, 280, 274, and 281: insulator, 301*a*, 301*b*, 305*a*, 305*b*, 311, 313, 315, and 317: conductor, 321: lower electrode, 323: insulator, 325: upper electrode, 331, 333, 335, 337, 341, 343, 347, 351, 353, 355, and 357: conductor, 361 and 363: insulator, 421 and 441: transistor, 700 and 700A: display device, 701 and 705: substrate, 702: pixel portion, 704: source driver circuit portion, 708: FPC terminal portion, 711: lead wiring portion, 712: sealant, 716: FPC, 730: insulating film, 732: sealing film, 734: insulating film, 736: coloring film, 750, 750A, 752, 752A, 754, and 754A: transistor, 760: connection electrode, 772: conductive layer, 775: liquid crystal element, 778: structure body, 780: anisotropic conductive film, 782: light-emitting element, 786: EL layer, 788: conductive film, and 790: capacitor.

The invention claimed is:

1. A display device comprising:
   a first transistor comprising:
      a first oxide;
      a second oxide;
      a first conductor and a second conductor over the first oxide;
      a third conductor;
      a first insulator between the first conductor and the second conductor; and
      a second insulator;
   a display element comprising: a first electrode electrically connected to the first transistor; and
      a second electrode over the first electrode;
   a first insulating layer over the second conductor;
   a capacitor comprising:
      a first electrode over the first insulating layer;
      an insulator over the first electrode; and
      a second electrode over the insulator; and
   a coloring film,
   wherein the coloring film, the first electrode of the display element, and the first electrode of the capacitor overlap one another,
   wherein the first electrode of the display element and the first conductor overlap each other,
   wherein the first conductor and the second conductor are apart from each other,
   wherein the first insulator comprises an opening,
   wherein the opening and a portion between the first conductor and the second conductor overlap each other,
   wherein the third conductor is positioned in the opening,
   wherein the second insulator is positioned between the third conductor and the first oxide,
   wherein the second insulator is positioned between the third conductor and each of the first conductor and the second conductor,
   wherein the second insulator is positioned between the third conductor and the first insulator,
   wherein the second oxide is positioned between the second insulator the first insulator,
   wherein the second oxide is positioned between the first oxide and the first insulator, and
   wherein the second oxide is positioned between each of the first conductor and the second conductor and the first insulator.

2. The display device according to claim 1, wherein the display element is a liquid crystal element.

3. The display device according to claim 1, wherein the display element is a light-emitting element.

4. The display device according to claim 1, further comprising a fourth conductor and a fifth conductor,
   wherein the fourth conductor is positioned between the first conductor and the first oxide, wherein the fifth conductor is positioned between the second conductor and the first oxide,
wherein a part of the first conductor is in contact with a top surface of the first oxide, and
wherein a part of the second conductor is in contact with a top surface of the first oxide.

5. The display device according to claim 4, wherein a distance between the first conductor and the second conductor is shorter than a length of the opening in a channel length direction.

6. The display device according to claim 1, further comprising a structural body in the same layer as a layer including the display element,
wherein the structure body and the first transistor overlap each other.

7. The display device according to claim 1, further comprising a second transistor electrically connected to the display element,
wherein a layer including the first transistor is positioned between a layer including the display element and a layer included in the second transistor.

8. The display device according to claim 7, further comprising a light-blocking film over the display element,
wherein the light-blocking film, the first transistor and the second transistor overlap one another.

9. The display device according to claim 7,
wherein the second transistor comprises silicon in a channel formation region, and
wherein the second transistor is an n-channel transistor.

10. The display device according to claim 7,
wherein the second transistor comprises silicon in a channel formation region, and
wherein the second transistor is a p-channel transistor.

11. The display device according to claim 1, further comprising a third insulator,
wherein the third insulator is positioned between the first insulator and the first oxide,
wherein the third insulator is positioned between the first insulator and each of the first conductor and the second conductor,
wherein the third insulator is positioned between the first insulator and the second oxide, and
wherein the third insulator has a lower oxygen permeability than the first insulator.

12. The display device according to claim 1, further comprising a third insulator,
wherein the third insulator is positioned between the first insulator and the first oxide,
wherein the third insulator is positioned between the first insulator and each of the first conductor and the second conductor,
wherein the third insulator is positioned between the first insulator and the second oxide,
wherein the second oxide is in contact with the first insulator, and
wherein the third insulator has a lower oxygen permeability than the first insulator.

13. A display device comprising:
a first transistor comprising:
  a first oxide;
  a second oxide over the first oxide;
  a first insulator over the second oxide;
  a conductor over the first insulator;
  a second insulator;
  a third insulator over the second insulator; and
  a fourth insulator; and
a display element electrically connected to the first transistor,
wherein the second insulator is in contact with a part of a top surface of the first oxide, a part of a side surface of the first oxide, and a part of a side surface of the second oxide,
wherein each of a part of the second oxide and a part of the first insulator is positioned between a side surface of the conductor and a side surface of the third insulator,
wherein the fourth insulator is in contact with a top surface of the second oxide, a top surface of the first insulator, a top surface of the conductor, and a top surface of the third insulator,
wherein the first oxide comprises a first region, a second region, and a third region between the first region and the second region,
wherein the conductor is over the third region,
wherein the conductor and the third region overlap each other,
wherein the second insulator is in contact with the first region and the second region, and
wherein each of the first region and the second region has a lower resistance than the third region.

14. The display device according to claim 13, further comprising a fifth insulator being in contact with a top surface of the second insulator and a part of the side surface of the second oxide,
wherein the first oxide further comprises:
  a fourth region between the first region and the third region; and
  a fifth region between the second region and the third region,
wherein each of the fourth region and the fifth region has a lower resistance than the third region and has a higher resistance than the first region and the second region.

15. The display device according to claim 14, wherein each of the fourth region and the fifth region comprises any one or more of phosphorus and boron.

16. The display device according to claim 14, wherein each of the first region and the second region has a larger amount of phosphorus or boron than each of the fourth region and the fifth region.

17. The display device according to claim 14, wherein the second oxide and each of a part of the fourth region and a part of the fifth region overlap each other.

18. The display device according to claim 13, further comprising a structural body in the same layer as a layer including the display element,
wherein the structure body and the first transistor overlap each other.

19. The display device according to claim 13, further comprising a second transistor electrically connected to the display element,
wherein a layer including the first transistor is positioned between a layer including the display element and a layer included in the second transistor.

20. The display device according to claim 19, further comprising a light-blocking film over the display element,
wherein the light-blocking film, the first transistor and the second transistor overlap one another.

21. The display device according to claim 19,
wherein the second transistor comprises silicon in a channel formation region, and
wherein the second transistor is an n-channel transistor.

22. The display device according to claim 19, wherein the second transistor comprises silicon in a channel formation region, and wherein the second transistor is a p-channel transistor.

23. The display device according to claim 13, wherein each of the first region and the second region comprises any one or more of phosphorus and boron.

24. The display device according to claim 13, wherein the second oxide and each of a part of the first region and a part of the second region overlap each other.

25. The display device according to claim 13, wherein the display element is a liquid crystal element.

26. The display device according to claim 13, wherein the display element is a light-emitting element.

* * * * *